US012120945B2

(12) United States Patent
Li

(10) Patent No.: US 12,120,945 B2
(45) Date of Patent: Oct. 15, 2024

(54) DISPLAY AND LIGHTING DEVICES COMPRISING PHOSPHORESCENT EXCIMERS WITH PREFERRED MOLECULAR ORIENTATION AS MONOCHROMATIC EMITTERS

(71) Applicant: Arizona Board of Regents on behalf of Arizona State University, Scottsdale, AZ (US)

(72) Inventor: Jian Li, Tempe, AZ (US)

(73) Assignee: Arizona Board of Regents on behalf of Arizona State University, Scottsdale, AZ (US)

(*) Notice: Subject to any disclaimer, the term of this patent is extended or adjusted under 35 U.S.C. 154(b) by 0 days.

(21) Appl. No.: 18/167,283

(22) Filed: Feb. 10, 2023

(65) Prior Publication Data

US 2023/0247897 A1 Aug. 3, 2023

Related U.S. Application Data

(63) Continuation of application No. 16/756,219, filed as application No. PCT/US2018/056364 on Oct. 17, 2018, now Pat. No. 11,594,688.
(Continued)

(51) Int. Cl.
*H10K 85/30* (2023.01)
*C07F 15/00* (2006.01)
(Continued)

(52) U.S. Cl.
CPC ......... *H10K 85/341* (2023.02); *C07F 15/006* (2013.01); *C09K 11/02* (2013.01);
(Continued)

(58) Field of Classification Search
CPC ...... H10K 85/341; H10K 50/11; H10K 50/15; H10K 50/16; H10K 2101/10;
(Continued)

(56) References Cited

U.S. PATENT DOCUMENTS 4,769,292 A 9/1988 Tang
5,451,674 A 9/1995 Silver
(Continued)

FOREIGN PATENT DOCUMENTS

CN 1680366 A 10/2005
CN 1777663 5/2006
(Continued)

OTHER PUBLICATIONS

Olynick et al. (2009). "The link between nanoscale feature development in a negative resist and the Hansen solubility sphere," Journal of Polymer Science: Part B: Polymer Physics, 47, 2091-2105.
(Continued)

*Primary Examiner* — Caleb E Henry
(74) *Attorney, Agent, or Firm* — Riverside Law LLP

(57) ABSTRACT

An organic light emitting diode having a substrate, a first electrode, a hole transporting layer proximate the first electrode, a second electrode, an electron transporting layer proximate the second electrode, and an emissive layer between the hole transporting layer and the electron transporting layer. The emissive layer includes a square planar tetradentate platinum or palladium complex, and excimers formed by two or more of the complexes are aligned such that emitting dipoles of the excimers are substantially parallel to a surface of the substrate.

16 Claims, 4 Drawing Sheets

Related U.S. Application Data

(60) Provisional application No. 62/573,639, filed on Oct. 17, 2017.

(51) Int. Cl.
*C09K 11/02* (2006.01)
*C09K 11/06* (2006.01)
*H10K 50/11* (2023.01)
*H10K 50/15* (2023.01)
*H10K 50/16* (2023.01)
*H10K 101/10* (2023.01)

(52) U.S. Cl.
CPC ...... *C09K 11/06* (2013.01); *C09K 2211/1007* (2013.01); *C09K 2211/1014* (2013.01); *C09K 2211/1022* (2013.01); *C09K 2211/1029* (2013.01); *C09K 2211/1044* (2013.01); *C09K 2211/185* (2013.01); *H10K 50/11* (2023.02); *H10K 50/15* (2023.02); *H10K 50/16* (2023.02); *H10K 2101/10* (2023.02)

(58) Field of Classification Search
CPC ....... C07F 15/006; C09K 11/02; C09K 11/06; C09K 2211/1007; C09K 2211/1014; C09K 2211/1022; C09K 2211/1029; C09K 2211/1044; C09K 2211/185
See application file for complete search history.

(56) References Cited

U.S. PATENT DOCUMENTS 5,641,878 A 6/1997 Dandliker
5,707,745 A 1/1998 Forrest
5,844,363 A 12/1998 Gu
6,200,695 B1 3/2001 Arai
6,303,238 B1 10/2001 Thompson
6,780,528 B2 8/2004 Tsuboyama
7,002,013 B1 2/2006 Chi
7,037,599 B2 5/2006 Culligan
7,064,228 B1 6/2006 Yu
7,268,485 B2 9/2007 Tyan
7,279,704 B2 10/2007 Walters
7,332,232 B2 2/2008 Ma
7,442,797 B2 10/2008 Itoh
7,501,190 B2 3/2009 Ise
7,635,792 B1 12/2009 Cella
7,655,322 B2 2/2010 Forrest
7,854,513 B2 12/2010 Quach
7,947,383 B2 5/2011 Ise
8,106,199 B2 1/2012 Jabbour
8,133,597 B2 3/2012 Yasukawa
8,389,725 B2 3/2013 Li
8,617,723 B2 12/2013 Stoessel
8,669,364 B2 3/2014 Li
8,778,509 B2 7/2014 Yasukawa
8,816,080 B2 8/2014 Li
8,846,940 B2 9/2014 Li
8,871,361 B2 10/2014 Xia
8,927,713 B2 1/2015 Li
8,933,622 B2 * 1/2015 Kawami ........... H10K 85/6572 313/504
8,946,417 B2 2/2015 Li
8,987,451 B2 3/2015 Tsai
9,059,412 B2 6/2015 Zeng
9,076,974 B2 7/2015 Li
9,082,989 B2 7/2015 Li
9,203,039 B2 12/2015 Li
9,221,857 B2 12/2015 Li
9,224,963 B2 12/2015 Li
9,238,668 B2 1/2016 Li
9,312,502 B2 4/2016 Li
9,312,505 B2 4/2016 Brooks
9,318,725 B2 4/2016 Li
9,324,957 B2 4/2016 Li
9,382,273 B2 7/2016 Li
9,385,329 B2 7/2016 Li
9,425,415 B2 8/2016 Li
9,461,254 B2 10/2016 Tsai
9,493,698 B2 11/2016 Beers
9,502,671 B2 11/2016 Li
9,550,801 B2 1/2017 Li
9,598,449 B2 3/2017 Li
9,617,291 B2 4/2017 Li
9,666,822 B2 5/2017 Forrest
9,673,409 B2 6/2017 Li
9,698,359 B2 7/2017 Li
9,711,739 B2 7/2017 Li
9,711,741 B2 7/2017 Li
9,711,742 B2 7/2017 Li
9,735,397 B2 8/2017 Riegel
9,755,163 B2 9/2017 Li
9,818,959 B2 11/2017 Li
9,865,825 B2 1/2018 Li
9,879,039 B2 1/2018 Li
9,882,150 B2 1/2018 Li
9,899,614 B2 2/2018 Li
9,920,242 B2 3/2018 Li
9,923,155 B2 3/2018 Li
9,941,479 B2 4/2018 Li
9,947,881 B2 4/2018 Li
9,985,224 B2 5/2018 Li
10,020,455 B2 7/2018 Li
10,033,003 B2 7/2018 Li
10,056,564 B2 8/2018 Li
10,056,567 B2 8/2018 Li
10,158,091 B2 12/2018 Li
10,177,323 B2 1/2019 Li
10,211,411 B2 2/2019 Li
10,211,414 B2 2/2019 Li
10,263,197 B2 4/2019 Li
10,294,417 B2 5/2019 Li
10,392,387 B2 8/2019 Li
10,411,202 B2 9/2019 Li
10,414,785 B2 9/2019 Li
10,516,117 B2 12/2019 Li
10,566,553 B2 2/2020 Li
10,566,554 B2 2/2020 Li
10,615,349 B2 4/2020 Li
10,622,571 B2 4/2020 Li
10,727,422 B2 7/2020 Li
10,745,615 B2 8/2020 Li
10,790,457 B2 9/2020 Li
10,793,546 B2 10/2020 Li
10,804,476 B2 10/2020 Li
10,822,363 B2 11/2020 Li
10,836,785 B2 11/2020 Li
10,851,106 B2 12/2020 Li
10,886,478 B2 1/2021 Li
10,930,865 B2 2/2021 Li
10,937,976 B2 3/2021 Li
10,944,064 B2 3/2021 Li
10,964,897 B2 3/2021 Li
10,991,897 B2 4/2021 Li
10,995,108 B2 5/2021 Li
11,011,712 B2 5/2021 Li
11,063,228 B2 7/2021 Li
11,101,435 B2 8/2021 Li
11,114,626 B2 9/2021 Li
11,121,328 B2 9/2021 Li
11,145,830 B2 10/2021 Li
2001/0019782 A1 9/2001 Tatsuya
2002/0068190 A1 6/2002 Tsuboyama
2003/0062519 A1 4/2003 Yamazaki
2003/0180574 A1 9/2003 Huang
2003/0186077 A1 10/2003 Chen
2004/0230061 A1 11/2004 Seo
2005/0037232 A1 2/2005 Tyan
2005/0139810 A1 6/2005 Kuehl
2005/0170207 A1 8/2005 Ma
2005/0260446 A1 11/2005 Mackenzie
2006/0024522 A1 2/2006 Thompson
2006/0032528 A1 2/2006 Wang
2006/0066228 A1 3/2006 Antoniadis

(56) References Cited

U.S. PATENT DOCUMENTS

2006/0073359 A1 4/2006 Ise
2006/0094875 A1 5/2006 Itoh
2006/0127696 A1 6/2006 Stossel
2006/0182992 A1 8/2006 Nii
2006/0202197 A1 9/2006 Nakayama
2006/0210831 A1 9/2006 Sano
2006/0255721 A1 11/2006 Igarashi
2006/0263635 A1 11/2006 Ise
2006/0286406 A1 12/2006 Igarashi
2007/0057630 A1 3/2007 Nishita
2007/0059551 A1 3/2007 Yamazaki
2007/0082284 A1 4/2007 Stoessel
2007/0103060 A1 5/2007 Hisanori
2007/0160905 A1 7/2007 Morishita
2007/0252140 A1 11/2007 Limmert
2008/0001530 A1 1/2008 Ise
2008/0036373 A1 2/2008 Hisanori
2008/0054799 A1 3/2008 Satou
2008/0079358 A1 4/2008 Satou
2008/0102310 A1 5/2008 Thompson
2008/0111476 A1 5/2008 Choi
2008/0241518 A1 10/2008 Satou
2008/0241589 A1 10/2008 Fukunaga
2008/0269491 A1 10/2008 Jabbour
2008/0315187 A1 12/2008 Bazan
2009/0026936 A1 1/2009 Satou
2009/0026939 A1 1/2009 Kinoshita
2009/0032989 A1 2/2009 Karim
2009/0039768 A1 2/2009 Igarashi
2009/0079340 A1 3/2009 Kinoshita
2009/0126796 A1 5/2009 Yang
2009/0128008 A1 5/2009 Ise
2009/0136779 A1 5/2009 Cheng
2009/0153045 A1 6/2009 Kinoshita
2009/0167157 A1 7/2009 Murakami
2009/0167167 A1 7/2009 Aoyama
2009/0205713 A1 8/2009 Mitra
2009/0218561 A1 9/2009 Kitamura
2009/0261721 A1 10/2009 Murakami
2009/0267500 A1 10/2009 Kinoshita
2010/0000606 A1 1/2010 Thompson
2010/0013386 A1 1/2010 Thompson
2010/0043876 A1 2/2010 Tuttle
2010/0093119 A1 4/2010 Shimizu
2010/0127246 A1 5/2010 Nakayama
2010/0141127 A1 6/2010 Xia
2010/0147386 A1 6/2010 Benson-Smith
2010/0171111 A1 7/2010 Takada
2010/0171418 A1 7/2010 Kinoshita
2010/0200051 A1 8/2010 Triani
2010/0204467 A1 8/2010 Lamarque
2010/0270540 A1 10/2010 Chung
2010/0288362 A1 11/2010 Hatwar
2010/0297522 A1 11/2010 Creeth
2010/0301315 A1* 12/2010 Masui .................. H10K 85/346
257/40
2010/0307594 A1 12/2010 Zhu
2011/0028723 A1 2/2011 Li
2011/0049496 A1 3/2011 Fukuzaki
2011/0062858 A1 3/2011 Yersin
2011/0132440 A1 6/2011 Sivarajan
2011/0217544 A1 9/2011 Young
2011/0227058 A1 9/2011 Masui
2011/0301351 A1 12/2011 Li
2012/0024383 A1 2/2012 Kaiho
2012/0025588 A1 2/2012 Humbert
2012/0039323 A1 2/2012 Hirano
2012/0095232 A1 4/2012 Li
2012/0108806 A1 5/2012 Li
2012/0146012 A1 6/2012 Limmert
2012/0181528 A1 7/2012 Takada
2012/0199823 A1 8/2012 Molt
2012/0202997 A1 8/2012 Parham
2012/0204960 A1 8/2012 Kato
2012/0215001 A1 8/2012 Li
2012/0223634 A1 9/2012 Xia
2012/0264938 A1 10/2012 Li
2012/0273736 A1 11/2012 James
2012/0302753 A1 11/2012 Li
2013/0048963 A1 2/2013 Beers
2013/0082245 A1 4/2013 Kottas
2013/0137870 A1 5/2013 Li
2013/0168656 A1 7/2013 Tsai
2013/0172561 A1 7/2013 Tsai
2013/0200340 A1 8/2013 Otsu
2013/0203996 A1 8/2013 Li
2013/0237706 A1 9/2013 Li
2013/0341600 A1 12/2013 Lin
2014/0014922 A1 1/2014 Lin
2014/0014931 A1* 1/2014 Riegel .................... H10K 71/00
438/46
2014/0027733 A1 1/2014 Zeng
2014/0042475 A1 2/2014 Park
2014/0066628 A1 3/2014 Li
2014/0073798 A1 3/2014 Li
2014/0084261 A1 3/2014 Brooks
2014/0114072 A1 4/2014 Li
2014/0147996 A1 5/2014 Vogt
2014/0148594 A1 5/2014 Li
2014/0191206 A1 7/2014 Cho
2014/0203248 A1 7/2014 Zhou
2014/0249310 A1 9/2014 Li
2014/0326960 A1 11/2014 Kim
2014/0330019 A1 11/2014 Li
2014/0364605 A1 12/2014 Li
2014/0374728 A1* 12/2014 Adamovich ......... H10K 50/121
257/40
2015/0008419 A1 1/2015 Li
2015/0018558 A1 1/2015 Li
2015/0028323 A1 1/2015 Xia
2015/0060804 A1 3/2015 Kanitz
2015/0069334 A1 3/2015 Xia
2015/0105556 A1 4/2015 Li
2015/0123047 A1 5/2015 Maltenberger
2015/0162552 A1 6/2015 Li
2015/0194616 A1 7/2015 Li
2015/0207086 A1 7/2015 Li
2015/0228914 A1 8/2015 Li
2015/0274762 A1 10/2015 Li
2015/0287938 A1 10/2015 Li
2015/0311456 A1 10/2015 Li
2015/0318500 A1 11/2015 Li
2015/0349279 A1 12/2015 Li
2015/0380666 A1 12/2015 Szigethy
2016/0028028 A1 1/2016 Li
2016/0028029 A1 1/2016 Li
2016/0043331 A1 2/2016 Li
2016/0072082 A1 3/2016 Brooks
2016/0130225 A1 5/2016 Tasaki
2016/0133861 A1 5/2016 Li
2016/0133862 A1 5/2016 Li
2016/0181529 A1 6/2016 Tsai
2016/0194344 A1 7/2016 Li
2016/0197285 A1 7/2016 Zeng
2016/0197291 A1 7/2016 Li
2016/0204358 A1* 7/2016 Stoessel ............... C07D 471/08
252/500
2016/0285015 A1 9/2016 Li
2016/0359120 A1 12/2016 Li
2016/0359125 A1 12/2016 Li
2017/0005278 A1 1/2017 Li
2017/0012224 A1 1/2017 Li
2017/0040555 A1 2/2017 Li
2017/0047533 A1 2/2017 Li
2017/0066792 A1 3/2017 Li
2017/0069855 A1 3/2017 Li
2017/0077420 A1 3/2017 Li
2017/0125708 A1 5/2017 Li
2017/0267923 A1 9/2017 Li
2017/0271611 A1* 9/2017 Li ........................ H10K 50/121
2017/0301871 A1* 10/2017 Li ........................ H10K 30/865
2017/0305881 A1 10/2017 Li
2017/0309943 A1 10/2017 Angell
2017/0331056 A1 11/2017 Li

(56) References Cited

U.S. PATENT DOCUMENTS

| | | | | |
|---|---|---|---|---|
| 2017/0342098 | A1 | 11/2017 | Li | |
| 2017/0373260 | A1 | 12/2017 | Li | |
| 2018/0006246 | A1 | 1/2018 | Li | |
| 2018/0013096 | A1 | 1/2018 | Hamada | |
| 2018/0037812 | A1* | 2/2018 | Pegington | H10K 85/111 |
| 2018/0052366 | A1 | 2/2018 | Hao | |
| 2018/0053904 | A1 | 2/2018 | Li | |
| 2018/0062084 | A1* | 3/2018 | Watabe | H10K 85/654 |
| 2018/0130960 | A1* | 5/2018 | Li | C07F 15/006 |
| 2018/0138428 | A1 | 5/2018 | Li | |
| 2018/0148464 | A1 | 5/2018 | Li | |
| 2018/0159051 | A1 | 6/2018 | Li | |
| 2018/0166655 | A1 | 6/2018 | Li | |
| 2018/0175329 | A1 | 6/2018 | Li | |
| 2018/0194790 | A1 | 7/2018 | Li | |
| 2018/0198081 | A1 | 7/2018 | Zeng | |
| 2018/0219161 | A1 | 8/2018 | Li | |
| 2018/0226592 | A1 | 8/2018 | Li | |
| 2018/0226593 | A1 | 8/2018 | Li | |
| 2018/0230173 | A1 | 8/2018 | Ji | |
| 2018/0277777 | A1 | 9/2018 | Li | |
| 2018/0301641 | A1 | 10/2018 | Li | |
| 2018/0312750 | A1 | 11/2018 | Li | |
| 2018/0331307 | A1 | 11/2018 | Li | |
| 2018/0334459 | A1 | 11/2018 | Li | |
| 2018/0337345 | A1 | 11/2018 | Li | |
| 2018/0337349 | A1 | 11/2018 | Li | |
| 2018/0337350 | A1 | 11/2018 | Li | |
| 2018/0353771 | A1 | 12/2018 | Kim | |
| 2019/0013485 | A1 | 1/2019 | Li | |
| 2019/0058137 | A1 | 2/2019 | Ko | |
| 2019/0067602 | A1 | 2/2019 | Li | |
| 2019/0109288 | A1 | 4/2019 | Li | |
| 2019/0119312 | A1 | 4/2019 | Chen | |
| 2019/0157352 | A1 | 5/2019 | Li | |
| 2019/0194536 | A1 | 6/2019 | Li | |
| 2019/0221757 | A1* | 7/2019 | Tarran | H10K 50/11 |
| 2019/0259963 | A1 | 8/2019 | Li | |
| 2019/0276485 | A1* | 9/2019 | Li | H10K 85/346 |
| 2019/0312217 | A1 | 10/2019 | Li | |
| 2019/0367546 | A1 | 12/2019 | Li | |
| 2019/0389893 | A1 | 12/2019 | Li | |
| 2020/0006678 | A1 | 1/2020 | Li | |
| 2020/0055885 | A1* | 2/2020 | Tarran | C07F 15/0033 |
| 2020/0071330 | A1 | 3/2020 | Li | |
| 2020/0075868 | A1 | 3/2020 | Li | |
| 2020/0119288 | A1 | 4/2020 | Li | |
| 2020/0119289 | A1 | 4/2020 | Lin | |
| 2020/0140471 | A1 | 5/2020 | Chen | |
| 2020/0152891 | A1 | 5/2020 | Li | |
| 2020/0168798 | A1 | 5/2020 | Han | |
| 2020/0227656 | A1 | 7/2020 | Li | |
| 2020/0227660 | A1 | 7/2020 | Li | |
| 2020/0239505 | A1 | 7/2020 | Li | |
| 2020/0243776 | A1 | 7/2020 | Li | |
| 2020/0287153 | A1 | 9/2020 | Li | |
| 2020/0332185 | A1 | 10/2020 | Li | |
| 2020/0373505 | A1 | 11/2020 | Li | |
| 2020/0403167 | A1 | 12/2020 | Li | |
| 2021/0024526 | A1 | 1/2021 | Li | |
| 2021/0024559 | A1 | 1/2021 | Li | |
| 2021/0047296 | A1 | 2/2021 | Li | |
| 2021/0091316 | A1 | 3/2021 | Li | |
| 2021/0095195 | A1* | 4/2021 | Ma | C09K 11/025 |
| 2021/0104687 | A1 | 4/2021 | Li | |
| 2021/0111355 | A1 | 4/2021 | Li | |
| 2021/0126208 | A1 | 4/2021 | Li | |
| 2021/0193936 | A1 | 6/2021 | Li | |
| 2021/0193947 | A1 | 6/2021 | Li | |
| 2021/0217973 | A1 | 7/2021 | Li | |
| 2021/0230198 | A1 | 7/2021 | Li | |
| 2021/0261589 | A1 | 8/2021 | Li | |
| 2021/0273182 | A1 | 9/2021 | Li | |
| 2021/0292351 | A1 | 9/2021 | Macinnis | |

FOREIGN PATENT DOCUMENTS

| | | | |
|---|---|---|---|
| CN | 1894267 | | 1/2007 |
| CN | 1894269 | A | 1/2007 |
| CN | 101142223 | A | 3/2008 |
| CN | 101667626 | | 3/2010 |
| CN | 102449108 | A | 5/2012 |
| CN | 102892860 | A | 1/2013 |
| CN | 102971396 | A | 3/2013 |
| CN | 103102372 | | 5/2013 |
| CN | 104232076 | A | 12/2014 |
| CN | 104377231 | | 2/2015 |
| CN | 104576934 | | 4/2015 |
| CN | 104693243 | A | 6/2015 |
| CN | 105367605 | A | 3/2016 |
| CN | 105418591 | A | 3/2016 |
| CN | 106783922 | | 5/2017 |
| EP | 1617493 | | 1/2006 |
| EP | 1808052 | A1 | 7/2007 |
| EP | 1874893 | A1 | 1/2008 |
| EP | 1874894 | A1 | 1/2008 |
| EP | 1919928 | A1 | 5/2008 |
| EP | 1968131 | | 9/2008 |
| EP | 2020694 | | 2/2009 |
| EP | 2036907 | A1 | 3/2009 |
| EP | 2096690 | | 9/2009 |
| EP | 2112213 | A2 | 10/2009 |
| EP | 2417217 | A2 | 2/2012 |
| EP | 2684932 | | 1/2014 |
| EP | 2711999 | A2 | 3/2014 |
| EP | 3032293 | | 6/2016 |
| JP | 2002010505 | | 1/2002 |
| JP | 2002105055 | | 4/2002 |
| JP | 2003342284 | | 12/2003 |
| JP | 2005031073 | | 2/2005 |
| JP | 2005267557 | | 9/2005 |
| JP | 2005310733 | A | 11/2005 |
| JP | 2006047240 | A | 2/2006 |
| JP | 2006232784 | A | 9/2006 |
| JP | 2006242080 | | 9/2006 |
| JP | 2006242081 | A | 9/2006 |
| JP | 2006256999 | A | 9/2006 |
| JP | 2006257238 | A | 9/2006 |
| JP | 2006261623 | A | 9/2006 |
| JP | 2006290988 | A | 10/2006 |
| JP | 2006313796 | A | 11/2006 |
| JP | 2006332622 | A | 12/2006 |
| JP | 2006351638 | A | 12/2006 |
| JP | 2007019462 | A | 1/2007 |
| JP | 2007031678 | | 2/2007 |
| JP | 2007042875 | A | 2/2007 |
| JP | 2007051243 | A | 3/2007 |
| JP | 2007053132 | A | 3/2007 |
| JP | 2007066581 | | 3/2007 |
| JP | 2007073620 | A | 3/2007 |
| JP | 2007073845 | A | 3/2007 |
| JP | 2007073900 | A | 3/2007 |
| JP | 2007080593 | | 3/2007 |
| JP | 2007080677 | A | 3/2007 |
| JP | 2007088105 | | 4/2007 |
| JP | 2007088164 | A | 4/2007 |
| JP | 2007096259 | A | 4/2007 |
| JP | 2007099765 | A | 4/2007 |
| JP | 2007110067 | | 4/2007 |
| JP | 2007110102 | A | 4/2007 |
| JP | 2007519614 | | 7/2007 |
| JP | 2007258550 | A | 10/2007 |
| JP | 2007324309 | A | 12/2007 |
| JP | 2008010353 | A | 1/2008 |
| JP | 2008091860 | A | 4/2008 |
| JP | 2008103535 | A | 5/2008 |
| JP | 2008108617 | A | 5/2008 |
| JP | 2008109085 | | 5/2008 |
| JP | 2008109103 | A | 5/2008 |
| JP | 2008116343 | A | 5/2008 |
| JP | 2008117545 | A | 5/2008 |
| JP | 2008160087 | A | 7/2008 |
| JP | 2008198801 | A | 8/2008 |
| JP | 2008270729 | A | 11/2008 |

(56) References Cited

FOREIGN PATENT DOCUMENTS

| | | |
|---|---|---|
| JP | 2008270736 | 11/2008 |
| JP | 2008310220 A | 12/2008 |
| JP | 2009016184 A | 1/2009 |
| JP | 2009016579 | 1/2009 |
| JP | 2009032977 A | 2/2009 |
| JP | 2009032988 A | 2/2009 |
| JP | 2009059997 | 3/2009 |
| JP | 2009076509 | 4/2009 |
| JP | 2009161524 A | 7/2009 |
| JP | 2009247171 | 10/2009 |
| JP | 2009266943 A | 11/2009 |
| JP | 2009267171 A | 11/2009 |
| JP | 2009267244 A | 11/2009 |
| JP | 2009272339 A | 11/2009 |
| JP | 2009283891 A | 12/2009 |
| JP | 4460952 | 5/2010 |
| JP | 2010135689 A | 6/2010 |
| JP | 2010171205 A | 8/2010 |
| JP | 2011071452 A | 4/2011 |
| JP | 2012074444 A | 4/2012 |
| JP | 2012079895 A | 4/2012 |
| JP | 2012079898 A | 4/2012 |
| JP | 5604505 | 9/2012 |
| JP | 2012522843 | 9/2012 |
| JP | 2012207231 A | 10/2012 |
| JP | 2012222255 A | 11/2012 |
| JP | 2012231135 A | 11/2012 |
| JP | 2013023500 A | 2/2013 |
| JP | 2013048256 A | 3/2013 |
| JP | 2013053149 A | 3/2013 |
| JP | 2013525436 | 6/2013 |
| JP | 2014019701 A | 2/2014 |
| JP | 2014058504 A | 4/2014 |
| JP | 2014520096 | 8/2014 |
| JP | 2012709899 | 11/2014 |
| JP | 2014221807 A | 11/2014 |
| JP | 2014239225 A | 12/2014 |
| JP | 2015081257 A | 4/2015 |
| KR | 20060011537 | 2/2006 |
| KR | 20060015371 | 2/2006 |
| KR | 20060115371 | 11/2006 |
| KR | 20070061830 | 6/2007 |
| KR | 20070112465 | 11/2007 |
| KR | 20130043460 A | 4/2013 |
| KR | 101338250 | 12/2013 |
| KR | 20140052501 | 5/2014 |
| TW | 200701835 | 1/2007 |
| TW | 201249851 | 12/2012 |
| TW | 201307365 A | 2/2013 |
| TW | 201710277 | 3/2017 |
| WO | 2000070655 | 11/2000 |
| WO | 2004003108 | 1/2004 |
| WO | 2004070655 | 8/2004 |
| WO | 2004085450 | 10/2004 |
| WO | 2004108857 | 12/2004 |
| WO | 2005042444 A2 | 5/2005 |
| WO | 2005042550 A1 | 5/2005 |
| WO | 2005113704 | 12/2005 |
| WO | 2006033440 A1 | 3/2006 |
| WO | 2006067074 | 6/2006 |
| WO | 2006081780 | 8/2006 |
| WO | 2006098505 A1 | 9/2006 |
| WO | 2006113106 | 10/2006 |
| WO | 2006115299 A1 | 11/2006 |
| WO | 2006115301 | 11/2006 |
| WO | 2007034985 A1 | 3/2007 |
| WO | 2007069498 A1 | 6/2007 |
| WO | 2008054578 | 5/2008 |
| WO | 2008066192 A1 | 6/2008 |
| WO | 2008066195 A1 | 6/2008 |
| WO | 2008066196 A1 | 6/2008 |
| WO | 2008101842 A1 | 8/2008 |
| WO | 2008117889 | 10/2008 |
| WO | 2008123540 | 10/2008 |
| WO | 2008131932 A1 | 11/2008 |
| WO | 2009003455 | 1/2009 |
| WO | 2009008277 | 1/2009 |
| WO | 2009011327 | 1/2009 |
| WO | 2009017211 A1 | 2/2009 |
| WO | 2009023667 | 2/2009 |
| WO | 2009086209 | 7/2009 |
| WO | 2009111299 | 9/2009 |
| WO | 2010007098 A1 | 1/2010 |
| WO | 2010056669 | 5/2010 |
| WO | 2010093176 | 8/2010 |
| WO | 2010105141 | 9/2010 |
| WO | 2010118026 A2 | 10/2010 |
| WO | 2011064335 A1 | 6/2011 |
| WO | 2011070989 A1 | 6/2011 |
| WO | 2011089163 | 7/2011 |
| WO | 2011137429 A2 | 11/2011 |
| WO | 2011137431 A2 | 11/2011 |
| WO | 2012074909 | 6/2012 |
| WO | 2012112853 A1 | 8/2012 |
| WO | 2012116231 | 8/2012 |
| WO | 2012142387 | 10/2012 |
| WO | 2012162488 A1 | 11/2012 |
| WO | 2012163471 A1 | 12/2012 |
| WO | 2013130483 A1 | 9/2013 |
| WO | 2014009310 | 1/2014 |
| WO | 2014016611 | 1/2014 |
| WO | 2014031977 | 2/2014 |
| WO | 2014047616 | 3/2014 |
| WO | 2014047616 A1 | 3/2014 |
| WO | 2014109814 | 7/2014 |
| WO | 2014208271 | 12/2014 |
| WO | 2015027060 A1 | 2/2015 |
| WO | 2015131158 | 9/2015 |
| WO | 2016025921 A1 | 2/2016 |
| WO | 2016029137 | 2/2016 |
| WO | 2016029186 | 2/2016 |
| WO | 2016088354 A1 | 6/2016 |
| WO | 2016197019 | 12/2016 |
| WO | 2017117935 | 7/2017 |
| WO | 2018071697 | 4/2018 |
| WO | 2018140765 | 8/2018 |
| WO | 2019079505 | 4/2019 |
| WO | 2019079508 | 4/2019 |
| WO | 2019079509 | 4/2019 |
| WO | 2019236541 | 12/2019 |
| WO | 2020018476 | 1/2020 |

OTHER PUBLICATIONS

Peet et al. (2007). "Efficiency enhancement in low-bandgap polymer solar cells by processing with alkane dithiols," Nature Materials, 6, 497-500.

Pivrikas et al. (2008). "Substituting the postproduction treatment for bulk-heterojunction solar cells using chemical additives," Organic Electronics, 9, 775-82.

Pui Keong Chow et al., "Strongly Phosphorescent Palladium(II) Complexes of Tetradentate Ligands with Mixed Oxygen, Carbon, and Nitrogen Donor Atoms: Photophysics, Photochemistry, and Applications," Angew. Chem. Int. Ed. 2013, 52, 11775-11779.

Pui-Keong Chow et al., "Highly luminescent palladium(II) complexes with sub-millisecond blue to green phosphorescent excited states. Photocatalysis and highly efficient PSF-OLEDs," Chem. Sci., 2016, 7, 6083-6098.

Results from SciFinder Compound Search on Dec. 8, 2016. (17 pages).

Rui Zhu et al., "Color tuning based on a six-membered chelated iridium (III) complex with aza-aromatic ligand," Chemistry Letters, vol. 34, No. 12, 2005, pp. 1668-1669.

Russell J. Holmes et al., "Blue and Near-UV Phosphorescence from Iridium Complexes with Cyclometalated Pyrazolyl or N-Heterocyclic Carbene Ligands," Inorganic Chemistry, 2005, vol. 44, No. 22, pp. 7995-8003.

S. Lamansky et al., "Synthesis and Characterization of Phosphorescent Cyclometalated Iridium Complexes", Inorg. Chem., vol. 40, pp. 1704-1711, 2001.

(56) References Cited

OTHER PUBLICATIONS

Sajoto, T. et al., "Temperature Dependence of Blue Phosphorescent Cyclometalated Ir(III) Complexes", Journal of the American Chemical Society, Jun. 2009, vol. 131, No. 28, pp. 9813-9822 <DOI: 10.1021/ja903317w>.
Sakai, Y. et al., "Simple model-free estimation of orientation order parameters of vacuum-deposited and spin-coated amorphous films used in organic light-emitting diodes", Applied Physics Express, Aug. 2015, vol. 8, No. 9, pp. 096601-1-096601-4 <DOI:10.7567/APEX.8.096601>.
Saricifci et al. (1993). "Semiconducting polymerbuckminsterfullerene heterojunctions: diodes photodiodes, and photovoltaic cells," Appl. Phys. Lett., 62, 585-87.
Satake et al., "Interconvertible Cationic and Neutral Pyridinylimidazole η3-Allylpalladium Complexes. Structural Assignment by 1H, 13C, and 15N NMR and X-ray Diffraction", Organometallics, vol. 18, No. 24, 1999, pp. 5108-5111.
Saunders et al. (2008). "Nanoparticle-polymer photovoltaic cells," Advances in Colloid and Interface Science, 138, 1-23.
Senes, A. et al., "Transition dipole moment orientation in films of solution processed fluorescent oligomers: Investigating the influence of molecular anisotropy", Journal of Materials Chemistry C, Jun. 2016, vol. 4, No. 26, pp. 6302-6308 <DOI:10.1039/c5tc03481g>.
Shih-Chun Lo et al. "High-Triplet-Energy Dendrons: Enhancing the Luminescence of Deep Blue Phosphorescent Indium(III) Complexes" J. Am. Chem. Soc., vol. 131, 2009, pp. 16681-16688.
Shin et al. (2010). "Abrupt morphology change upon thermal annealing in Poly(3-hexathiophene)/soluble fullerene blend films for polymer solar cells," Adv. Funct. Mater., 20, 748-54.
Shiro Koseki et al., "Spin-orbit coupling analyses of the geometrical effects on phosphorescence in Ir(ppy)3 and its derivatives", J. Phys. Chem. C, vol. 117, pp. 5314-5327 (2013).
Shizuo Tokito et al. "Confinement of triplet energy on phosphorescent molecules for highly-efficient organic blue-light-emitting devices" Applied Physics Letters, vol. 83, No. 3, Jul. 21, 2003, pp. 569-571.
Stefan Bernhard, "The First Six Years: A Report," Department of Chemistry, Princeton University, May 2008, 11 pages.
Stephen R. Forrest, "The path to ubiquitous and low-cost organic electronic appliances on plastic," Nature, vol. 428, Apr. 29, 2004, pp. 911-918.
Steven C. F. Kui et al., "Robust phosphorescent platinum(II) complexes with tetradentate ONCN ligands: high efficiency OLEDs with excellent efficiency stability," Chem. Commun., 2013, vol. 49, pp. 1497-1499.
Steven C. F. Kui et al., "Robust Phosphorescent Platinum(II) Complexes Containing Tetradentate ONCN Ligands: Excimeric Excited State and Application in Organic White-Light-Emitting Diodes," Chem. Eur. J., 2013, vol. 19, pp. 69-73.
Strouse, G. et al., "Optical Spectroscopy of Single Crystal [Re(bpy)(CO)4](PF6): Mixing between Charge Transfer and Ligand Centered Excited States", Inorganic Chemistry, Oct. 1995, vol. 34, No. 22, pp. 5578-5587 <DOI:10.1021/ic00126a031>.
Supporting Information: Xiao-Chun Hang et al., "Highly Efficient Blue-Emitting Cyclometalated Platinum(II) Complexes by Judicious Molecular Design," Wiley-VCH 2013, 7 pages.
Sylvia Bettington et al. "Tris-Cyclometalated Iridium(III) Complexes of Carbazole(fluorenyl)pyridine Ligands: Synthesis, Redox and Photophysical Properties, and Electrophosphorescent Light-Emitting Diodes" Chemistry: A European Journal, 2007, vol. 13, pp. 1423-1431.
Tang, C. et al., "Organic electroluminescent diodes", Applied Physics Letters, Jul. 1987, vol. 51, No. 12, pp. 913-915 <DOI: 10.1063/1.98799>.
Tsuoboyama, A. et al., "Homoleptic Cyclometalated Iridium Complexes with Highly Efficient Red Phosphorescence and Application to Organic Light-Emitting Diode", Journal of the American Chemical Society, Sep. 2003, vol. 125, No. 42, pp. 12971-12979 <DOI: 10.1021/ja034732d>.
Turro, N., "Modern Molecular Photochemistry" (Sausalito, California, University Science Books, 1991), p. 48. (3 pages).
Tyler Fleetham et al., "Efficient "pure" blue OLEDs employing tetradentate Pt complexes with a narrow spectral bandwidth," Advanced Materials (Weinheim, Germany), Vo. 26, No. 41, 2014, pp. 7116-7121.
Tyler Fleetham et al., "Efficient Red-Emitting Platinum Complex with Long Operational Stability," ACS Appl. Mater. Interfaces 2015, 7, 16240-16246.
Tyler Fleetham, "Phosphorescent Pt(II) and Pd(II) Complexes for Efficient, High-Color-Quality, and Stable OLEDs", 52 pages, Material Science and Engineering, Arizona State University (Year: 2016).
V. Adamovich et al., "High efficiency single dopant white electrophosphorescent light emitting diodes", New J. Chem, vol. 26, pp. 1171-1178. 2002.
V. Thamilarasan et al., "Green-emitting phosphorescent iridium(III) complex: Structural, photophysical and electrochemical properties," Inorganica Chimica Acta, vol. 408, 2013, pp. 240-245.
Vanessa Wood et al., "Colloidal quantum dot light-emitting devices," Nano Reviews 1, Jul. 2010, pp. 5202. (7 pages).
Vezzu, D. et al.: Highly luminescent tridentate platinum (II) complexes featured in fused five-six-membered metallacycle and diminishing concentration quenching. Inorganic Chem., vfol. 50 (17), pp. 8261-8273, 2011.
Wang et al. (2010). "The development of nanoscale morphology in polymer: fullerene photovoltaic blends during solvent casting," Soft Matter, 6, 4128-4134.
Wang et al., C(aryl)-C(alkyl) bond formation from Cu(Cl04)2-mediated oxidative cross coupling reaction between arenes and alkyllithium reagents through structurally well-defined Ar—Cu(III) intermediates, Chem Commun, 48: 9418-9420 (2012).
Williams et al., "Organic light-emitting diodes having exclusive near-infrared electrophosphorescence", Applied Physics Letters, vol. 89, pp. 083506 (3 pages), 2006.
Williams, E. et al., "Excimer-Based White Phosphorescent Organic Light-Emitting Diodes with Nearly 100 % Internal Quantum Efficiency", Advanced Materials, Jan. 2007, vol. 19, No. 2, pp. 197-202 <DOI: 10.1002/adma.200602174>.
Wong. Challenges in organometallic research—Great opportunity for solar cells and OLEDs. Journal of Organometallic Chemistry 2009, vol. 694, pp. 2644-2647.
Written Opinion mailed on Aug. 17, 2012 for Intl. Pat. App. No. PCT/US2012/039323 filed May 24, 2012 and published as WO 2012/162488 on Nov. 29, 2012 (Applicants—Arizona Board of Regents Acting for and on Behalf of Arizona State University; Inventors—Li et al.; (6 pages).
Xiao-Chu Hang et al., "Highly Efficient Blue-Emitting Cyclometalated Platinum(II) Complexes by Judicious Molecular Design," Angewandte Chemie, International Edition, vol. 52, Issue 26, Jun. 24, 2013, pp. 6753-6756.
Xiaofan Ren et al., "Ultrahigh Energy Gap Hosts in Deep Blue Organic Electrophosphorescent Devices," Chem. Mater., vol. 16, 2004, pp. 4743-4747.
Xin Li et al., "Density functional theory study of photophysical properties of iridium (III) complexes with phenylisoquinoline and phenylpyridine ligands", The Journal of Physical Chemistry C, 2011, vol. 115, No. 42, pp. 20722-20731.
Yakubov, L.A. et al., Synthesis and Properties of Zinc Complexes of mesoHexadecyloxy-Substituted Tetrabenzoporphyrin and Tetrabenzoazaporphyrins, Russian Journal of Organic Chemistry, 2008, vol. 44, No. 5, pp. 755-760.
Yang et al. (2005). "Nanoscale morphology of high-performance polymer solar cells," Nano Lett., 5, 579-83.
Yang, X. et al., "Efficient Blue- and White-Emitting Electrophosphorescent Devices Based on Platinum(II) [1,3-Difluoro-4,6-di(2-pyridinyl)benzene] Chloride", Advanced Materials, Jun. 2008, vol. 20, No. 12, pp. 2405-2409 <DOI:10.1002/adma.200702940>.
Yao et al. (2008). "Effect of solvent mixture on nanoscale phase separation in polymer solar cells," Adv. Funct. Mater., 18, 1783-89.

(56) References Cited

OTHER PUBLICATIONS

Yao et al., Cu(Cl04)2-Mediated Arene C—H Bond Halogenations of Azacalixaromatics Using Alkali Metal Halides as Halogen Sources, The Journal of Organic Chemistry, 77(7): 3336-3340 (2012).
Ying Yang et al., "Induction of Circularly Polarized Electroluminescence from an Achiral Light-Emitting Polymer via a Chiral Small-Molecule Dopant," Advanced Materials, vol. 25, Issue 18, May 14, 2013, pp. 2624-2628.
Yu et al. (1995). "Polymer Photovoltaic Cells: Enhanced efficiencies via a network of internal donor-acceptor heterojunctions," Science, 270, 1789-91.
Z Liu et al., "Green and blue-green phosphorescent heteroleptic iridium complexes containing carbazole-functionalized beta-diketonate for non-doped organic light-emitting diodes", Organic Electronics 9 (2008) pp. 171-182.
Z. Xu et al., "Synthesis and properties of iridium complexes based 1,3,4-oxadiazoles derivatives", Tetrahedron 64 (2008) pp. 1860-1867.
Zhi-Qiang Zhu et al., "Efficient Cyclometalated Platinum(II) Complex with Superior Operational Stability," Adv. Mater. 29 (2017) 1605002, pp. 1-5.
Zhi-Qiang Zhu et.al., "Harvesting All Electrogenerated Excitons through Metal Assisted Delayed Fluorescent Materials," Adv. Mater. 27 (2015) 2533-2537.
Zhu, W. et al., "Highly efficient electrophosphorescent devices based on conjugated polymers doped with iridium complexes", Applied Physics Letters, Mar. 2002, vol. 80, No. 12, pp. 2045-2047 <DOI: 10.1063/1.1461418>.
The claim set of the U.S. Appl. No. 62/444,973, filed Jan. 11, 2017, Lichang Zeng, 36 pages. (Year: 2017).
Adachi, C. et al., "High-efficiency organic electrophosphorescent devices with tris(2-phenylpyridine)iridium doped into electron-transporting materials", Applied Physics Letters, Aug. 2000, vol. 77, No. 6, pp. 904-906 <DOI:10.1063/1.1306639>.
Ayan Maity et al., "Room-temperature synthesis of cyclometalated iridium(III) complexes; kinetic isomers and reactive functionalities" Chem. Sci., vol. 4, pp. 1175-1181 (2013).
Baldo et al., "Very High-Efficiency Green Organic Light-Emitting Devices Based on Electrophosphorescence", Appl Phys Lett, 75(3):4-6 (1999).
Baldo et al., "Highly Efficient Phosphorescent Emission from Organic Electroluminescent Devices," Nature, vol. 395, Sep. 10, 1998, pp. 151-154.
Baldo, M. et al., "Excitonic singlet-triplet ratio in a semiconducting organic thin film", Physical Review B, Nov. 1999, vol. 60, No. 20, pp. 14422-14428 <DOI: 10.1103/PhysRevB.60.14422>.
Baldo, M. et al., "High-efficiency fluorescent organic light-emitting devices using a phosphorescent sensitizer", Nature, Feb. 2000, vol. 403, pp. 750-753.
Barry O'Brien et al.: White organic light emitting diodes using Pt-based red, green and blue phosphorescent dopants. Proc. SPIE, vol. 8829, pp. 1-6, Aug. 25, 2013.
Barry O'Brien et al., "High efficiency white organic light emitting diodes employing blue and red platinum emitters," Journal of Photonics for Energy, vol. 4, 2014, pp. 043597-1-8.
Berson et al. (2007). "Poly(3-hexylthiophene) fibers for photovoltaic applications," Adv. Funct. Mat., 17, 1377-84.
Bouman et al. (1994). "Chiroptical properties of regioregular chiral polythiophenes," Mol. Cryst. Liq. Cryst., 256, 439-48.
Brian W. D'Andrade et al., "Controlling Exciton Diffusion in Multilayer White Phosphorescent Organic Light Emitting Devices", Adv. Mater., vol. 14, No. 2, Jan. 16, 2002, pp. 147-151.
Bronner; "Dipyrrin based luminescent cyclometallated palladium and platinum complexes", Dalton Trans., 2010, 39, 180-184. DOI: 10.1039/b908424j (Year: 2010) (5 pages).
Brooks, J. et al., "Synthesis and Characterization of Phosphorescent Cyclometalated Platinum Complexes", Inorganic Chemistry, May 2002, vol. 41, No. 12, pp. 3055-3066 <DOI:10.1021/ic0255508>.
Brown, A. et al., "Optical spectroscopy of triplet excitons and charged excitations in poly(p-phenylenevinylene) light-emitting diodes", Chemical Physics Letters, Jul. 1993, vol. 210, No. 1-3, pp. 61-66 <DOI:10.1016/0009-2614(93) 89100-V>.
Burroughes, J. et al., "Light-emitting diodes based on conjugated polymers", Nature, Oct. 1990, vol. 347, pp. 539-541.
Campbell et al. (2008). "Low-temperature control of nanoscale morphology for high performance polymer photovoltaics," Nano Lett., 8, 3942-47.
Chen, F. et al., "High-performance polymer light-emitting diodes doped with a red phosphorescent iridium complex", Applied Physics Letters, Apr. 2002 [available online Mar. 2002], vol. 80, No. 13, pp. 2308-2310 10.1063/1.1462862>.
Chen, X., et al., "Fluorescent Chemosensors Based on Spiroring-Opening of Xanthenes and Related Derivatives", Chemical Reviews, 2012 [available online Oct. 2011], vol. 112, No. 3, pp. 1910-1956 <DOI:10.1021/cr200201z>.
Chew, S. et al: Photoluminescence and electroluminescence of a new blue-emitting homoleptic iridium complex. Applied Phys. Letters; vol. 88, pp. 093510-1-093510-3, 2006.
Chi et al.; Transition-metal phosphors with cyclometalating ligands: fundamentals and applications, Chemical Society Reviews, vol. 39, No. 2, Feb. 2010, pp. 638-655.
Chi-Ming Che et al. "Photophysical Properties and OLEO Applications of Phosphorescent Platinum(II) Schiff Base Complexes," Chem. Eur. J., vol. 16, 2010, pp. 233-247.
Christoph Ulbricht et al., "Synthesis and Characterization of Oxetane-Functionalized Phosphorescent Ir(III)-Complexes", Macromol. Chem. Phys. 2009, 210, pp. 531-541.
Coakley et al. (2004). "Conjugated polymer photovoltaic cells," Chem. Mater., 16, 4533-4542.
Colombo, M. et al., "Synthesis and high-resolution optical spectroscopy of bis[2-(2-thienyl)pyridinato-C3, N'](2,2'-bipyridine)iridium(III)", Inorganic Chemistry, Jul. 1993, vol. 32, No. 14, pp. 3081-3087 <DOI:10.1021/ic00066a019>.
Corrected Notice of Allowance dated Feb. 23, 2021 for U.S. Appl. No. 15/905,385 (pp. 1-3).
D.F. O'Brien et al., "Improved energy transfer in electrophosphorescent devices," Appl. Phys. Lett., vol. 74, No. 3, Jan. 18, 1999, pp. 442-444.
D'Andrade, B. et al., "Operational stability of electrophosphorescent devices containing p and n doped transport layers ", Applied Physics Letters, Nov. 2003, vol. 83, No. 19, pp. 3858-3860 <DOI:10.1063/1.1624473>.
Dan Wang et al., "Carbazole and arylamine functionalized iridium complexes for efficient electro-phosphorescent light-emitting diodes", Inorganica Chimica Acta 370 (2011) pp. 340-345.
Dileep A. K. Vezzu et al., "Highly Luminescent Tetradentate Bis-Cyclometalated Platinum Complexes: Design, Synthesis, Structure, Photophysics, and Electroluminescence Application," Inorg. Chem., vol. 49, 2010, pp. 5107-5119.
Dorwald, Side Reactions in Organic Synthesis 2005, Wiley:VCH Weinheim Preface, pp. 1-15 & Chapter 1, pp. 279-308.
Dorwald; "Side Reactions in Organic Synthesis: A Guide to Successful Synthesis Design," Chapter 1, 2005 Wiley-VCH Verlag Gmbh & Co. KGaA, Wienheim, 32 pages.
Dsouza, R., et al., "Fluorescent Dyes and Their Supramolecular Host/Guest Complexes with Macrocycles in Aqueous Solution", Oct. 2011, vol. 111, No. 12, pp. 7941-7980 <DOI: 10.1021/cr200213s>.
Eric Turner et al., "Cyclometalated Platinum Complexes with Luminescent Quantum Yields Approaching 100%," Inorg. Chem., 2013, vol. 52, pp. 7344-7351.
Evan L. Williams et al., "Excimer-Based White Phosphorescent Organic Light Emitting Diodes with Nearly 100% Internal Quantum Efficiency," Adv. Mater., vol. 19, 2007, pp. 197-202.
Finikova, M.A. et al., New Selective Synthesis of Substituted Tetrabenzoporphyris, Doklady Chemistry, 2003, vol. 391, No. 4-6, pp. 222-224.
Fuchs, C. et al., "Enhanced light emission from top-emitting organic light-emitting diodes by optimizing surface plasmon polariton losses", arXiv, submitted Mar. 2015, 11 pages, arXiv:1503.01309.
Fuchs, C. et al., "Enhanced light emission from top-emitting organic light-emitting diodes by optimizing surface plasmon polariton losses",

(56) References Cited

OTHER PUBLICATIONS

Physical Review B, Dec. 2015, vol. 92, No. 24, pp. 245306-1-245306-10 <DOI: 10.1103/PhysRevB.92.245306>.
Galanin et al. Synthesis and Properties of meso-Phenyl-Substituted Tetrabenzoazaporphines Magnesium Complexes. Russian Journal of Organic Chemistry (Translation of Zhurnal Organicheskoi Khimii) (2002), 38(8), 1200-1203.
Galanin et al., meso-Phenyltetrabenzoazaporphyrins and their zinc complexes. Synthesis and spectral properties, Russian Journal of General Chemistry (2005), 75(4), 651-655.
Gather, M. et al., "Recent advances in light outcoupling from white organic light-emitting diodes," Journal of Photonics for Energy, May 2015, vol. 5, No. 1, 057607-1-057607-20 <DOI:10.1117/1.JPE.5.057607>.
Glauco Ponterini et al., "Comparison of Radiationless Decay Processes in Osmium and Platinum Porphyrins," J. Am. Chem. Soc., vol. 105, No. 14, 1983, pp. 4639-4645.
Gong et al., Highly Selective Complexation of Metal Ions by the Self-Tuning Tetraazacalixpyridine macrocycles, Tetrahedron, 65(1): 87-92 (2009).
Gottumukkala, V. et al., Synthesis, cellular uptake and animal toxicity of a tetra carboranylphenyl N-tetrabenzoporphyr in, Bioorganic & Medicinal Chemistry, 2006, vol. 14, pp. 1871-1879.
Graf, A. et al., "Correlating the transition dipole moment orientation of phosphorescent emitter molecules in OLEDs with basic material properties", Journal of Materials Chemistry C, Oct. 2014, vol. 2, No. 48, pp. 10298-10304 <DOI: 10.1039/c4tc00997e>.
Guijie Li et al., "Efficient and stable red organic light emitting devices from a tetradentate cyclometalated platinum complex," Organic Electronics, 2014, vol. 15 pp. 1862-1867.
Guijie Li et al., "Modifying Emission Spectral Bandwidth of Phosphorescent Platinum(II) Complexes Through Synthetic Control," Inorg. Chem. 2017, 56, 8244-8256.
Guijie Li et al., Efficient and Stable White Organic Light-Emitting Diodes Employing a Single Emitter, Adv. Mater., 2014, vol. 26, pp. 2931-2936.
Hansen (1969). "The universality of the solubility parameter," I & EC Product Research and Development, 8, 2-11.
Hatakeyama, T. et al., "Ultrapure Blue Thermally Activated Delayed Fluorescence Molecules: Effi cient Homo-Lumo Separation by the Multiple Resonance Effect", Advanced Materials, Apr. 2016, vol. 28, No. 14, pp. 2777-2781, <DOI:10.1002/adma.201505491>.
Dong Ryun Lee et al. "Emitting Materials for Thermally Activated Delayed Fluorescent Organic Light-Emitting Diodes Using Benzofurocarbazole and Benzothienocarbazole as Donor Moieties" SID 2015 Digest, vol. 46, p. 502-504 (Year: 2015).
Hirohiko Fukagawa et al., "Highly Efficient and Stable Red Phosphorescent Organic Light-Emitting Diodes Using Platinum Complexes," Adv. Mater., 2012, vol. 24, pp. 5099-5103.
Hoe-Joo Seo et al., "Blue phosphorescent iridium(III) complexes containing carbazole-functionalized phenyl pyridine for organic light-emitting diodes: energy transfer from carbazolyl moieties to iridium(III) cores", RSC Advances, 2011, 1, pp. 755-757.
Holmes, R. et al., "Efficient, deep-blue organic electrophosphorescence by guest charge trapping", Applied Physics Letters, Nov. 2003 [available online Oct. 2003], vol. 83, No. 18, pp. 3818-3820 <DOI:10.1063/1.1624639>.
Huaijun Tang et al., "Novel yellow phosphorescent iridium complexes containing a carbazoleeoxadiazole unit used in polymeric light-emitting diodes", Dyes and Pigments 91 (2011) pp. 413-421.
Imre et al (1996). "Liquid-liquid demixing ffrom solutions of polystyrene. 1. A review. 2. Improved correlation with solvent properties," J. Phys. Chem. Ref. Data, 25, 637-61.
International Preliminary Report on Patentability issued on Nov. 26, 2013 for Intl. Pat. App. No. PCT/US2012/039323 filed May 24, 2012 and published as WO 2012/162488 on Nov. 29, 2012 (Applicants—Arizona Board of Regents Acting for and on Behalf of Arizona State University; Inventors—Li et al.; (7 pages).
Ivaylo Ivanov et al., "Comparison of the INDO band structures of polyacetylene, polythiophene, polyfuran, and polypyrrole," Synthetic Metals, vol. 116, Issues 1-3, Jan. 1, 2001, pp. 111-114.
Jack W. Levell et al., "Carbazole/iridium dendrimer side-chain phosphorescent copolymers for efficient light emitting devices", New J. Chem., 2012, vol. 36, pp. 407-413.
Jan Kalinowski et al., "Light-emitting devices based on organometallic platinum complexes as emitters," Coordination Chemistry Reviews, vol. 255, 2011, pp. 2401-2425.
Jeong et al. (2010). "Improved efficiency of bulk heterojunction poly (3-hexylthiophene):[6,6]-phenyl-C61-butyric acid methyl ester photovoltaic devices using discotic liquid crystal additives," Appl. Phys. Lett.. 96, 183305. (3 pages).
Jeonghun Kwak et al., "Bright and Efficient Full-Color Colloidal Quantum Dot Light-Emitting Diodes Using an Inverted Device Structure," Nano Letters 12, Apr. 2, 2012, pp. 2362-2366.
Ji Hyun Seo et al., "Efficient blue-green organic light-emitting diodes based on heteroleptic tris-cyclometalated iridium (III) complexes". Thin Solid Films, vol. 517, pp. 1807-1810 (2009).
JP2009267244, English Translation from EPO, Nov. 2009, 80 pages.
JP2010135689, English translation from EPO, dated Jun. 2010, 95 pages.
JP4460952 machine translation downloaded from Google patents Dec. 30, 2022.
Kai Li et al., "Light-emitting platinum(II) complexes supported by tetradentate dianionic bis(N-heterocyclic carbene) ligands: towards robust blue electrophosphors," Chem. Sci., 2013, vol. 4, pp. 2630-2644.
Ke Feng et al., "Norbornene-Based Copolymers Containing Platinum Complexes and Bis(carbazolyl)benzene Groups in Their Side-Chains," Macromolecules, vol. 42, 2009, pp. 6855-6864.
Kim et al (2009). "Altering the thermodynamics of phase separation in inverted bulk-heterojunction organic solar cells," Adv. Mater., 21, 3110-15.
Kim et al. (2005). "Device annealing effect in organic solar cells with blends of regioregular poly (3-hexylthiophene) and soluble fullerene," Appl. Phys. Lett. 86, 063502. (3 pages).
Kim, HY et al., "Crystal Organic Light-Emitting Diodes with Perfectly Oriented Non-Doped Pt-Based Emitting Layer", Advanced Functional Materials, Feb. 2016, vol. 28, No. 13, pp. 2526-2532 <DOI:10.1002/adma.201504451>.
Kim, JJ., "Setting up the new efficiency limit of OLEDs; Abstract" [online], Electrical Engineering—Princeton University, Aug. 2014 [retrieved on Aug. 24, 2016], retrieved from the internet: <URL:http://ee.princeton.edu/events/setting-new-efficiency-limit-oled> 2 pages.
Kim, SY. et al., "Organic Light-Emitting Diodes with 30% External Quantum Efficiency Based on a Horizontally Oriented Emitter", Advanced Functional Materials, Mar. 2013, vol. 23, No. 31, pp. 3896-3900 <DOI:10.1002/adfm.201300104 >.
Korean Office Action (with English translation) for App. No. KR10-2015-0104260, dated Jan. 12, 2022, 12 pages.
Kroon et al. (2008). "Small bandgap olymers for organic solar cells," Polymer Reviews, 48, 531-82.
Kwon-Hyeon Kim et al., "Controlling Emitting Dipole Orientation with Methyl Substituents on Main Ligand of Iridium Complexes for Highly Efficient Phosphorescent Organic Light-Emitting Diodes", Adv. Optical Mater. 2015, 3, pp. 1191-1196.
Kwong, R. et al., "High operational stability of electrophosphorescent devices", Applied Physics Letters, Jul. 2002 [available online Jun. 2002], vol. 81, No. 1, pp. 162-164 <DOI:10.1063/1.1489503>.
Lamansky, S. et al., "Cyclometalated Ir complexes in polymer organic light-emitting devices", Journal of Applied Physics, Aug. 2002 [available online Jul. 2002], vol. 92, No. 3, pp. 1570-1575 <10.1063/1.1491587>.
Lampe, T. et al., "Dependence of Phosphorescent Emitter Orientation on Deposition Technique in Doped Organic Films", Chemistry of Materials, Jan. 2016, vol. 28, pp. 712-715 <DOI:10.1021/acs.chemmater.5b04607>.
Lee et al. (2008). "Processing additives for inproved efficiency from bulk heterojunction solar cells," J. Am. Chem. Soc, 130, 3619-23.

(56) References Cited

OTHER PUBLICATIONS

Li et al. (2005). "Investigation of annealing effects and film thickness dependence of polymer solar cells based on poly (3-hexylthiophene)," J. Appl. Phys., 98, 043704. (5 pages).

Li et al. (2007). "Solvent annealing effect in polymer solar cells based on poly(3-hexylthiophene) and methanofullerenes," Adv. Funct. Mater, 17, 1636-44.

Li, J. et al., "Synthesis and characterization of cyclometalated Ir(III) complexes with pyrazolyl ancillary ligands", Polyhedron, Jan. 2004, vol. 23, No. 2-3, pp. 419-428 <DOI:10.1016/j.poly.2003.11.028>.

Li, J., "Efficient and Stable OLEDs Employing Square Planar Metal Complexes and Inorganic Nanoparticles", in DOE SSL R&D Workshop (Raleigh, North Carolina, 2016), Feb. 2016, 15 pages.

Li, J., et al., "Synthetic Control of Excited-State Properties in Cyclometalated Ir(III) Complexes Using Ancillary Ligands", Inorganic Chemistry, Feb. 2005, vol. 44, No. 6, pp. 1713-1727 <DOI:10.1021/ic048599h>.

Liang, et al. (2010). "For the bright future-bulk heterojunction polymer solar cells with power conversion efficiency of 7.4%," Adv. Mater. 22, E135-38.

Lin, TA et al., " Sky-Blue Organic Light Emitting Diode with 37% External Quantum Efficiency Using Thermally Activated Delayed Fluorescence from Spiroacridine-Triazine Hybrid", Advanced Materials, Aug. 2016, vol. 28, No. 32, pp. 6876-6983 <DOI: 10.1002/adma.201601675>.

Machine-translated English version of JP 2012/074444 A, Sekine Noboru, Apr. 12, 2012 (Year: 2012) 75 pages.

Maestri et al., "Absorption Spectra and Luminescence Properties of Isomeric Platinum (II) and Palladium (II) Complexes Containing 1,1'-Biphenyldiyl, 2-Phenylpyridine, and 2,2'-Bipyridine as Ligands," Helvetica Chimica Acta, vol. 71, Issue 5, Aug. 10, 1988, pp. 1053-1059.

Marc Lepeltier et al., "Efficient blue green organic light-emitting devices based on a monofluorinated heteroleptic iridium(III) complex," Synthetic Metals, vol. 199, 2015, pp. 139-146.

Markham, J. et al., "High-efficiency green phosphorescence from spin-coated single-layer dendrimer light-emitting diodes ", Applied Physics Lettersm Apr. 2002, vol. 80, vol. 15, pp. 2645-2647 <DOI: 10.1063/1.1469218>.

Matthew J. Jurow et al., "Understanding and predicting the orientation of heteroleptic phosphors in organic light-emitting materials", Nature Materials, vol. 15, Jan. 2016, pp. 85-93.

Michl, J., "Relationship of bonding to electronic spectra", Accounts of Chemical Research, May 1990, vol. 23, No. 5, pp. 127-128 <DOI: 10.1021/ar00173a001>.

Miller, R. et al., "Polysilane high polymers", Chemical Reviews, Sep. 1989, vol. 89, No. 6, pp. 1359-1410 DOI:10.1021/cr00096a006>.

Morana et al. (2007). "Organic field-effect devices as tool to characterize the bipolar transport in polymer-fullerene blends: the case of P3HT-PCBM," Adv. Funct. Mat., 17, 3274-83.

Moule et al. (2008). "Controlling morphology in Polymer-Fullerene mixtures," Adv. Mater., 20, 240-45.

Murakami; JP 2007324309, English machine translation from EPO, dated Dec. 13, 2007, 89 pages.

Nazeeruddin, M. et al., "Highly Phosphorescence Iridium Complexes and Their Application in Organic Light-Emitting Devices", Journal of the American Chemical Society, Jun. 2003, vol. 125, No. 29, pp. 8790-8797 <DOI: 10.1021/ja021413y>.

Nicholas R. Evans et al., "Triplet Energy Back Transfer in Conjugated Polymers with Pendant Phosphorescent Iridium Complexes," J. Am. Chem. Soc., vol. 128, 2006, pp. 6647-6656.

Nillson et al. (2007). "Morphology and phase segregation of spin-casted films of polyfluorene/PCBM Blends," Macromolecules, 40, 8291-8301.

Official Action (and English Translation) issued by the Japanese Patent Office dated Mar. 11, 2015 for Pat. App. No. 2013-508082 filed May 2, 2011, 16 pages.

* cited by examiner

DISPLAY AND LIGHTING DEVICES COMPRISING PHOSPHORESCENT EXCIMERS WITH PREFERRED MOLECULAR ORIENTATION AS MONOCHROMATIC EMITTERS

CROSS-REFERENCE TO RELATED APPLICATION

This application is a continuation of U.S. application Ser. No. 16/756,219, filed Apr. 15, 2020, now allowed, which is a 35 U.S.C. § 371 National Stage Patent Application of International Patent Application No. PCT/US2018/056364, filed Oct. 17, 2018, which claims the benefit of U.S. Patent Application No. 62/573,639 filed Oct. 17, 2017, all of which applications are incorporated herein by reference in their entireties.

STATEMENT OF GOVERNMENT SUPPORT

This invention was made with government support under DE-EE0007090 awarded by the Department of Energy. The government has certain rights in the invention.

TECHNICAL FIELD

This invention relates to phosphorescent excimers with a preferred molecular orientation as monochromatic emitters for display and lighting applications.

BACKGROUND

FIG. 1 depicts a cross-sectional view of an OLED 100. OLED 100 includes anode 102, hole transporting layer (HTL) 104, emissive layer (EML) 106, electron transporting layer (ETL) 108, and metal cathode 110. Anode 102 is typically a transparent material, such as indium tin oxide, and may be formed on substrate 112. EML 106 may include an emitter and a host. Although phosphorescent emitters used in OLEDS such as OLED 100 can reach electron-to-photon conversion efficiency approaching 100%, much of the light emitted in these OLEDS remains trapped in the stratified thin film structure. FIG. 2 depicts four different pathways of photons (modes) in OLED 100, including plasmon mode 204, organic mode 206, and substrate mode 208, all of which represent trapping of photons in OLED 100, and air mode 210, which represents light emitted from OLED 100. Due at least in part to losses via plasmon mode 204, organic mode 206, and substrate mode 208, a maximum external quantum efficiency (EQE) of a typical OLED (e.g., 20-30%) is much less than that of a typical inorganic LED.

SUMMARY

In a general aspect, an organic light emitting diode has a substrate, a first electrode, a hole transporting layer proximate the first electrode, a second electrode, an electron transporting layer proximate the second electrode, and an emissive layer between the hole transporting layer and the electron transporting layer. The emissive layer includes a square planar tetradentate platinum or palladium complex, and excimers formed by two or more of the complexes are aligned such that emitting dipoles of the excimers are substantially parallel to a surface of the substrate.

Implementations of the general aspect may include one or more of the following features.

The first electrode may be formed on the surface of the substrate. The complex may include one of the square planar tetradentate platinum or palladium complexes represented by Formulas I-IX or any example thereof described herein. A concentration of the complex in the emissive layer is in a range of 5 wt % to 100 wt %. In some cases, the emissive layer includes a neat film of the complex. In certain cases, the emissive layer includes a doped film comprising a host material and the complex. A concentration of the complex in the doped film is typically in a range of 5 wt % to 25 wt %. The host material may include a carbazole-based host having one to three carbazole skeletons, such as those described herein. Examples of suitable carbazole-based hosts include tris-PCz (9,9',9"-triphenyl-9H,9'H,9"H-3,3':6'3"-tercarbazole), CBP (4,4-di(9H-carbazol-9-yl) biphenyl), mCBP (3,3-di(9H-carbazol-9-yl) biphenyl), and mCP (meta-di(carbazolyl) phenyl).

In some cases, the emissive layer includes one or more doped films including the complex, each doped film having a different concentration of the complex. In one example, the emissive layer has a first doped film including the complex and a second doped film including the complex. A concentration of the complex in the first doped film can be in a range of 15 wt % to 25 wt %, and a concentration of the complex in the second doped film can be in a range of 5 wt % to 15 wt %. The emissive layer may further have a third doped film including the complex. A concentration of the complex in the third doped film can be in a range of 5 wt % to 10 wt %.

The details of one or more implementations of the subject matter described in this specification are set forth in the accompanying drawings and the description below. Other features, aspects, and advantages of the subject matter will become apparent from the description, the drawings, and the claims.

DETAILED DESCRIPTION

Figure 1:
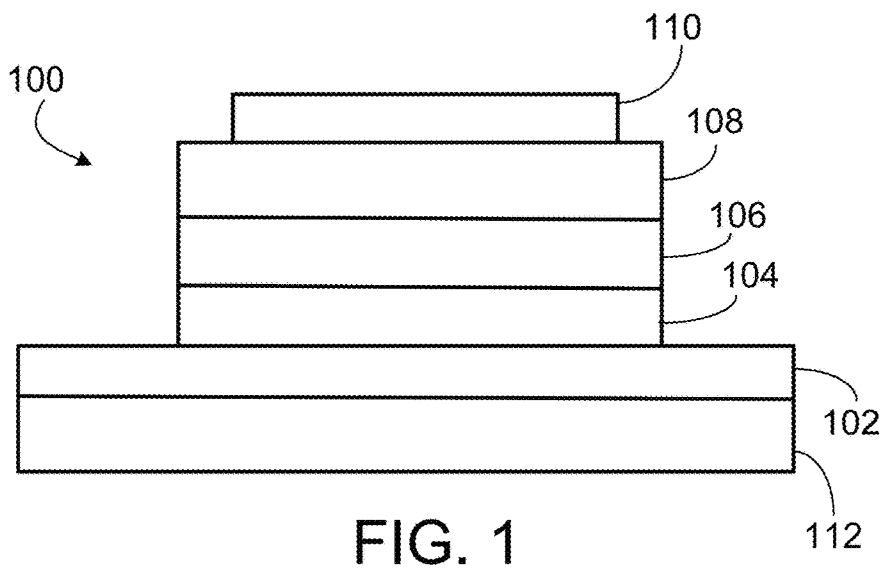
FIG. 1 depicts an organic light emitting diode (OLED).
Figure 2:
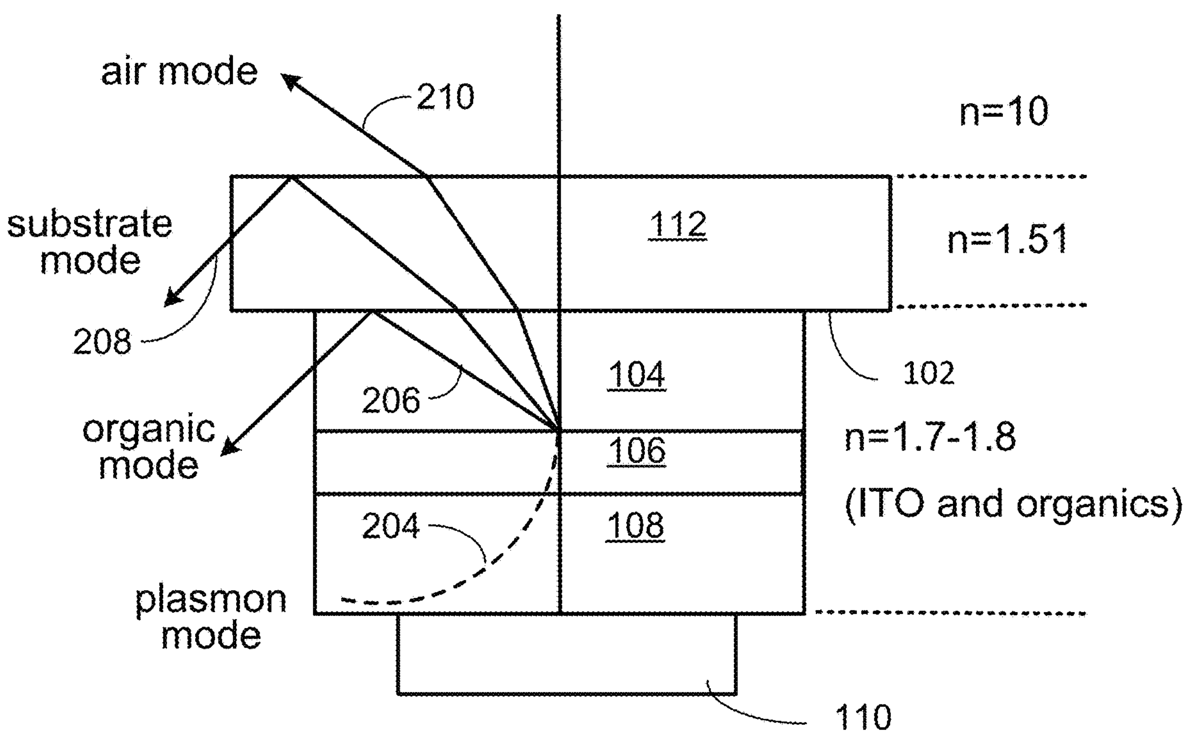
FIG. 2 depicts different pathways of photons in an OLED.
Figure 3:
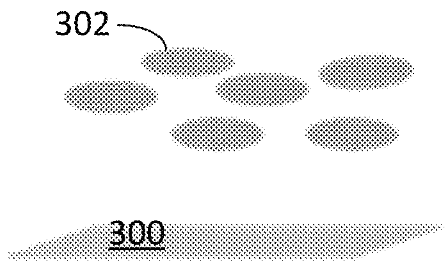
FIG. 3 depicts excimers aligned with emitting dipoles aligned with respect to a substrate.
Figure 4:
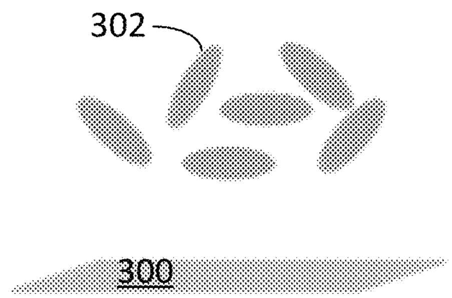
FIG. 4 depicts excimers with emitting dipoles randomly oriented with respect to a substrate.

Square planar tetradentate platinum and palladium complexes can have a high photoluminescent (PL) emission efficiency. Organic light emitting diodes (OLEDs) with excimers formed by these complexes can maintain this high efficiency when, as depicted in FIG. 3, emitting dipoles 300 of the excimers are aligned parallel to substrate 302 of the OLED. In contrast, as depicted in FIG. 4, with emitting dipoles 300 oriented randomly with respect to substrate 302, OLEDs with excimers formed by these complexes demonstrate lower efficiency.

Suitable square planar tetradentate platinum and palladium complexes include complexes represented by Formula I.

Formula I

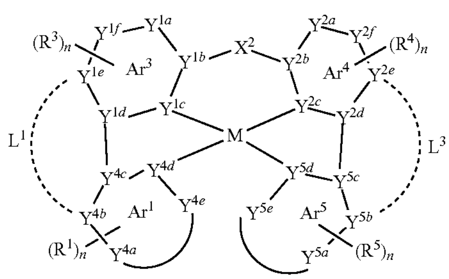

In Formula I:

M represents Pt(II) or Pd(II);

$R^1$, $R^3$, $R^4$, and $R^5$ each independently represents hydrogen, halogen, hydroxyl, nitro, cyanide, thiol, or optionally substituted $C_1$-$C_4$ alkyl, alkoxy, amino, or aryl;

each n is independently an integer, valency permitting;

$Y^{1a}$, $Y^{1b}$, $Y^{1c}$, $Y^{1d}$, $Y^{1e}$, $Y^{1f}$, $Y^{2a}$, $Y^{2b}$, $Y^{2c}$, $Y^{2d}$, $Y^{2e}$, $Y^{2f}$, $Y^{4a}$, $Y^{4b}$, $Y^{4c}$, $Y^{4d}$, $Y^{4e}$, $Y^{5a}$, $Y^{5b}$, $Y^{5c}$, $Y^{5d}$, and $Y^{5e}$ each independently represents C, N, Si, O, S;

$X^2$ represents NR, PR, CRR', SiRR', CRR', SiRR', O, S, S═O, O═S═O, Se, Se═O, or O═Se═O, where R and R' each independently represents hydrogen, halogen, hydroxyl, nitro, cyanide, thiol, or optionally substituted $C_1$-$C_4$ alkyl, alkoxy, amino, aryl, or heteroaryl;

each of $L^1$ and $L^3$ is independently present or absent, and if present, represents a substituted or unsubstituted linking atom or group, where a substituted linking atom is bonded to an alkyl, alkoxy, alkenyl, alkynyl, hydroxy, amine, amide, thiol, aryl, heteroaryl, cycloalkyl, or heterocyclyl moiety;

$Ar^3$ and $Ar^4$ each independently represents 6-membered aryl group; and $Ar^1$ and $Ar^5$ each independently represents a 5- to 10-membered aryl, heteroaryl, fused aryl, or fused heteroaryl.

Suitable square planar tetradentate platinum and palladium complexes also include Formulas II-IX.

Formula II

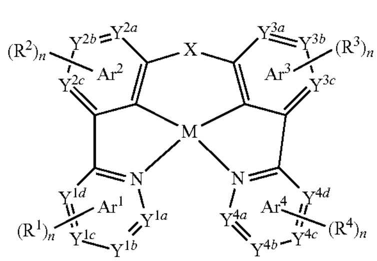

-continued

Formula III

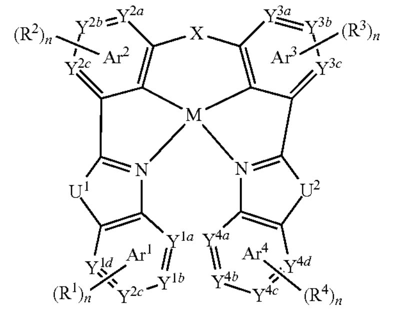

Formula IV

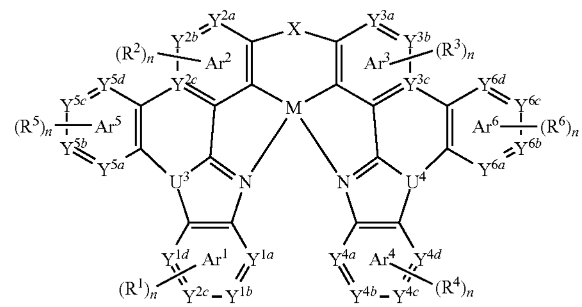

Formula V

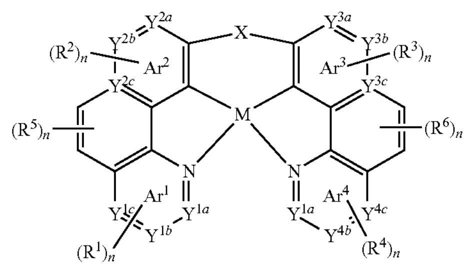

Formula VI

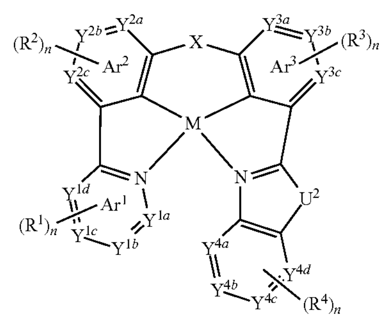

Formula VII

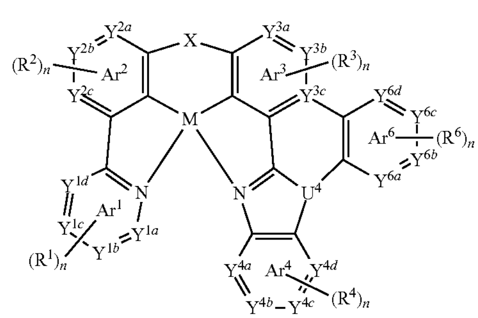

-continued

Formula VIII

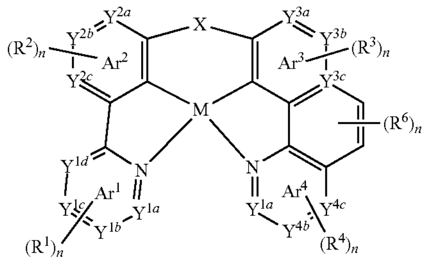

Formula IX

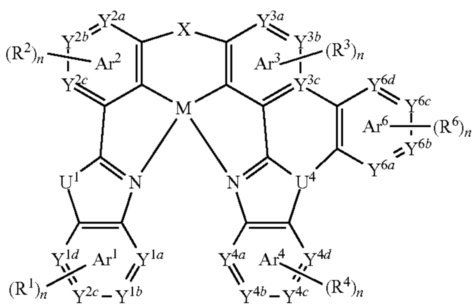

In Formulas II-IX:

M represents Pt(II) or Pd(II);

each $R^1$, $R^2$, $R^3$, $R^4$, $R^5$, and $R^6$ present independently represents hydrogen, halogen, hydroxyl, nitro, cyanide, thiol, or optionally substituted $C_1$-$C_4$ alkyl, alkoxy, amino, or aryl;

each n is independently an integer, valency permitting;

each $Y^{1a}$, $Y^{1b}$, $Y^{1c}$, $Y^{1d}$, $Y^{2a}$, $Y^{2b}$, $Y^{2c}$, $Y^{3a}$, $Y^{3b}$, $Y^{3c}$, $Y^{4a}$, $Y^{4b}$, $Y^{4c}$, $Y^{4d}$, $Y^{5a}$, $Y^{5b}$, $Y^{5c}$, $Y^{5d}$, $Y^{6a}$, $Y^{6b}$, $Y^{6c}$, and $Y^{6d}$ present independently represents C, N, or Si;

$U^1$ and $U^2$ each independently represents NR, O or S, wherein R represents hydrogen, halogen, hydroxyl, nitro, cyanide, thiol, or optionally substituted $C_1$-$C_4$ alkyl, alkoxy, amino, or aryl;

$U^3$ and $U^4$ each independently represents N or P; and

X represents O, S, NR, CRR', SiRR', PR, BR, S═O, O═S═O, Se, Se═O, or O═Se═O, where R and R' each independently represents hydrogen, halogen, hydroxyl, nitro, cyanide, thiol, or optionally substituted $C_1$-$C_4$ alkyl, alkoxy, amino, aryl, or heteroaryl.

Examples of complexes of Formula I are shown below.

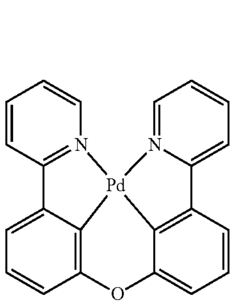

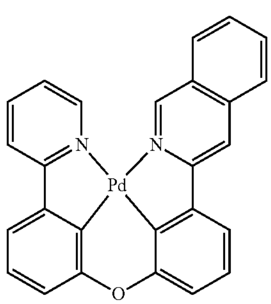

-continued

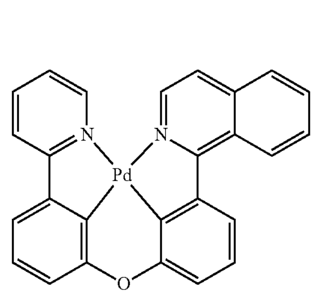

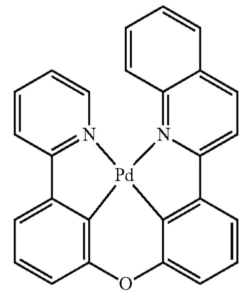

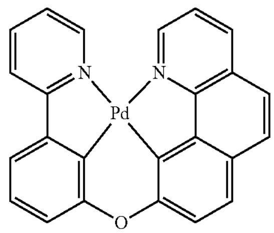

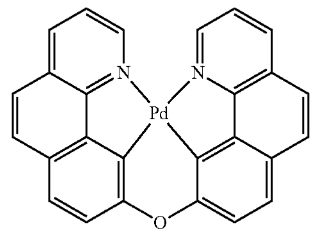

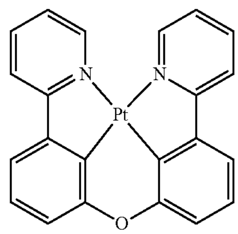

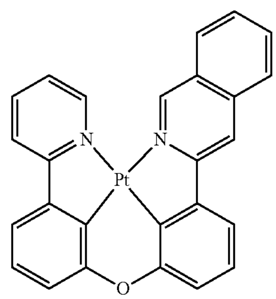

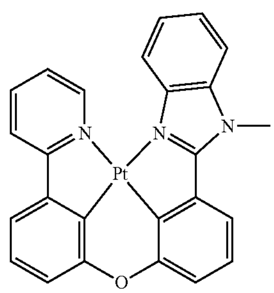

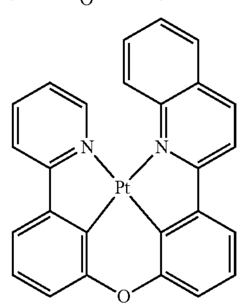

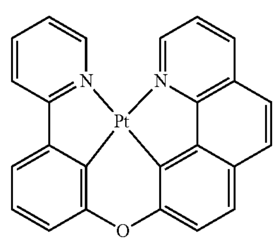

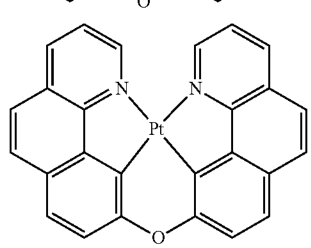

Examples of complexes of Formula II-IX are shown below, where M represents Pt(II) or Pd(II) and R and R' each independently represents substituted or unsubstituted $C_1$-$C_4$ alkyl, alkoxy, aryl, or heteroaryl.

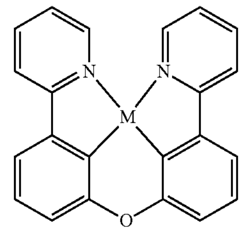
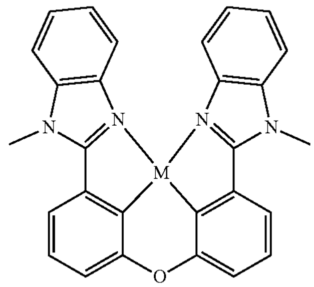
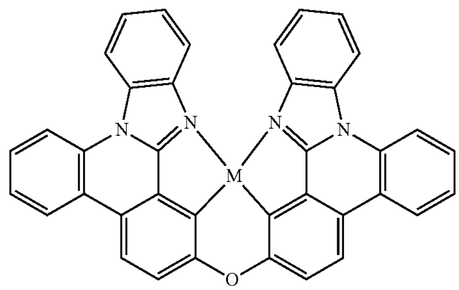
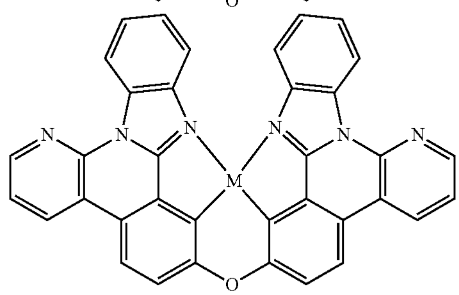
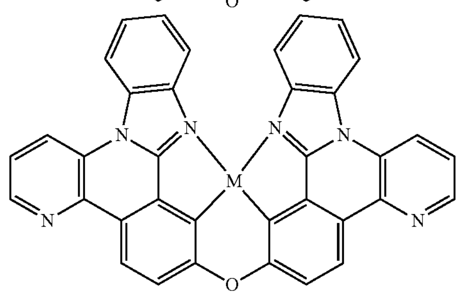
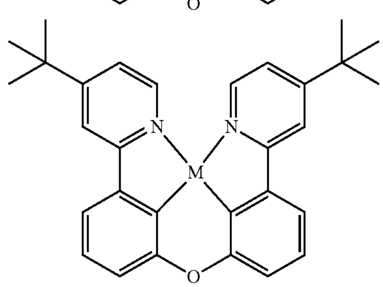
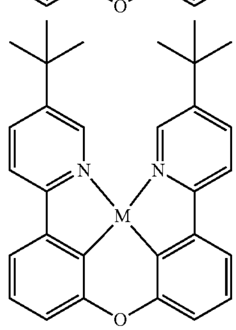
-continued
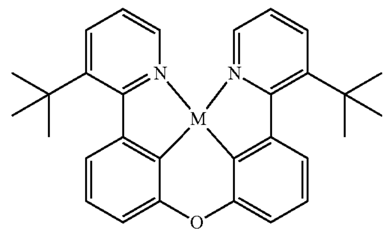
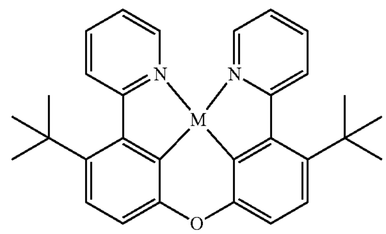
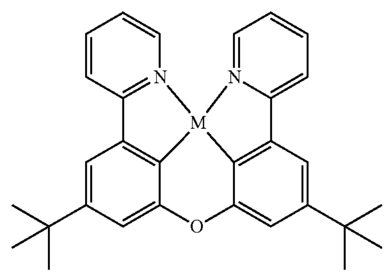
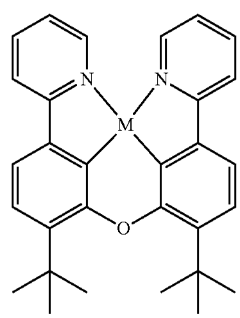
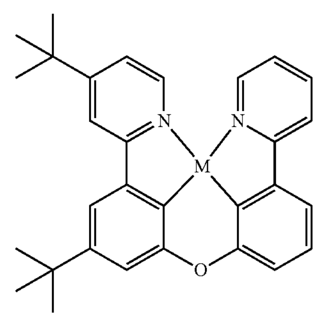
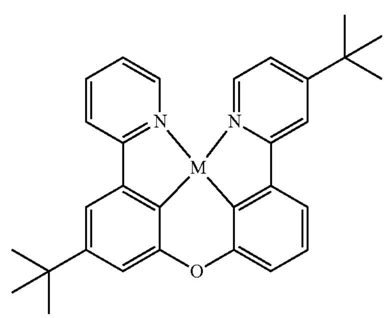
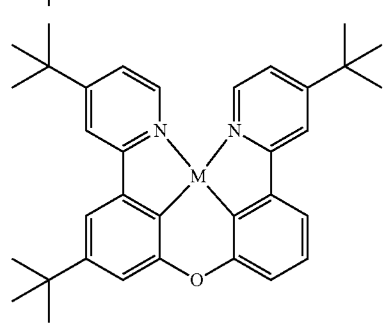

-continued
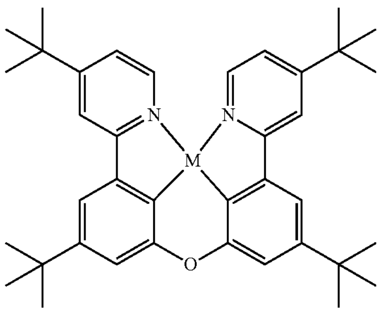
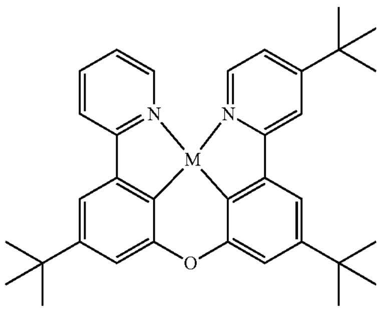
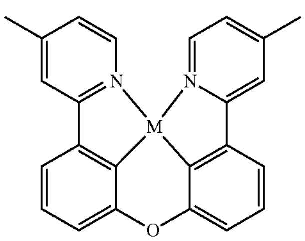
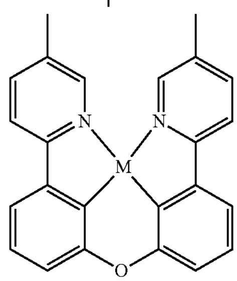
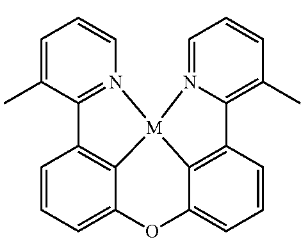
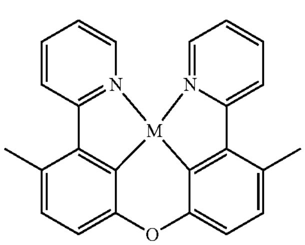
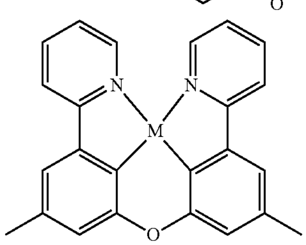
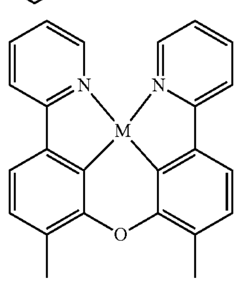
-continued
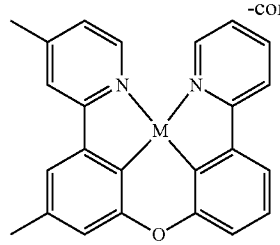
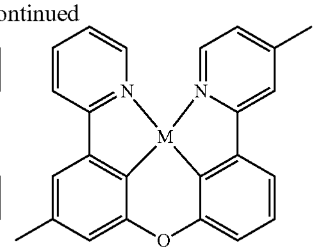
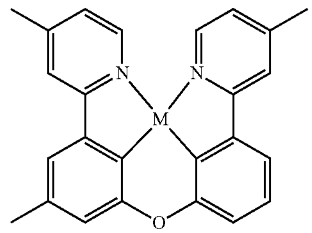
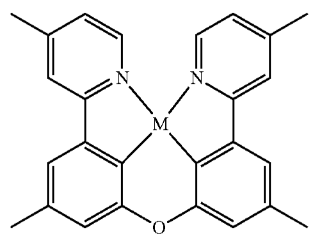
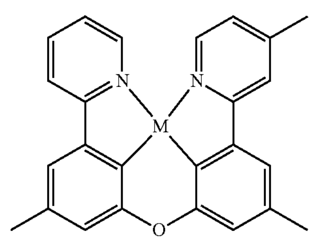
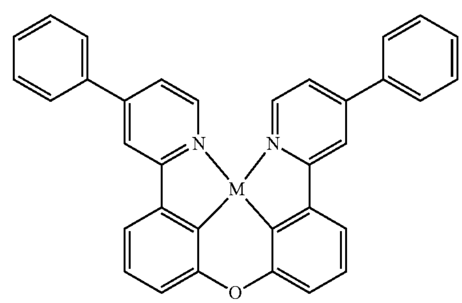
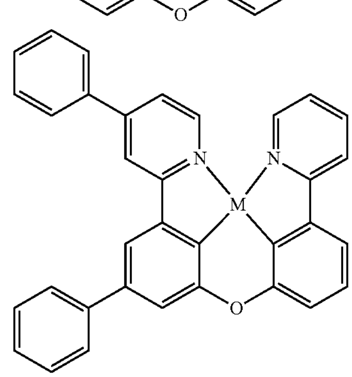

-continued
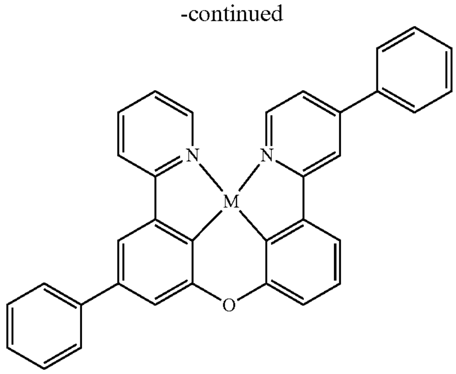
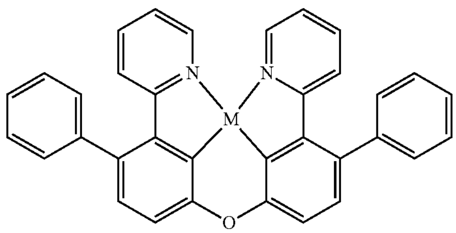
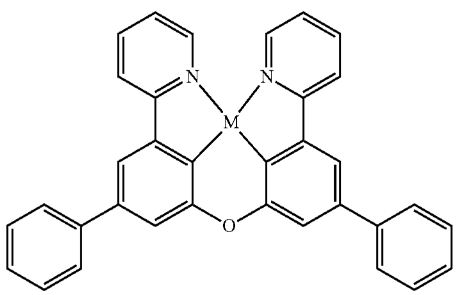
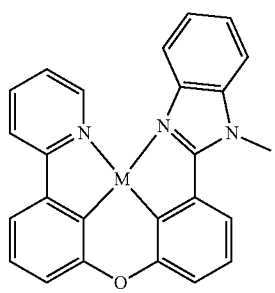
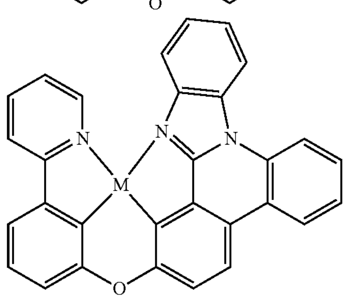
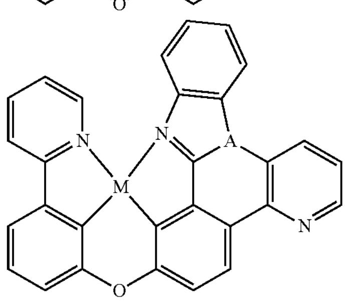
-continued
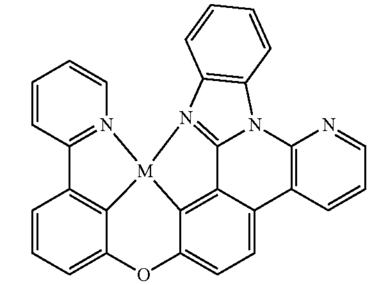
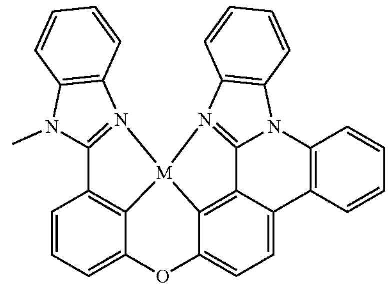
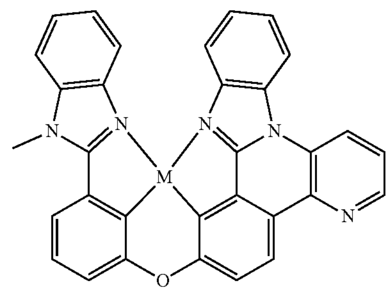
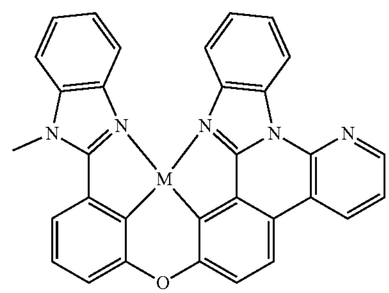
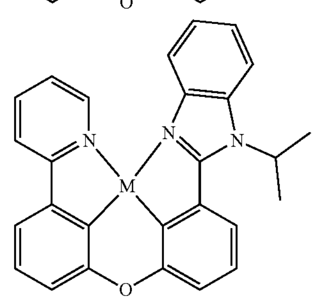
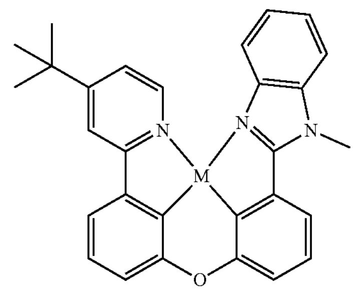

-continued
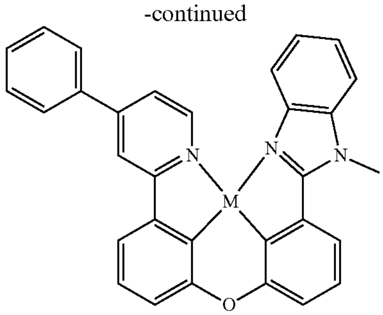
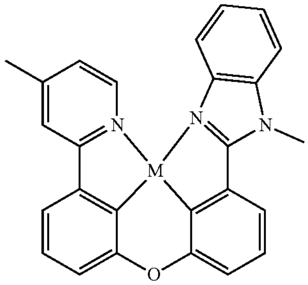
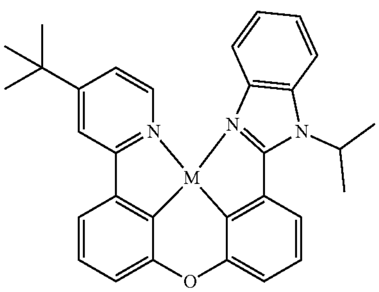
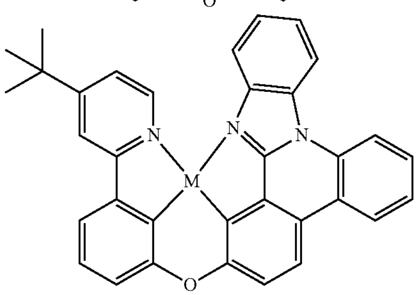
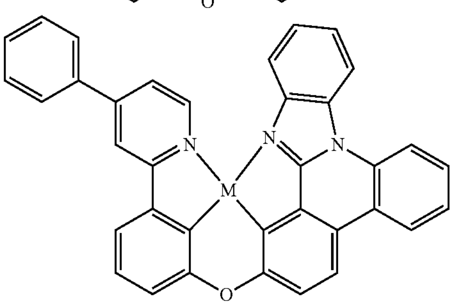
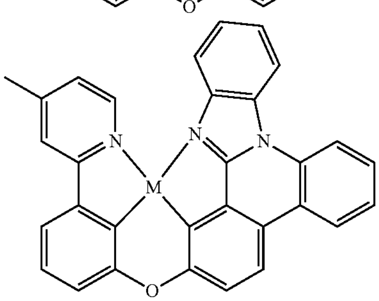
-continued
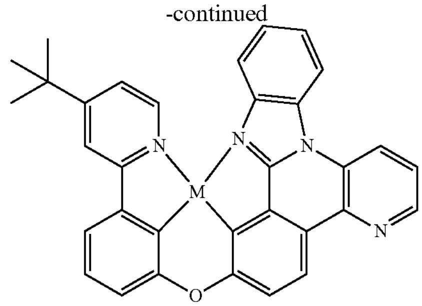
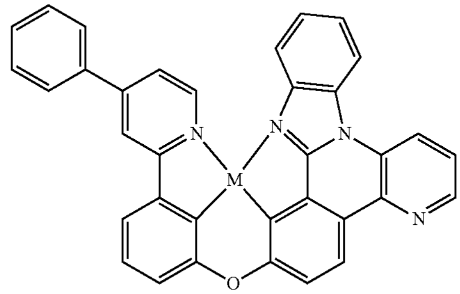
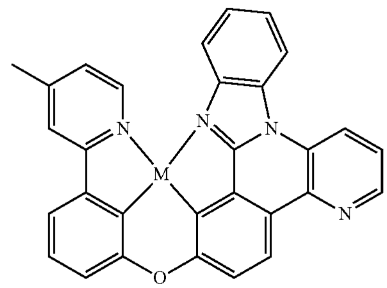
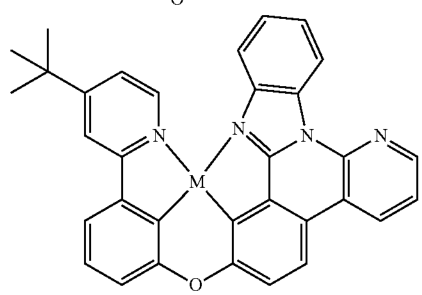
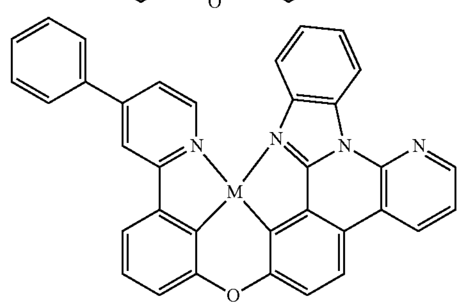
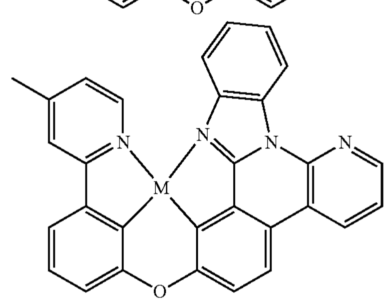

-continued
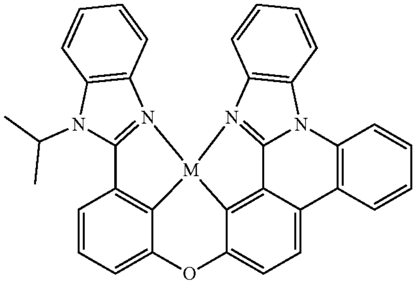
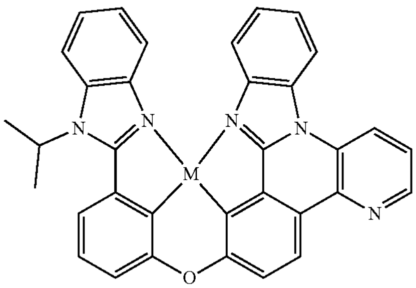
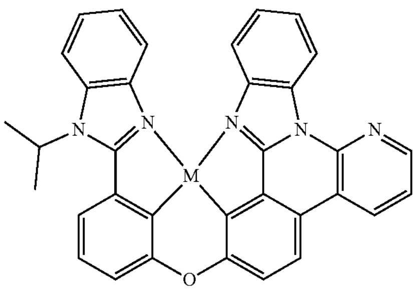
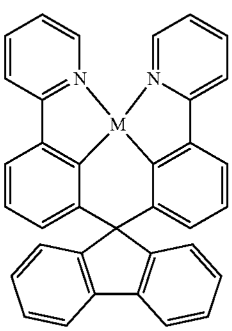
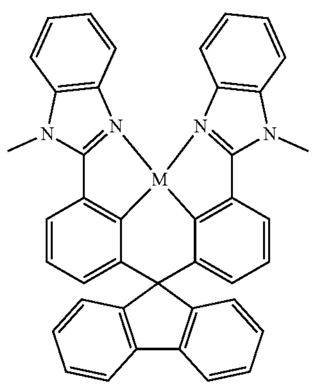
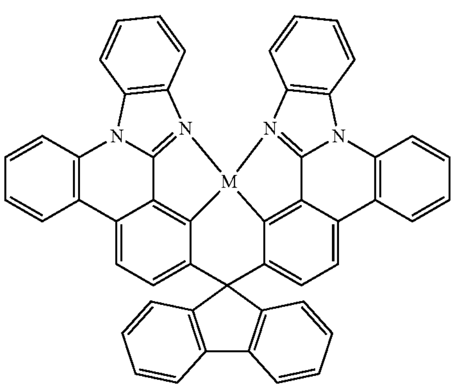
-continued
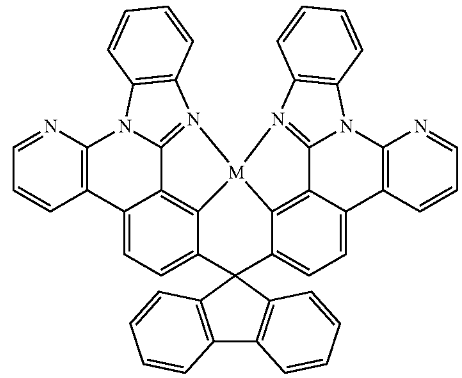
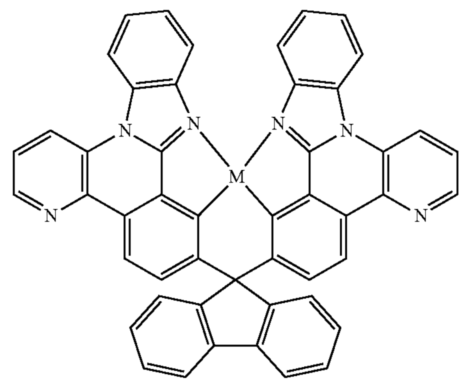
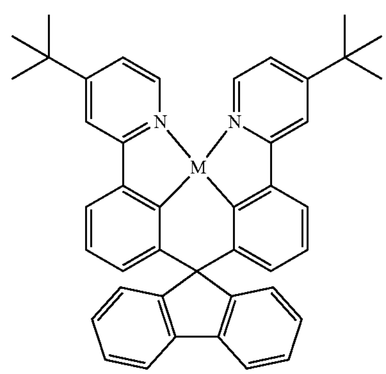
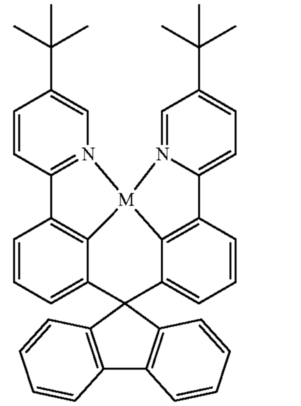

-continued
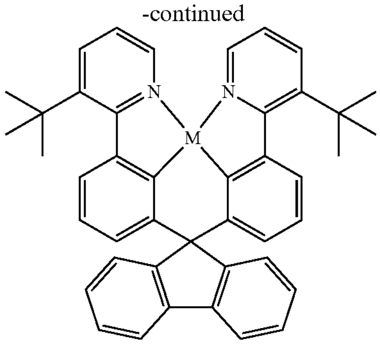
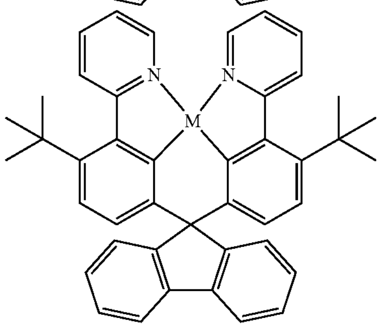
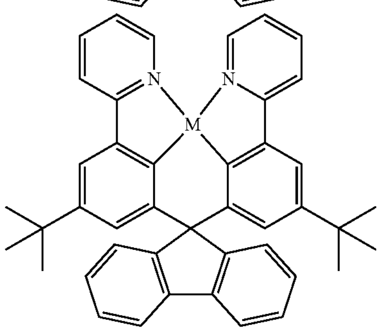
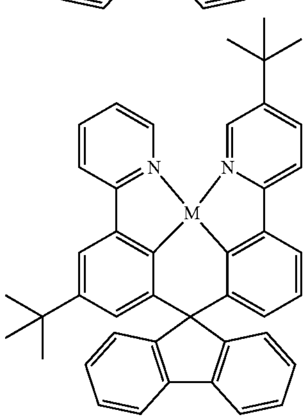
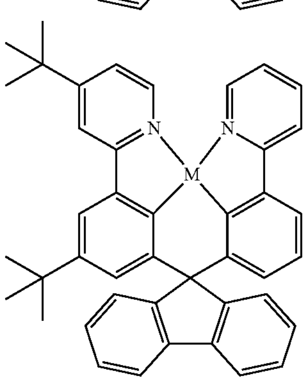
-continued
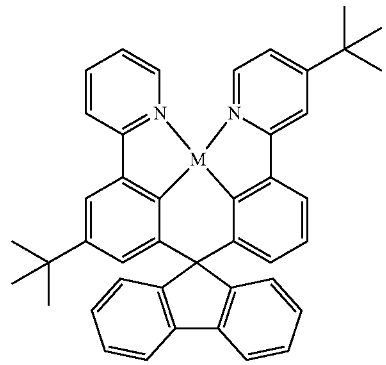
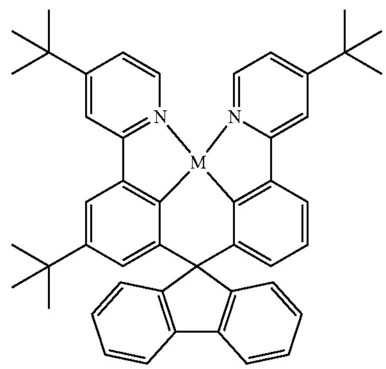
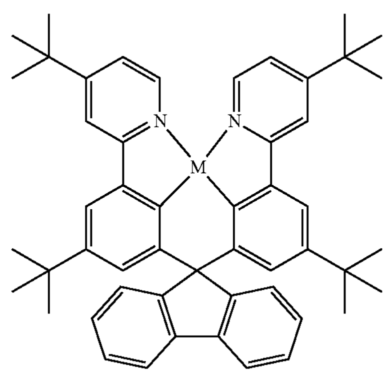
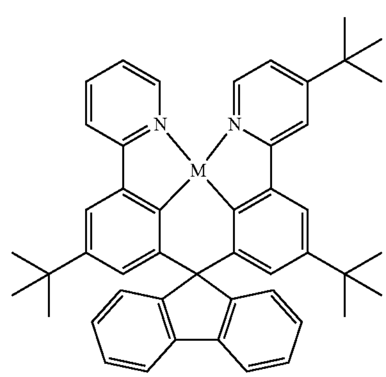

-continued
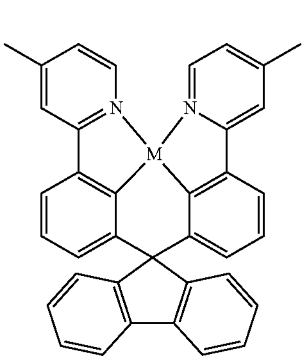
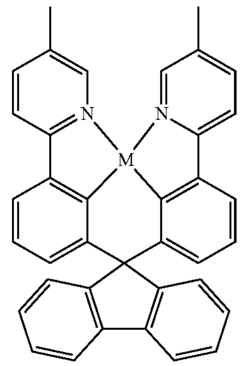
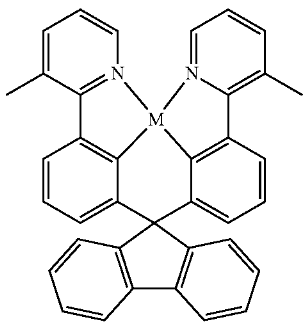
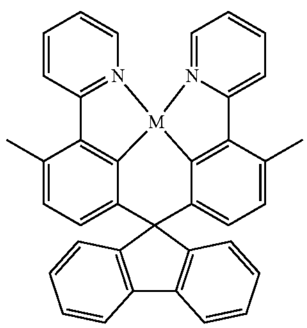
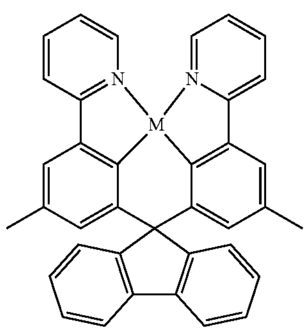
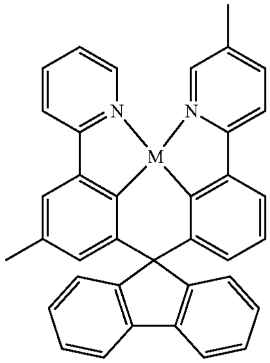
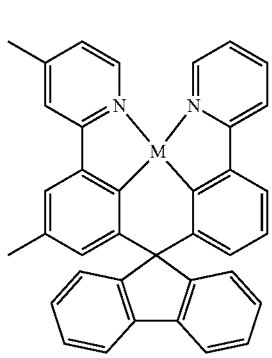
-continued
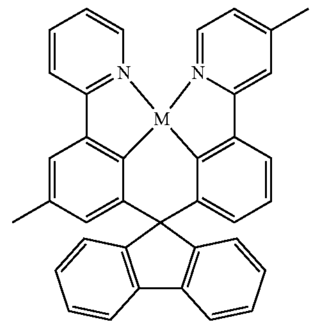
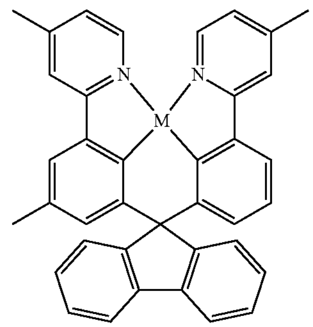
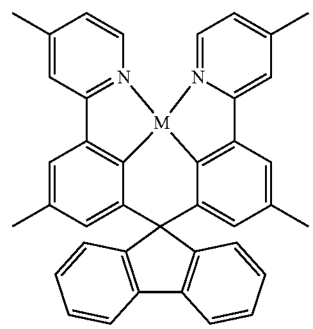
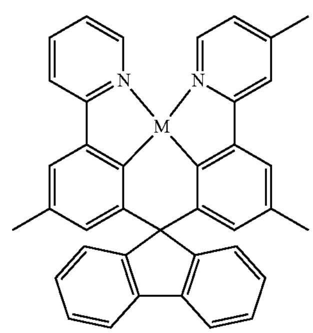
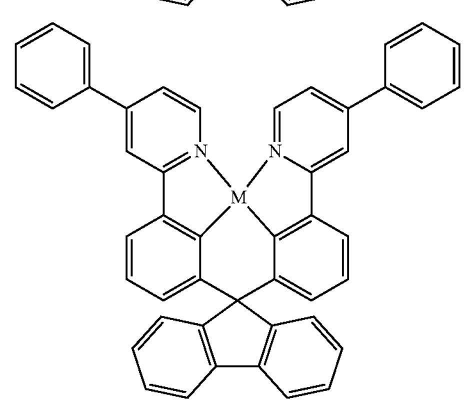

-continued
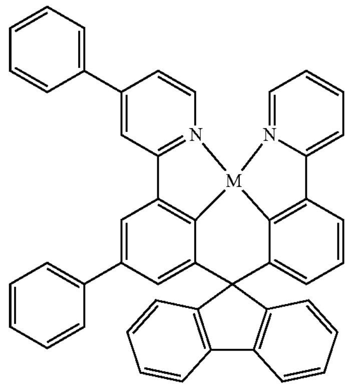
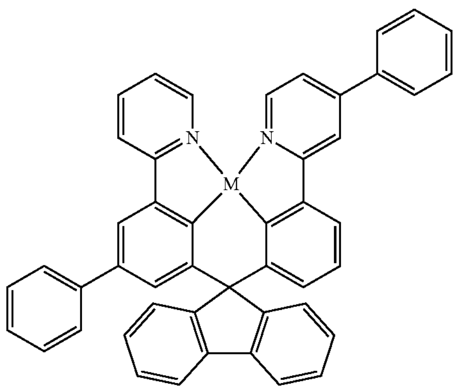
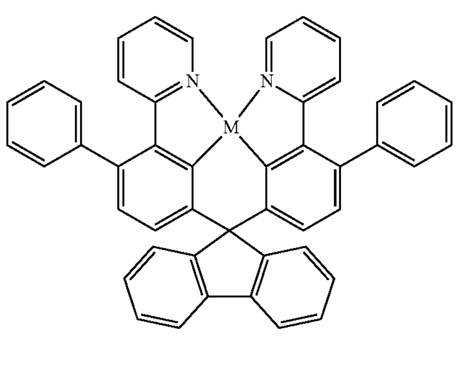
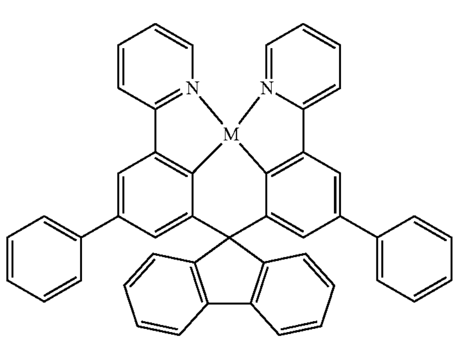
-continued
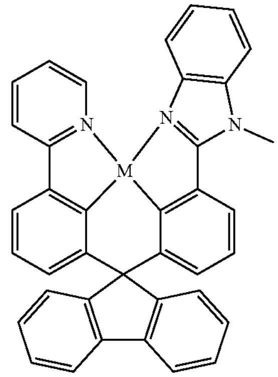
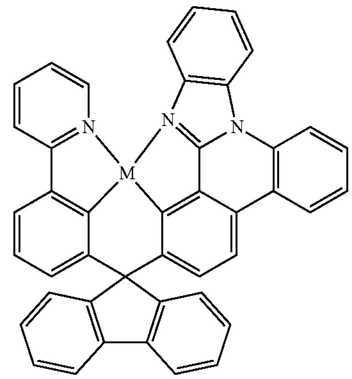
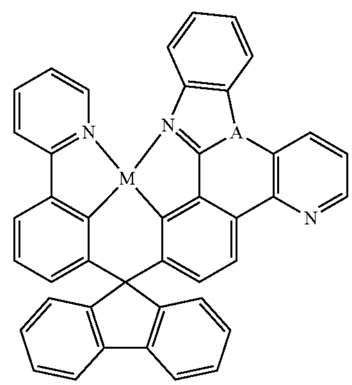
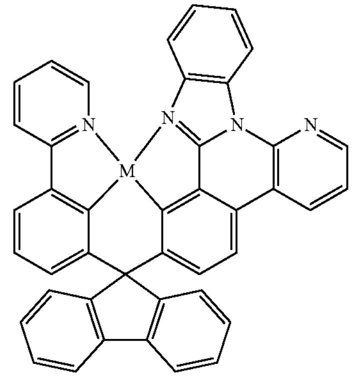

-continued
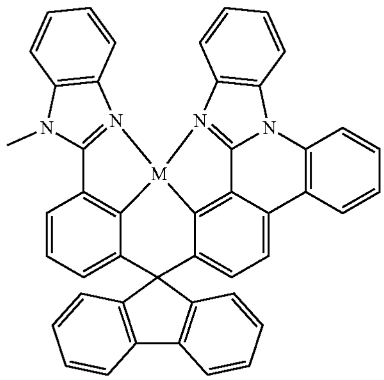
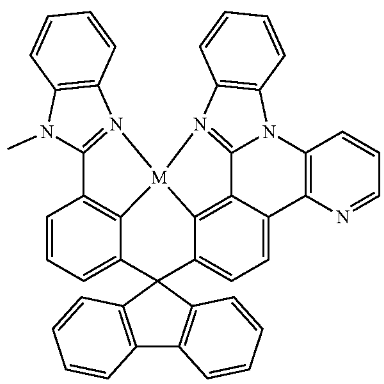
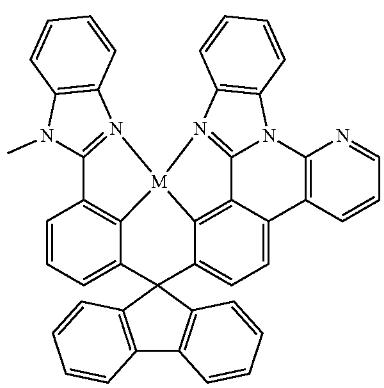
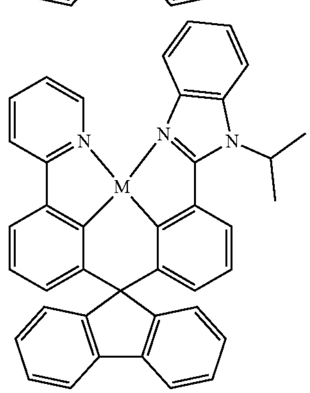
-continued
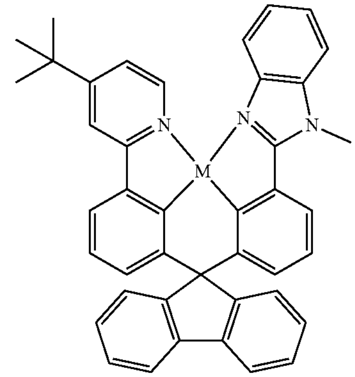
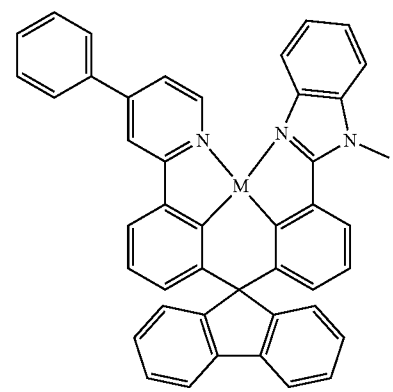
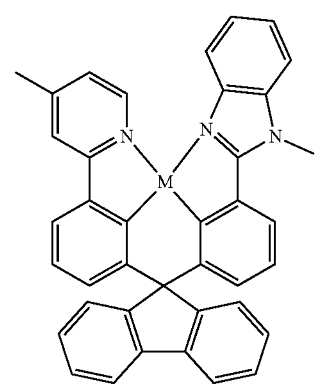
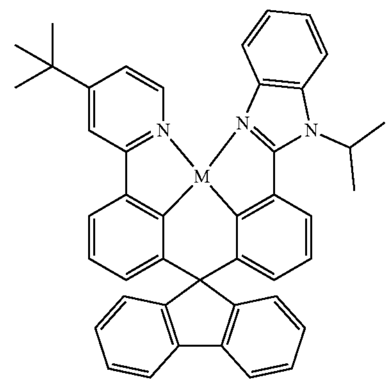

-continued
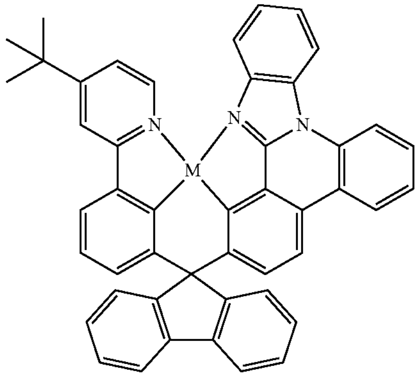
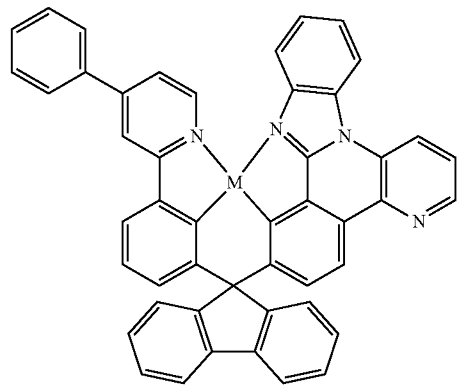
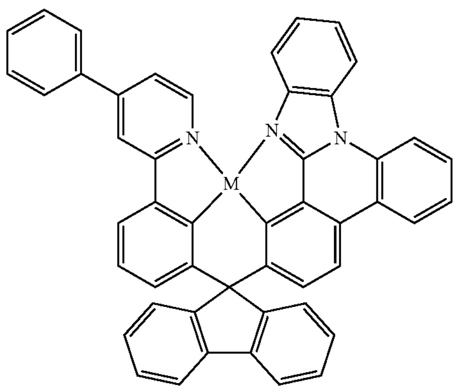
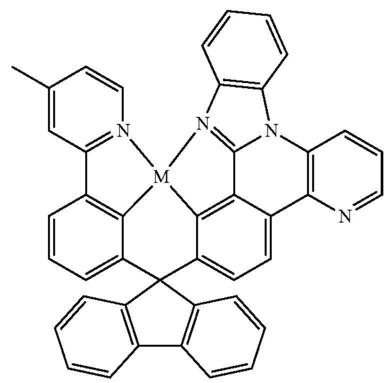
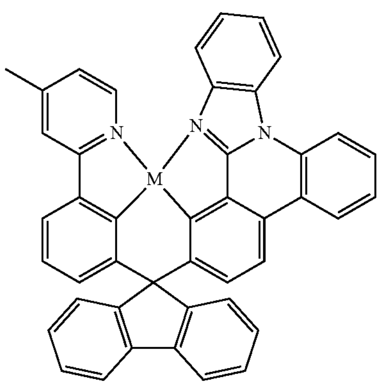
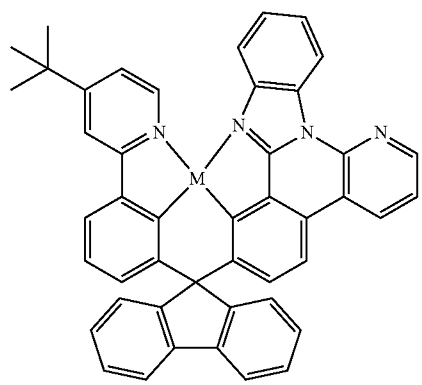
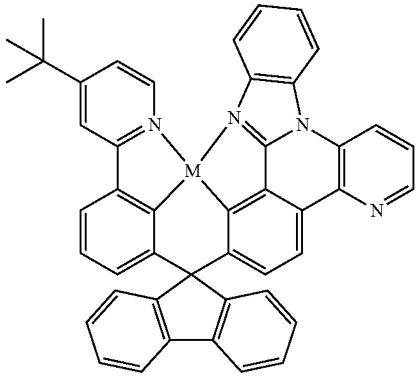
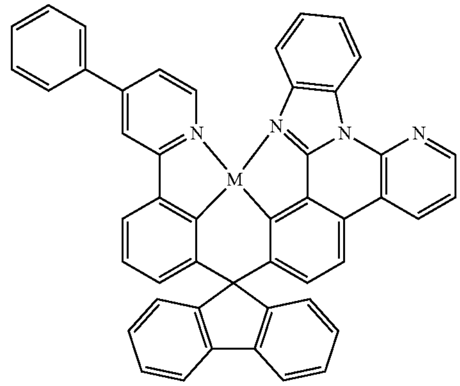
-continued

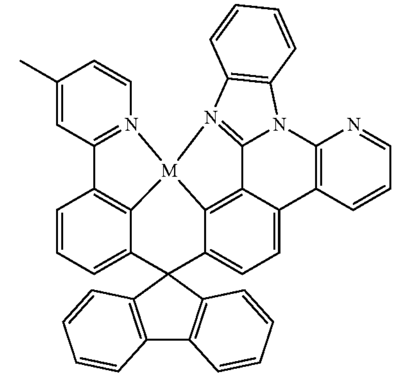
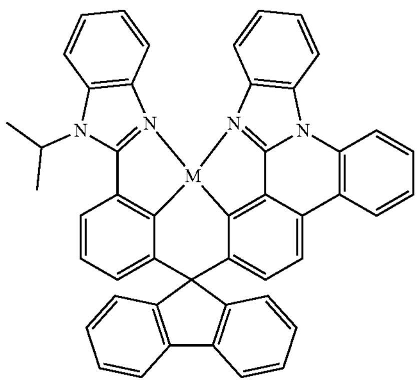
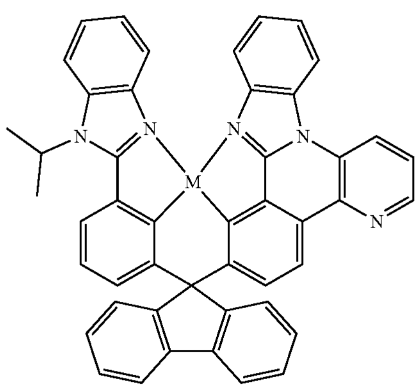
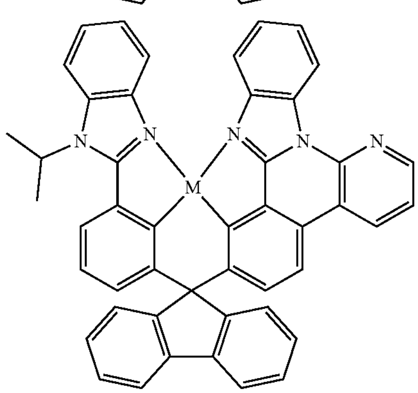
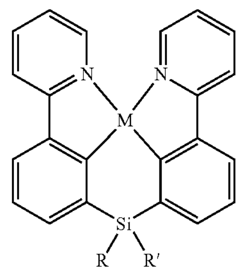
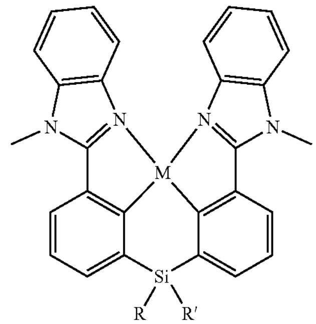
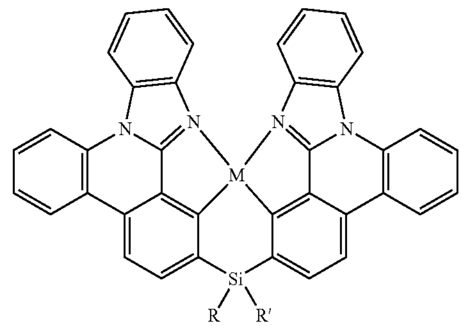
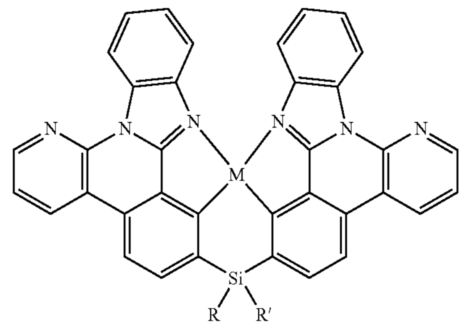
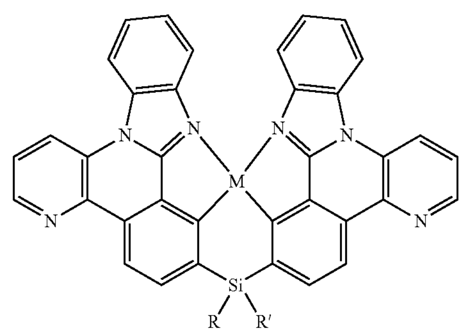
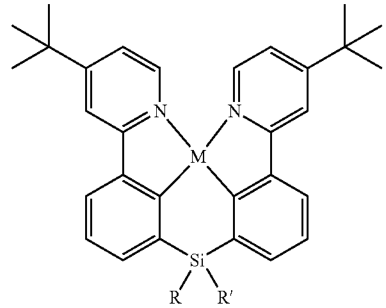

-continued
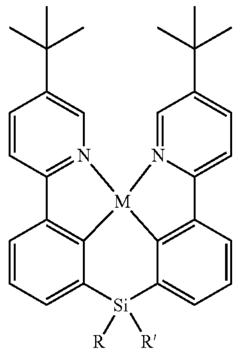
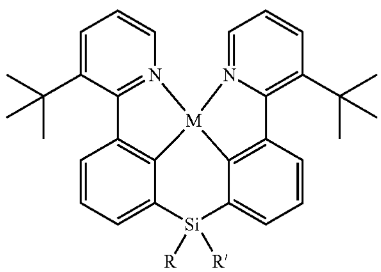
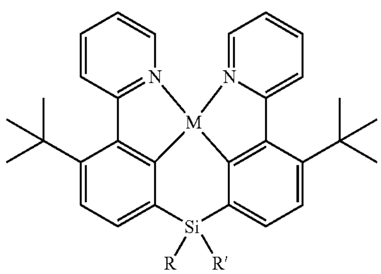
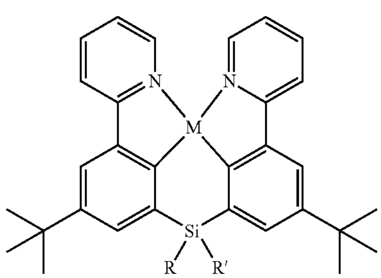
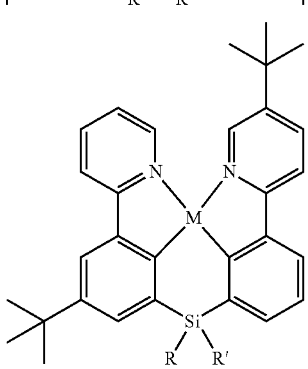
-continued
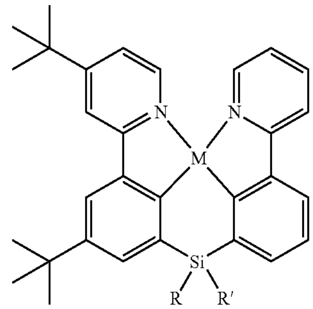
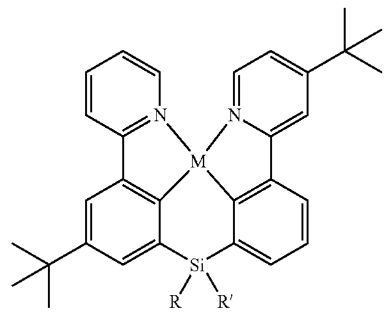
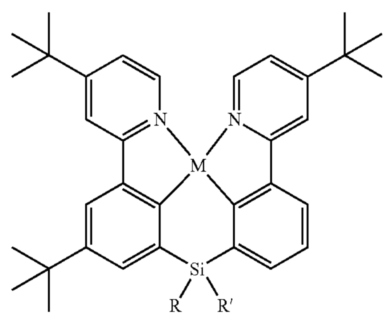
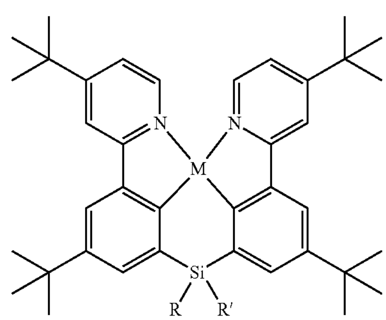
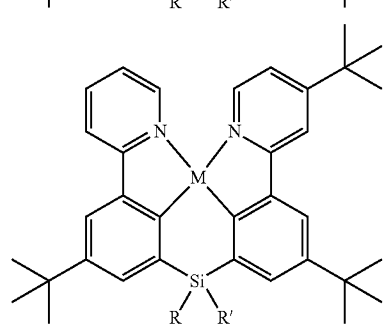

-continued
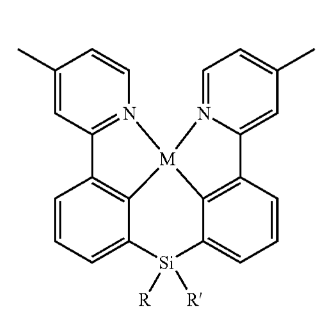
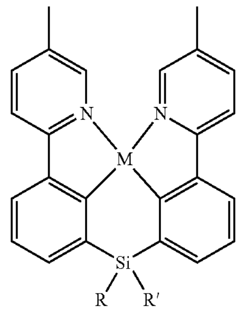
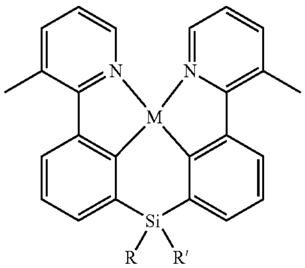
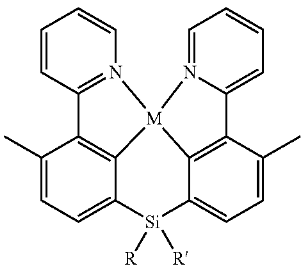
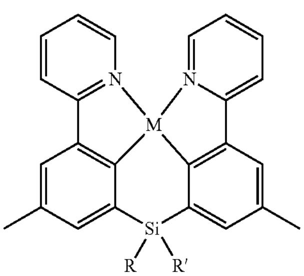
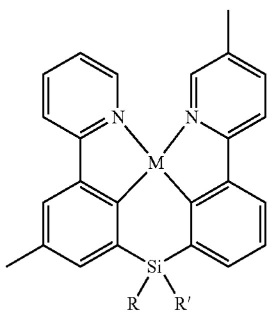
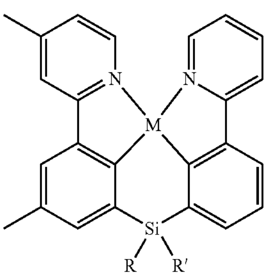
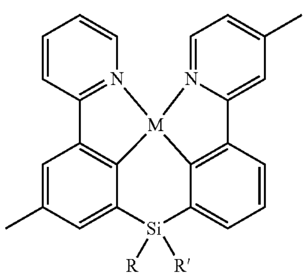
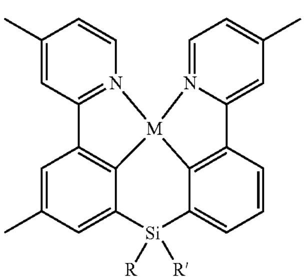
-continued
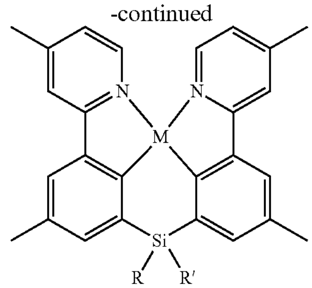
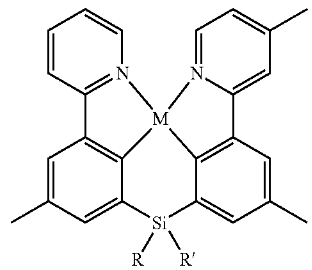
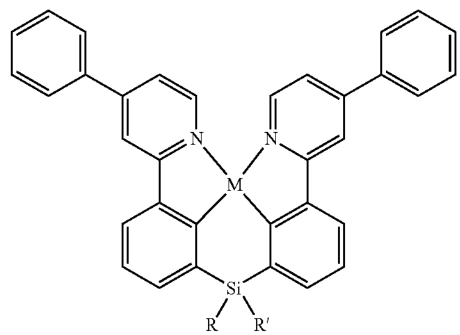
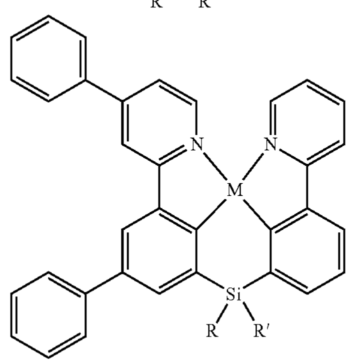
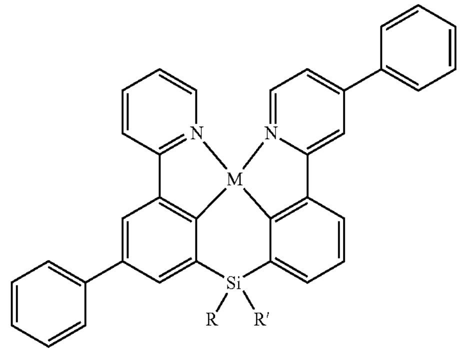

-continued
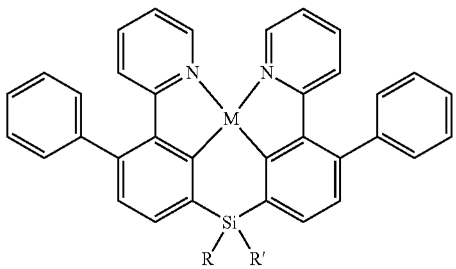
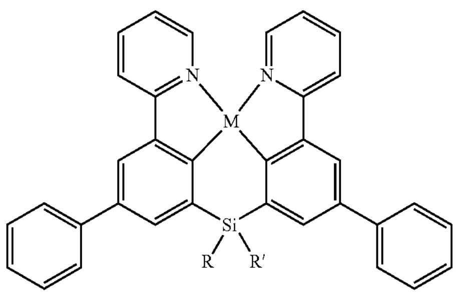
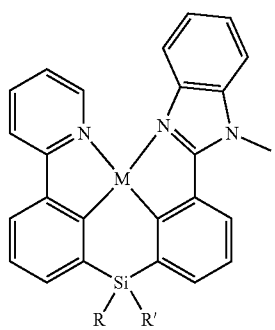
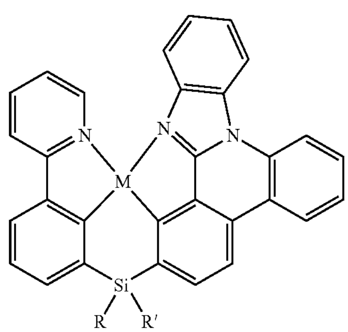
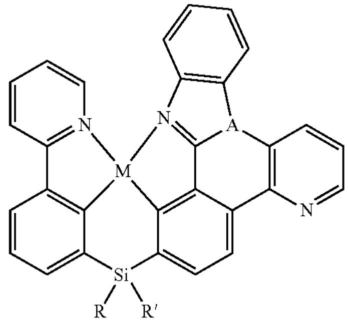
-continued
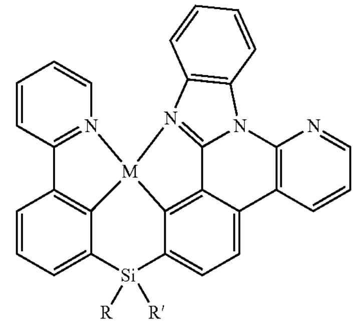
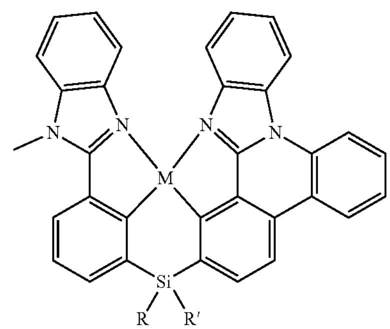
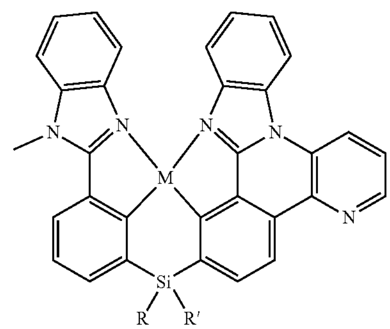
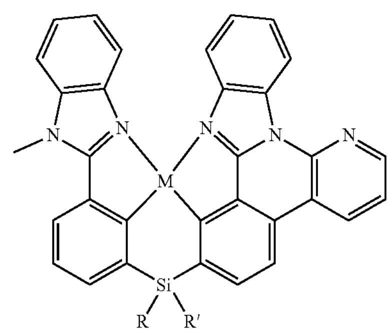
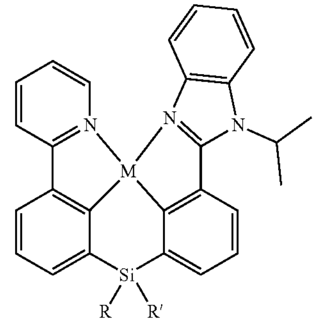

-continued
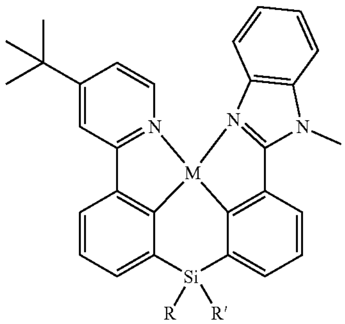
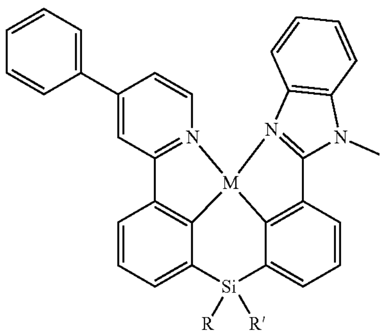
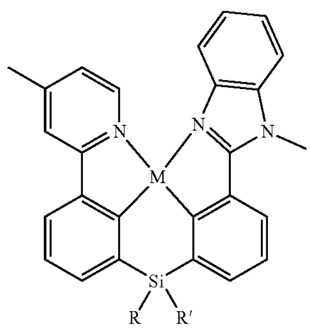
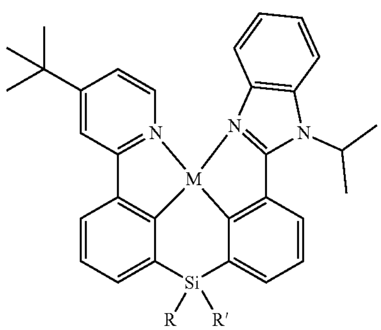
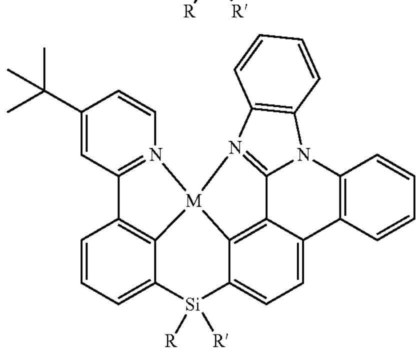
-continued
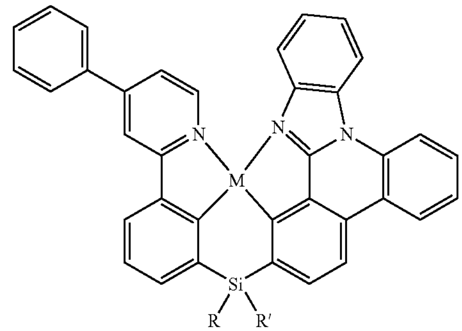
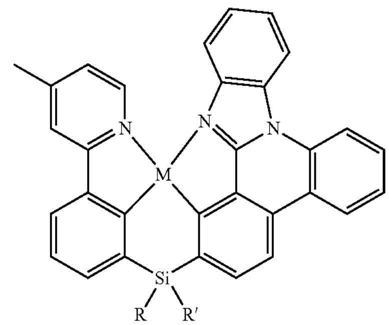
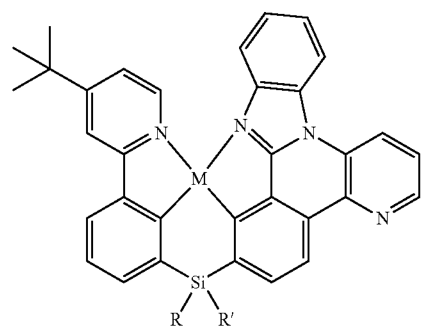
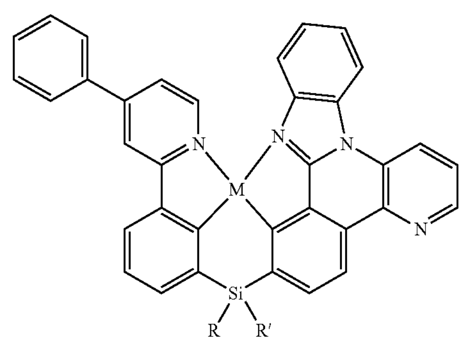
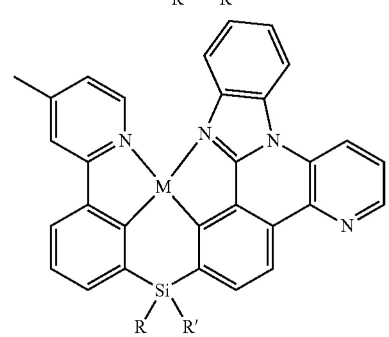

-continued
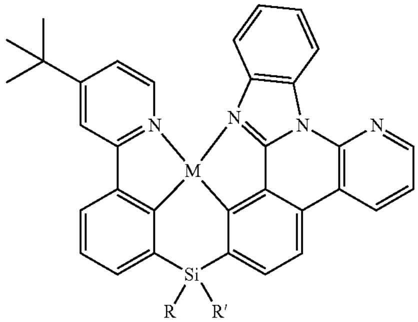
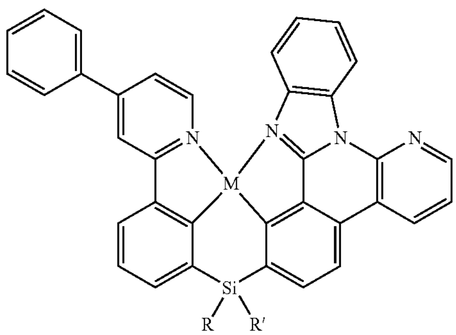
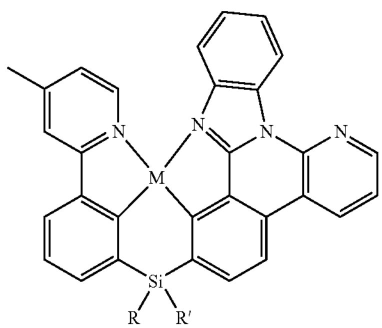
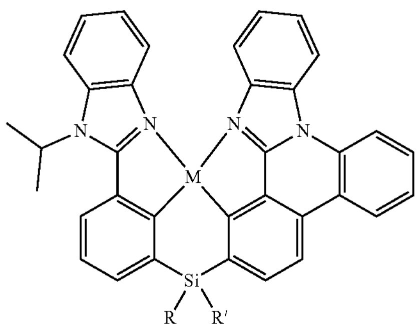
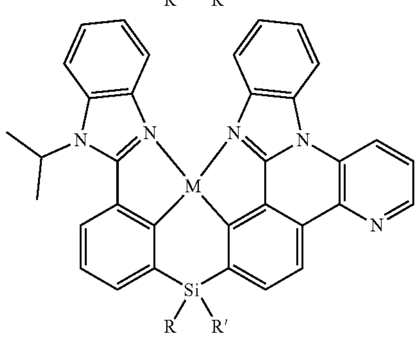
-continued
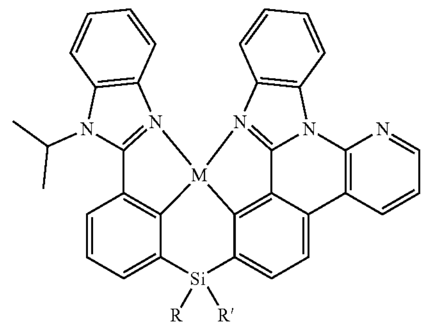
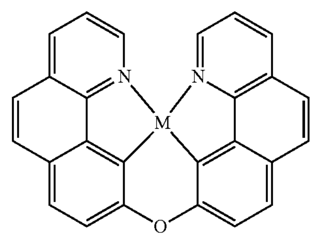
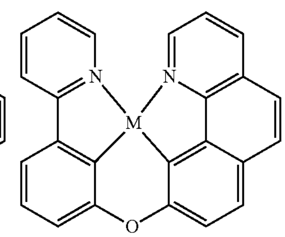
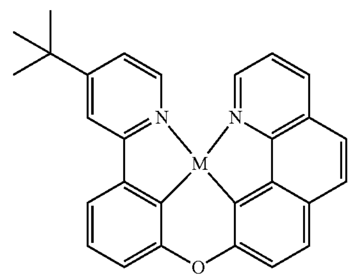
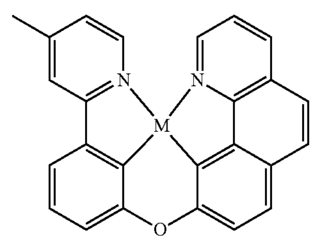
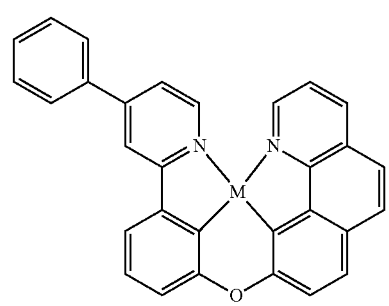
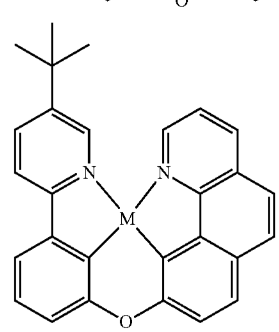

-continued
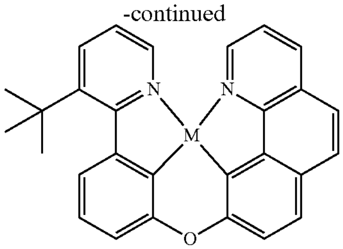
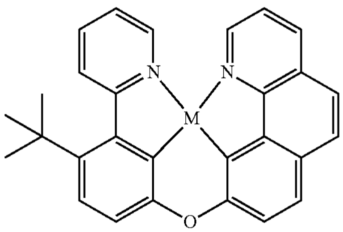
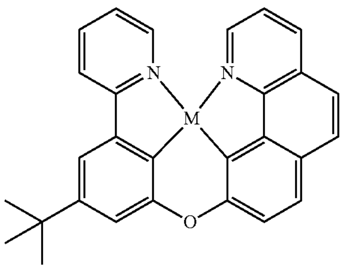
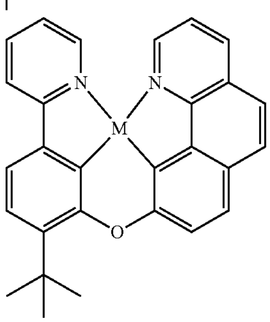
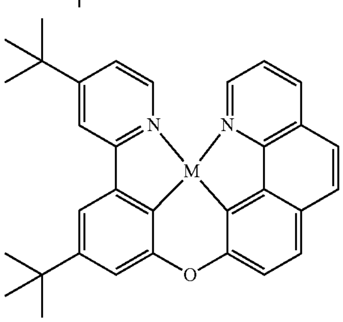
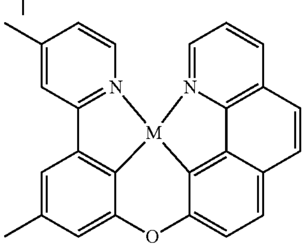
-continued
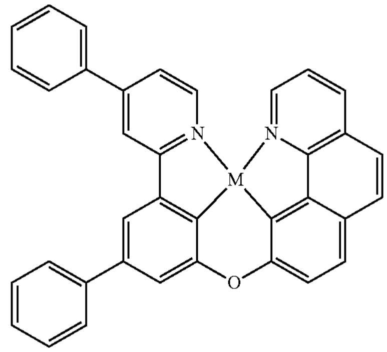
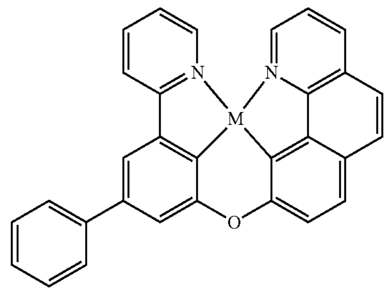
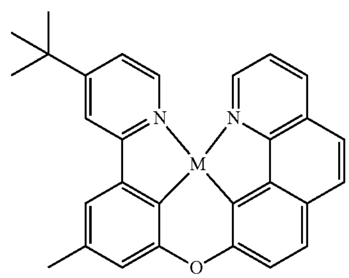
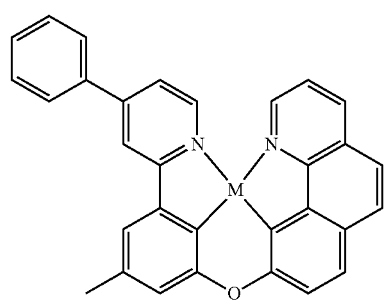
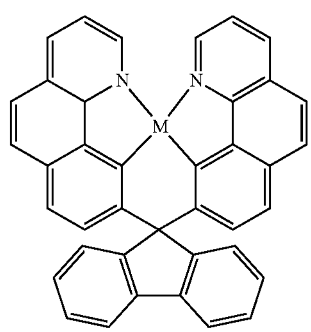
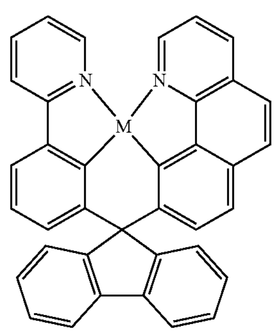

-continued
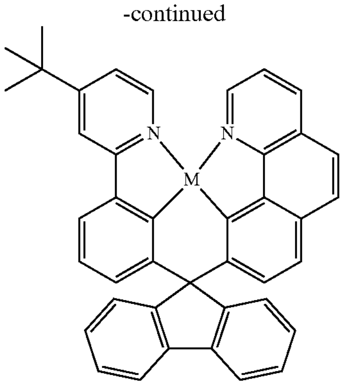
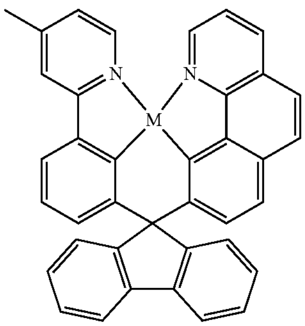
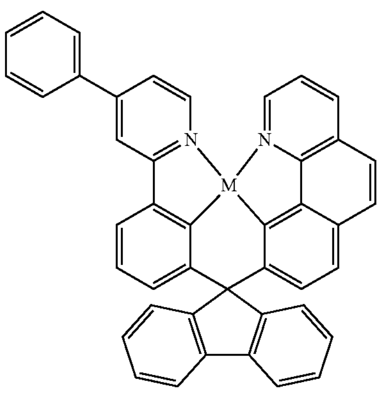
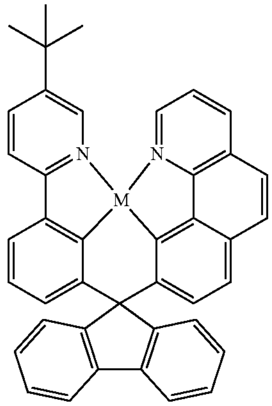
-continued
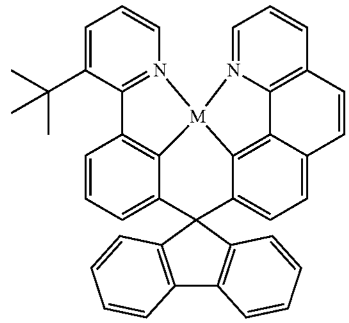
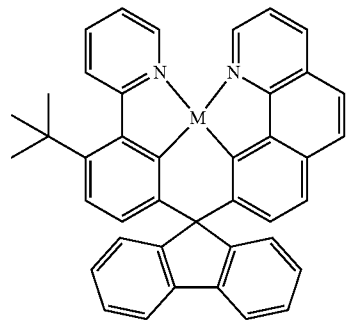
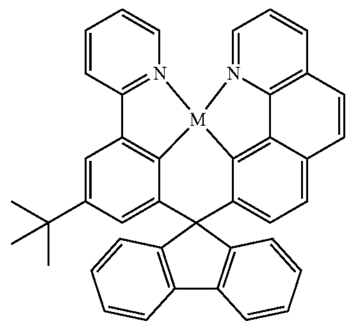
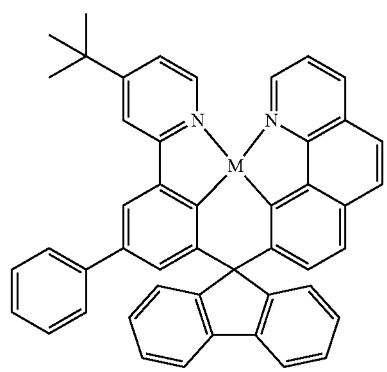
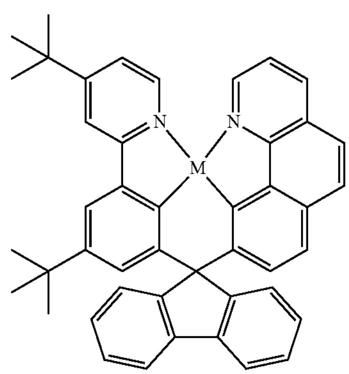

-continued
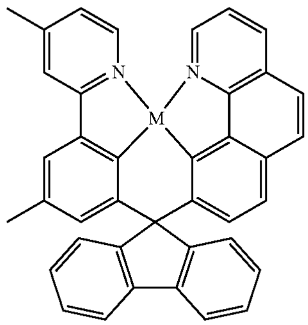
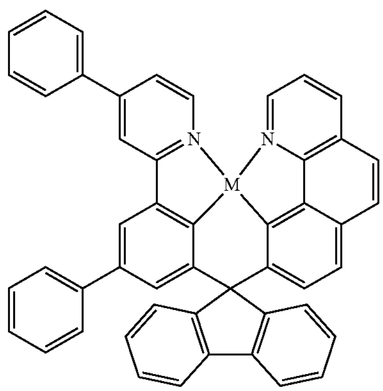
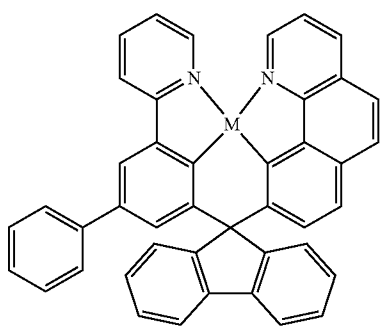
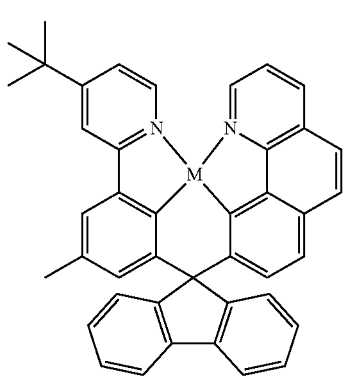
-continued
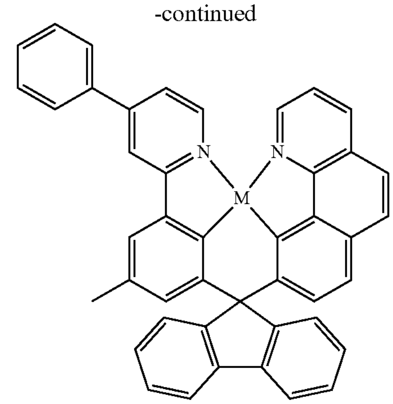
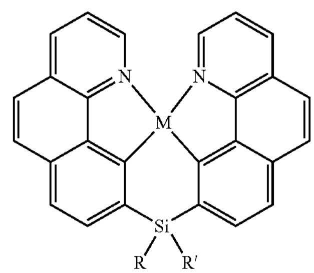
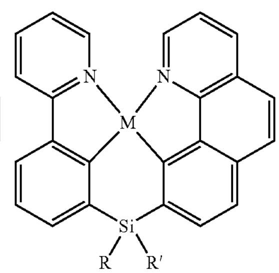
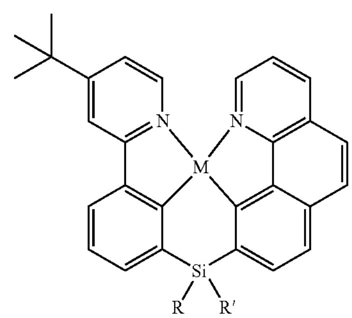
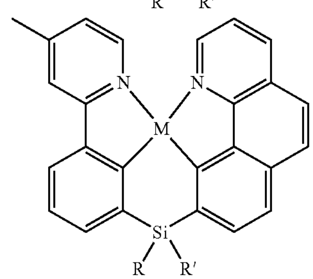
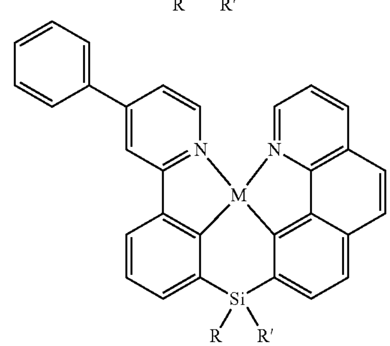

-continued
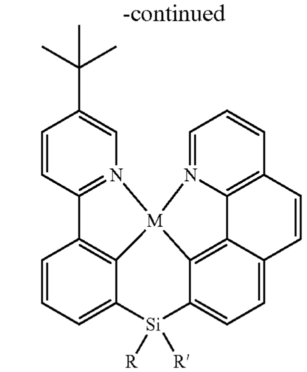
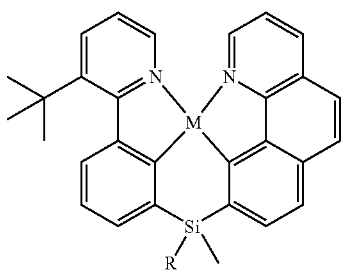
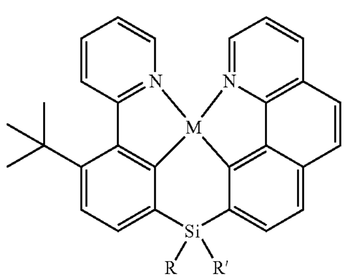
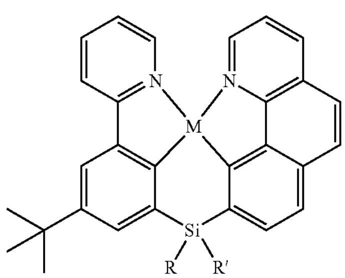
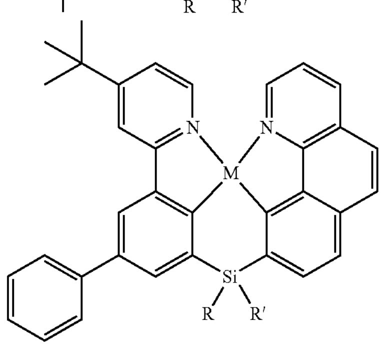
-continued
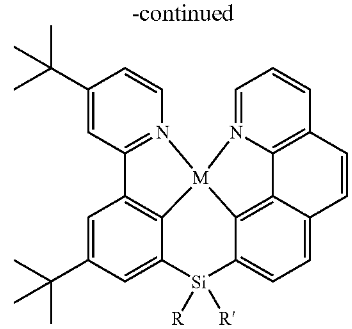
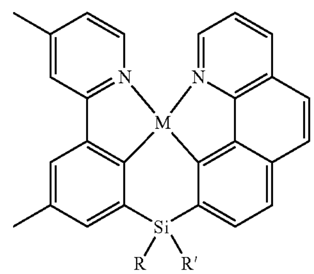
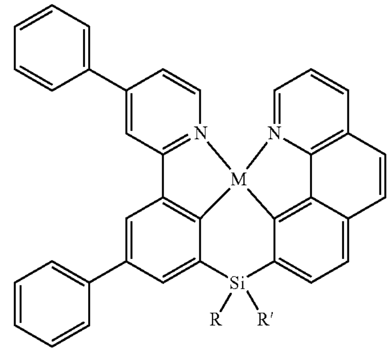
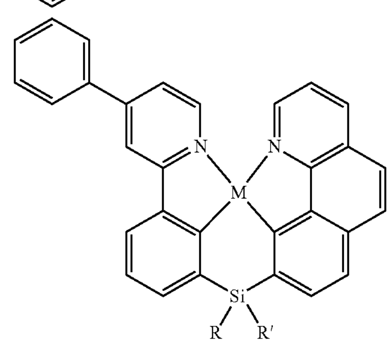
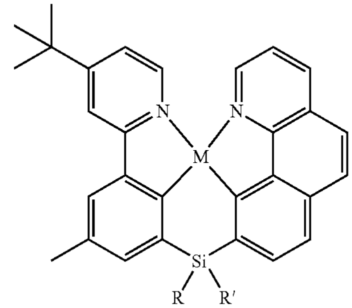

-continued

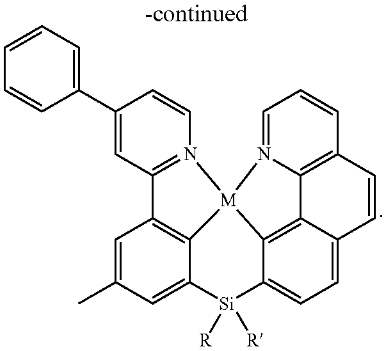

The platinum and palladium complexes disclosed herein may be deposited on a surface of an OLED, such as a hole transporting layer or an electron-transporting layer, via vapor deposition to form an emissive layer of the OLED. In some cases, the substrate may be cooled below room temperature. The structure of theses complexes promotes preferential alignment such that emitting dipoles of the excimers are aligned parallel to the surface on which the emissive layer is formed. A concentration of the complexes in the emissive layer can be in a range between 5 wt % and 100 wt %. That is, the emissive layer may be a neat film or a doped film. A concentration of the complex in the doped film is typically in a range of 5 wt % to 25 wt %.

The host in the doped film may have a carbazole skeleton or other relatively flat structure. In some cases, the host material is a carbazole-based host having one to three carbazole skeletons. Suitable carbazole-based hosts are represented Formulas 1-3:

Formula 1

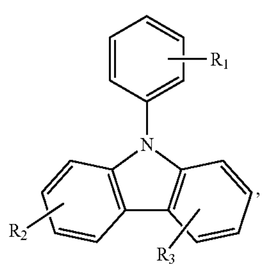

Formula 2

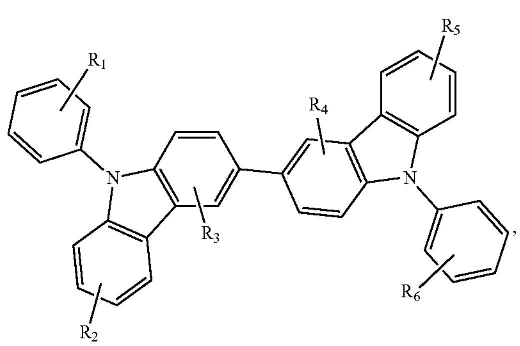

-continued

Formula 3

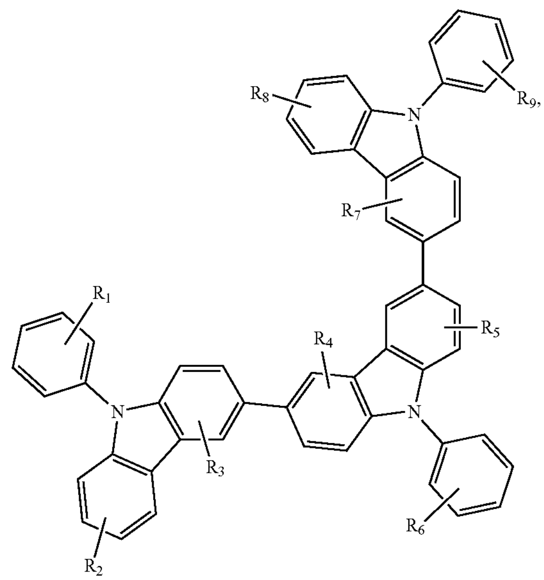

where each occurrence of $R^1$-$R^9$ independently represents halogen, hydroxyl, nitro, cyanide, thiol, or optionally substituted alkyl, alkenyl, alkynyl, aryl, heteroaryl, cycloalkane, cycloalkane, heterocyclyl, amino, alkoxy, haloalkyl, arylalkane, or arylalkene. Examples of suitable carbazole-based hosts include tris-PCz (9,9',9"-triphenyl-9H,9'H,9"H-3,3':6'3"-tercarbazole), CBP (4,4-di(9H-carbazol-9-yl) biphenyl), mCBP (3,3-di(9H-carbazol-9-yl) biphenyl), and mCP (meta-di(carbazolyl) phenyl).

In some cases, the emissive layer has one or more doped films including the complex, with each doped film having a different concentration of the complex. In one example, the emissive layer has a first doped film including the complex and a second doped film including the complex. A concentration of the complex in the first doped film is typically in a range of 15 wt % to 25 wt %, and a concentration of the complex in the second doped film is typically in a range of 5 wt % to 15 wt %. The emissive layer further may also have a third doped film including the complex. A concentration of the complex in the third doped film is typically in a range of 5 wt % to 10 wt %.

The platinum and palladium complexes disclosed herein are suitable for use in a wide variety of devices, including, for example, optical and electro-optical devices, including, for example, photo-absorbing devices such as solar- and photo-sensitive devices, OLEDs, photo-emitting devices, devices capable of both photo-absorption and emission, and display, illumination, and automobile taillight applications. Light emitting devices based on electrophosphorescent emitters are described in more detail in WO2000/070655 to Baldo et al., which is incorporated herein by this reference for its teaching of OLEDs, and in particular phosphorescent OLEDs.

Also disclosed herein are compositions and light emitting devices including one or more complexes disclosed herein. The light emitting devices can be OLEDs (e.g., phosphorescent OLEDs). The present disclosure also provides a photovoltaic device comprising one or more complexes or compositions described herein. Further, the present disclosure also provides a luminescent display device comprising one or more complexes or compositions described herein.

Components used to prepare the compositions described herein are disclosed, as well as the compositions themselves to be used within disclosed methods. These and other materials are disclosed, and it is understood that when combinations, subsets, interactions, groups, etc. of these materials are disclosed that while specific reference of each various individual and collective combinations and permutation of these compounds may not be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C is disclosed as well as a class of molecules D, E, and F, and an example of a combination molecule, A-D is disclosed, then even if each is not individually recited, each is individually and collectively contemplated, meaning combinations A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions disclosed herein. Thus, if there are a variety of additional steps that can be performed, it is understood that each of these additional steps can be performed with any specific embodiment or combination of embodiments of the methods described herein.

As referred to herein, a linking atom or linking group connects two atoms such as, for example, an N atom and a C atom. A linking atom or linking group is in one aspect disclosed as $L^1$, $L^2$, $L^3$, etc. herein. The linking atom can optionally, if valency permits, have other chemical moieties attached. For example, in one aspect, an oxygen would not have any other chemical groups attached as the valency is satisfied once it is bonded to two groups (e.g., N and/or C groups). In another aspect, when carbon is the linking atom, two additional chemical moieties can be attached to the carbon. Suitable chemical moieties include amino, amide, thiol, aryl, heteroaryl, cycloalkyl, and heterocyclyl moieties. The term "cyclic structure" or the like terms used herein refer to any cyclic chemical structure which includes, but is not limited to, aryl, heteroaryl, cycloalkyl, cycloalkenyl, heterocyclyl, carbene, and N-heterocyclic carbene.

As used herein, the term "substituted" is contemplated to include all permissible substituents of organic compounds. In a broad aspect, the permissible substituents include acyclic and cyclic, branched and unbranched, carbocyclic and heterocyclic, and aromatic and nonaromatic substituents of organic compounds. Illustrative substituents include, for example, those described below. The permissible substituents can be one or more and the same or different for appropriate organic compounds. For purposes of this disclosure, the heteroatoms, such as nitrogen, can have hydrogen substituents and/or any permissible substituents of organic compounds described herein which satisfy the valences of the heteroatoms. This disclosure is not intended to be limited in any manner by the permissible substituents of organic compounds. Also, the terms "substitution" or "substituted with" include the implicit proviso that such substitution is in accordance with permitted valence of the substituted atom and the substituent, and that the substitution results in a stable compound, e.g., a compound that does not spontaneously undergo transformation such as by rearrangement, cyclization, elimination, etc. It is also contemplated that, in certain aspects, unless expressly indicated to the contrary, individual substituents can be further optionally substituted (i.e., further substituted or unsubstituted).

In defining various terms, "$A^1$", "$A^2$", "$A^3$", "$A^4$" and "$A^5$" are used herein as generic symbols to represent various specific substituents. These symbols can be any substituent, not limited to those disclosed herein, and when they are defined to be certain substituents in one instance, they can, in another instance, be defined as some other substituents.

The term "alkyl" as used herein is a branched or unbranched saturated hydrocarbon group of 1 to 24 carbon atoms, such as methyl, ethyl, n-propyl, isopropyl, n-butyl, isobutyl, s-butyl, t-butyl, n-pentyl, isopentyl, s-pentyl, neopentyl, hexyl, heptyl, octyl, nonyl, decyl, dode cyl, tetradecyl, hexadecyl, eicosyl, tetracosyl, and the like. The alkyl group can be cyclic or acyclic. The alkyl group can be branched or unbranched. The alkyl group can also be substituted or unsubstituted. For example, the alkyl group can be substituted with one or more groups including, but not limited to, alkyl, cycloalkyl, alkoxy, amino, ether, halide, hydroxy, nitro, silyl, sulfo-oxo, or thiol, as described herein. A "lower alkyl" group is an alkyl group containing from one to six (e.g., from one to four) carbon atoms.

Throughout the specification "alkyl" is generally used to refer to both unsubstituted alkyl groups and substituted alkyl groups; however, substituted alkyl groups are also specifically referred to herein by identifying the specific substituent(s) on the alkyl group. For example, the term "halogenated alkyl" or "haloalkyl" specifically refers to an alkyl group that is substituted with one or more halide, e.g., fluorine, chlorine, bromine, or iodine. The term "alkoxyalkyl" specifically refers to an alkyl group that is substituted with one or more alkoxy groups, as described below. The term "alkylamino" specifically refers to an alkyl group that is substituted with one or more amino groups, as described below, and the like. When "alkyl" is used in one instance and a specific term such as "alkylalcohol" is used in another, it is not meant to imply that the term "alkyl" does not also refer to specific terms such as "alkylalcohol" and the like.

This practice is also used for other groups described herein. That is, while a term such as "cycloalkyl" refers to both unsubstituted and substituted cycloalkyl moieties, the substituted moieties can, in addition, be specifically identified herein; for example, a particular substituted cycloalkyl can be referred to as, e.g., an "alkylcycloalkyl." Similarly, a substituted alkoxy can be specifically referred to as, e.g., a "halogenated alkoxy," a particular substituted alkenyl can be, e.g., an "alkenylalcohol," and the like. Again, the practice of using a general term, such as "cycloalkyl," and a specific term, such as "alkylcycloalkyl," is not meant to imply that the general term does not also include the specific term.

The term "cycloalkyl" as used herein is a non-aromatic carbon-based ring composed of at least three carbon atoms. Examples of cycloalkyl groups include, but are not limited to, cyclopropyl, cyclobutyl, cyclopentyl, cyclohexyl, norbornyl, and the like. The term "heterocycloalkyl" is a type of cycloalkyl group as defined above, and is included within the meaning of the term "cycloalkyl," where at least one of the carbon atoms of the ring is replaced with a heteroatom such as, but not limited to, nitrogen, oxygen, sulfur, or phosphorus. The cycloalkyl group and heterocycloalkyl group can be substituted or unsubstituted. The cycloalkyl group and heterocycloalkyl group can be substituted with one or more groups including, but not limited to, alkyl, cycloalkyl, alkoxy, amino, ether, halide, hydroxy, nitro, silyl, sulfo-oxo, or thiol as described herein.

The terms "alkoxy" and "alkoxyl" as used herein to refer to an alkyl or cycloalkyl group bonded through an ether linkage; that is, an "alkoxy" group can be defined as —$OA^1$ where $A^1$ is alkyl or cycloalkyl as defined above. "Alkoxy" also includes polymers of alkoxy groups as just described; that is, an alkoxy can be a polyether such as —$OA^1$-$OA^2$ or -$OA^1$-$(OA^2)_a$-$OA^3$, where "a" is an integer of from 1 to 200 and $A^1$, $A^2$, and $A^3$ are alkyl and/or cycloalkyl groups.

The term "alkenyl" as used herein is a hydrocarbon group of from 2 to 24 carbon atoms with a structural formula containing at least one carbon-carbon double bond. Asymmetric structures such as $(A^1A^2)C{=}C(A^3A^4)$ are intended to include both the E and Z isomers. This can be presumed in structural formulas herein wherein an asymmetric alkene is present, or it can be explicitly indicated by the bond symbol C═C. The alkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkenyl" as used herein is a non-aromatic carbon-based ring composed of at least three carbon atoms and containing at least one carbon-carbon double bound, i.e., C═C. Examples of cycloalkenyl groups include, but are not limited to, cyclopropenyl, cyclobutenyl, cyclopentenyl, cyclopentadienyl, cyclohexenyl, cyclohexadienyl, norbornenyl, and the like. The term "heterocycloalkenyl" is a type of cycloalkenyl group as defined above, and is included within the meaning of the term "cycloalkenyl," where at least one of the carbon atoms of the ring is replaced with a heteroatom such as, but not limited to, nitrogen, oxygen, sulfur, or phosphorus. The cycloalkenyl group and heterocycloalkenyl group can be substituted or unsubstituted. The cycloalkenyl group and heterocycloalkenyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "alkynyl" as used herein is a hydrocarbon group of 2 to 24 carbon atoms with a structural formula containing at least one carbon-carbon triple bond. The alkynyl group can be unsubstituted or substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol, as described herein.

The term "cycloalkynyl" as used herein is a non-aromatic carbon-based ring composed of at least seven carbon atoms and containing at least one carbon-carbon triple bound. Examples of cycloalkynyl groups include, but are not limited to, cycloheptynyl, cyclooctynyl, cyclononynyl, and the like. The term "heterocycloalkynyl" is a type of cycloalkenyl group as defined above, and is included within the meaning of the term "cycloalkynyl," where at least one of the carbon atoms of the ring is replaced with a heteroatom such as, but not limited to, nitrogen, oxygen, sulfur, or phosphorus. The cycloalkynyl group and heterocycloalkynyl group can be substituted or unsubstituted. The cycloalkynyl group and heterocycloalkynyl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein.

The term "aryl" as used herein is a group that contains any carbon-based aromatic group including, but not limited to, benzene, naphthalene, phenyl, biphenyl, phenoxybenzene, and the like. The term "aryl" also includes "heteroaryl," which is defined as a group that contains an aromatic group that has at least one heteroatom incorporated within the ring of the aromatic group. Examples of heteroatoms include, but are not limited to, nitrogen, oxygen, sulfur, and phosphorus. Likewise, the term "non-heteroaryl," which is also included in the term "aryl," defines a group that contains an aromatic group that does not contain a heteroatom. The aryl group can be substituted or unsubstituted. The aryl group can be substituted with one or more groups including, but not limited to, alkyl, cycloalkyl, alkoxy, alkenyl, cycloalkenyl, alkynyl, cycloalkynyl, aryl, heteroaryl, aldehyde, amino, carboxylic acid, ester, ether, halide, hydroxy, ketone, azide, nitro, silyl, sulfo-oxo, or thiol as described herein. The term "biaryl" is a specific type of aryl group and is included in the definition of "aryl." Biaryl refers to two aryl groups that are bound together via a fused ring structure, as in naphthalene, or are attached via one or more carbon-carbon bonds, as in biphenyl.

The term "aldehyde" as used herein is represented by the formula —C(O)H. Throughout this specification "C(O)" is a short hand notation for a carbonyl group, i.e., C═O.

The terms "amine" or "amino" as used herein are represented by the formula —$NA^1A^2$, where $A^1$ and $A^2$ can be, independently, hydrogen or alkyl, cycloalkyl, alkenyl, cycloalkenyl, alkynyl, cycloalkynyl, aryl, or heteroaryl group as described herein.

The term "alkylamino" as used herein is represented by the formula —NH(-alkyl) where alkyl is a described herein. Representative examples include, but are not limited to, methylamino group, ethylamino group, propylamino group, isopropylamino group, butylamino group, isobutylamino group, (sec-butyl)amino group, (tert-butyl)amino group, pentylamino group, isopentylamino group, (tert-pentyl) amino group, hexylamino group, and the like.

The term "dialkylamino" as used herein is represented by the formula —$N(\text{-alkyl})_2$ where alkyl is a described herein. Representative examples include, but are not limited to, dimethylamino group, diethylamino group, dipropylamino group, diisopropylamino group, dibutylamino group, diisobutylamino group, di(sec-butyl)amino group, di(tert-butyl)amino group, dipentylamino group, diisopentylamino group, di(tert-pentyl)amino group, dihexylamino group, N-ethyl-N-methylamino group, N-methyl-N-propylamino group, N-ethyl-N-propylamino group and the like.

The term "carboxylic acid" as used herein is represented by the formula —C(O)OH.

The term "ester" as used herein is represented by the formula —$OC(O)A^1$ or —$C(O)OA^1$, where $A^1$ can be alkyl, cycloalkyl, alkenyl, cycloalkenyl, alkynyl, cycloalkynyl, aryl, or heteroaryl group as described herein. The term "polyester" as used herein is represented by the formula -$(A^1O(O)C\text{-}A^2\text{-}C(O)O)_a$— or -$(A^1O(O)C\text{-}A^2\text{-}OC(O))_a$—, where $A^1$ and $A^2$ can be, independently, an alkyl, cycloalkyl, alkenyl, cycloalkenyl, alkynyl, cycloalkynyl, aryl, or heteroaryl group described herein and "a" is an integer from 1 to 500. "Polyester" is as the term used to describe a group that is produced by the reaction between a compound having at least two carboxylic acid groups with a compound having at least two hydroxyl groups.

The term "ether" as used herein is represented by the formula $A^1OA^2$, where $A^1$ and $A^2$ can be, independently, an alkyl, cycloalkyl, alkenyl, cycloalkenyl, alkynyl, cycloalkynyl, aryl, or heteroaryl group described herein. The term "polyether" as used herein is represented by the formula $-(A^1O-A^2O)_a-$, where $A^1$ and $A^2$ can be, independently, an alkyl, cycloalkyl, alkenyl, cycloalkenyl, alkynyl, cycloalkynyl, aryl, or heteroaryl group described herein and "a" is an integer of from 1 to 500. Examples of polyether groups include polyethylene oxide, polypropylene oxide, and polybutylene oxide.

The term "halide" or "halo" as used herein refers to the halogens fluorine, chlorine, bromine, and iodine.

The term "heterocyclyl," as used herein refers to single and multi-cyclic non-aromatic ring systems and "heteroaryl as used herein refers to single and multi-cyclic aromatic ring systems: in which at least one of the ring members is other than carbon. The terms includes azetidine, dioxane, furan, imidazole, isothiazole, isoxazole, morpholine, oxazole, oxazole, including, 1,2,3-oxadiazole, 1,2,5-oxadiazole and 1,3,4-oxadiazole, piperazine, piperidine, pyrazine, pyrazole, pyridazine, pyridine, pyrimidine, pyrrole, pyrrolidine, tetrahydrofuran, tetrahydropyran, tetrazine, including 1,2,4,5-tetrazine, tetrazole, including 1,2,3,4-tetrazole and 1,2,4,5-tetrazole, thiadiazole, including, 1,2,3-thiadiazole, 1,2,5-thiadiazole, and 1,3,4-thiadiazole, thiazole, thiophene, triazine, including 1,3,5-triazine and 1,2,4-triazine, triazole, including, 1,2,3-triazole, 1,3,4-triazole, and the like.

The term "hydroxyl" as used herein is represented by the formula —OH.

The term "ketone" as used herein is represented by the formula $A^1C(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "azide" as used herein is represented by the formula $—N_3$.

The term "nitro" as used herein is represented by the formula $—NO_2$.

The term "cyanide" as used herein is represented by the formula —CN.

The term "silyl" as used herein is represented by the formula $—SiA^1A^2A^3$, where $A^1$, $A^2$, and $A^3$ can be, independently, hydrogen or an alkyl, cycloalkyl, alkoxy, alkenyl, cycloalkenyl, alkynyl, cycloalkynyl, aryl, or heteroaryl group as described herein.

The term "sulfo-oxo" as used herein is represented by the formulas $—S(O)A^1$, $—S(O)_2A^1$, $—OS(O)_2A^1$, or $—OS(O)_2OA^1$, where $A^1$ can be hydrogen or an alkyl, cycloalkyl, alkenyl, cycloalkenyl, alkynyl, cycloalkynyl, aryl, or heteroaryl group as described herein.

Throughout this specification "S(O)" is a short hand notation for S=O. The term "sulfonyl" is used herein to refer to the sulfo-oxo group represented by the formula $—S(O)_2A^1$, where $A^1$ can be hydrogen or an alkyl, cycloalkyl, alkenyl, cycloalkenyl, alkynyl, cycloalkynyl, aryl, or heteroaryl group as described herein. The term "sulfone" as used herein is represented by the formula $A^1S(O)_2A^2$, where $A^1$ and $A^2$ can be, independently, an alkyl, cycloalkyl, alkenyl, cycloalkenyl, alkynyl, cycloalkynyl, aryl, or heteroaryl group as described herein. The term "sulfoxide" as used herein is represented by the formula $A^1S(O)A^2$, where $A^1$ and $A^2$ can be, independently, an alkyl, cycloalkyl, alkenyl, cycloalkenyl, alkynyl, cycloalkynyl, aryl, or heteroaryl group as described herein.

The term "thiol" as used herein is represented by the formula —SH. "$R^1$," "$R^2$," "$R^3$," "$R^n$," where n is an integer, as used herein can, independently, possess one or more of the groups listed above. For example, if $R^1$ is a straight chain alkyl group, one of the hydrogen atoms of the alkyl group can optionally be substituted with a hydroxyl group, an alkoxy group, an alkyl group, a halide, and the like. Depending upon the groups that are selected, a first group can be incorporated within second group or, alternatively, the first group can be pendant (i.e., attached) to the second group. For example, with the phrase "an alkyl group comprising an amino group," the amino group can be incorporated within the backbone of the alkyl group. Alternatively, the amino group can be attached to the backbone of the alkyl group. The nature of the group(s) that is (are) selected will determine if the first group is embedded or attached to the second group.

Compounds described herein may contain "optionally substituted" moieties. In general, the term "substituted," whether preceded by the term "optionally" or not, means that one or more hydrogens of the designated moiety are replaced with a suitable substituent. Unless otherwise indicated, an "optionally substituted" group may have a suitable substituent at each substitutable position of the group, and when more than one position in any given structure may be substituted with more than one substituent selected from a specified group, the substituent may be either the same or different at every position. Combinations of substituents envisioned by this disclosure are preferably those that result in the formation of stable or chemically feasible compounds. In is also contemplated that, in certain aspects, unless expressly indicated to the contrary, individual substituents can be further optionally substituted (i.e., further substituted or unsubstituted).

In some aspects, a structure of a compound can be represented by a formula:

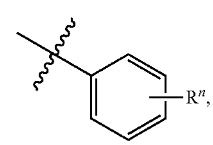

which is understood to be equivalent to a formula:

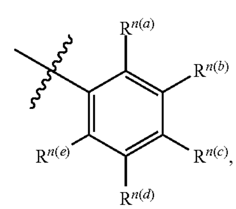

wherein n is typically an integer. That is, $R^n$ is understood to represent five independent substituents, $R^{n(a)}$, $R^{n(b)}$, $R^{n(c)}$, $R^{n(d)}$, $R^{n(e)}$. By "independent substituents," it is meant that each R substituent can be independently defined. For example, if in one instance $R^{n(a)}$ is halogen, then $R^{n(b)}$ is not necessarily halogen in that instance.

Several references to R, $R^1$, $R^2$, $R^3$, $R^4$, $R^5$, $R^6$, etc. are made in chemical structures and moieties disclosed and described herein. Any description of R, $R^1$, $R^2$, $R^3$, $R^4$, $R^5$, $R^6$, etc. in the specification is applicable to any structure or moiety reciting R, $R^1$, $R^2$, $R^3$, $R^4$, $R^5$, $R^6$, etc. respectively.

EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to be limiting in scope. Some of these synthetic examples have been performed. Others are based on an understanding of related synthetic procedures 20 and are predictive in nature. Efforts have been made to ensure accuracy with respect to numbers (e.g., amounts, temperature, etc.), but some errors and deviations should be accounted for. Unless indicated otherwise, parts are parts by weight, temperature is ° C. or is at ambient temperature, and pressure is at or near atmospheric.

Various methods for the preparation method of the compounds described herein are recited in the examples. These methods are provided to illustrate various methods of preparation, but are not intended to limit any of the methods recited herein. Accordingly, one of skill in the art in possession of this disclosure could readily modify a recited method or utilize a different method to prepare one or more of the compounds described herein. The following aspects are only exemplary and are not intended to be limiting in scope.

Temperatures, catalysts, concentrations, reactant compositions, and other process conditions can vary, and one of skill in the art, in possession of this disclosure, could readily select appropriate reactants and conditions for a desired complex.

Device Example 1

An OLED device (Device 1) having the structure ITO/HATCN/NPD/Tris-PCz/20 wt % Pd3O3:mCBP (10 nm)/6 wt % Pd3O3:mCBP (20 nm)/BAlq/BPyTP/LiF/Al was prepared, where ITO: indium tin oxide HATCN: hexaazatriphenylenehexacarbonitrile NPD: N,N'-di(1-naphthyl)-N,N'-diphenyl-(1,1'-biphenyl)-4,4'-diamine Tris-PCz:

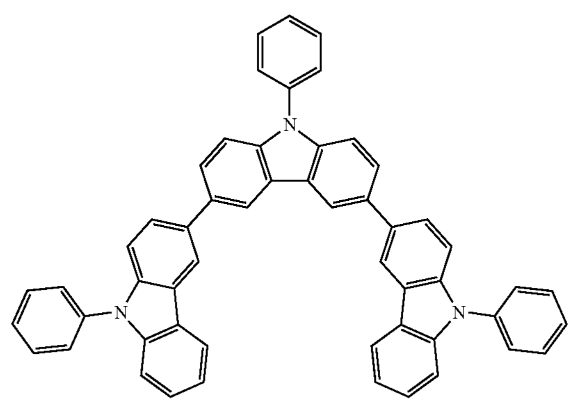 [SMILES: c1ccc(-n2c3ccccc3c3cc(-c4ccc5c(c4)c4cc(-c6ccc7c(c6)c6ccccc6n7-c6ccccc6)ccc4n5-c4ccccc4)ccc32)cc1]

Pd3O3:

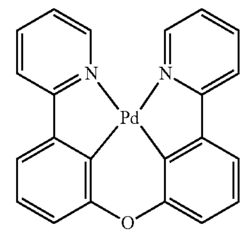

mCBP:

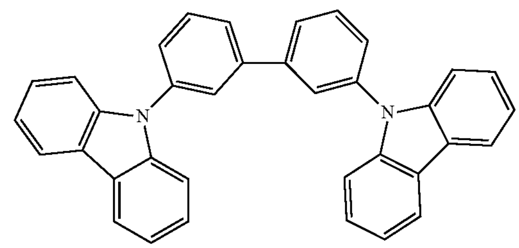 [SMILES: c1cc(-c2cccc(-n3c4ccccc4c4ccccc43)c2)cc(-n2c3ccccc3c3ccccc32)c1]

BAlq: bis(8-hydroxy-2-methylquinoline)-(4-phenylphenoxy)aluminum

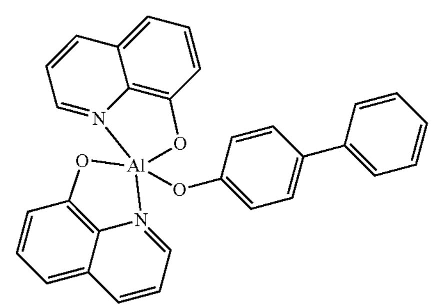

BPyTP: 2,7-di(2,2'-bipyridin-5-yl)triphenylene

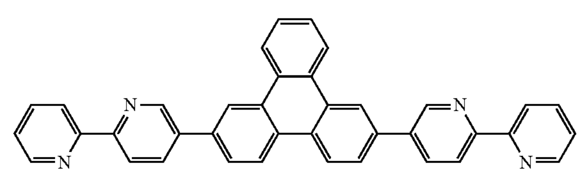 [SMILES: c1ccc(-c2ccc(-c3ccc4c5ccc(-c6ccc(-c7ccccn7)nc6)cc5c5ccccc5c4c3)cn2)nc1]

LiF: lithium fluoride

Al: aluminum

Figure 5:
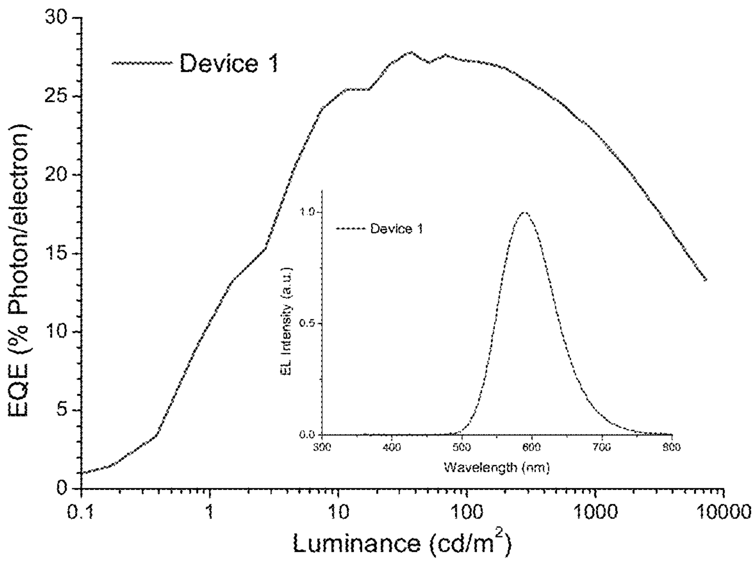
FIG. 5 shows external quantum efficiency (EQE) versus luminance and electroluminescent intensity versus wavelength for an OLED having excimers with emitting dipoles aligned with respect to a substrate.
Figure 6:
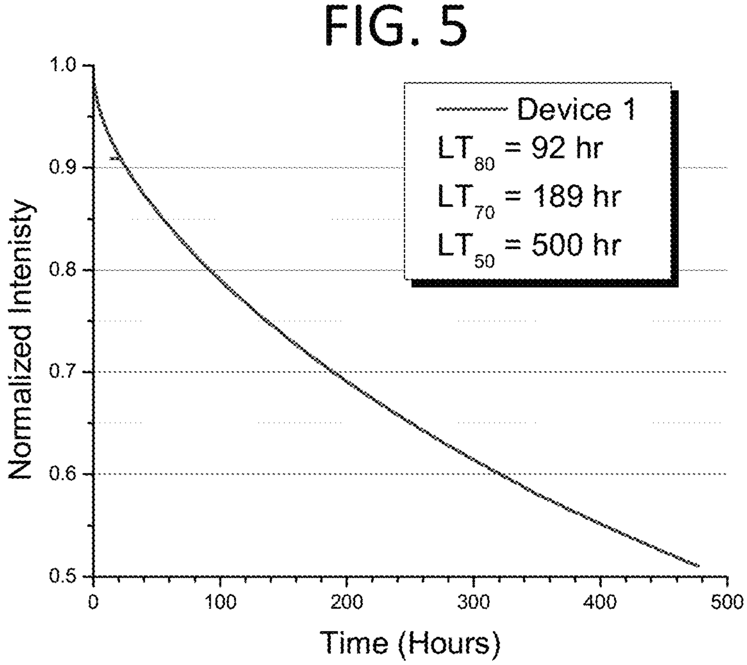
FIG. 6 shows intensity versus time for an OLED having excimers with emitting dipoles aligned with respect to a substrate.

FIG. 5 shows external quantum efficiency versus brightness and electroluminescent intensity versus wavelength for Device 1. FIG. 6 shows relative luminance versus operational time at the constant current of 20 mA/cm$^2$ for Device 1. As shown in FIG. 5, Device 1 shows improved operation stability while maintaining a high device efficiency. A device efficiency of Device 1 was over 22%, with PE of 40 lm/W at 1000 cd/m$^2$ and LT$_{50}$ of over 470 hours with the brightness of over 7000 cd/cm$^2$. Extrapolating these accelerated testing results to practical luminance of 1000 cd/m$^2$ yields LT$_{50}$ of 13,000 hrs. The peak device efficiency exceeded 28%, indicating a device out-coupling enhancement due to the alignment of the emitting dipoles of the Pd303 excimers parallel to the surface on which the emissive layer was formed. These results are consistent with the development of a stable monochromic OLED with device efficiency approaching 40% on a standard OLED structure.

Device Example 2

An OLED device (Device 2) having the structure ITO/HATCN/NPD/BCN34/Pd3O3 (15 nm)/BAlq/BPyTP/LiF/Al was prepared, where

BCN34,

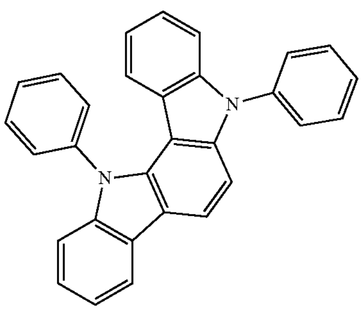 [SMILES: c1ccc(-n2c3ccccc3c3c2ccc2c4ccccc4n(-c4ccccc4)c23)cc1]

Figure 7:
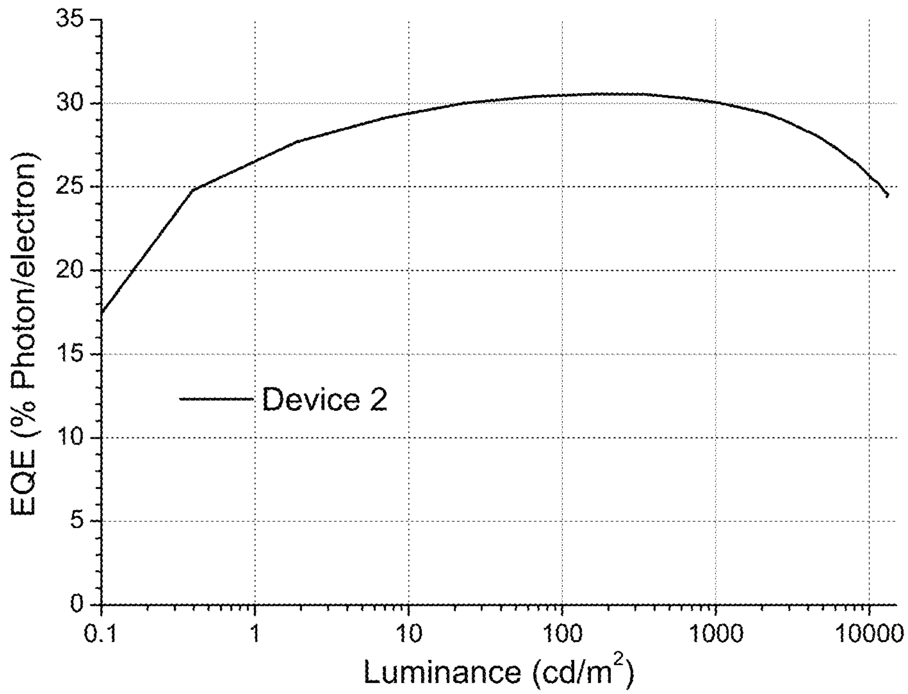
FIG. 7 shows EQE versus luminance for an OLED disclosed herein.
Figure 8:
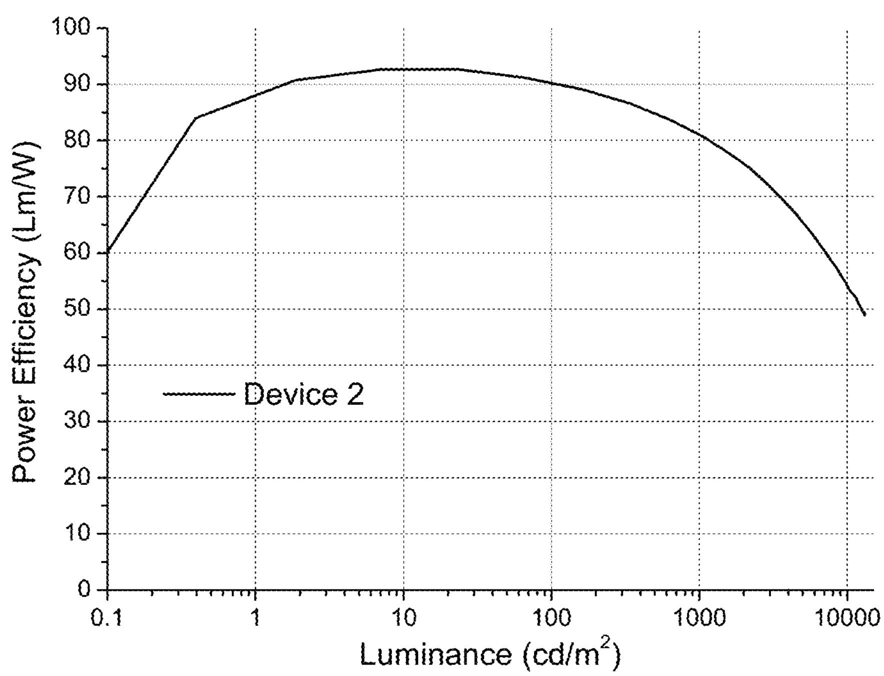
FIG. 8 shows power efficiency versus luminance an OLED disclosed herein.

FIG. 7 shows external quantum efficiency versus luminance (brightness) for Device 2. FIG. 8 shows power efficiency versus luminance for Device 2. As shown in FIG. 7, Device 2 shows improved operation stability while maintaining a high device efficiency. A device efficiency of Device 2 was over 30%, with PE of 80 lm/W at 1000 cd/m$^2$ and estimated $LT_{70}$ of over 30000 hours. The peak device efficiency exceeded 31%, also indicating a device outcoupling enhancement due to the alignment of the emitting dipoles of the Pd3O3 excimers parallel to the surface on which the emissive layer was formed. These results are consistent with the development of a stable monochromic OLED with device efficiency approaching 40% on a standard OLED structure.

General Example 1

Figure 9:
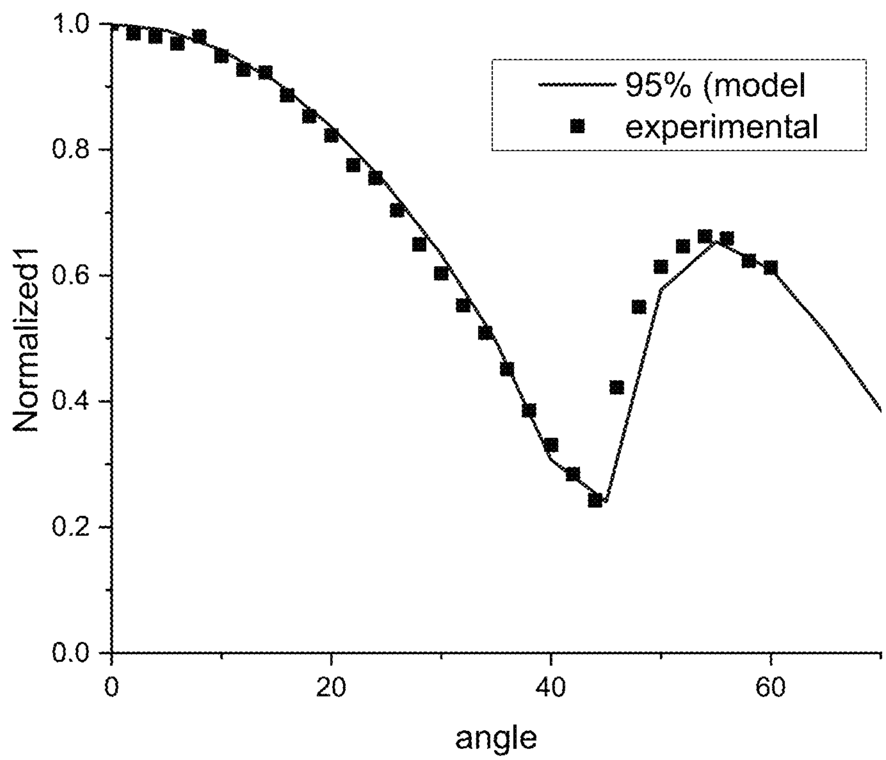
FIG. 9 shows cross sections at a wavelength of 600 nm of experimental and model data of angular-dependent p-polarized photoluminescence (PL) emission spectra (considering emission in the x-z plane) for neat films of Pd303 on glass substrates.

FIG. 9 shows cross sections at a wavelength of 600 nm of the measurements and simulations of the angular dependent p-polarized photoluminescence (PL) emission spectra (considering an emission in the x-z-plane) for films of 20 nm neat Pd3O3 film on glass substrates. The solid squares represent measured data points, and the solid curve represents simulations for around 95% horizontal orientation of the transition dipole moments for Pd3O3 excimer.

Synthetic Example 1

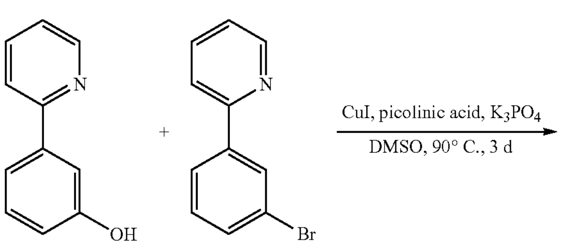

-continued

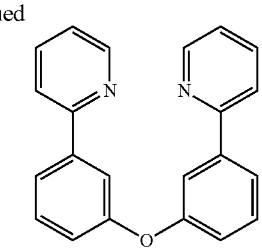

L1

2-(3-bromophenyl)pyridine (234.10 mg, 1.0 mmol, 1.0 eq), 3-(pyridin-2-yl)phenol (205.44 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L1 as a white solid in 50%-90% yield.

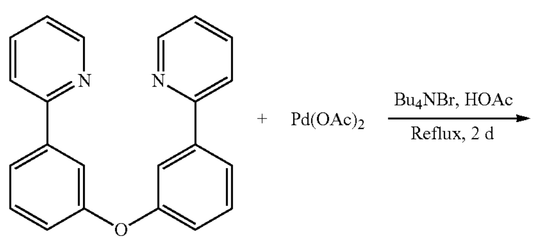

L1

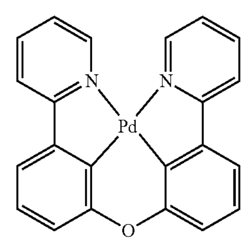

C1

L1 (64.9 mg, 0.20 mmol, 1.0 eq), $Pd(OAc)_2$ (54 mg, 0.24 mmol, 1.2 eq) and n-$Bu_4NBr$ (6.5 mg, 0.02 mmol, 0.1 eq) were added to a dry pressure tube, which was taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C1 as a white solid in 40%-80% yield.

Synthetic Example 2

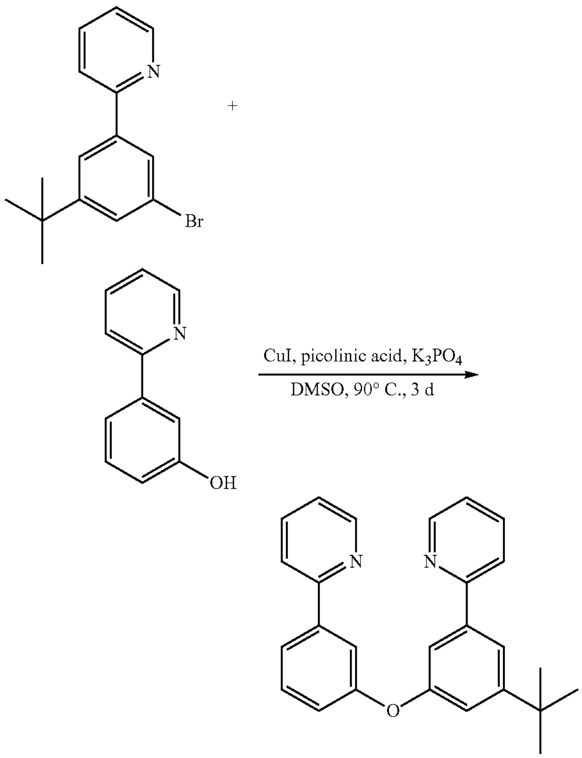

L2

2-(3-bromo-5-(tert-butyl)phenyl)pyridine (405 mg, 1.4 mmol, 1.0 eq), 3-(pyridin-2-yl)phenol (287 mg, 1.67 mmol, 1.2 eq), CuI (53 mg, 0.28 mmol, 0.2 eq), picolinic acid (34 mg, 0.28 mmol, 0.2 eq) and $K_3PO_4$ (594 mg, 2.8 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (15 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L2 as a colorless oil in 50%-90% yield.

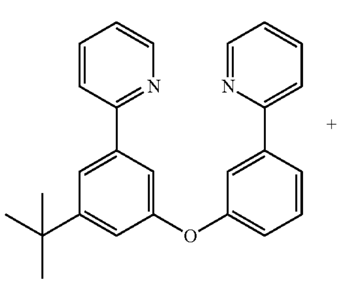

L2

-continued

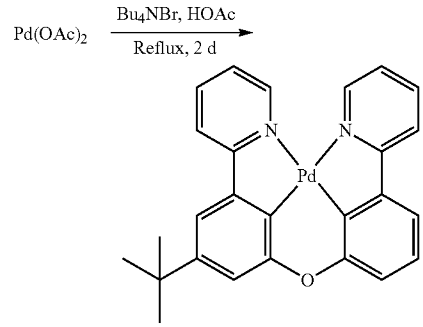

C2

L2 (405 mg, 1.06 mmol, 1.0 eq), $Pd(OAc)_2$ (286 mg, 1.27 mmol, 1.2 eq) and n-$Bu_4NBr$ (34 mg, 0.11 mmol, 0.1 eq) were added to a dry pressure tube, which was taken into a glove box and acetic acid (62 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C2 in 40%-80% yield.

Synthetic Example 3

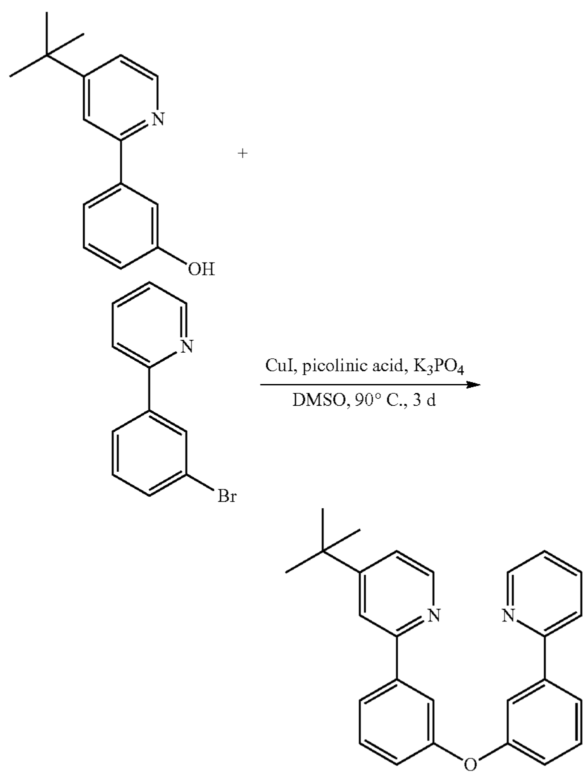

L3

3-(4-(tert-butyl)pyridin-2-yl)phenol (227 mg, 1.0 mmol, 1.0 eq), 2-(3-bromophenyl)pyridine (281 mg, 1.2 mmol, 1.2 eq), CuI (38 mg, 0.2 mmol, 0.2 eq), picolinic acid (25 mg, 0.2 mmol, 0.2 eq) and $K_3PO_4$ (424 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L3 in 50%-90% yield.

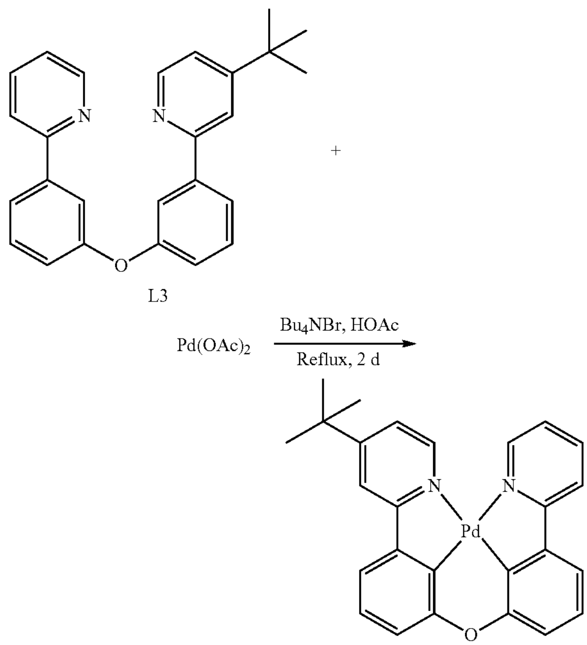

C3

L3 (405 mg, 1.06 mmol, 1.0 eq), $Pd(OAc)_2$ (286 mg, 1.27 mmol, 1.2 eq) and n-$Bu_4NBr$ (34 mg, 0.11 mmol, 0.1 eq) were added to a dry pressure tube, which was taken into a glove box and acetic acid (62 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C3 in 40%-80% yield.

Synthetic Example 4

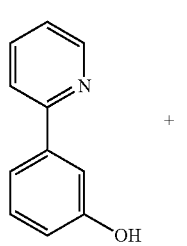

-continued

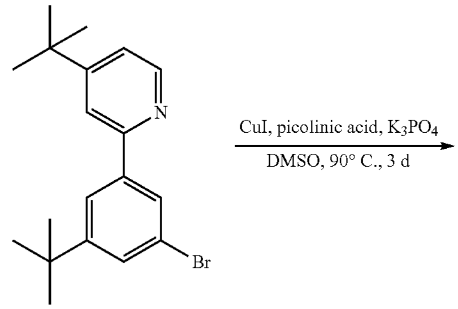

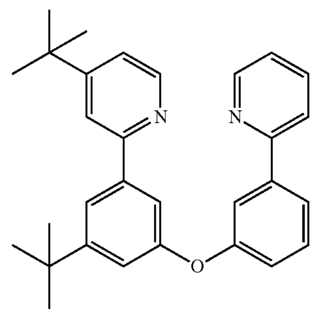

L4

3-(pyridin-2-yl)phenol (171 mg, 1.0 mmol, 1.0 eq), 2-(3-bromo-5-(tert-butyl)phenyl)-4-(tert-butyl)pyridine (415 mg, 1.2 mmol, 1.2 eq), CuI (38 mg, 0.2 mmol, 0.2 eq), picolinic acid (25 mg, 0.2 mmol, 0.2 eq) and $K_3PO_4$ (424 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L4 in 50%-90% yield.

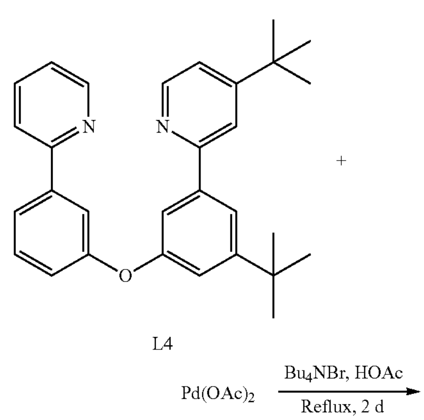

-continued

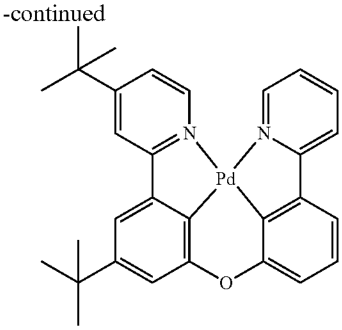

C4

L4 (436 mg, 1.0 mmol, 1.0 eq), $Pd(OAc)_2$ (269 mg, 1.2 mmol, 1.2 eq) and $n\text{-}Bu_4NBr$ (32 mg, 0.1 mmol, 0.1 eq) were added to a dry pressure tube, which was taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C4 in 40%-80% yield.

Synthetic Example 5

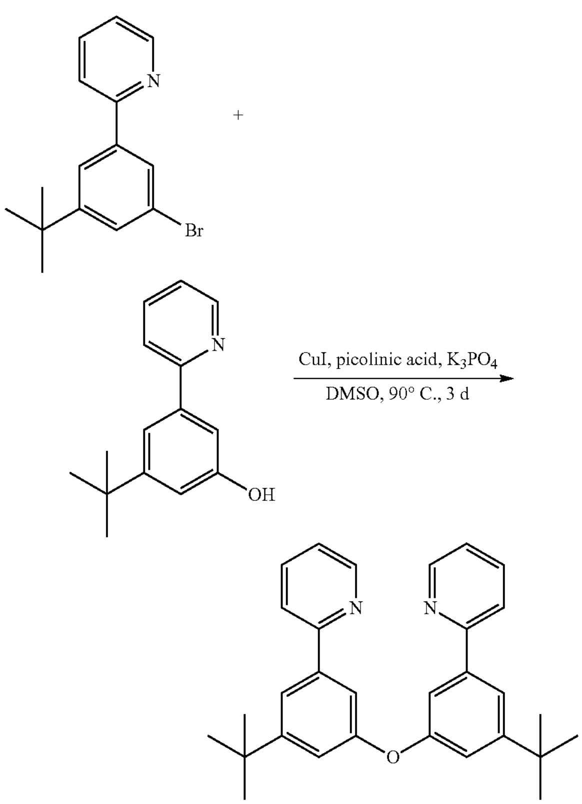

L5

2-(3-bromo-5-(tert-butyl)phenyl)pyridine (405 mg, 1.4 mmol, 1.0 eq), 3-(tert-butyl)-5-(pyridin-2-yl)phenol (379 mg, 1.67 mmol, 1.2 eq), CuI (53 mg, 0.28 mmol, 0.2 eq), picolinic acid (34 mg, 0.28 mmol, 0.2 eq) and $K_3PO_4$ (594 mg, 2.8 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (15 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L5 as a colorless oil in 50%-90% yield.

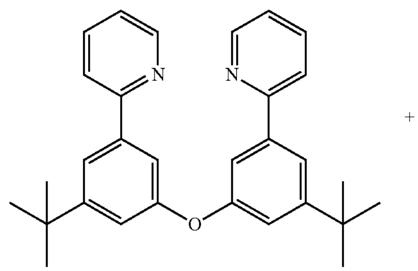

L5

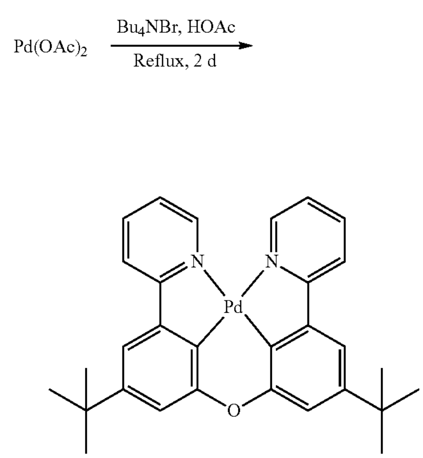

C5

L5 (437 mg, 1.0 mmol, 1.0 eq), $Pd(OAc)_2$ (269 mg, 1.2 mmol, 1.2 eq) and $n\text{-}Bu_4NBr$ (32 mg, 0.10 mmol, 0.1 eq) were added to a dry pressure tube, which was taken into a glove box and acetic acid (62 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C5 in 40%-80% yield.

Synthetic Example 6

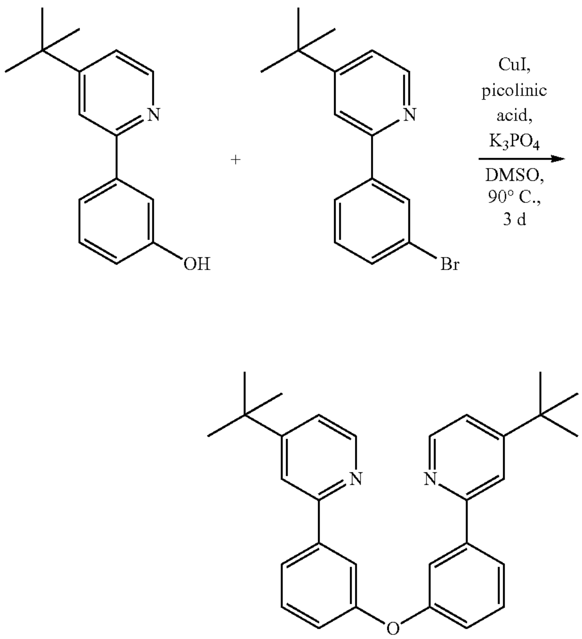

L6

3-(4-(tert-butyl)pyridin-2-yl)phenol (227 mg, 1.0 mmol, 1.0 eq), 2-(3-bromophenyl)-4-(tert-butyl)pyridine (348 mg, 1.2 mmol, 1.2 eq), CuI (38 mg, 0.2 mmol, 0.2 eq), picolinic acid (25 mg, 0.2 mmol, 0.2 eq) and $K_3PO_4$ (424 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L6 in 50%-90% yield.

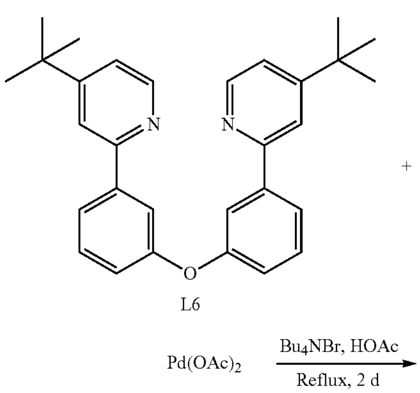

-continued

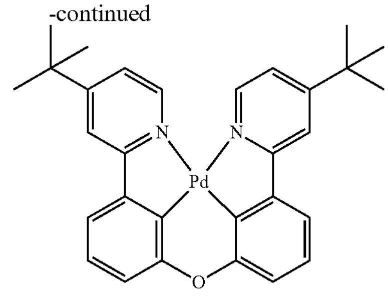

C6

L6 (405 mg, 1.06 mmol, 1.0 eq), $Pd(OAc)_2$ (286 mg, 1.27 mmol, 1.2 eq) and n-$Bu_4NBr$ (34 mg, 0.11 mmol, 0.1 eq) were added to a dry pressure tube, which was taken into a glove box and acetic acid (62 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C6 in 40%-80% yield.

Synthetic Example 7

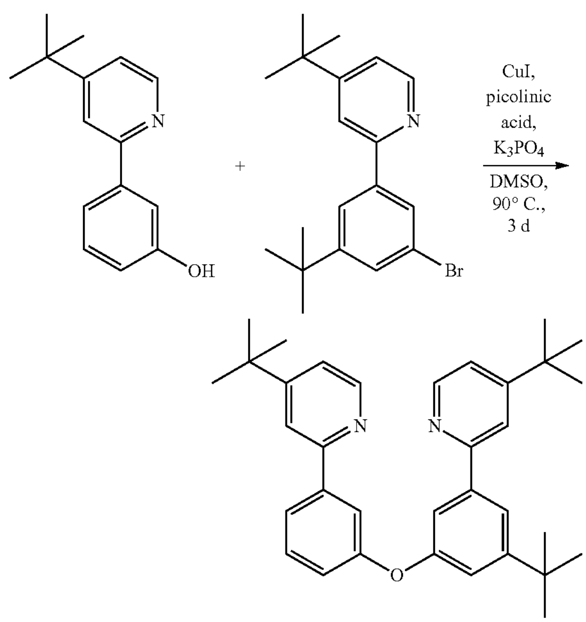

L7

2-(3-bromo-5-(tert-butyl)phenyl)-4-(tert-butyl)pyridine (150 mg, 0.43 mmol, 1.0 eq), 3-(4-(tert-butyl)pyridin-2-yl)phenol (118 mg, 0.52 mmol, 1.2 eq), CuI (16 mg, 0.09 mmol, 0.2 eq), picolinic acid (11 mg, 0.09 mmol, 0.2 eq) and $K_3PO_4$ (183 mg, 0.86 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (5 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L7 as a colorless oil in 50%-90% yield.

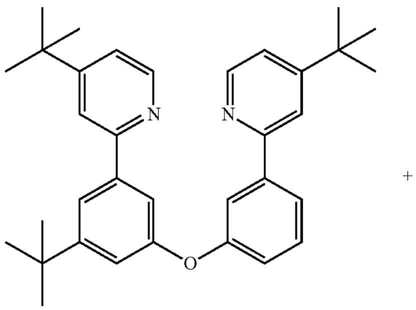

L7

Pd(OAc)$_2$ —Bu$_4$NBr, HOAc / Reflux, 2 d→

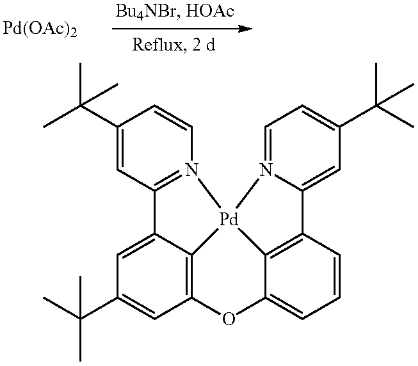

C7

L7 (141 mg, 0.29 mmol, 1.0 eq), Pd(OAc)$_2$ (77 mg, 0.34 mmol, 1.2 eq) and n-Bu$_4$NBr (9 mg, 0.03 mmol, 0.1 eq) were added to a dry pressure tube, which was taken into a glove box and acetic acid (18 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C7 in 40%-80% yield.

Synthetic Example 8

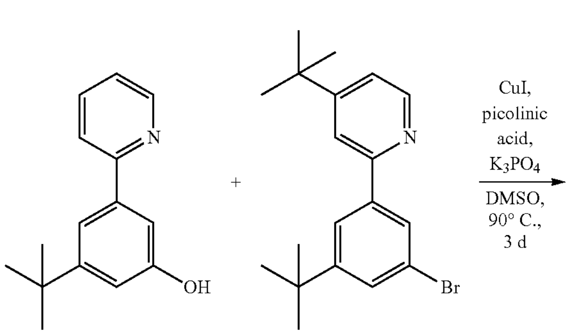

-continued

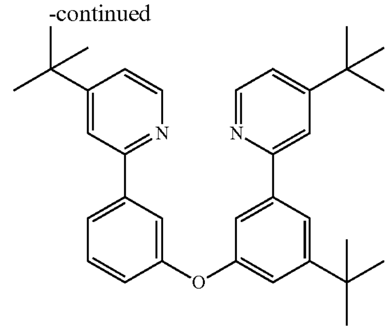

L8

2-(3-bromo-5-(tert-butyl)phenyl)-4-(tert-butyl)pyridine (150 mg, 0.43 mmol, 1.0 eq), 3-(tert-butyl)-5-(pyridin-2-yl)phenol (118 mg, 0.52 mmol, 1.2 eq), CuI (16 mg, 0.09 mmol, 0.2 eq), picolinic acid (I1 mg, 0.09 mmol, 0.2 eq) and $K_3PO_4$ (183 mg, 0.86 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (5 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L8 in 50%-90% yield.

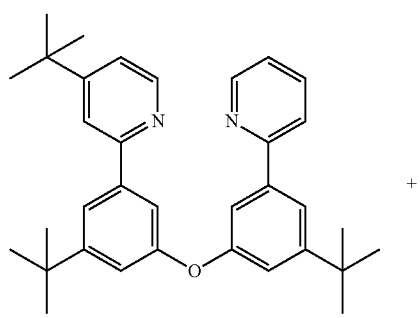

L8

Pd(OAc)$_2$ —Bu$_4$NBr, HOAc / Reflux, 2 d→

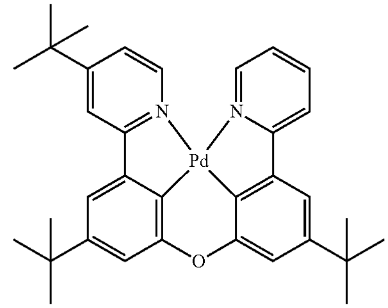

C8

L8 (141 mg, 0.29 mmol, 1.0 eq), Pd(OAc)$_2$ (77 mg, 0.34 mmol, 1.2 eq) and n-Bu$_4$NBr (9 mg, 0.03 mmol, 0.1 eq)

were added to a dry pressure tube, which was taken into a glove box and acetic acid (18 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C8 in 40%-80% yield.

Synthetic Example 9

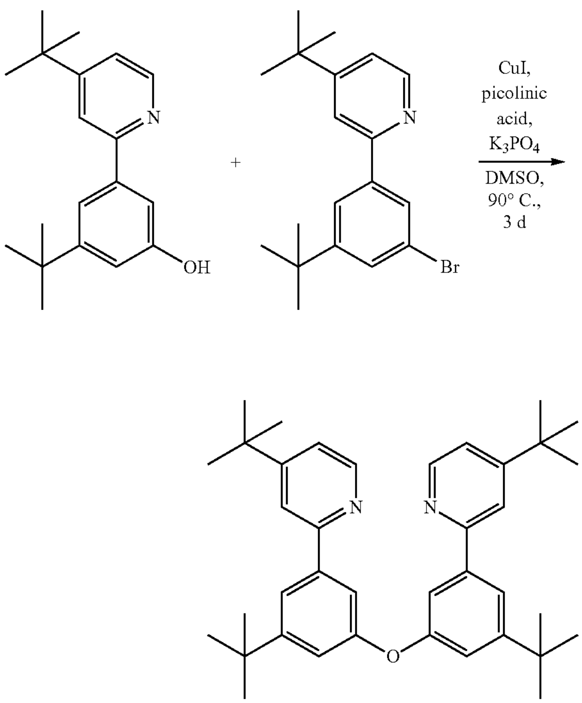

L9

3-(tert-butyl)-5-(4-(tert-butyl)pyridin-2-yl)phenol (283 mg, 1 mmol, 1.0 eq), 2-(3-bromo-5-(tert-butyl)phenyl)-4-(tert-butyl)pyridine (415 mg, 1.2 mmol, 1.2 eq). CuI (38 mg, 0.2 mmol, 0.2 eq), picolinic acid (25 mg, 0.2 mmol, 0.2 eq) and $K_3PO_4$ (424 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L9 in 50%-90% yield.

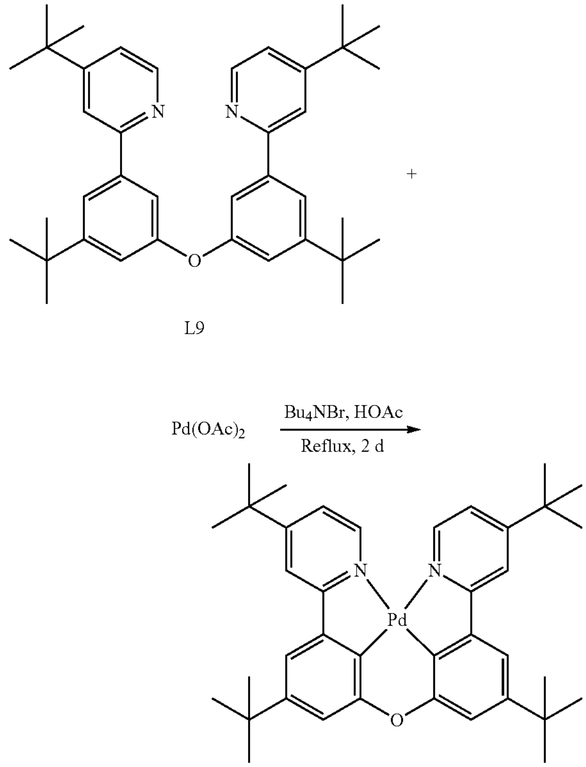

C9

L9 (159 mg, 0.29 mmol, 1.0 eq), $Pd(OAc)_2$ (77 mg, 0.34 mmol, 1.2 eq) and n-$Bu_4NBr$ (9 mg, 0.03 mmol, 0.1 eq) were added to a dry pressure tube, which was taken into a glove box and acetic acid (18 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C9 in 40%-80% yield.

Synthetic Example 10

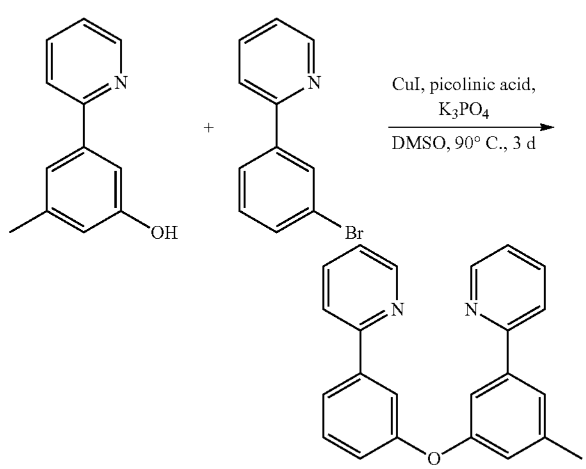

L10

3-methyl-5-(pyridin-2-yl)phenol (300 mg, 1.62 mmol, 1.0 eq), 24(3-bromophenyl)pyridine (450 mg, 1.94 mmol, 1.2 eq), CuI (62 mg, 0.32 mmol, 0.2 eq), picolinic acid (40 mg, 0.32 mmol, 0.2 eq) and $K_3PO_4$ (688 mg, 3.24 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (18 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L10 in 50%-95% yield.

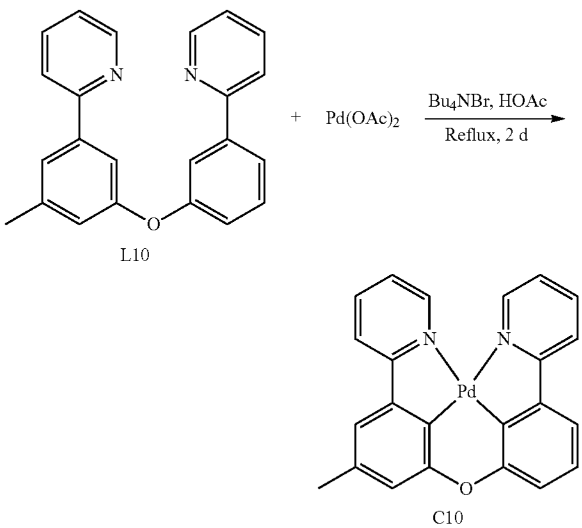

L10 (450 mg, 1.33 mmol, 1.0 eq), $Pd(OAc)_2$ (358 mg, 1.6 mmol, 1.2 eq) and n-$Bu_4NBr$ (43 mg, 0.133 mmol, 0.1 eq) were added to a dry pressure tube, which was taken into a glove box and acetic acid (83 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C10 in 40%-80% yield.

Synthetic Example 11

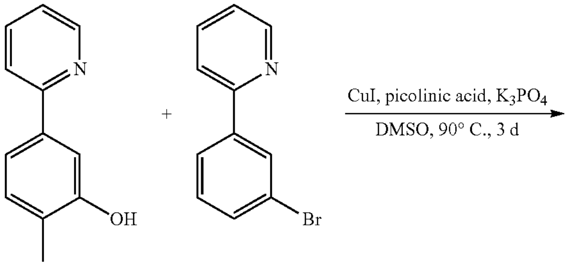

-continued

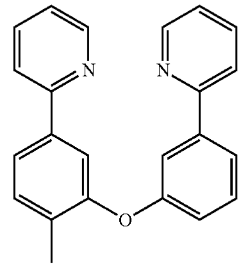

L11

2-methyl-5-(pyridin-2-yl)phenol (300 mg, 1.62 mmol, 1.0 eq), 24(3-bromophenyl)pyridine (450 mg, 1.94 mmol, 1.2 eq), CuI (62 mg, 0.32 mmol, 0.2 eq), picolinic acid (40 mg, 0.32 mmol, 0.2 eq) and $K_3PO_4$ (688 mg, 3.24 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (18 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L11 in 50%-97% yield.

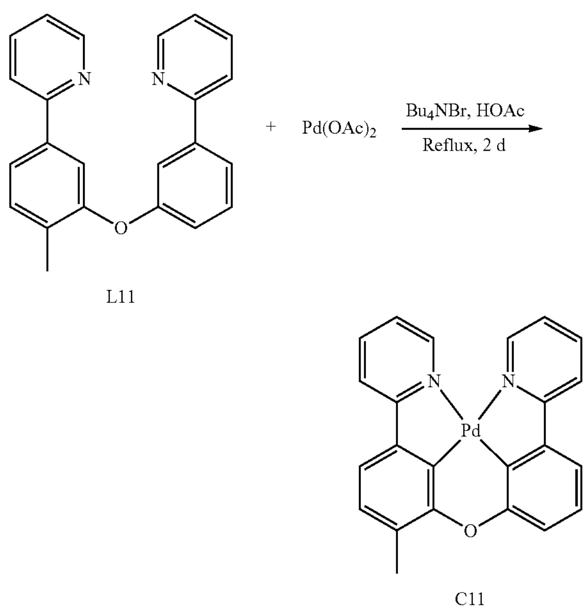

L11 (480 mg, 1.42 mmol, 1.0 eq), $Pd(OAc)_2$ (381 mg, 1.7 mmol, 1.2 eq) and n-$Bu_4NBr$ (43 mg, 0.133 mmol, 0.1 eq) were added to a dry pressure tube, which was taken into a glove box and acetic acid (83 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C11 in 40%-90% yield.

Synthetic Example 12

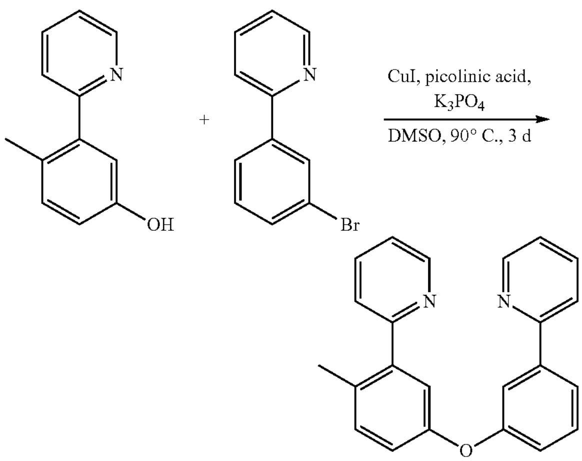

L12

4-methyl-3-(pyridin-2-yl)phenol (300 mg, 1.62 mmol, 1.0 eq), 2-(3-bromophenyl)pyridine (450 mg, 1.94 mmol, 1.2 eq), CuI (62 mg, 0.32 mmol, 0.2 eq), picolinic acid (40 mg, 0.32 mmol, 0.2 eq) and $K_3PO_4$ (688 mg, 3.24 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (18 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L12 in 60%-95% yield.

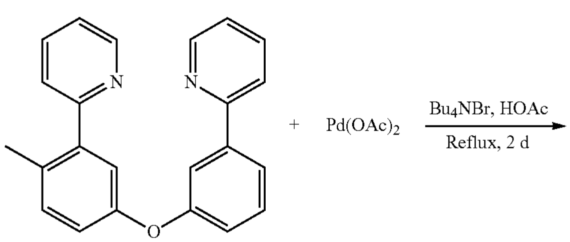

L12

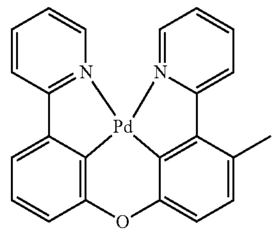

C12

L12 (480 mg, 1.42 mmol, 1.0 eq), $Pd(OAc)_2$ (381 mg, 1.7 mmol, 1.2 eq) and n-$Bu_4NBr$ (43 mg, 0.133 mmol, 0.1 eq) were added to a dry pressure tube, which was taken into a glove box and acetic acid (83 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C12 in 60%-90% yield.

Synthetic Example 13

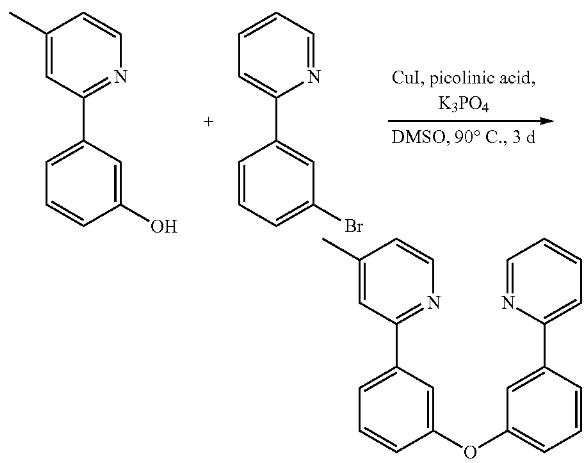

L13

3-(4-methylpyridin-2-yl)phenol (300 mg, 1.62 mmol, 1.0 eq), 2-(3-bromophenyl)pyridine (450 mg, 1.94 mmol, 1.2 eq), CuI (62 mg, 0.32 mmol, 0.2 eq), picolinic acid (40 mg, 0.32 mmol, 0.2 eq) and $K_3PO_4$ (688 mg, 3.24 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (18 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L13 in 60%-95% yield.

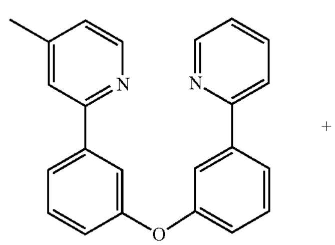

L13

-continued

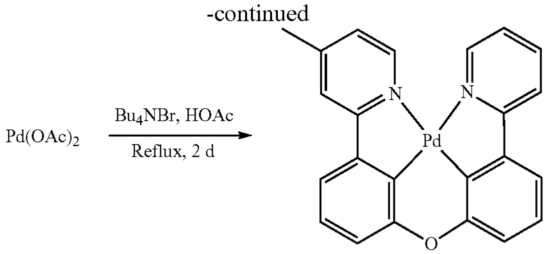

C13

L13 (480 mg, 1.42 mmol, 1.0 eq), $Pd(OAc)_2$ (381 mg, 1.7 mmol, 1.2 eq) and n-$Bu_4NBr$ (43 mg, 0.133 mmol, 0.1 eq) were added to a dry pressure tube, which was taken into a glove box and acetic acid (83 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C13 in 60%-90% yield.

Synthetic Example 14

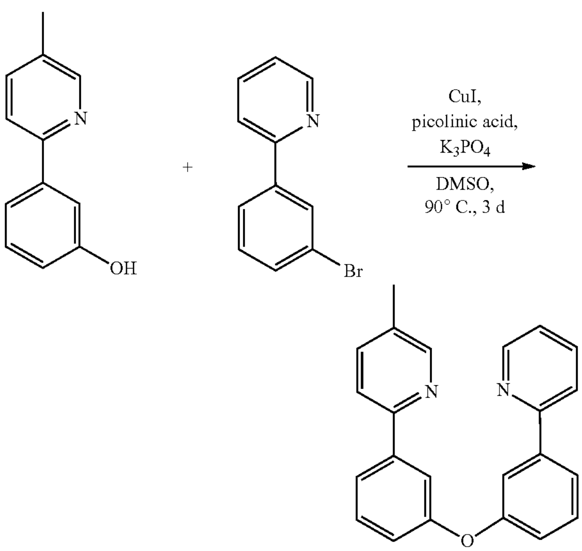

L14

3-(5-methylpyridin-2-yl)phenol (300 mg, 1.62 mmol, 1.0 eq), 2-(3-bromophenyl)pyridine (450 mg, 1.94 mmol, 1.2 eq), CuI (62 mg, 0.32 mmol, 0.2 eq), picolinic acid (40 mg, 0.32 mmol, 0.2 eq) and $K_3PO_4$ (688 mg, 3.24 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (18 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L14 in 60%-95% yield.

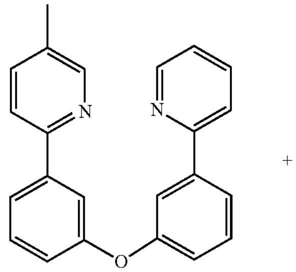

L14

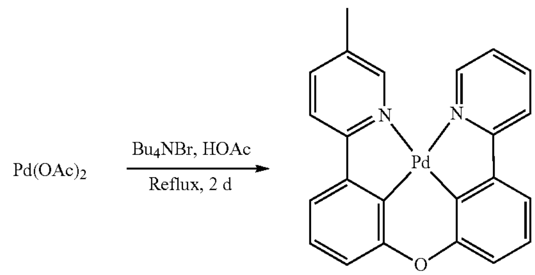

C14

L14 (480 mg, 1.42 mmol, 1.0 eq), $Pd(OAc)_2$ (381 mg, 1.7 mmol, 1.2 eq) and n-$Bu_4NBr$ (43 mg, 0.133 mmol, 0.1 eq) were added to a dry pressure tube, which was taken into a glove box and acetic acid (83 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C14 in 60%-90% yield.

Synthetic Example 15

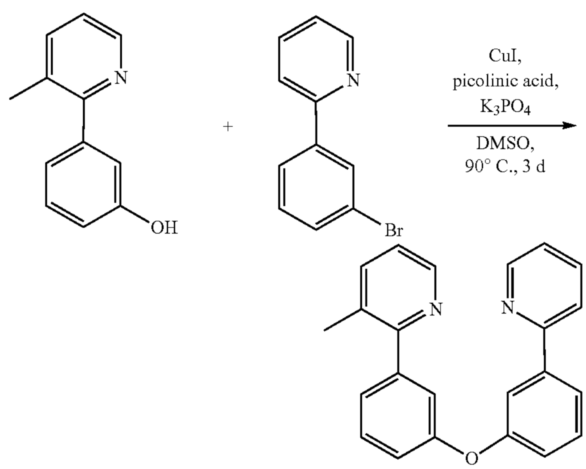

L15

3-(3-methylpyridin-2-yl)phenol (300 mg, 1.62 mmol, 1.0 eq), 2-(3-bromophenyl)pyridine (450 mg, 1.94 mmol, 1.2 eq), CuI (62 mg, 0.32 mmol, 0.2 eq), picolinic acid (40 mg, 0.32 mmol, 0.2 eq) and $K_3PO_4$ (688 mg, 3.24 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (18 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L15 in 60%-95% yield.

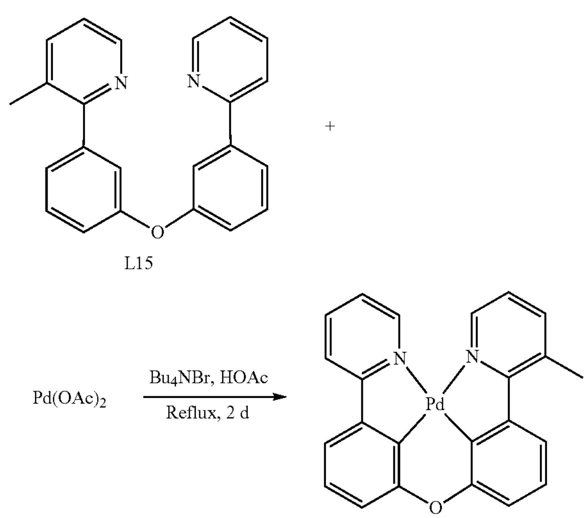

L15

C15

L15 (480 mg, 1.42 mmol, 1.0 eq), $Pd(OAc)_2$ (381 mg, 1.7 mmol, 1.2 eq) and n-$Bu_4NBr$ (43 mg, 0.133 mmol, 0.1 eq) were added to a dry pressure tube, which was taken into a glove box and acetic acid (83 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C15 in 60%-90% yield.

Synthetic Example 16

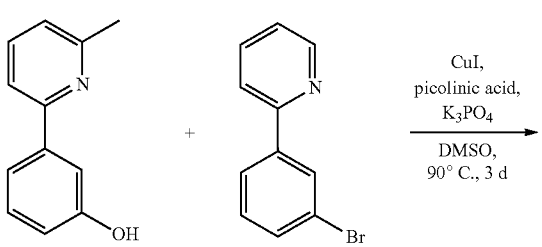

-continued

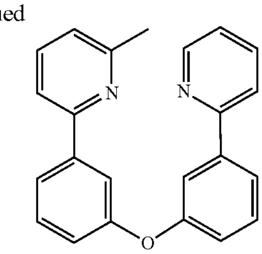

L16

3-(6-methylpyridin-2-yl)phenol (300 mg, 1.62 mmol, 1.0 eq), 2-(3-bromophenyl)pyridine (450 mg, 1.94 mmol, 1.2 eq), CuI (62 mg, 0.32 mmol, 0.2 eq), picolinic acid (40 mg, 0.32 mmol, 0.2 eq) and $K_3PO_4$ (688 mg, 3.24 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (18 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L16 in 60%-95% yield.

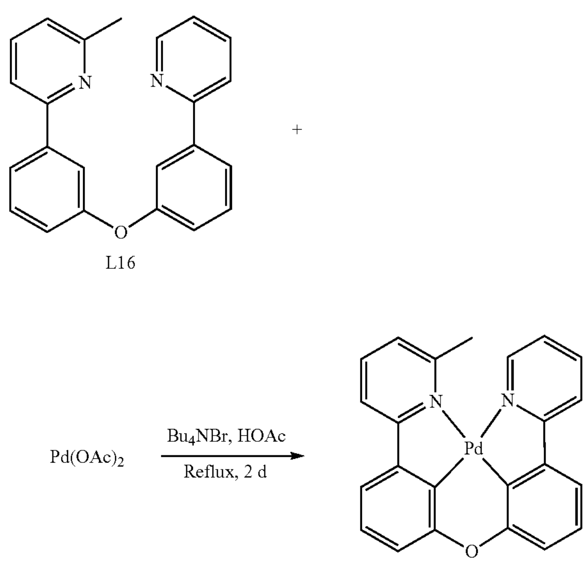

L16

C16

L16 (480 mg, 1.42 mmol, 1.0 eq), $Pd(OAc)_2$ (381 mg, 1.7 mmol, 1.2 eq) and n-$Bu_4NBr$ (43 mg, 0.133 mmol, 0.1 eq) were added to a dry pressure tube, which was taken into a glove box and acetic acid (83 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C16 in 60%-90% yield.

Synthetic Example 17

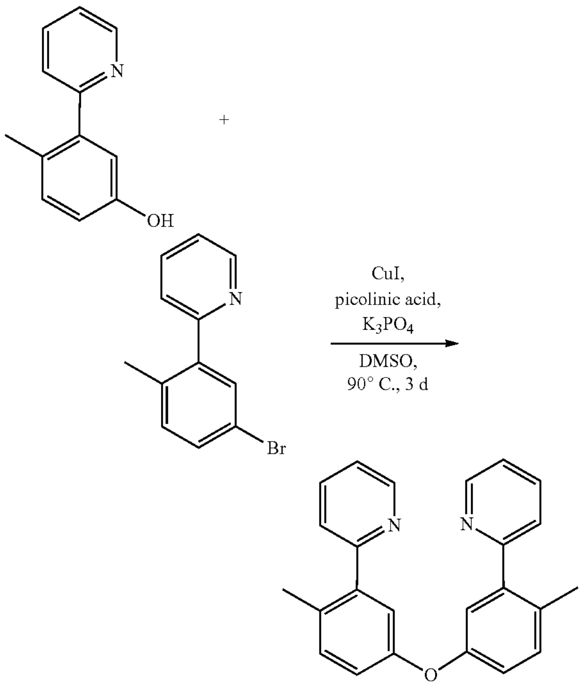

L17

4-methyl-3-(pyridin-2-yl)phenol (300 mg, 1.62 mmol, 1.0 eq), (4-bromo-2-(pyridin-2-yl)phenyl)methylium (481 mg, 1.94 mmol, 1.2 eq), CuI (62 mg, 0.32 mmol, 0.2 eq), picolinic acid (40 mg, 0.32 mmol, 0.2 eq) and $K_3PO_4$ (688 mg, 3.24 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (18 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L17 in 60%-95% yield.

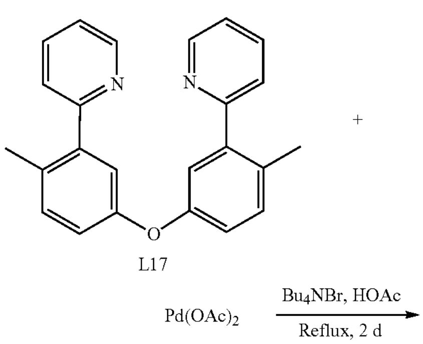

-continued

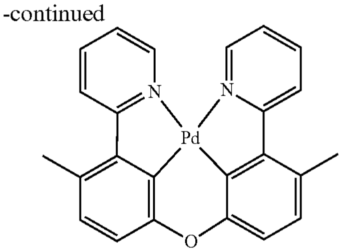

C17

L17 (498 mg, 1.42 mmol, 1.0 eq), $Pd(OAc)_2$ (381 mg, 1.7 mmol, 1.2 eq) and n-$Bu_4NBr$ (43 mg, 0.133 mmol, 0.1 eq) were added to a dry pressure tube, which was taken into a glove box and acetic acid (83 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C17 in 60%-90% yield.

Synthetic Example 18

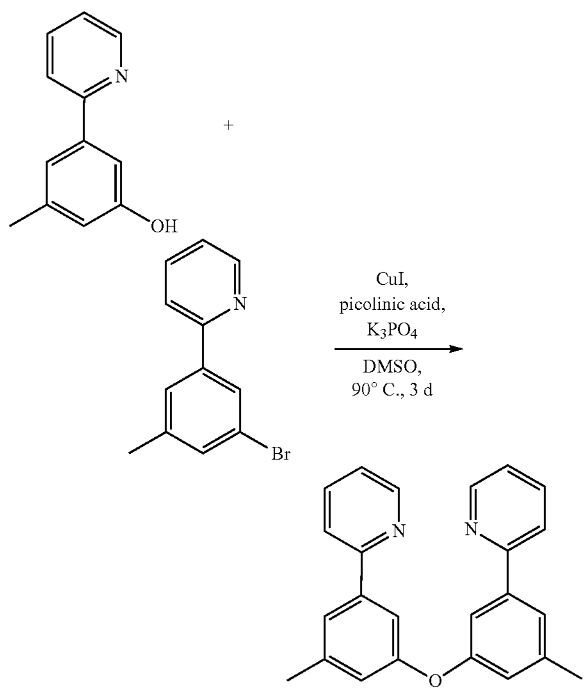

L18

3-methyl-5-(pyridin-2-yl)phenol (300 mg, 1.62 mmol, 1.0 eq), 2-(3-bromo-5-methylphenyl)pyridine (481 mg, 1.94 mmol, 1.2 eq), CuI (62 mg, 0.32 mmol, 0.2 eq), picolinic acid (40 mg, 0.32 mmol, 0.2 eq) and $K_3PO_4$ (688 mg, 3.24 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (18 mL) was added under the protection of nitrogen. The mixture was stirred in an oil bath at a temperature of 90°

C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L18 in 60%-95% yield.

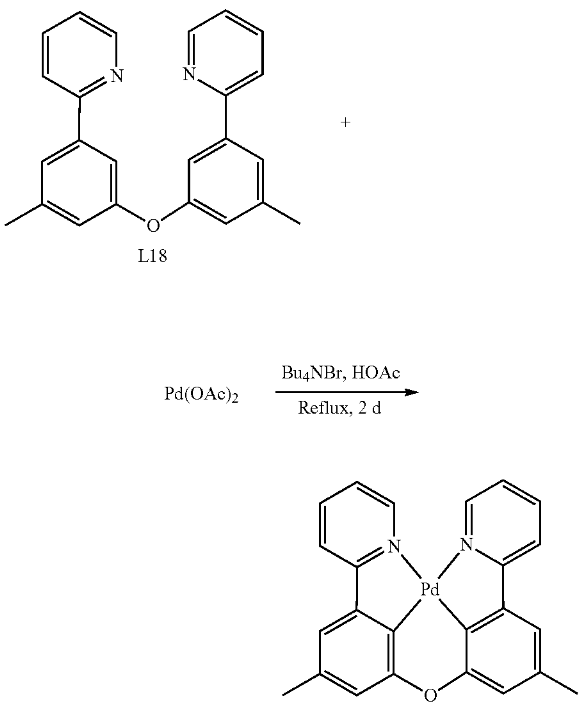

L18

C18

L18 (498 mg, 1.42 mmol, 1.0 eq), $Pd(OAc)_2$ (381 mg, 1.7 mmol, 1.2 eq) and n-$Bu_4NBr$ (43 mg, 0.133 mmol, 0.1 eq) were added to a dry pressure tube, which was taken into a glove box and acetic acid (83 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C18 in 60%-90% yield.

Synthetic Example 19

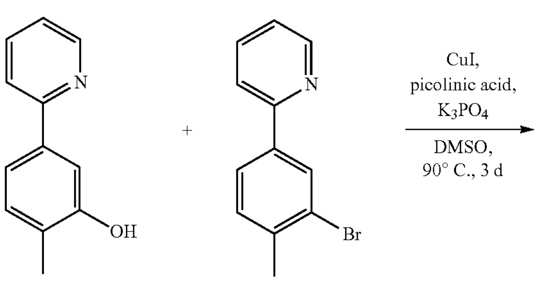

-continued

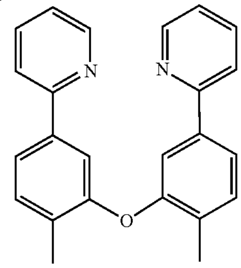

L19

2-methyl-5-(pyridin-2-yl)phenol (300 mg, 1.62 mmol, 1.0 eq), 2-(3-bromo-4-methylphenyl)pyridine (481 mg, 1.94 mmol, 1.2 eq), CuI (62 mg, 0.32 mmol, 0.2 eq), picolinic acid (40 mg, 0.32 mmol, 0.2 eq) and $K_3PO_4$ (688 mg, 3.24 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (18 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L19 in 60%-95% yield.

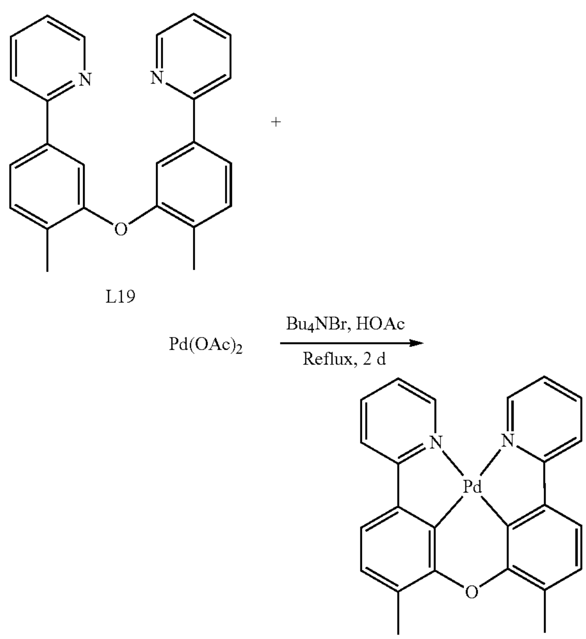

L19

C19

L19 (498 mg, 1.42 mmol, 1.0 eq), $Pd(OAc)_2$ (381 mg, 1.7 mmol, 1.2 eq) and n-$Bu_4NBr$ (43 mg, 0.133 mmol, 0.1 eq) were added to a dry pressure tube, which was taken into a glove box and acetic acid (83 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C19 in 60%-90% yield.

Synthetic Example 20

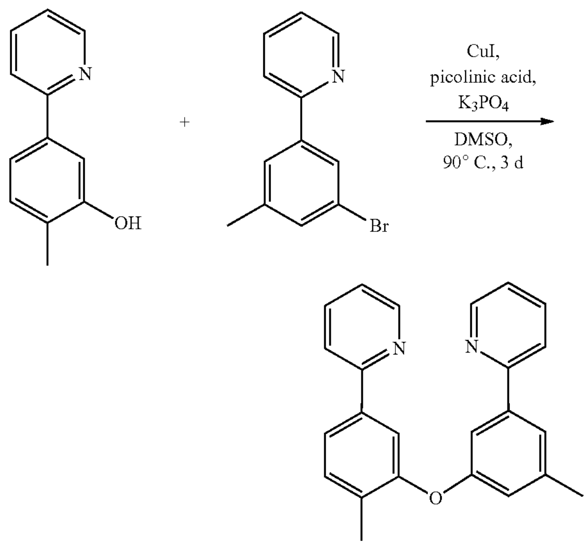

L20

2-methyl-5-(pyridin-2-yl)phenol (300 mg, 1.62 mmol, 1.0 eq), 2-(3-bromo-5-methylphenyl)pyridine (481 mg, 1.94 mmol, 1.2 eq), CuI (62 mg, 0.32 mmol, 0.2 eq), picolinic acid (40 mg, 0.32 mmol, 0.2 eq) and $K_3PO_4$ (688 mg, 3.24 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (18 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L20 in 60%-95% yield.

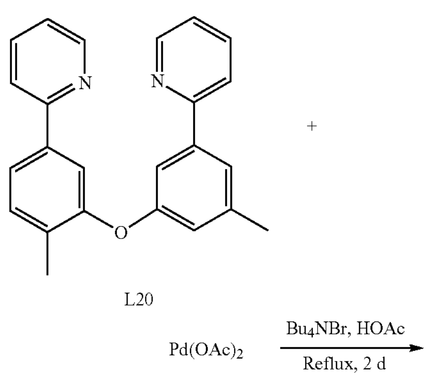

-continued

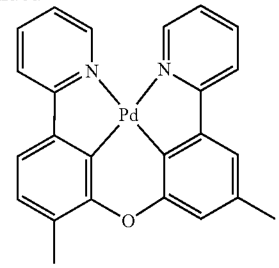

C20

L20 (498 mg, 1.42 mmol, 1.0 eq), $Pd(OAc)_2$ (381 mg, 1.7 mmol, 1.2 eq) and n-$Bu_4NBr$ (43 mg, 0.133 mmol, 0.1 eq) were added to a dry pressure tube, which was taken into a glove box and acetic acid (83 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C20 in 60%-90% yield.

Synthetic Example 21

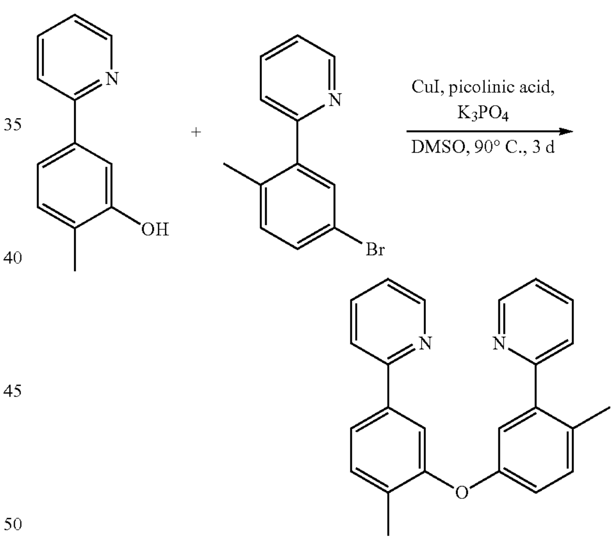

L21

2-methyl-5-(pyridin-2-yl)phenol (300 mg, 1.62 mmol, 1.0 eq), (4-bromo-2-(pyridin-2-yl)phenyl)methylium (481 mg, 1.94 mmol, 1.2 eq), CuI (62 mg, 0.32 mmol, 0.2 eq), picolinic acid (40 mg, 0.32 mmol, 0.2 eq) and $K_3PO_4$ (688 mg, 3.24 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (18 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L21 in 60%-95% yield.

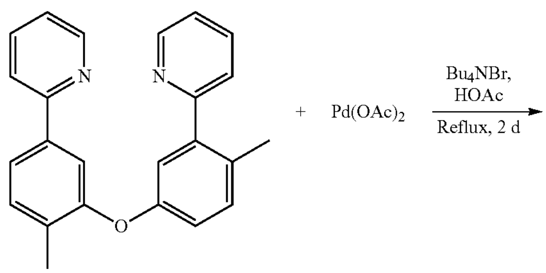

L21

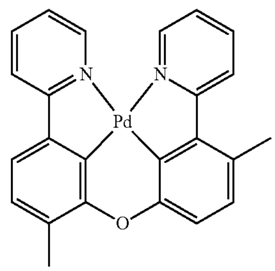

C21

L21 (498 mg, 1.42 mmol, 1.0 eq), $Pd(OAc)_2$ (381 mg, 1.7 mmol, 1.2 eq) and n-$Bu_4NBr$ (43 mg, 0.133 mmol, 0.1 eq) were added to a dry pressure tube, which was taken into a glove box and acetic acid (83 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C21 in 60%-90% yield.

Synthetic Example 22

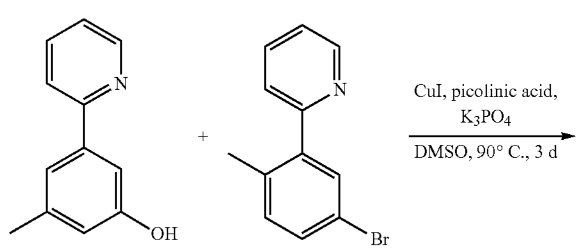

L22

3-methyl-5-(pyridin-2-yl)phenol (300 mg, 1.62 mmol, 1.0 eq), (4-bromo-2-(pyridin-2-yl)phenyl)methylium (481 mg, 1.94 mmol, 1.2 eq), CuI (62 mg, 0.32 mmol, 0.2 eq), picolinic acid (40 mg, 0.32 mmol, 0.2 eq) and $K_3PO_4$ (688 mg, 3.24 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (18 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L22 in 60%-95% yield.

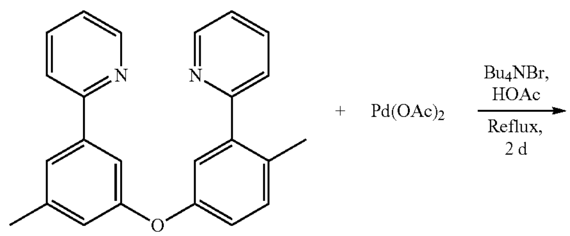

L22

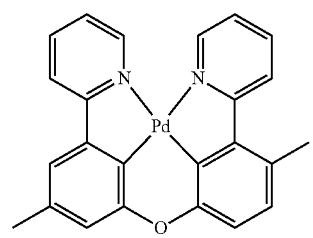

C22

L22 (498 mg, 1.42 mmol, 1.0 eq), $Pd(OAc)_2$ (381 mg, 1.7 mmol, 1.2 eq) and n-$Bu_4NBr$ (43 mg, 0.133 mmol, 0.1 eq) were added to a dry pressure tube, which was taken into a glove box and acetic acid (83 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C22 in 60%-90% yield.

Synthetic Example 23

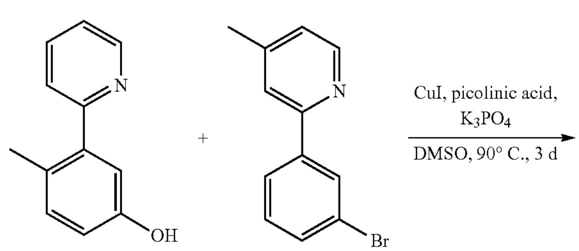

-continued

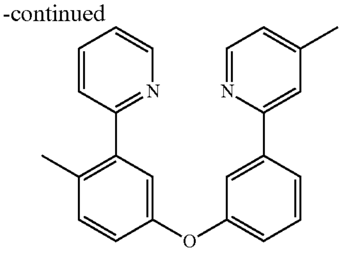

L23

4-methyl-3-(pyridin-2-yl)phenol (300 mg, 1.62 mmol, 1.0 eq), 2-(3-bromophenyl)-4-methylpyridine (481 mg, 1.94 mmol, 1.2 eq), CuI (62 mg, 0.32 mmol, 0.2 eq), picolinic acid (40 mg, 0.32 mmol, 0.2 eq) and $K_3PO_4$ (688 mg, 3.24 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (18 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L23 in 60%-95% yield.

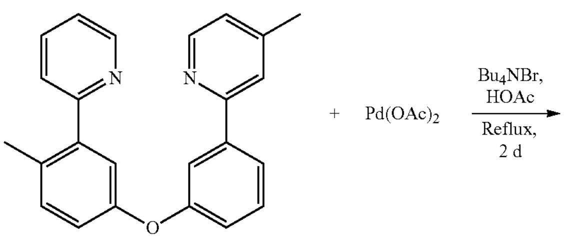

L23

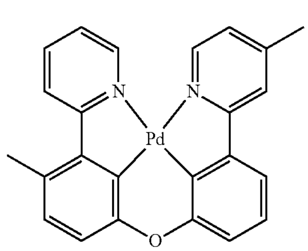

C23

L23 (498 mg, 1.42 mmol, 1.0 eq), $Pd(OAc)_2$ (381 mg, 1.7 mmol, 1.2 eq) and n-$Bu_4NBr$ (43 mg, 0.133 mmol, 0.1 eq) were added to a dry pressure tube, which was taken into a glove box and acetic acid (83 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C23 in 60%-90% yield.

Synthetic Example 24

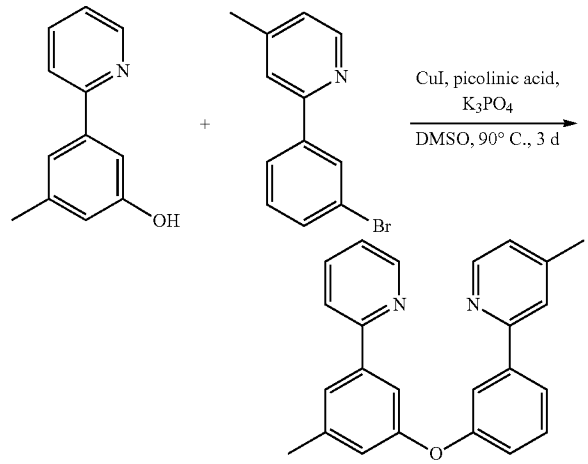

L24

3-methyl-5-pyridin-2-yl)phenol (300 mg, 1.62 mmol, 1.0 eq), 2-(3-bromophenyl)-4-methylpyridine (481 mg, 1.94 mmol, 1.2 eq), CuI (62 mg, 0.32 mmol, 0.2 eq), picolinic acid (40 mg, 0.32 mmol, 0.2 eq) and $K_3PO_4$ (688 mg, 3.24 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (18 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L24 in 60%-95% yield.

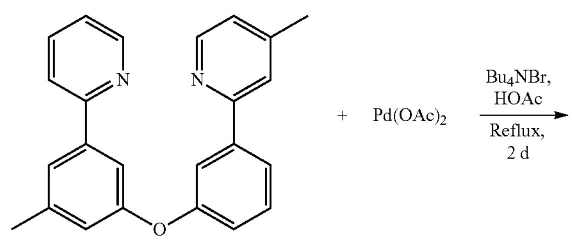

L24

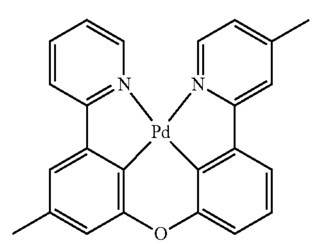

C24

L24 (498 mg, 1.42 mmol, 1.0 eq), $Pd(OAc)_2$ (381 mg, 1.7 mmol, 1.2 eq) and n-$Bu_4NBr$ (43 mg, 0.133 mmol, 0.1 eq)

were added to a dry pressure tube, which was taken into a glove box and acetic acid (83 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C24 in 60%-90% yield.

Synthetic Example 25

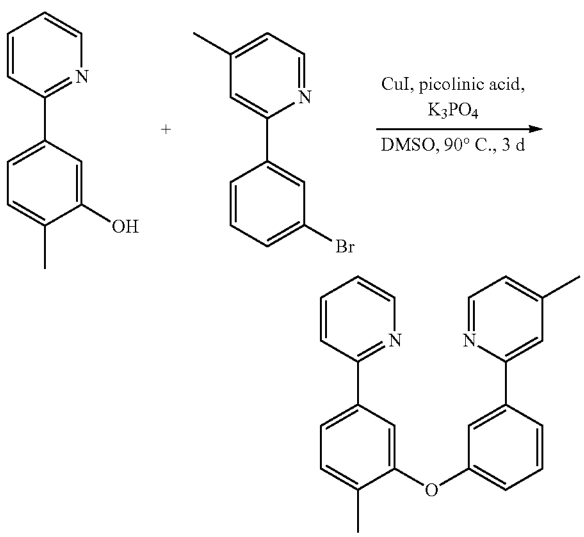

L25

2-methyl-5-(pyridin-2-yl)phenol (300 mg, 1.62 mmol, 1.0 eq), 2-(3-bromophenyl)-4-methylpyridine (481 mg, 1.94 mmol, 1.2 eq), CuI (62 mg, 0.32 mmol, 0.2 eq), picolinic acid (40 mg, 0.32 mmol, 0.2 eq) and $K_3PO_4$ (688 mg, 3.24 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (18 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L25 in 60%-95% yield.

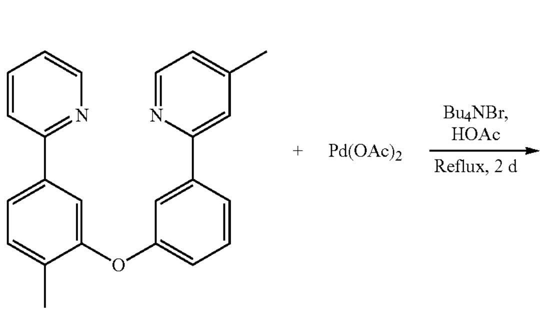

L25

-continued

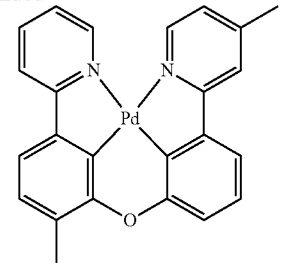

C25

L25 (498 mg, 1.42 mmol, 1.0 eq), $Pd(OAc)_2$ (381 mg, 1.7 mmol, 1.2 eq) and n-$Bu_4NBr$ (43 mg, 0.133 mmol, 0.1 eq) were added to a dry pressure tube, which was taken into a glove box and acetic acid (83 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C25 in 60%-90% yield.

Synthetic Example 26

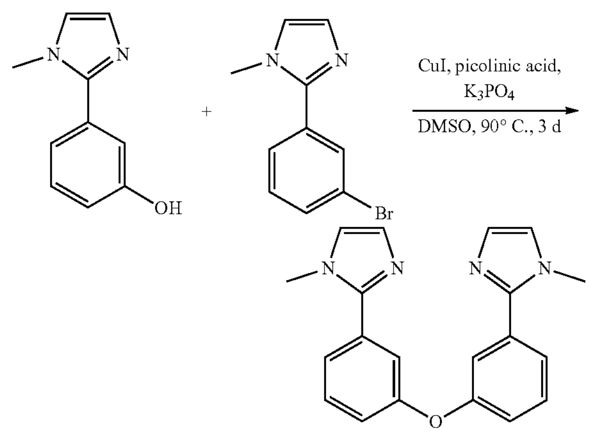

L26

3-(1-methyl-1H-imidazol-2-yl)phenol (75 mg, 0.43 mmol, 1.0 eq), 2-(3-bromophenyl)-1-methyl-1H-imidazole (123 mg, 0.52 mmol, 1.2 eq), CuI (16 mg, 0.09 mmol, 0.2 eq), picolinic acid (11 mg, 0.09 mmol, 0.2 eq) and $K_3PO_4$ (183 mg, 0.86 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (5 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L26 in 50%-80% yield.

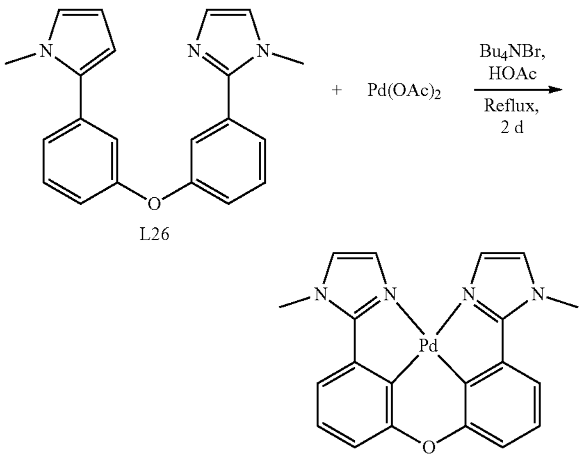

C26

L26 (478 mg, 1.45 mmol, 1.0 eq), $Pd(OAc)_2$ (348 mg, 1.55 mmol, 1.07 eq) and n-$Bu_4NBr$ (48 mg, 0.15 mmol, 0.1 eq) were added to a dry pressure tube, which was taken into a glove box and acetic acid (30 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C26 in 40%-80% yield.

Synthetic Example 27

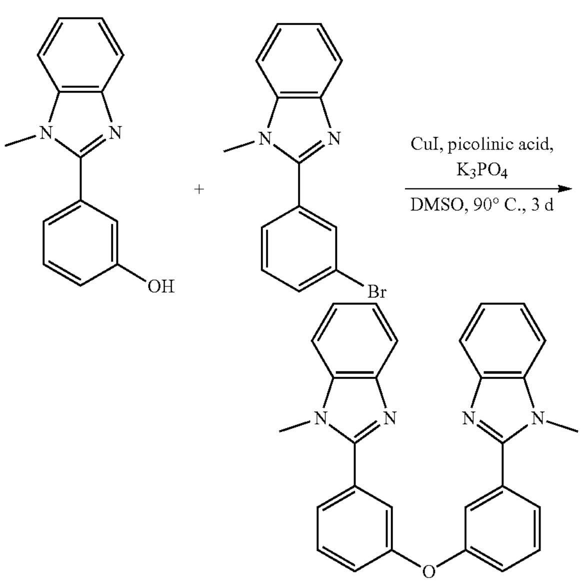

L27

3-(1-methyl-1H-benzo[d]imidazol-2-yl)phenol (224 mg, 1.0 mmol, 1.0 eq), 2-(3-bromophenyl)-1-methyl-1H-benzo[d]imidazole (345 mg, 1.2 mmol, 1.2 eq), CuI (38 mg, 0.2 mmol, 0.2 eq), picolinic acid (25 mg, 0.2 mmol, 0.2 eq) and $K_3PO_4$ (424 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L27 in 40%-80% yield.

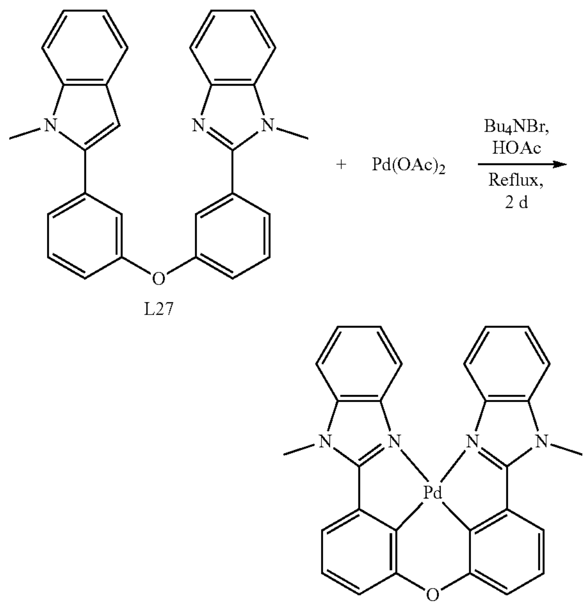

C27

L27 (431 mg, 1.0 mmol, 1.0 eq), $Pd(OAc)_2$ (246 mg, 1.1 mmol, 1.1 eq) and n-$Bu_4NBr$ (32 mg, 0.1 mmol, 0.1 eq) were added to a dry pressure tube, which was taken into a glove box and acetic acid (30 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C27 in 30%-80% yield.

Synthetic Example 28

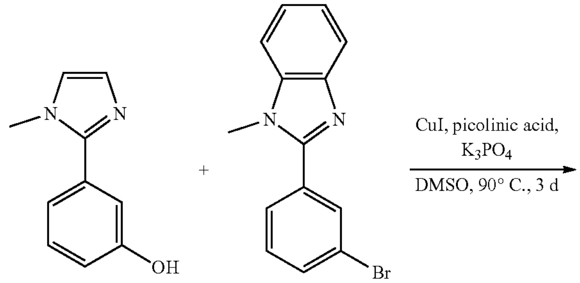

-continued

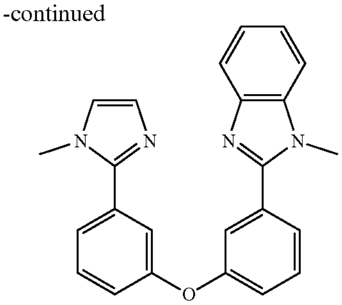

L28

3-(1-methyl-1H-imidazol-2-yl)phenol (174 mg, 1.0 mmol, 1.0 eq), 2-(3-bromophenyl)-1-methyl-1H-benzo[d]imidazole (344 mg, 1.2 mmol, 1.2 eq), CuI (38 mg, 0.2 mmol, 0.2 eq), picolinic acid (25 mg, 0.2 mmol, 0.2 eq) and $K_3PO_4$ (424 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L28 in 30%-80% yield.

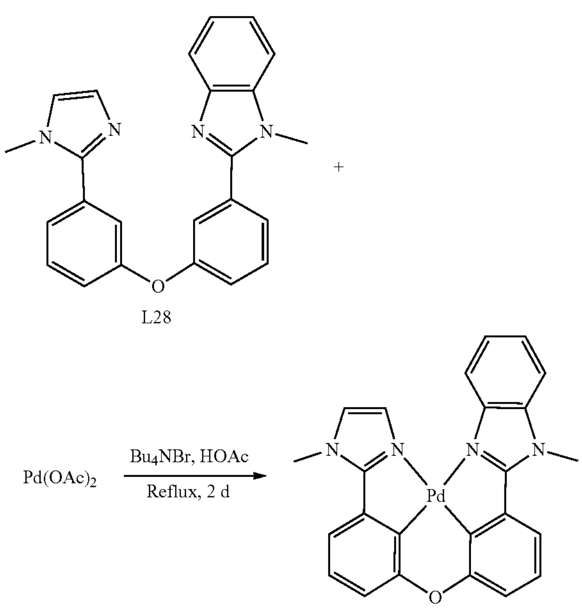

L28

C28

L28 (380 mg, 1.0 mmol, 1.0 eq), $Pd(OAc)_2$ (246 mg, 1.1 mmol, 1.1 eq) and n-$Bu_4NBr$ (32 mg, 0.1 mmol, 0.1 eq) were added to a dry pressure tube, which was taken into a glove box and acetic acid (30 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C28 in 30%-70% yield.

Synthetic Example 29

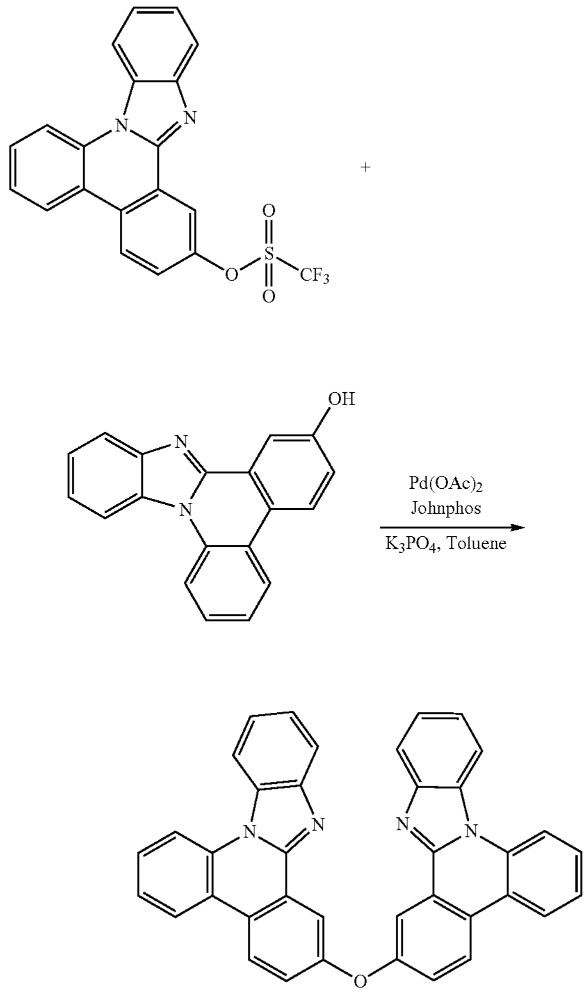

L29

Benzo[4,5]imidazo[1,2-f]phenanthridin-7-yl trifluoromethanesulfonate (1(0) mg, 0.24 mmol, 1.0 eq), benzo[4,5]imidazo[1,2-f]phenanthridin-7-ol (82 mg, 0.29 mmol, 1.2 eq), $Pd(OAc)_2$ (11 mg, 0.05 mmol, 0.2 eq), Johnphos (22 mg, 0.072 mmol, 0.3 eq) and $K_3PO_4$ (102 mg, 0.48 mmol, 2.0 eq) were added to a dry Shlenck tube equipped with a magnetic stir bar. The tube was evacuated and backfilled with nitrogen. The evacuation and backfill procedure was repeated for a total of three times. Then solvent toluene (5 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L29 in 20%-60% yield.

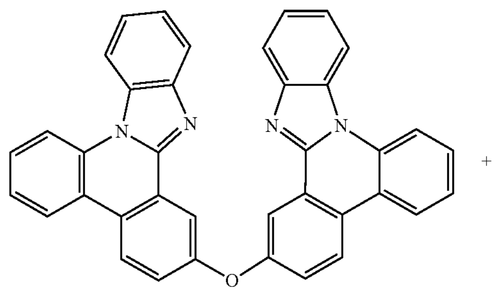

L29

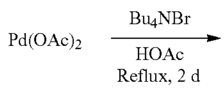

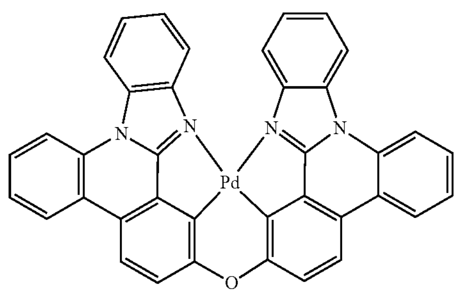

C29

L29 (110 mg, 0.20 mmol, 1.0 eq), Pd(OAc)$_2$ (54 mg, 0.24 mmol, 1.2 eq) and n-Bu$_4$NBr (6.5 mg, 0.02 mmol, 0.1 eq) were added to a dry pressure tube was then taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain the desired product C29 in 10%~50% yield.

Synthetic Example 30

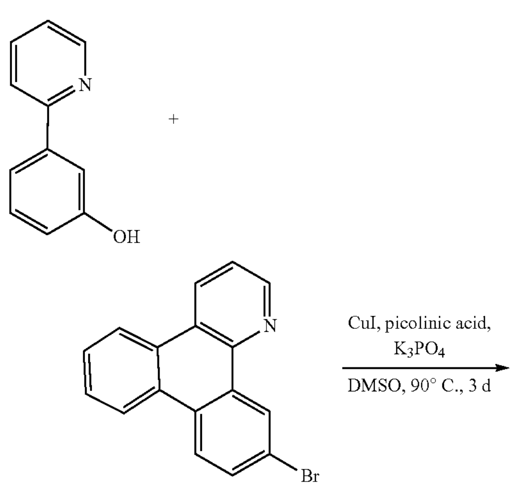

-continued

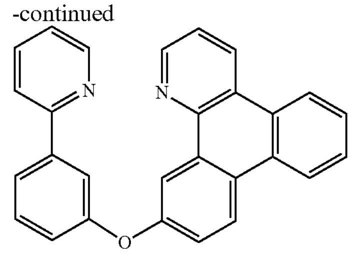

L30

11-bromodibenzo[f,h]quinolin-6-ylium (308 mg, 1.0 mmol, 1.0 eq), 3-(pyridin-2-yl)phenol (205.44 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L30 as a white solid in 50%-90% yield.

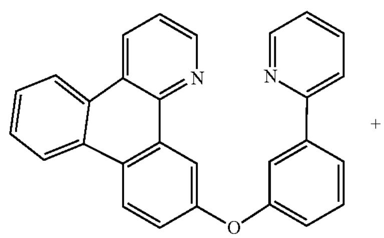

L30

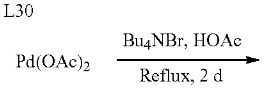

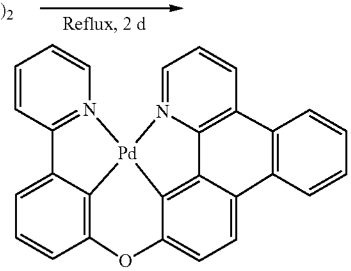

C30

L30 (80 mg, 0.20 mmol, 1.0 eq), Pd(OAc)$_2$ (54 mg, 0.24 mmol, 1.2 eq) and n-Bu$_4$NBr (6.5 mg, 0.02 mmol, 0.1 eq) were added to a dry pressure tube, which was taken into a glove box and acetic acid (10 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C30 in 30%-80% yield.

Synthetic Example 31

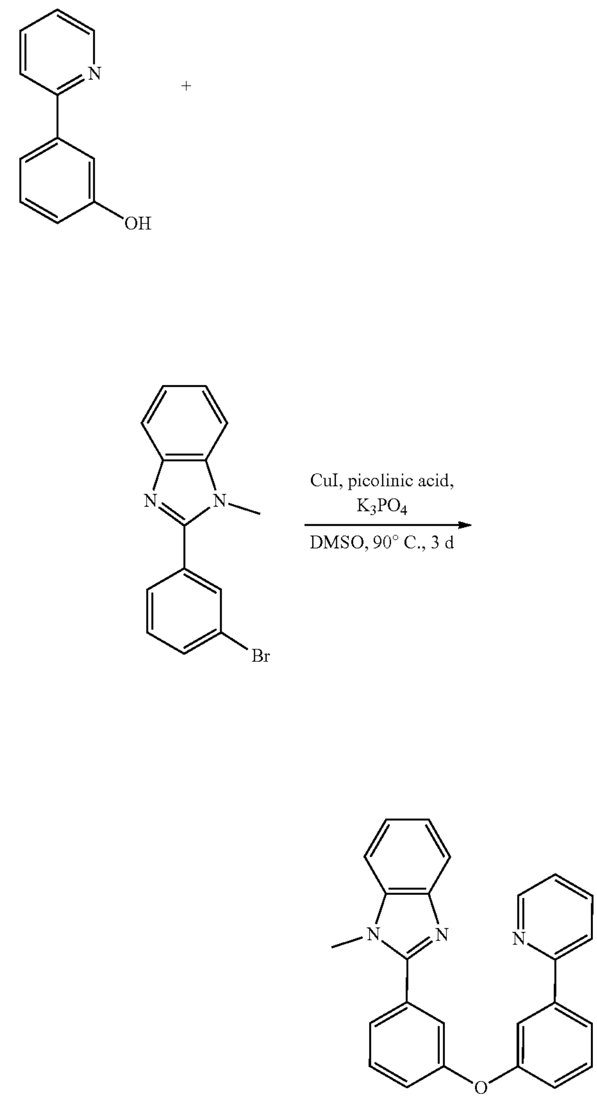

L31

3-(pyridin-2-yl)phenol (171 mg, 1 mmol, 1.0 eq), 2-(3-bromophenyl)-1-methyl-1H-benzo[d]imidazole (344 mg, 1.2 mmol, 1.2 eq), CuI (38 mg, 0.2 mmol, 0.2 eq), picolinic acid (25 mg, 0.2 mmol, 0.2 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel to obtain the desired product ligand L31 in 40%-80% yield.

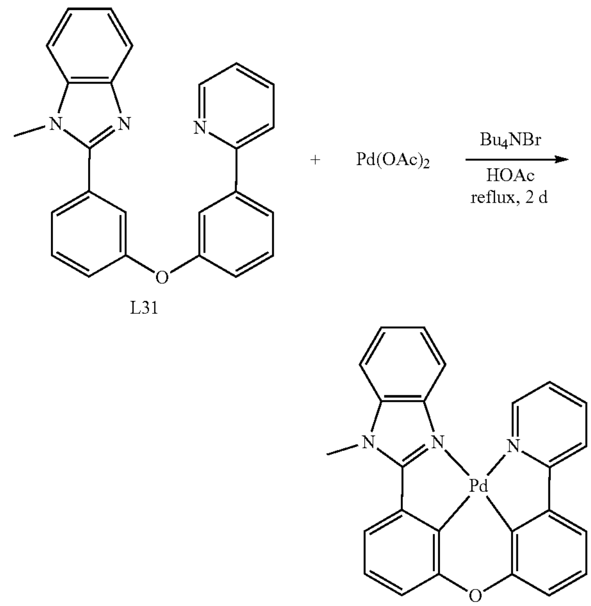

C31

L31 (377 mg, 1.0 mmol, 1.0 eq), $Pd(OAc)_2$ (246 mg, 1.1 mmol, 1.1 eq) and n-$Bu_4NBr$ (32 mg, 0.1 mmol, 0.1 eq) were added to a dry pressure tube was then taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel to obtain the desired product C31 in 30%-70% yield.

Synthetic Example 32

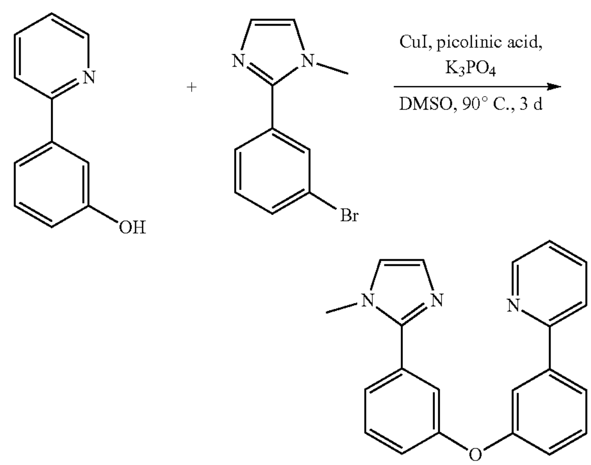

L32

3-(pyridin-2-yl)phenol (171 mg, 1 mmol, 1.0 eq), 2-(3-bromophenyl)-1-methyl-1H-imidazole (244 mg, 1.2 mmol, 1.2 eq), CuI (38 mg, 0.2 mmol, 0.2 eq), picolinic acid (25 mg, 0.2 mmol, 0.2 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L32 in 40%-80% yield.

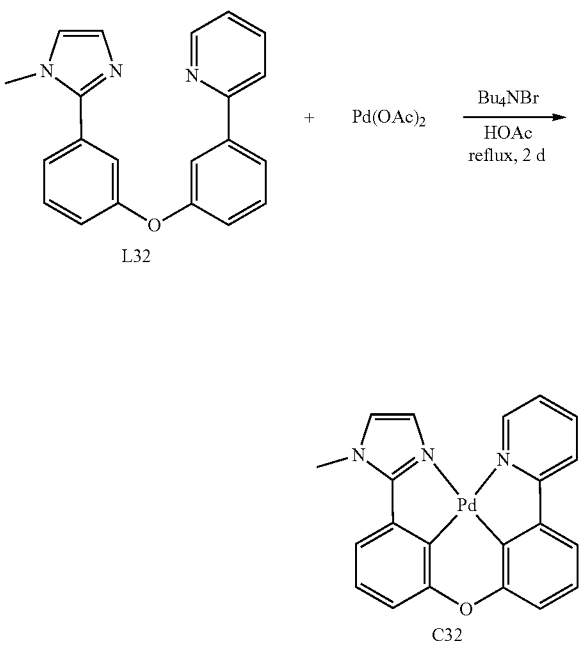

L32 (327 mg, 1.0 mmol, 1.0 eq), $Pd(OAc)_2$ (246 mg, 1.1 mmol, 1.1 eq) and n-$Bu_4NBr$ (32 mg, 0.1 mmol, 0.1 eq) were added to a dry pressure tube was then taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C32 in 30%-70% yield.

Synthetic Example 33

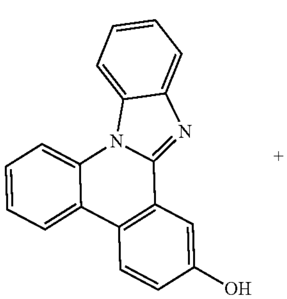

-continued

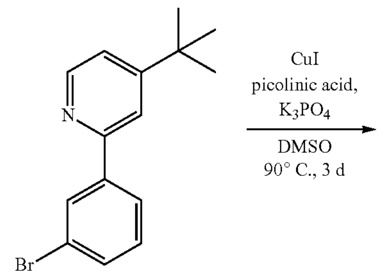

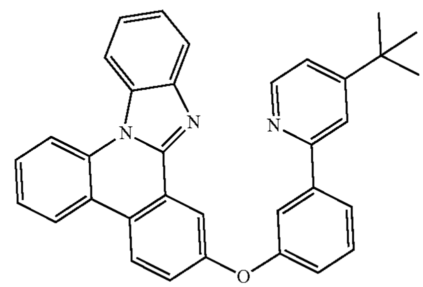

L33

Benzo[4,5]imidazo[1,2-f]phenanthridin-7-ol (293 mg, 1.03 mmol, 1.0 eq), 2-(3-bromophenyl)-4-(tert-butyl)pyridine (357 mg, 1.23 mmol, 1.2 eq), CuI (40 mg, 0.21 mmol, 0.2 eq), picolinic acid (25 mg, 0.21 mmol, 0.2 eq) and $K_3PO_4$ (437 mg, 2.06 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L33 in 30%-80% yield.

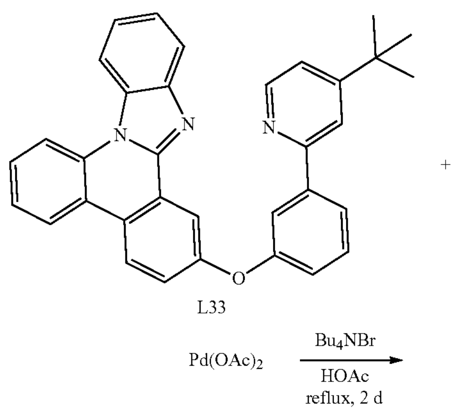

-continued

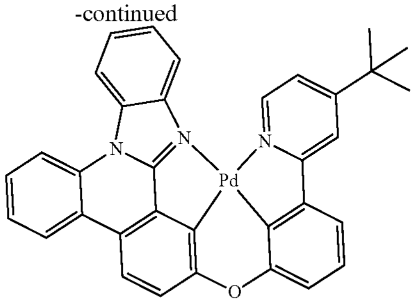

C33

L33 (493 mg, 1.0 mmol, 1.0 eq), $Pd(OAc)_2$ (246 mg, 1.1 mmol, 1.1 eq) and n-$Bu_4NBr$ (32 mg, 0.1 mmol, 0.1 eq) were added to a dry pressure tube, which was taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C33 in 30%-70% yield.

Synthetic Example 34

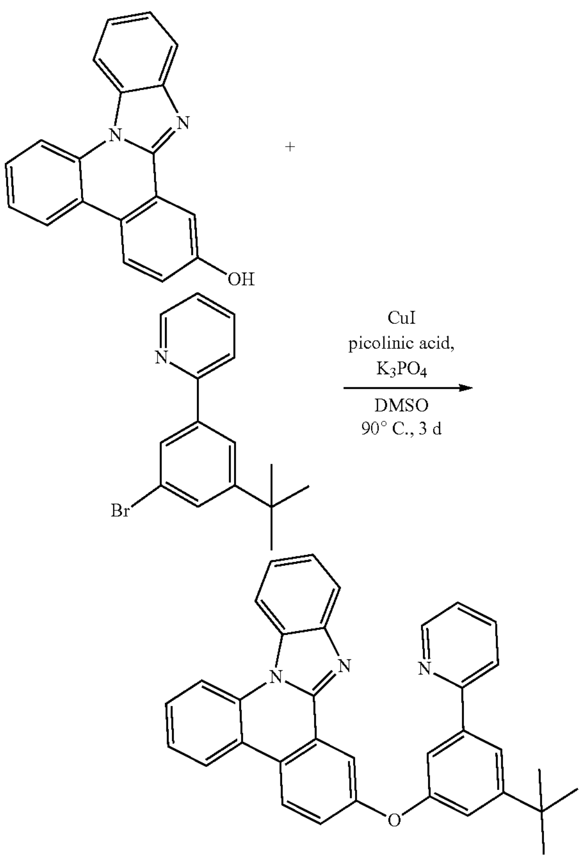

L34

Benzo[4,5]imidazo[1,2-f]phenanthridin-7-ol (293 mg, 1.03 mmol, 1.0 eq), 2-(3-bromo-5-(tert-butyl)phenyl)pyridine (357 mg 1.23 mmol, 1.2 eq), CuI (40 mg, 0.21 mmol, 0.2 eq), picolinic acid (25 mg, 0.21 mmol, 0.2 eq) and $K_3PO_4$ (437 mg, 2.06 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L34 in 50%-85% yield.

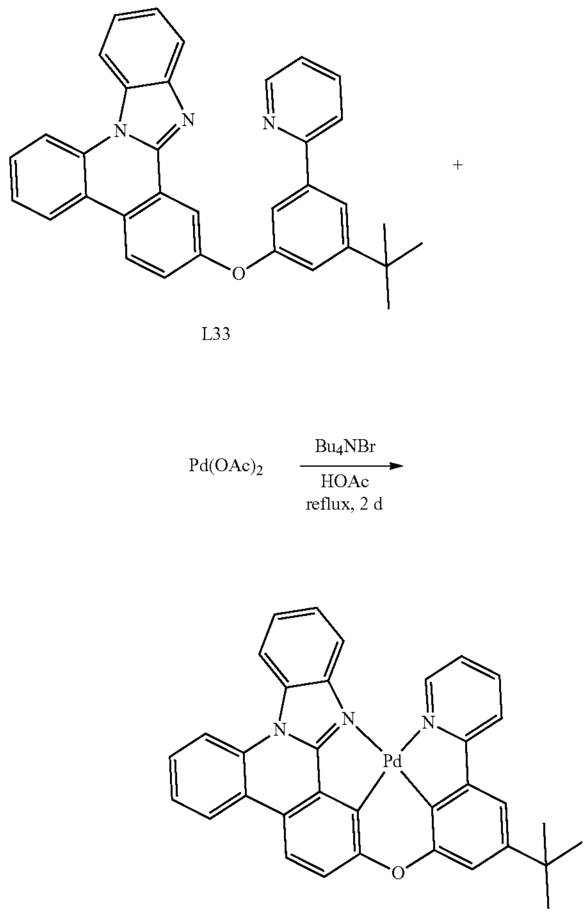

C34

L34 (493 mg, 1.0 mmol, 1.0 eq), $Pd(OAc)_2$ (246 mg, 1.1 mmol, 1.1 eq) and n-$Bu_4NBr$ (32 mg, 0.1 mmol, 0.1 eq) were added to a dry pressure tube, which was taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C34 in 30%-70% yield.

Synthetic Example 35

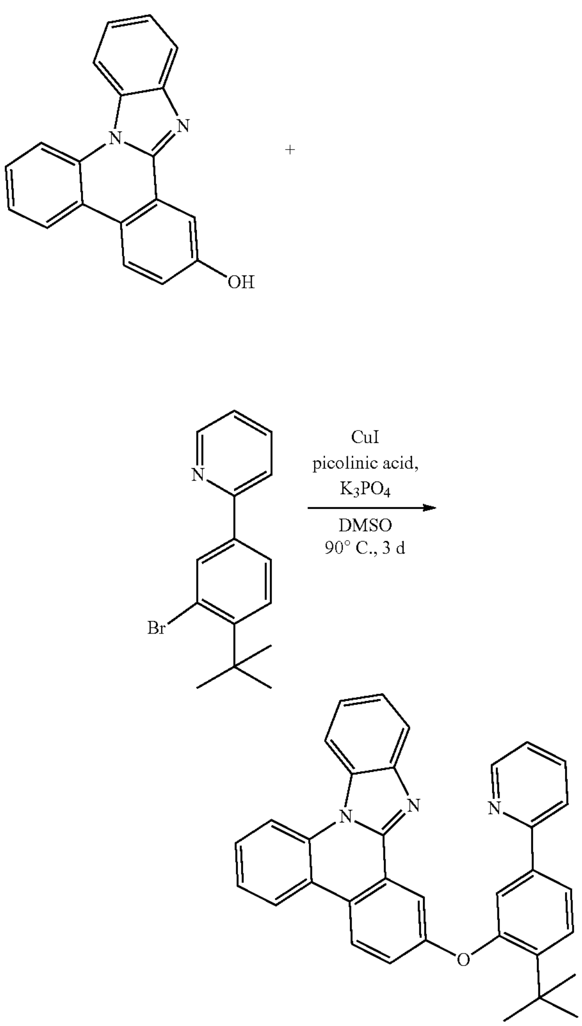

L35

Benzo[4,5]imidazo[1,2-f]phenanthridin-7-ol (293 mg, 1.03 mmol, 1.0 eq), 2-(3-bromo-4-(tert-butyl)phenyl)pyridine (357 mg 1.23 mmol, 1.2 eq), CuI (40 mg, 0.21 mmol, 0.2 eq), picolinic acid (25 mg, 0.21 mmol, 0.2 eq) and $K_3PO_4$ (437 mg, 2.06 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L35 in 50%-90% yield.

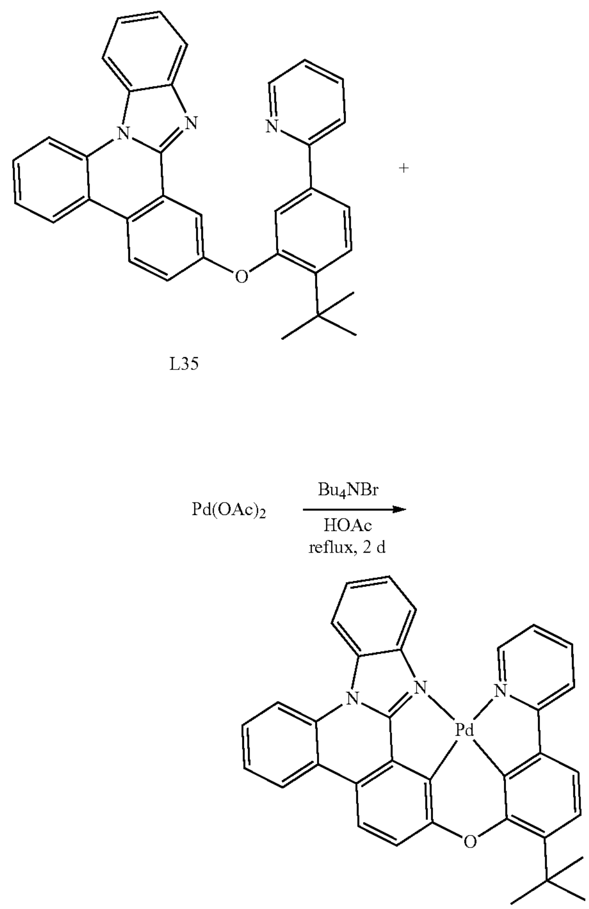

C35

L35 (493 mg, 1.0 mmol, 1.0 eq), $Pd(OAc)_2$ (246 mg, 1.1 mmol, 1.1 eq) and n-$Bu_4NBr$ (32 mg, 0.1 mmol, 0.1 eq) were added to a dry pressure tube, which was taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C35 in 30%-80% yield.

Synthetic Example 36

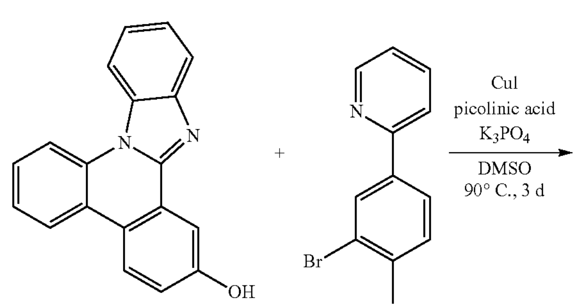

-continued

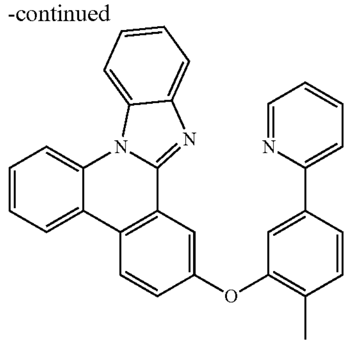

L36

Benzo[4,5]imidazo[1,2-f]phenanthridin-7-ol (293 mg, 1.03 mmol, 1.0 eq), 2-(3-bromo-4-methylphenyl)pyridine (305 mg 1.23 mmol, 1.2 eq), CuI (40 mg, 0.21 mmol, 0.2 eq), picolinic acid (25 mg, 0.21 mmol, 0.2 eq) and $K_3PO_4$ (437 mg, 2.06 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L36 in 50%-90% yield.

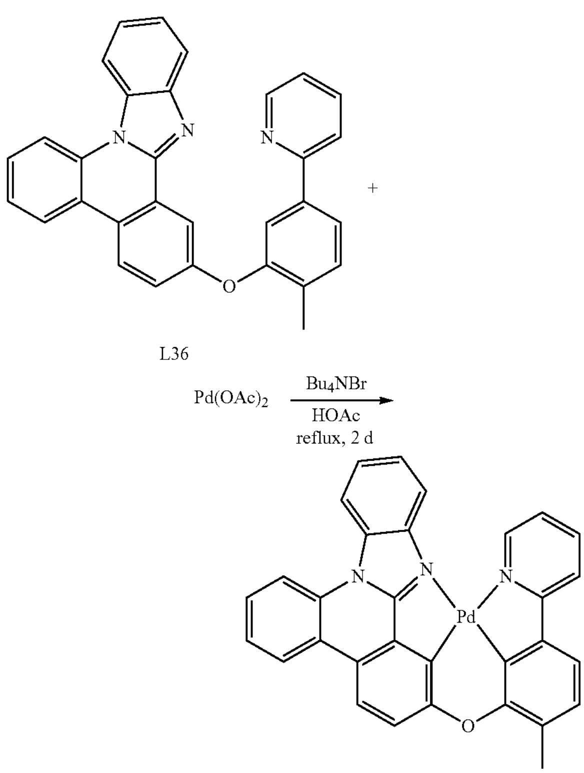

C36

L36 (451 mg, 1.0 mmol, 1.0 eq), $Pd(OAc)_2$ (246 mg, 1.1 mmol, 1.1 eq) and n-$Bu_4NBr$ (32 mg, 0.1 mmol, 0.1 eq) were added to a dry pressure tube, which was taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C36 in 30%-80% yield.

Synthetic Example 37

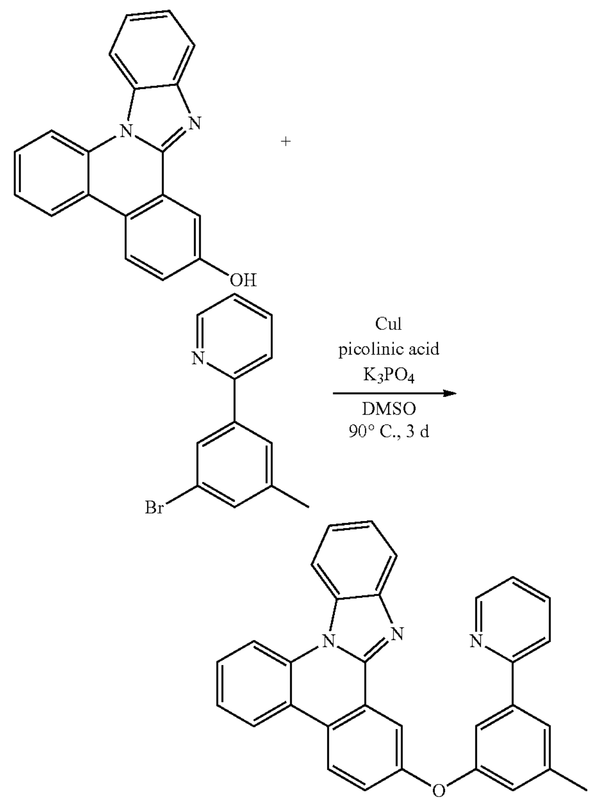

L37

Benzo[4,5]imidazo[1,2-f]phenanthridin-7-ol (293 mg, 1.03 mmol, 1.0 eq), 2-(3-bromo-5-methylphenyl)pyridine (305 mg 1.23 mmol, 1.2 eq), CuI (40 mg, 0.21 mmol, 0.2 eq), picolinic acid (25 mg, 0.21 mmol, 0.2 eq) and $K_3PO_4$ (437 mg, 2.06 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L37 in 50%-90% yield.

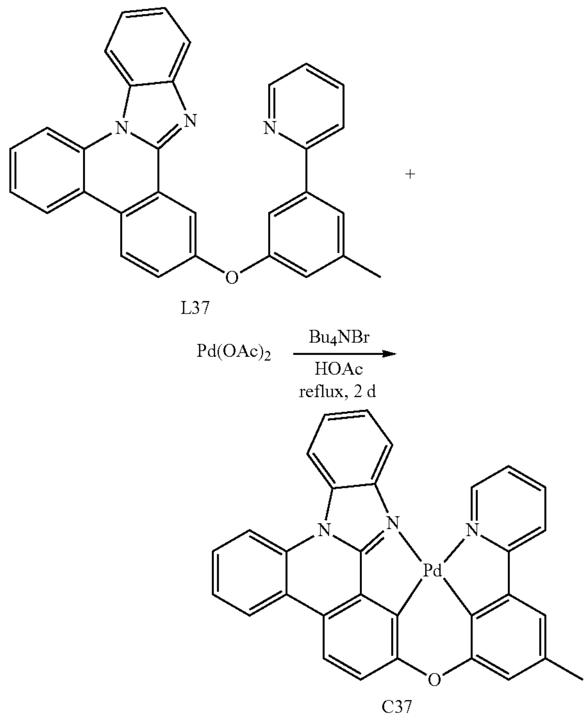

L37 (451 mg, 1.0 mmol, 1.0 eq), Pd(OAc)$_2$ (246 mg, 1.1 mmol, 1.1 eq) and n-Bu$_4$NBr (32 mg, 0.1 mmol, 0.1 eq) were added to a dry pressure tube, which was taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C37 in 30%-80% yield.

Synthetic Example 38

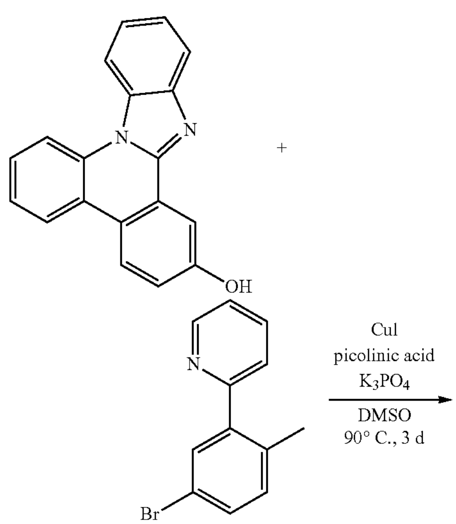

-continued

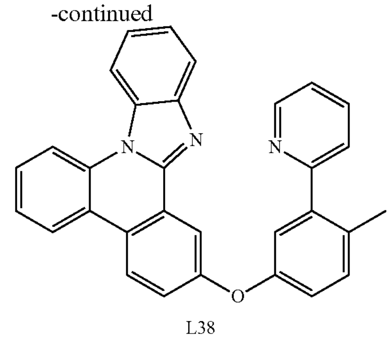

Benzo[4,5]imidazo[1,2-f]phenanthridin-7-ol (293 mg, 1.03 mmol, 1.0 eq), 2-(5-bromo-2-methylphenyl)pyridine (305 mg 1.23 mmol, 1.2 eq), CuI (40 mg, 0.21 mmol, 0.2 eq), picolinic acid (25 mg, 0.21 mmol, 0.2 eq) and $K_3PO_4$ (437 mg, 2.06 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L38 in 50%-90% yield.

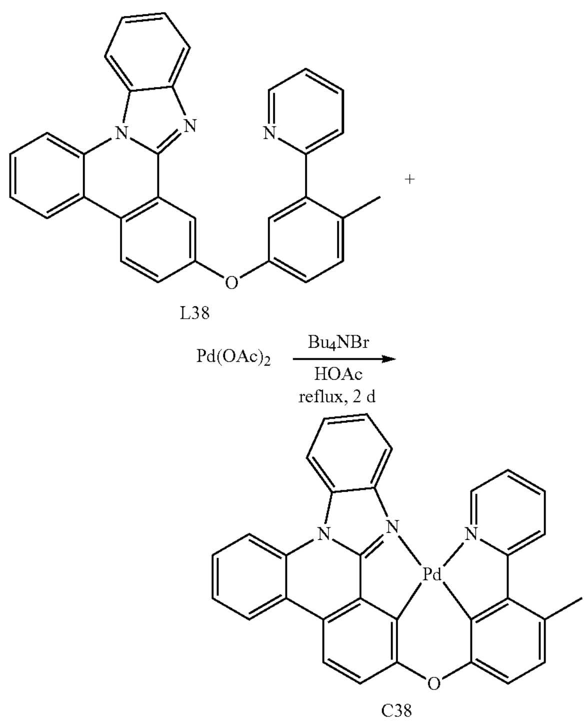

L38 (451 mg, 1.0 mmol, 1.0 eq), Pd(OAc)$_2$ (246 mg, 1.1 mmol, 1.1 eq) and n-Bu$_4$NBr (32 mg, 0.1 mmol, 0.1 eq) were added to a dry pressure tube, which was taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C38 in 30%-80% yield.

Synthetic Example 39

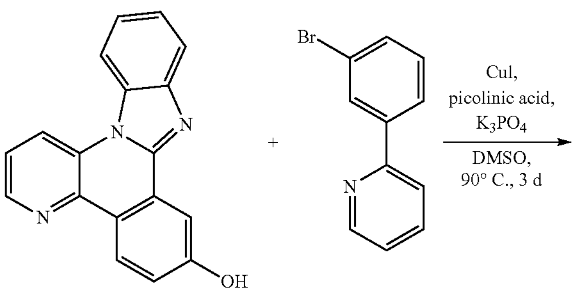

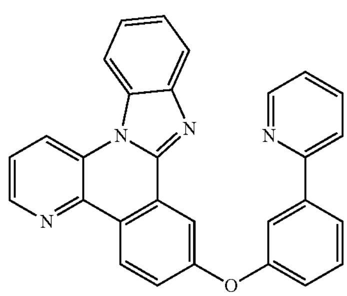

L39

Benzo[c]benzo[4,5]imidazo[1,2-a][1,5]naphthyridin-7-ol (285.3 mg, 1 mmol, 1.0 eq), 2-(3-bromophenyl)pyridine (281 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L39 in 30%-80% yield.

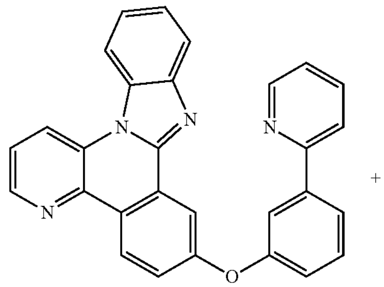

L39

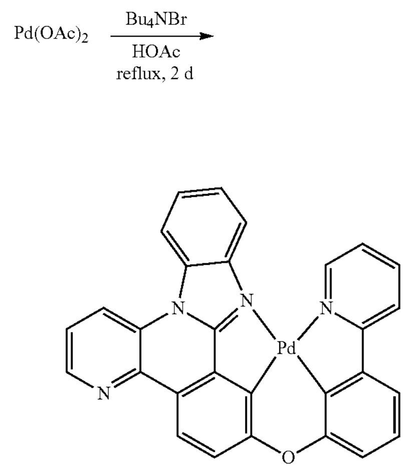

C39

L39 (438 mg, 1.0 mmol, 1.0 eq), $Pd(OAc)_2$ (246 mg, 1.1 mmol, 1.1 eq) and n-$Bu_4NBr$ (32 mg, 0.1 mmol, 0.1 eq) were added to a dry pressure tube, which was taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C39 in 20%-70% yield.

Synthetic Example 40

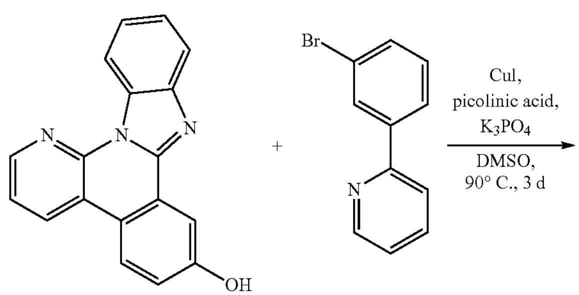

-continued

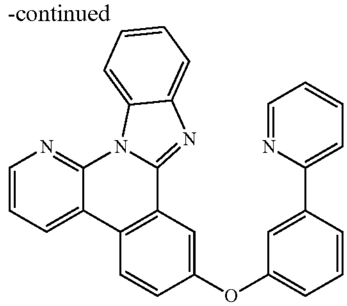

L40

Benzo[c]benzo[4,5]imidazo[1,2-a][1,8]naphthyridin-7-ol (285.3 mg, 1 mmol, 1.0 eq), 2-(3-bromophenyl)pyridine (281 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L40 in 30%-80% yield.

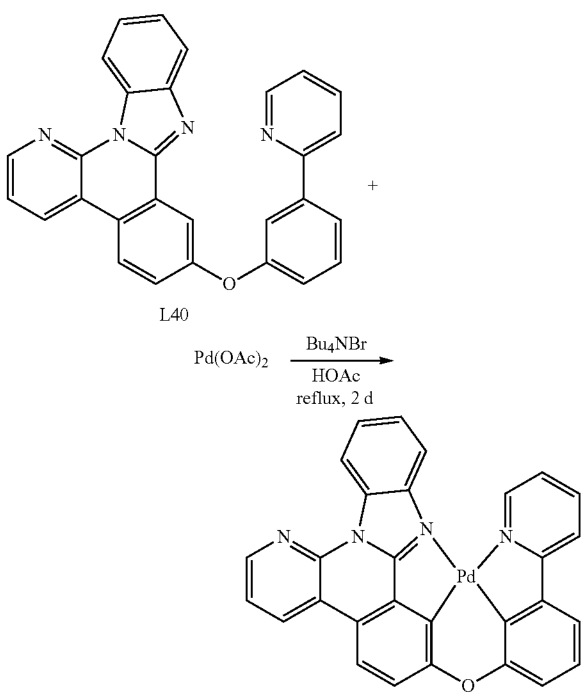

C40

L40 (438 mg, 1.0 mmol, 1.0 eq), $Pd(OAc)_2$ (246 mg, 1.1 mmol, 1.1 eq) and n-$Bu_4NBr$ (32 mg, 0.1 mmol, 0.1 eq) were added to a dry pressure tube, which was taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C40 in 20%-70% yield.

Synthetic Example 41

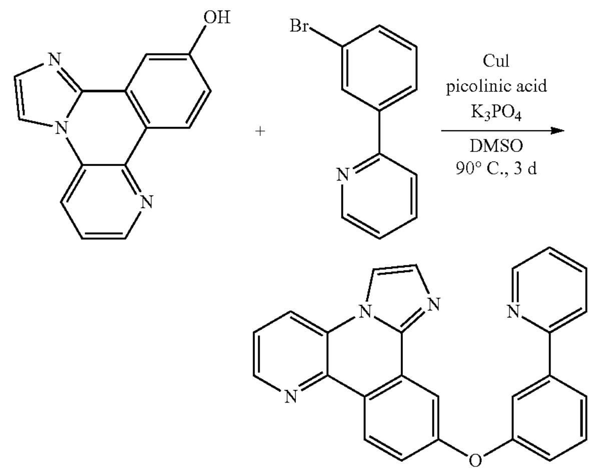

L41

Benzo[c]imidazo[1,2-a][1,5]naphthyridin-11-ol (235 mg, 1 mmol, 1.0 eq), 2-(3-bromophenyl)pyridine (281 mg, 1.2 mmol, 1.2 eq), CuI), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel to obtain the desired product ligand L41 in 30%-80% yield.

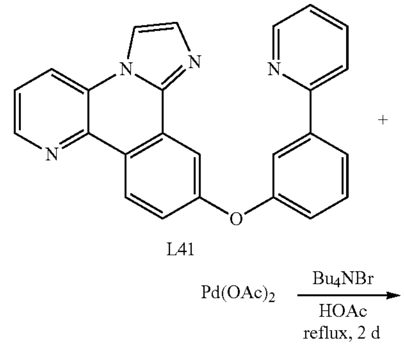

-continued

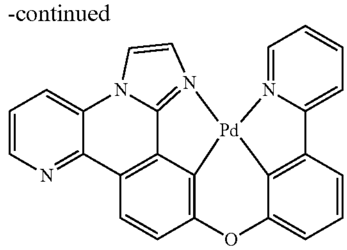

C41

L41 (388 mg, 1.0 mmol, 1.0 eq), $Pd(OAc)_2$ (246 mg, 1.1 mmol, 1.1 eq) and n-$Bu_4NBr$ (32 mg, 0.1 mmol, 0.1 eq) were added to a dry pressure tube was then taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain the desired product C41 in 20%-70% yield.

Synthetic Example 42

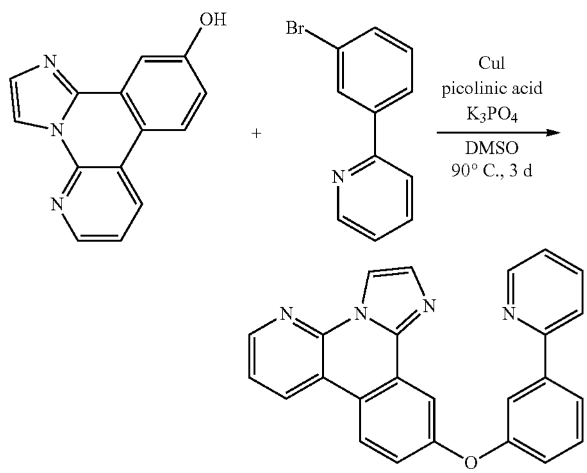

L42

Benzo[c]imidazo[1,2-a][1,8]naphthyridin-11-ol (235 mg, 1 mmol, 1.0 eq), 2-(3-bromophenyl)pyridine (281 mg, 1.2 mmol, 1.2 eq), CuI), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired L42 in 30%-80% yield.

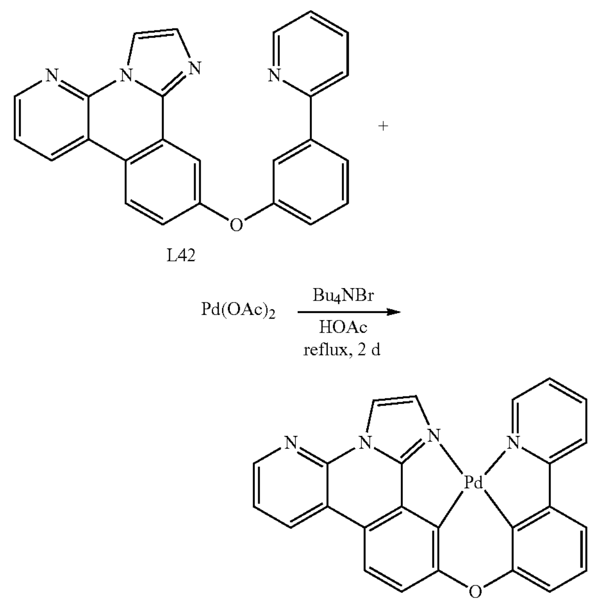

C42

L42 (388 mg, 1.0 mmol, 1.0 eq), $Pd(OAc)_2$ (246 mg, 1.1 mmol, 1.1 eq) and n-$Bu_4NBr$ (32 mg, 0.1 mmol, 0.1 eq) were added to a dry pressure tube was then taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and removed the solvent. Then the solid was purified through column chromatography on silica gel using dichloromethane as eluent to obtain the desired product C42 in 20%-70% yield.

Synthetic Example 43

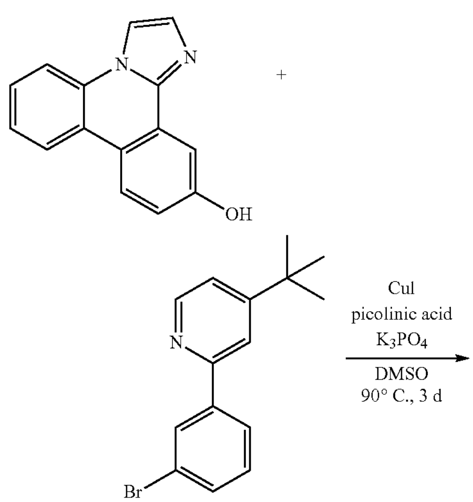

-continued

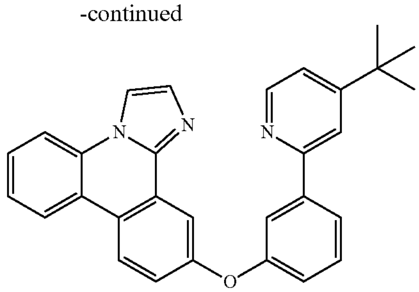

L43

Imidazo[1,2-f]phenanthridin-11-ol (235 mg, 1.0 mmol, 1.0 eq), 2-(3-bromophenyl)-4-(tert-butyl)pyridine (348 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L43 in 30%-80% yield.

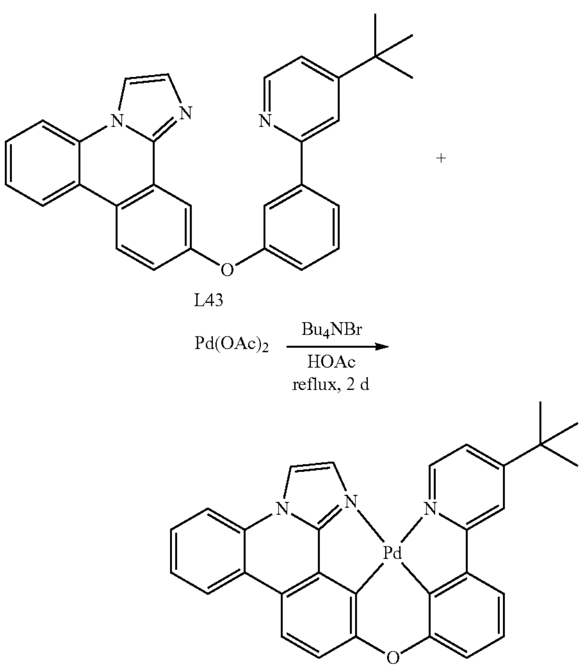

L43 (443 mg, 1.0 mmol, 1.0 eq), $Pd(OAc)_2$ (246 mg, 1.1 mmol, 1.1 eq) and n-$Bu_4NBr$ (32 mg, 0.1 mmol, 0.1 eq) were added to a dry pressure tube was then taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C43 in 20%-70% yield.

Synthetic Example 44

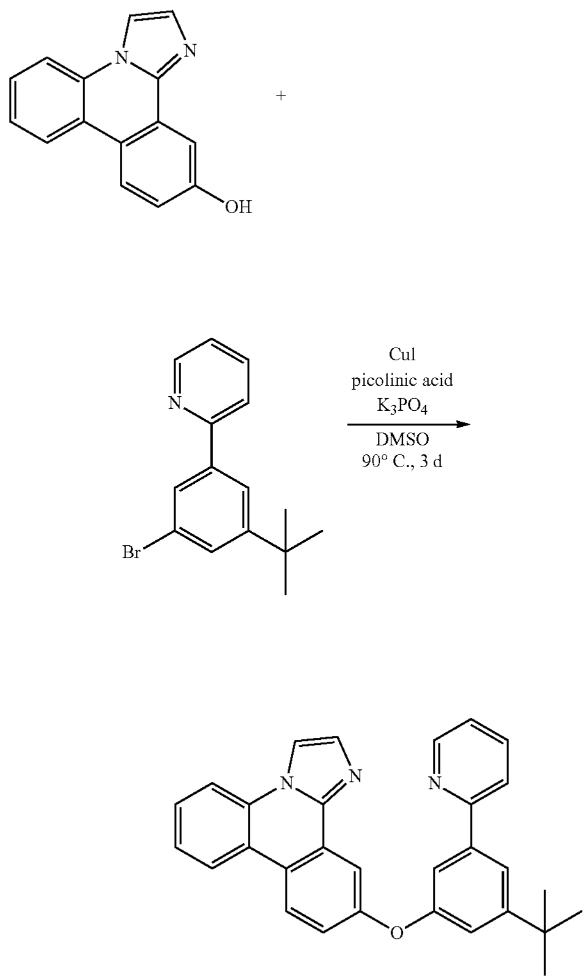

L44

Imidazo[1,2-f]phenanthridin-11-ol (235 mg, 1.0 mmol, 1.0 eq), 2-(3-bromo-5-(tert-butyl)phenyl)pyridine (348 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L44 in 30%-80% yield.

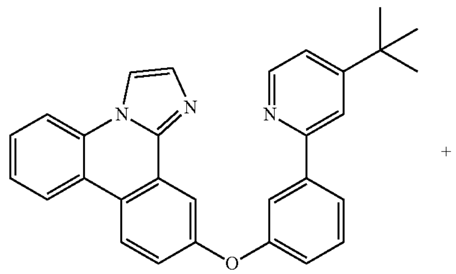

L44

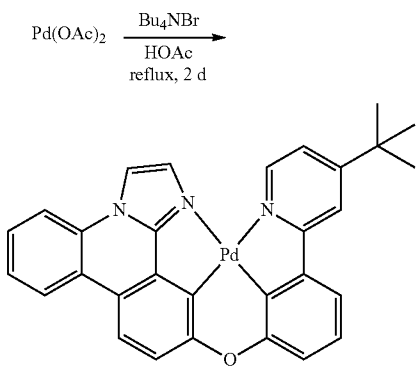

C44

L44 (443 mg, 1.0 mmol, 1.0 eq), $Pd(OAc)_2$ (246 mg, 1.1 mmol, 1.1 eq) and n-$Bu_4NBr$ (32 mg, 0.1 mmol, 0.1 eq) were added to a dry pressure tube was then taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C44 in 20%-70% yield.

Synthetic Example 45

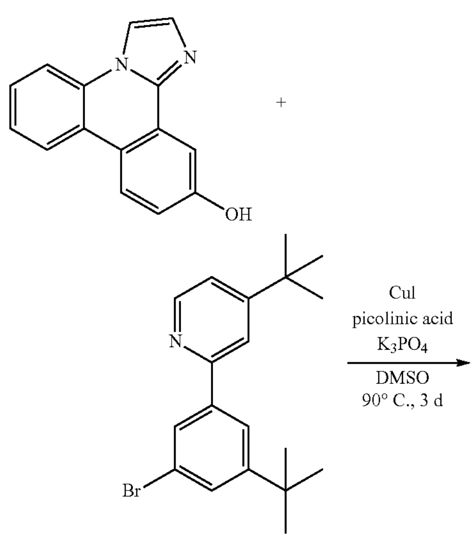

-continued

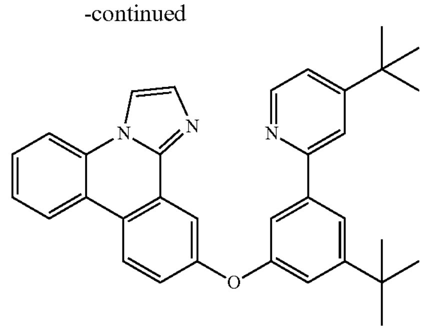

L45

Imidazo[1,2-f]phenanthridin-11-ol (235 mg, 1.0 mmol, 1.0 eq), 2-(3-bromo-5-(tert-butyl)phenyl)-4-(tert-butyl)pyridine (415 mg, 1.20 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L45 in 30%-80% yield.

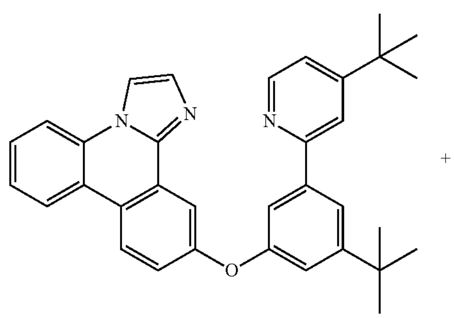

L45

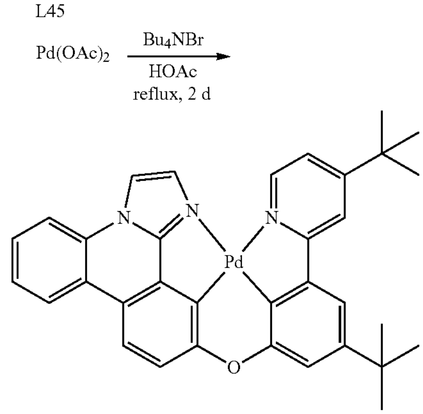

C45

L45 (500 mg, 1.0 mmol, 1.0 eq), $Pd(OAc)_2$ (246 mg, 1.1 mmol, 1.1 eq) and n-$Bu_4NBr$ (32 mg, 0.1 mmol, 0.1 eq)

were added to a dry pressure tube was then taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C45 in 20%-70% yield.

Synthetic Example 46

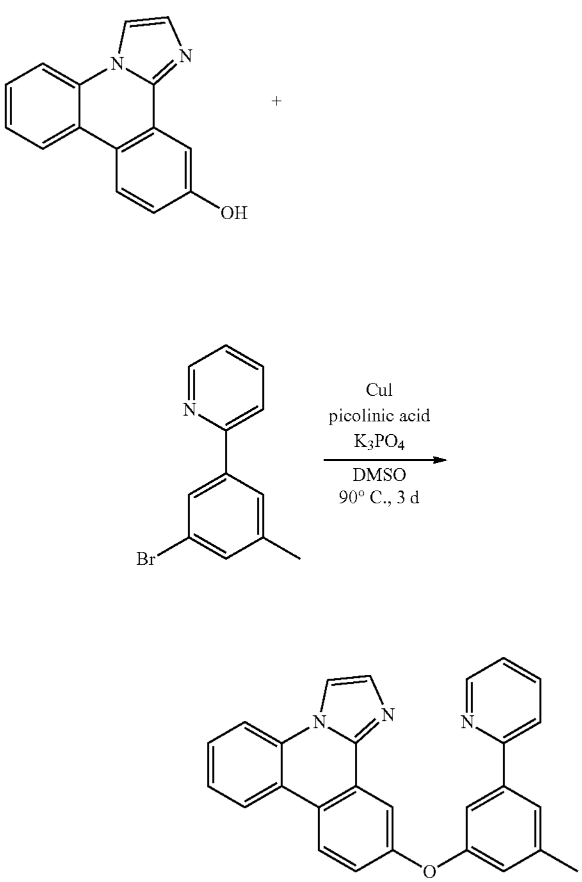

L46

Imidazo[1,2-f]phenanthridin-11-ol (235 mg, 1.0 mmol, 1.0 eq), 2-(3-bromo-5-methylphenyl)pyridine (298 mg, 1.20 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L46 in 40%-90% yield.

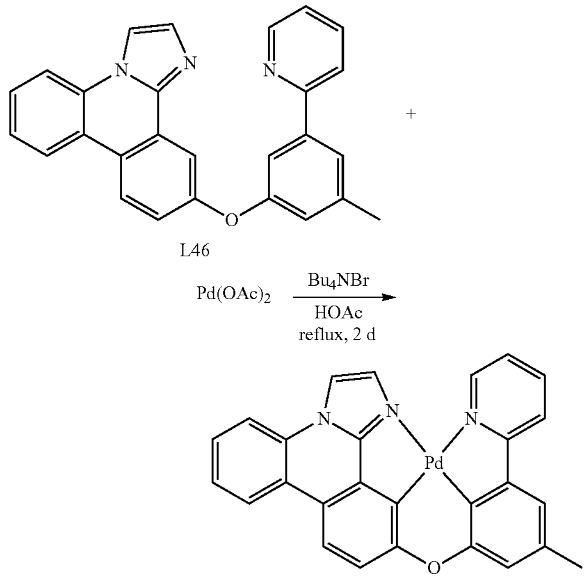

C46

L46 (401 mg, 1.0 mmol, 1.0 eq), $Pd(OAc)_2$ (246 mg, 1.1 mmol, 1.1 eq) and n-$Bu_4NBr$ (32 mg, 0.1 mmol, 0.1 eq) were added to a dry pressure tube was then taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C46 in 30%-80% yield.

Synthetic Example 47

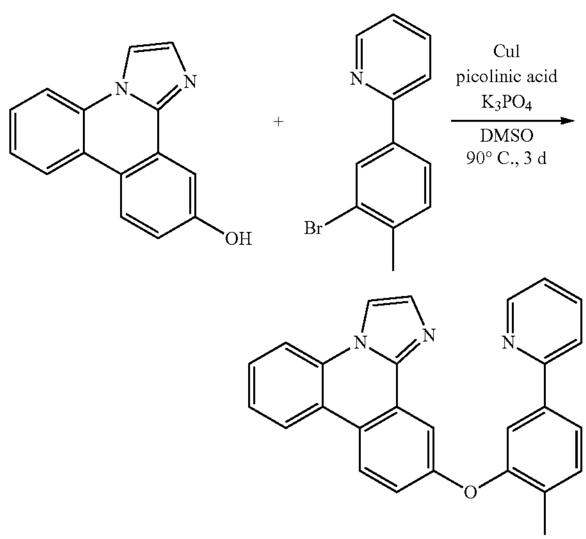

L47

Imidazo[1,2-f]phenanthridin-11-ol (235 mg, 1.0 mmol, 1.0 eq), 2-(3-bromo-4-methylphenyl)pyridine (298 mg, 1.20 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L47 in 40%-90% yield.

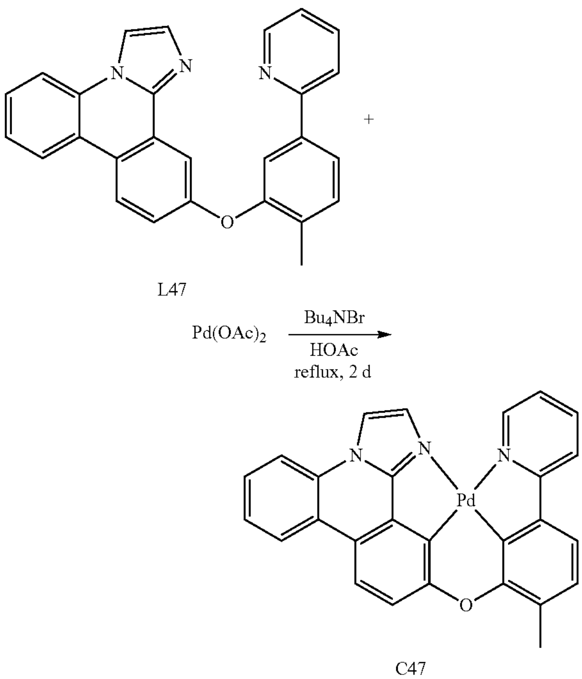

L47 (401 mg, 1.0 mmol, 1.0 eq), $Pd(OAc)_2$ (246 mg, 1.1 mmol, 1.1 eq) and n-$Bu_4NBr$ (32 mg, 0.1 mmol, 0.1 eq) were added to a dry pressure tube was then taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C47 in 30%-80% yield.

Synthetic Example 48

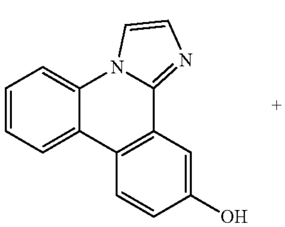

-continued

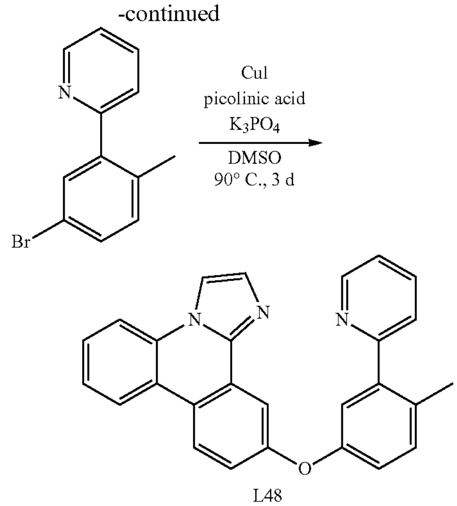

Imidazo[1,2-f]phenanthridin-11-ol (235 mg, 1.0 mmol, 1.0 eq), 2-(5-bromo-2-methylphenyl)pyridine (298 mg, 1.20 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate as eluent to obtain the desired product ligand L48 in 40%-90% yield.

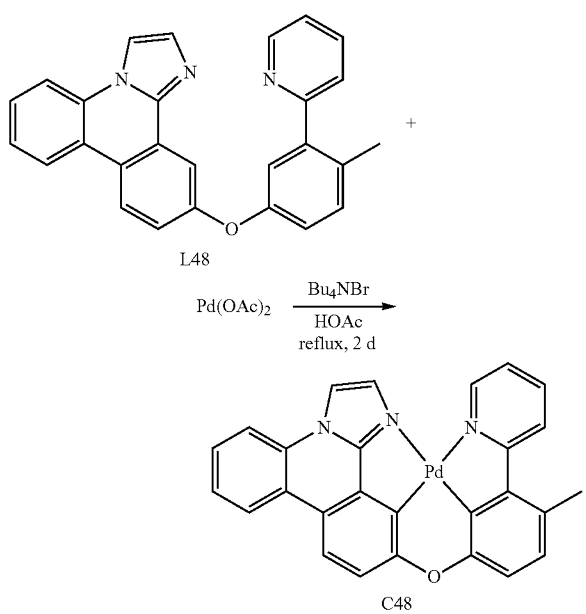

L48 (401 mg, 1.0 mmol, 1.0 eq), $Pd(OAc)_2$ (246 mg, 1.1 mmol, 1.1 eq) and n-$Bu_4NBr$ (32 mg, 0.1 mmol, 0.1 eq) were added to a dry pressure tube was then taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C48 in 30%-80% yield.

Synthetic Example 49

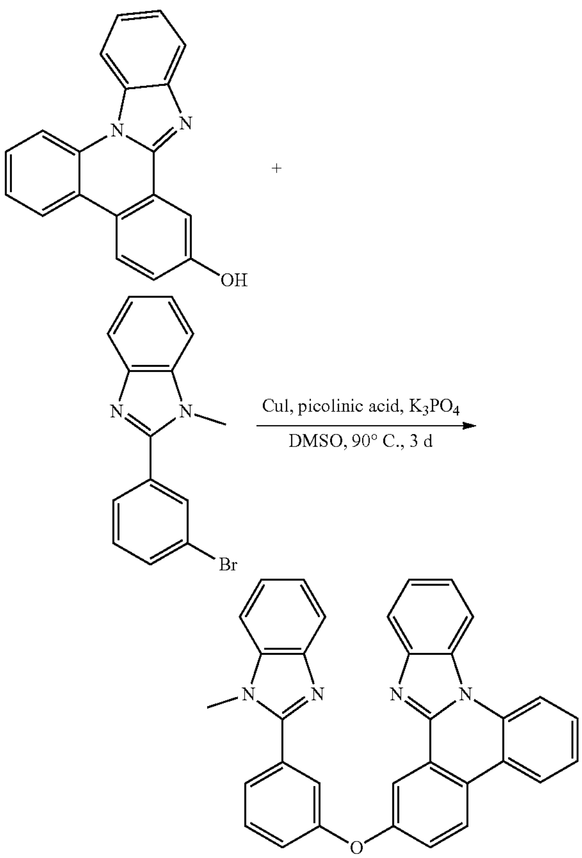

L49

Benzo[4,5]imidazo[1,2-f]phenanthridin-7-ol (227 mg, 0.8 mmol, 1.0 eq), 2-(3-bromophenyl)-1-methyl-TH-benzo[d]imidazole (276 mg, 0.96 mmol, 1.2 eq), CuI (30 mg, 0.2 mmol, 0.2 eq), picolinic acid (20 mg, 0.2 mmol, 0.2 eq) and $K_3PO_4$ (339 mg, 1.6 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (12 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel using hexane/ethyl acetate (2:1) as eluent to obtain the desired product ligand L49 in 30%-80% yield.

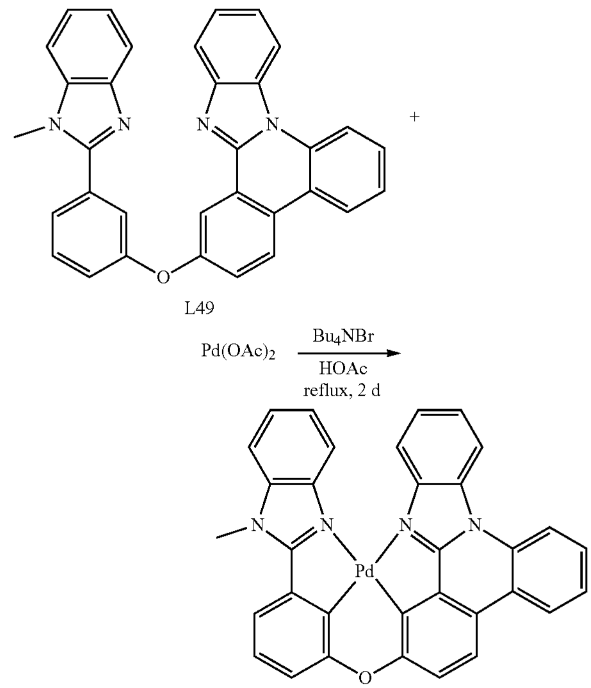

C49

LC49 (234 mg, 0.48 mmol, 1.0 eq), $Pd(OAc)_2$ (118 mg, 0.53 mmol, 1.2 eq) and n-$Bu_4NBr$ (15 mg, 0.05 mmol, 0.1 eq) were added to a dry pressure tube, which was taken into a glove box and acetic acid (35 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C49 in 20%-70% yield.

Synthetic Example 50

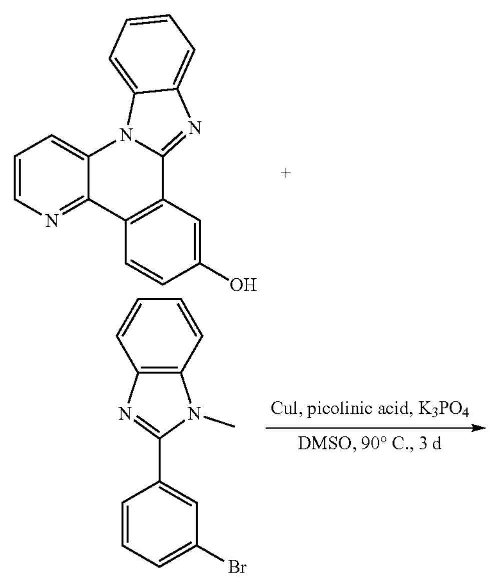

-continued

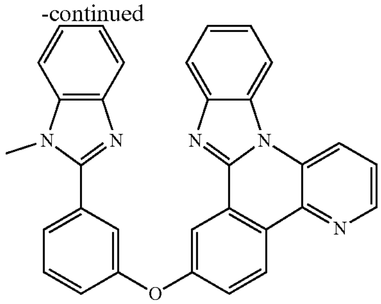

L50

Benzo[c]benzo[4,5]imidazo[1,2-a][1,5]naphthyridin-7-ol (285.3 mg, 1 mmol, 1.0 eq), 2-(3-bromophenyl)-1-methyl-1H-benzo[d]imidazole (345 mg, 1.2 mmol, 1.2 eq), CuI (38 mg, 0.2 mmol, 0.2 eq), picolinic acid (49 mg, 0.4 mmol, 0.4 eq) and $K_3PO_4$ (425 mg, 2 mmol, 2.0 eq) were added to a dry Shlenck tube equipped with a magnetic stir bar. The tube was evacuated and backfilled with nitrogen. The evacuation and backfill procedure was repeated for a total of three times. Then solvent DMSO (10 mL) was added under the protection of nitrogen. The mixture was stirred in an oil bath at a temperature of 90° C. for 3 days and then cooled down to ambient temperature, diluted with ethyl acetate. The mixture was washed with water three times and then dried over sodium sulfate and filtered. The solvent was removed under reduced pressure, and the residue was purified through column chromatography on silica gel to obtain the desired product ligand L50 in 30%-80% yield.

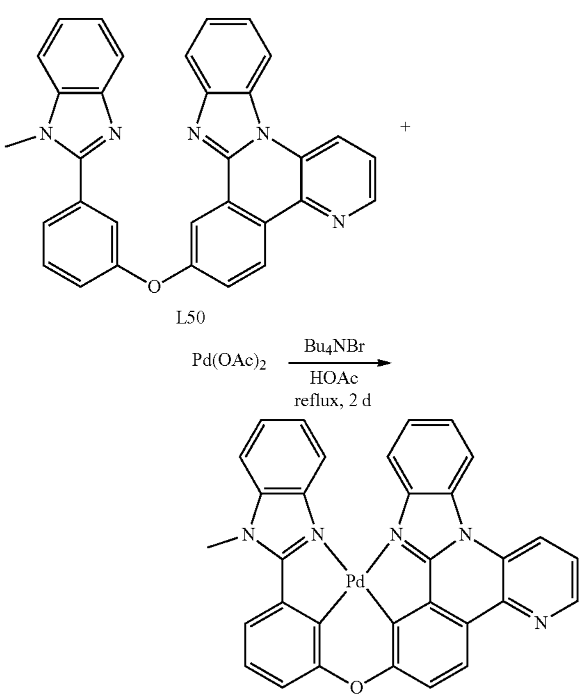

C50

L50 (490 mg, 1.0 mmol, 1.0 eq), $Pd(OAc)_2$ (246 mg, 1.1 mmol, 1.1 eq) and n-$Bu_4NBr$ (32 mg, 0.1 mmol, 0.1 eq) were added to a dry pressure tube was then taken into a glove box and acetic acid (63 mL) was added. The mixture was bubbled with nitrogen for 30 minutes and then the tube was sealed. Then the mixture was heated to reflux in an oil bath and stirred for 2 days, cooled to ambient temperature and the solvent removed. Then the solid was purified through column chromatography on silica gel using dichloromethane as eluent to obtain the desired product C50 in 20%-70% yield.

Only a few implementations are described and illustrated. Variations, enhancements and improvements of the described implementations and other implementations can be made based on what is described and illustrated in this document.

What is claimed is:

1. An organic light emitting diode comprising:

a substrate;

a first electrode;

a hole transporting layer proximate the first electrode;

a second electrode;

an electron transporting layer proximate the second electrode; and an emissive layer between the hole transporting layer and the electron transporting layer, wherein the emissive layer comprises a square planar tetradentate platinum complex represented by one of Formulas I-IX, and excimers formed by two or more of the complexes are aligned such that emitting dipoles of the excimers are substantially parallel to a surface of the substrate:

Formula I

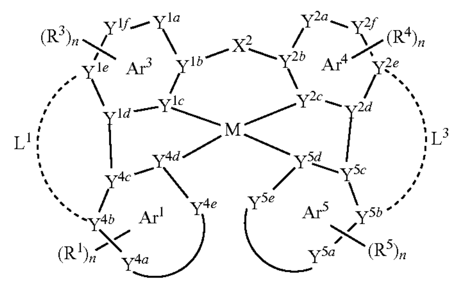

Formula II

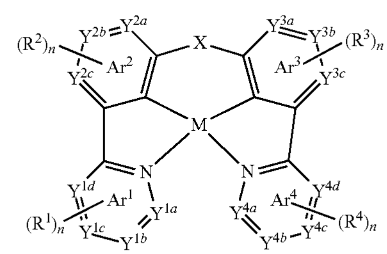

Formula III

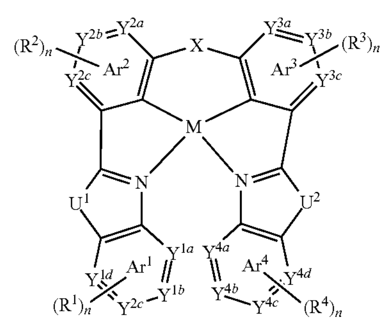

-continued

Formula IV

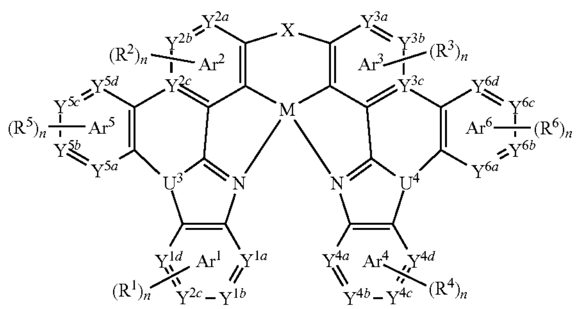

Formula V

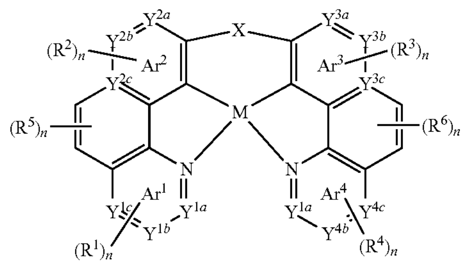

Formula VI

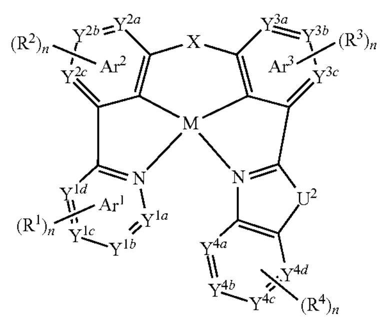

Formula VII

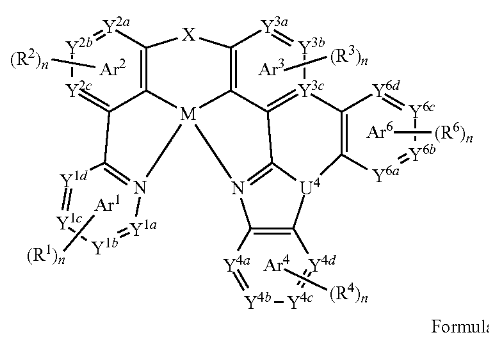

Formula VIII

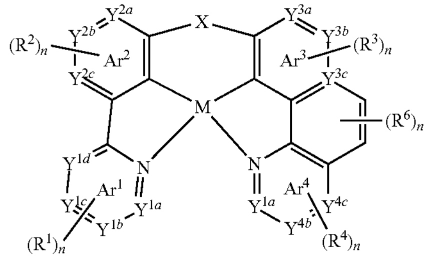

-continued

Formula IX

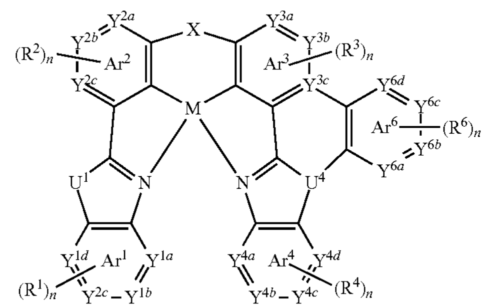

wherein, in Formula I:

M represents Pt(II);

$R^1$, $R^3$, $R^4$, and $R^5$ each independently represents hydrogen, halogen, hydroxyl, nitro, cyanide, thiol, or optionally substituted $C_1$-$C_4$ alkyl, alkoxy, amino, or aryl;

each n is independently an integer as limited by valency;

$Y^{1a}$, $Y^{1b}$, $Y^{1c}$, $Y^{1d}$, $Y^{1e}$, $Y^{1f}$, $Y^{2a}$, $Y^{2b}$, $Y^{2c}$, $Y^{2d}$, $Y^{2e}$, $Y^{2f}$, $Y^{4a}$, $Y^{4b}$, $Y^{4c}$, $Y^{4d}$, $Y^{4e}$, $Y^{5a}$, $Y^{5b}$, $Y^{5c}$, $Y^{5d}$, and $Y^{5e}$ each independently represents C, N, Si, O, S;

$X^2$ represents NR, PR, CRR', SiRR', CRR', SiRR', O, S, S═O, O═S═O, Se, Se═O, or O═Se═O, where R and R' each independently represents halogen, hydroxyl, nitro, cyanide, thiol, or optionally substituted $C_1$-$C_4$ alkyl, alkoxy, amino, aryl, or heteroaryl;

each of $L^1$ and $L^3$ is independently present or absent, and if present, represents a substituted or unsubstituted linking atom or group, where a substituted linking atom is bonded to an alkyl, alkoxy, alkenyl, alkynyl, hydroxy, amine, amide, thiol, aryl, heteroaryl, cycloalkyl, or heterocyclyl moiety;

$Ar^3$ and $Ar^4$ each independently represents 6-membered aryl group; and $Ar^1$ and $Ar^5$ each independently represents a 5- to 10-membered aryl, heteroaryl, fused aryl, or fused heteroaryl; and wherein, in Formulas II-IX:

M represents Pt(II);

each $R^1$, $R^2$, $R^3$, $R^4$, $R^5$, and $R^6$ present independently represents hydrogen, halogen, hydroxyl, nitro, cyanide, thiol, or optionally substituted $C_1$-$C_4$ alkyl, alkoxy, amino, or aryl;

each n is independently an integer, valency permitting;

each $Y^{1a}$, $Y^{1b}$, $Y^{1c}$, $Y^{1d}$, $Y^{2a}$, $Y^{2b}$, $Y^{2c}$, $Y^{3a}$, $Y^{3b}$, $Y^{3c}$, $Y^{4a}$, $Y^{4b}$, $Y^{4c}$, $Y^{4d}$, $Y^{5a}$, $Y^{5b}$, $Y^{5c}$, $Y^{5d}$, $Y^{6a}$, $Y^{6b}$, $Y^{6e}$, and $Y^{6d}$ present independently represents C, N, or Si;

$U^1$ and $U^2$ each independently represents NR, O or S, wherein R represents hydrogen, halogen, hydroxyl, nitro, cyanide, thiol, or optionally substituted $C_1$-$C_4$ alkyl, alkoxy, amino, or aryl;

$U^3$ and $U^4$ each independently represents N or P; and

X represents O, S, NR, CRR', SiRR', PR, BR, S═O, O═S═O, Se, Se═O, or O═Se═O, where R and R' each independently represents hydrogen, halogen, hydroxyl, nitro, cyanide, thiol, or optionally substituted $C_1$-$C_4$ alkyl, alkoxy, amino, aryl, or heteroaryl.

2. The organic light emitting diode of claim 1, wherein the complex represented by Formula I comprises one of:
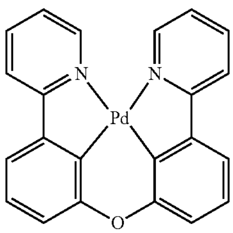
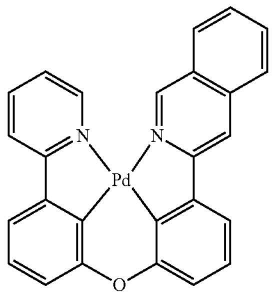
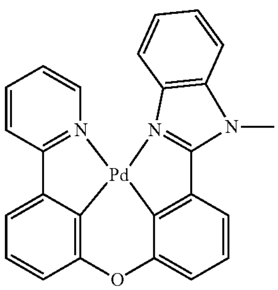
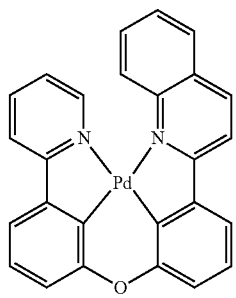
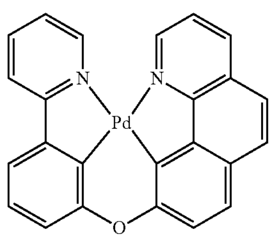
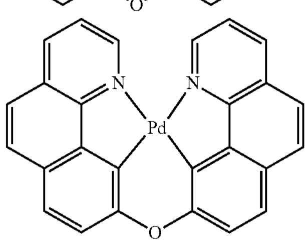
and the complex represented by one of Formulas II-IX comprises one of:
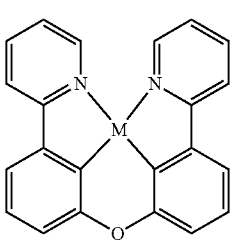
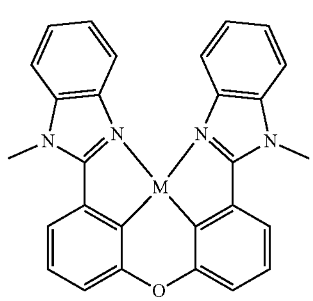
-continued
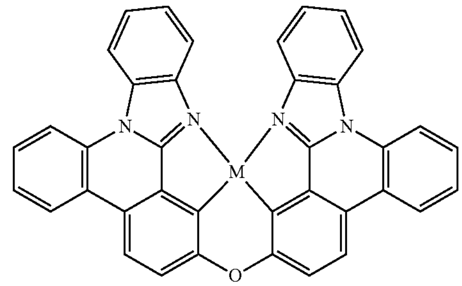
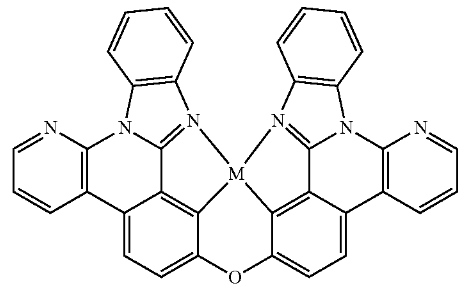
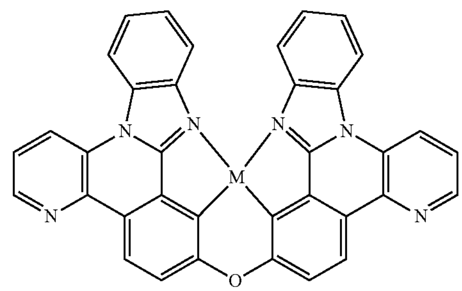
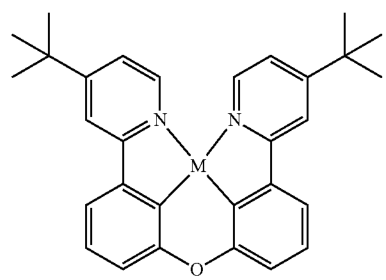
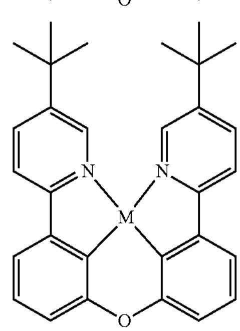
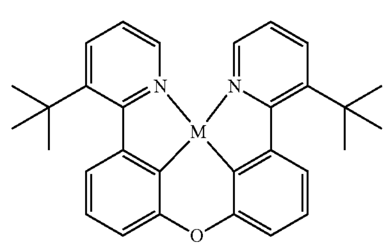

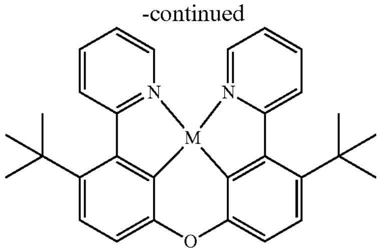
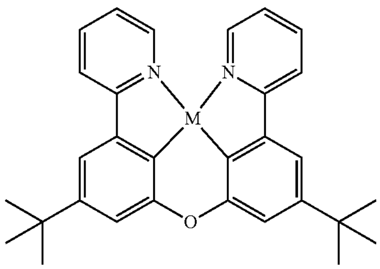
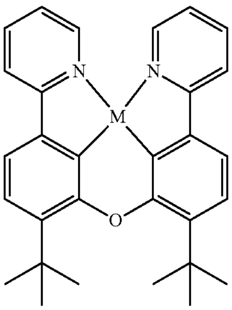
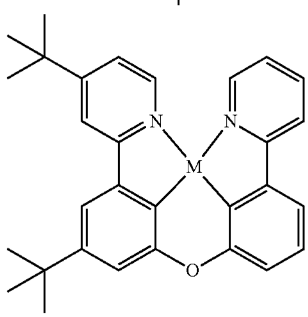
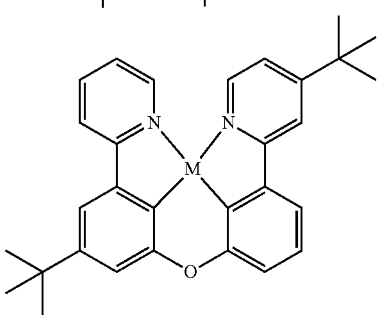
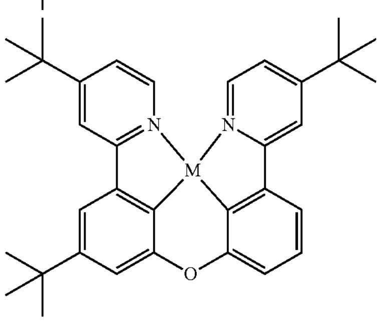
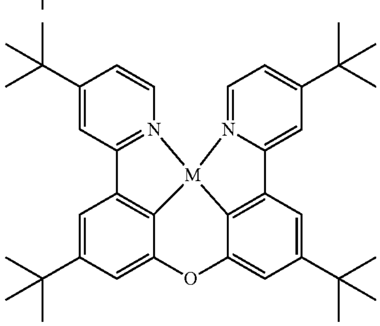
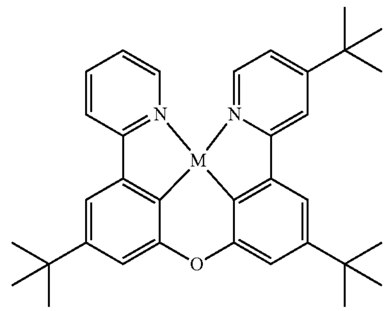
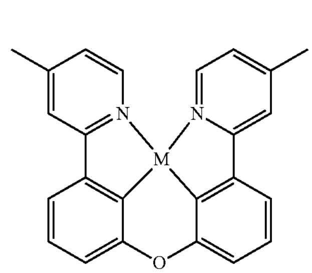
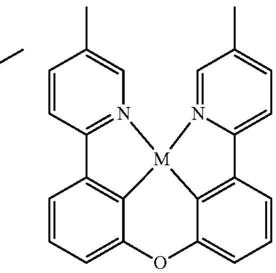
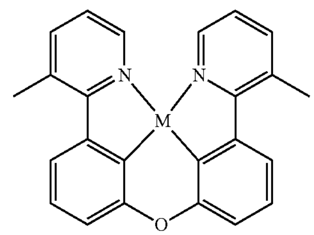
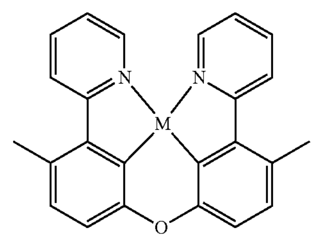
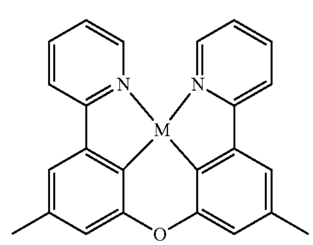
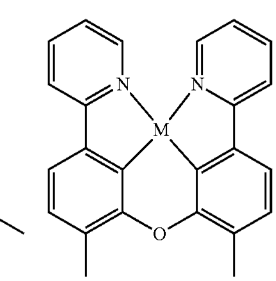
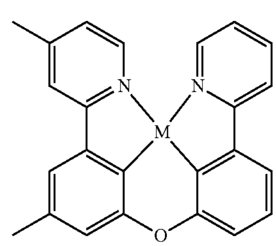
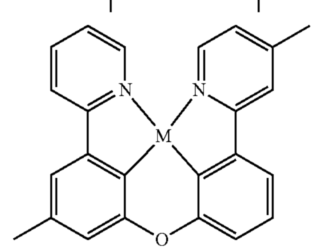

-continued
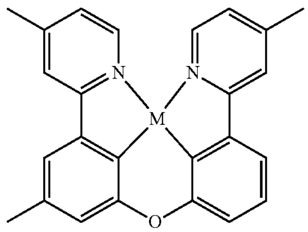
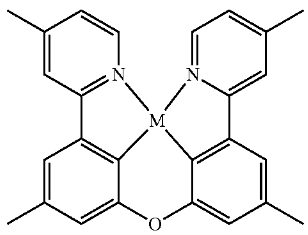
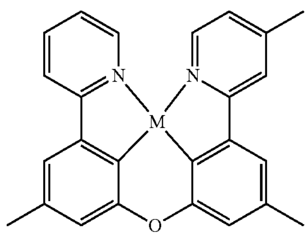
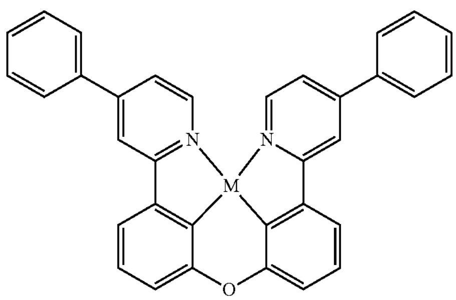
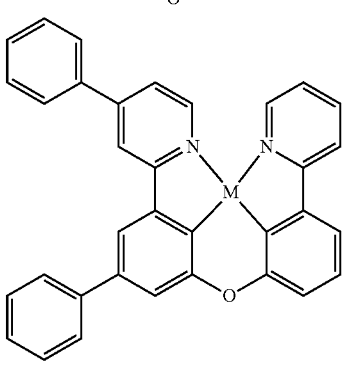
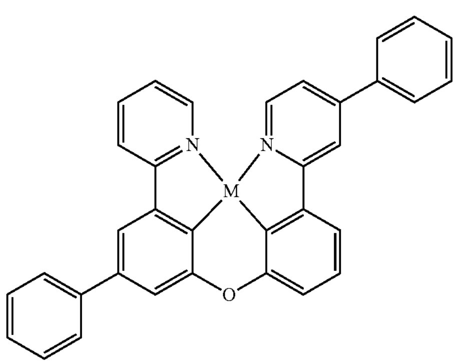
-continued
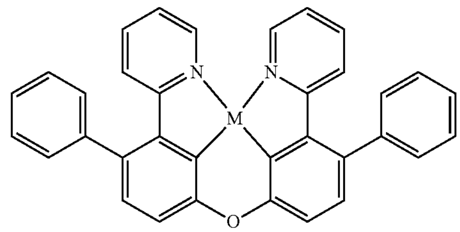
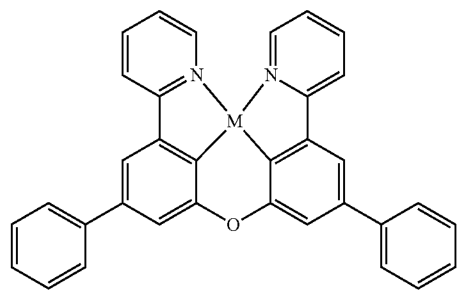
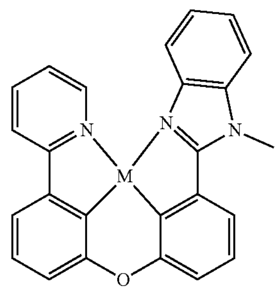
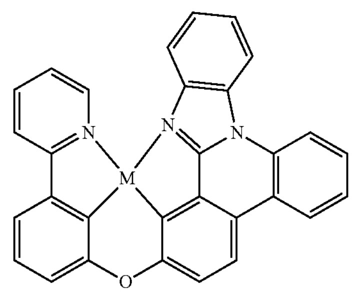
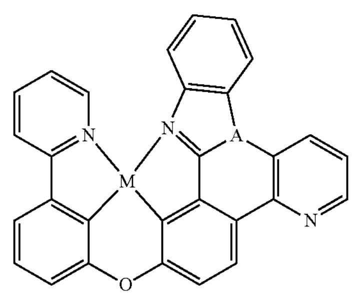
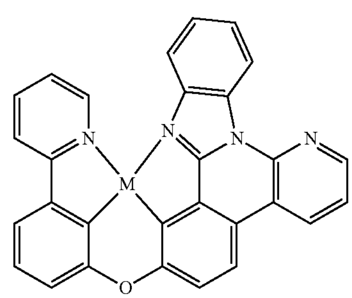

-continued
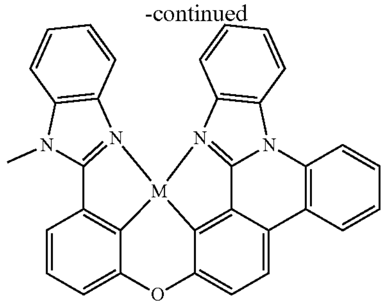
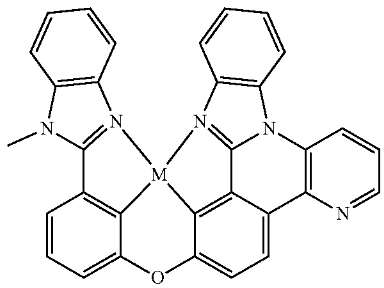
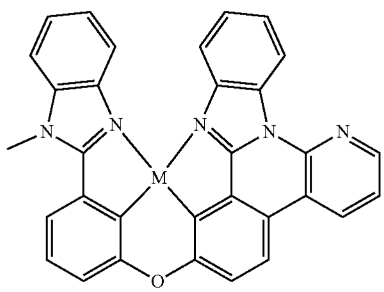
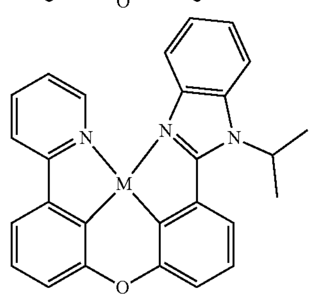
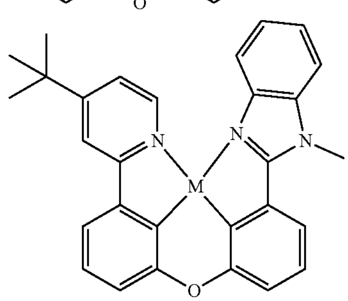
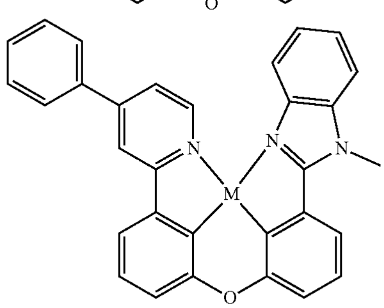
-continued
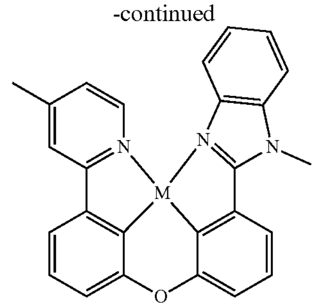
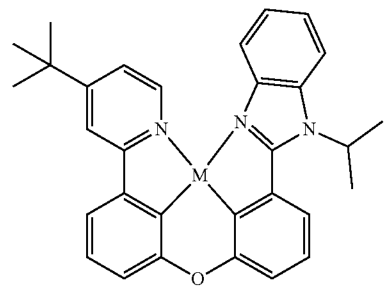
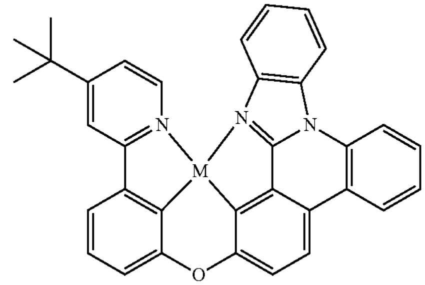
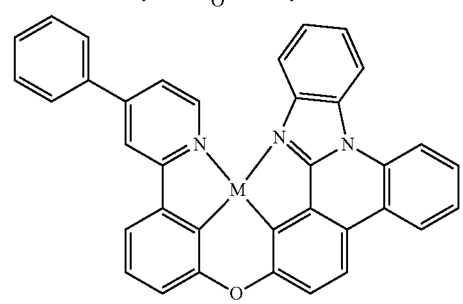
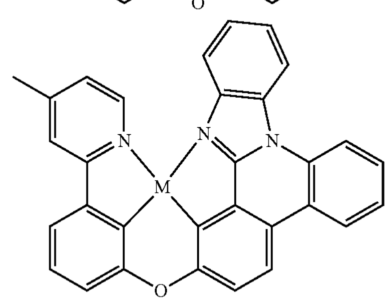
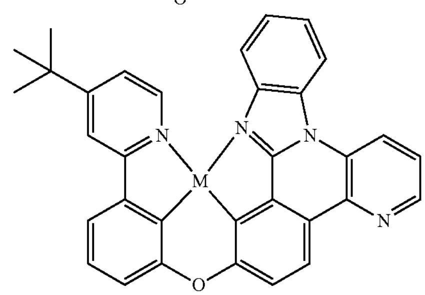

-continued
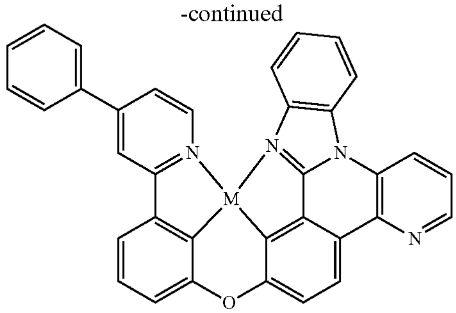
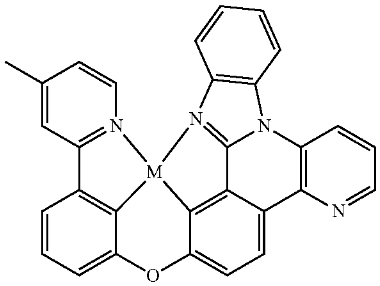
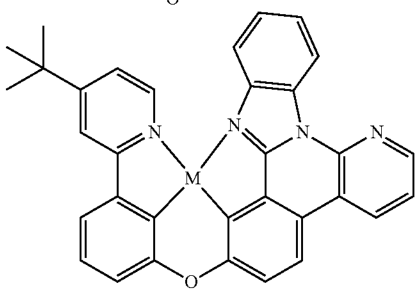
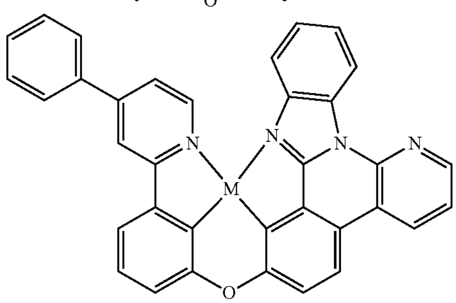
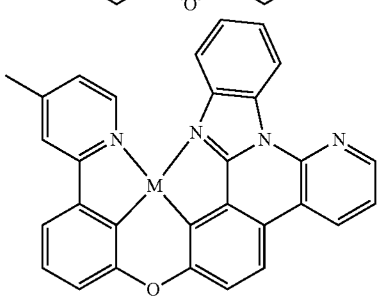
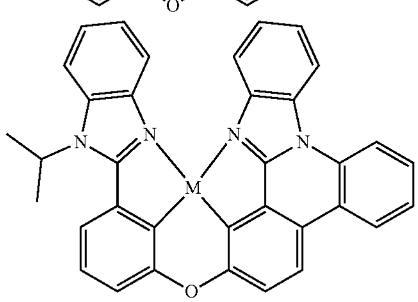
-continued
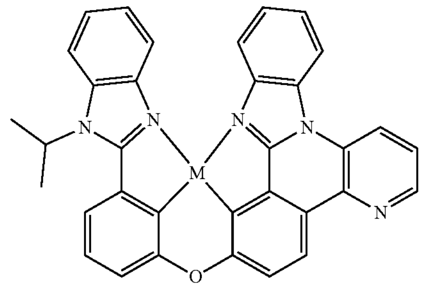
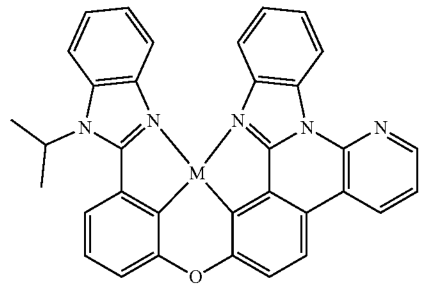
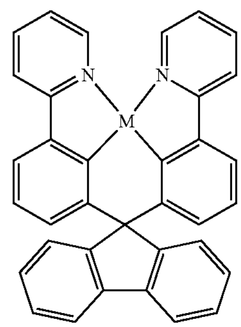
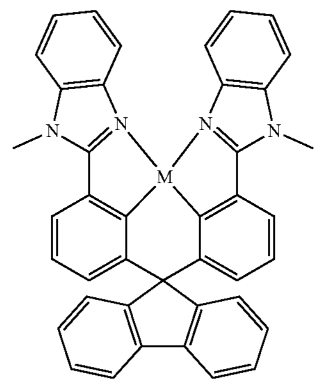
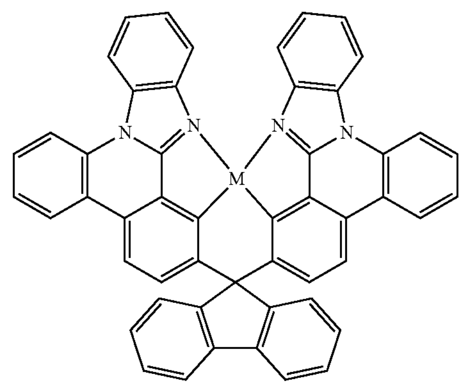
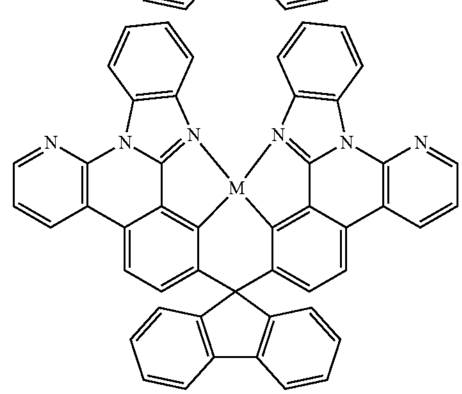

-continued
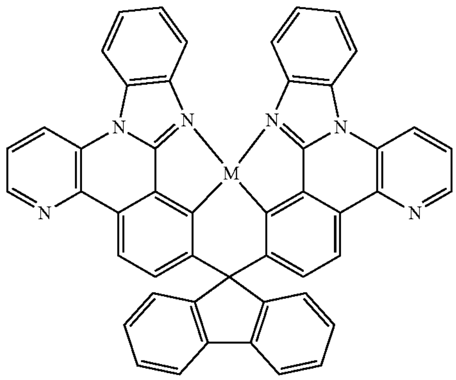
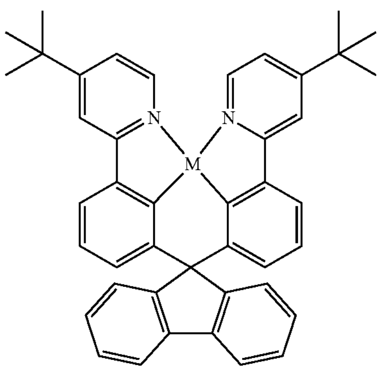
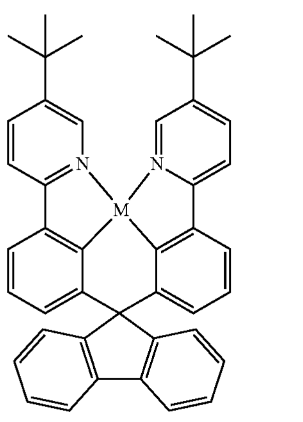
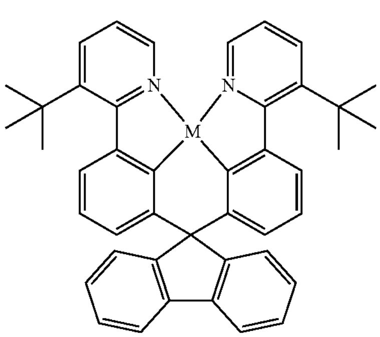
-continued
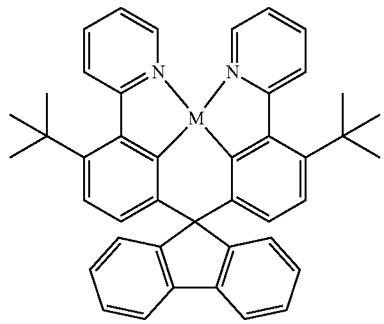
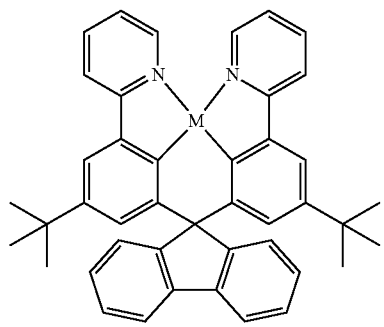
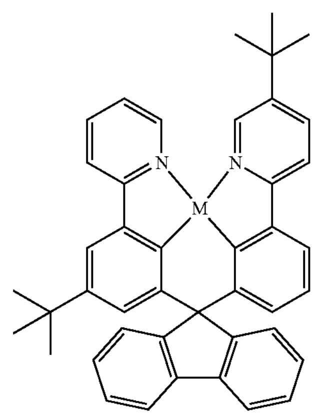
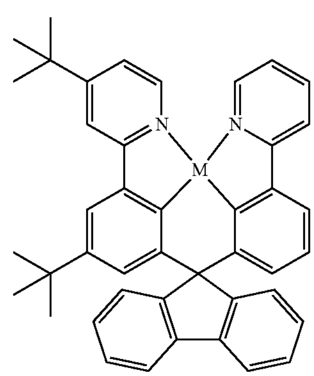

-continued
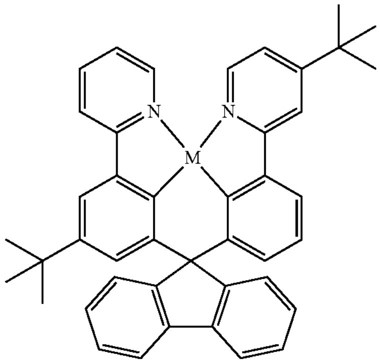
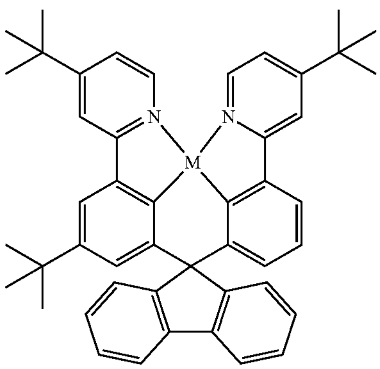
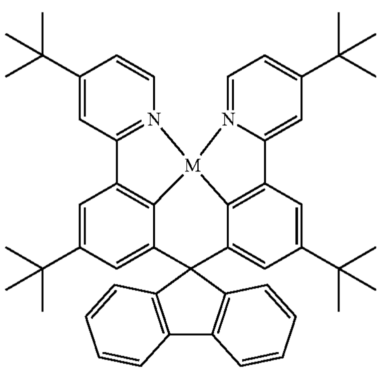
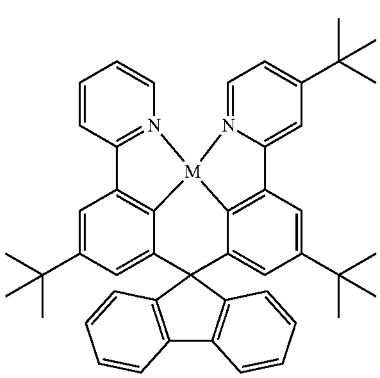
-continued
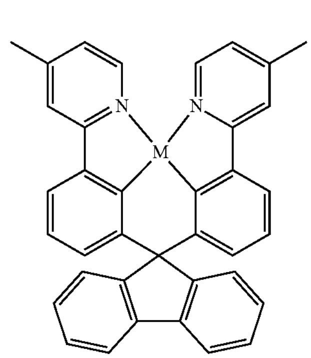
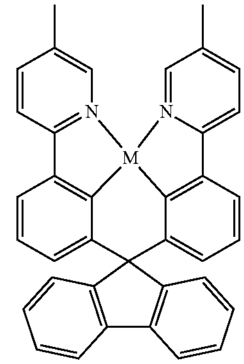
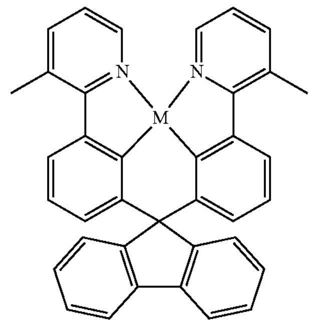
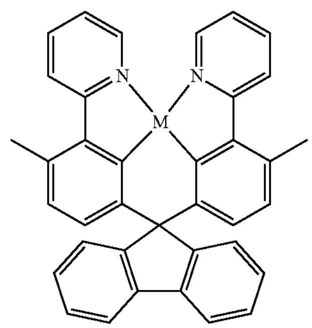
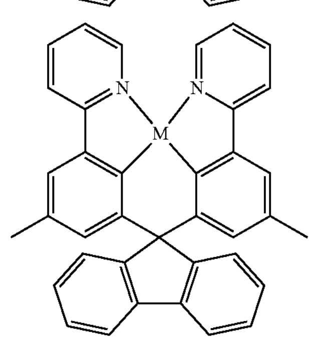
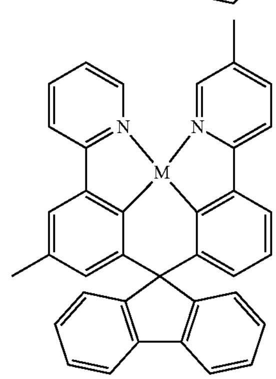
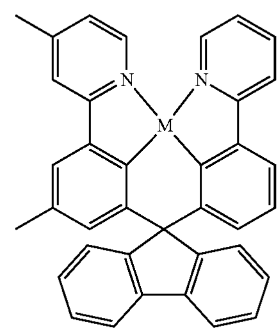

-continued
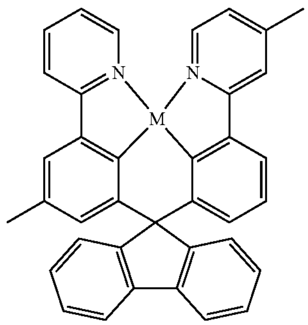
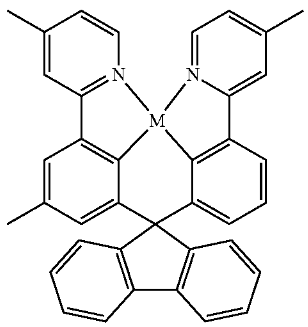
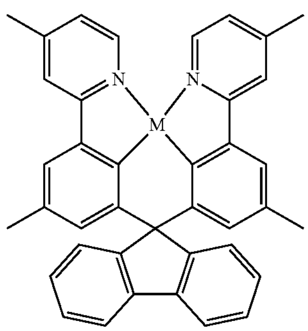
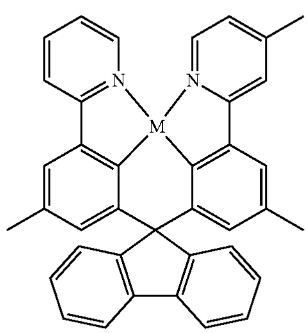
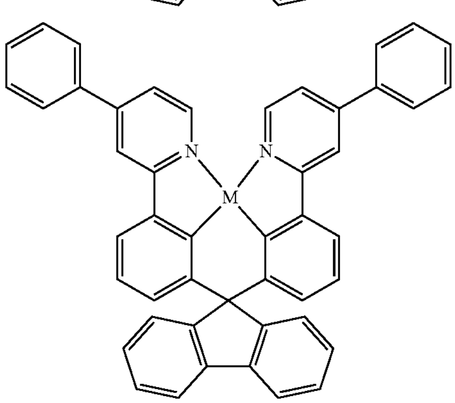
-continued
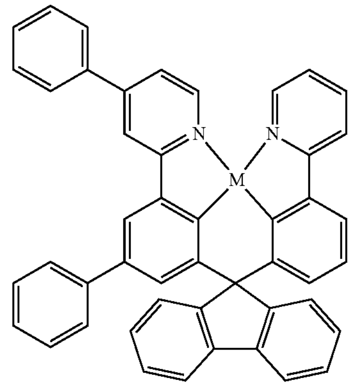
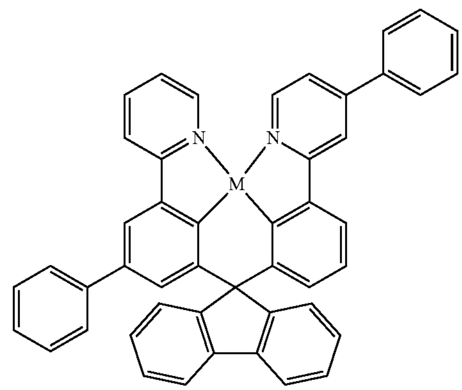
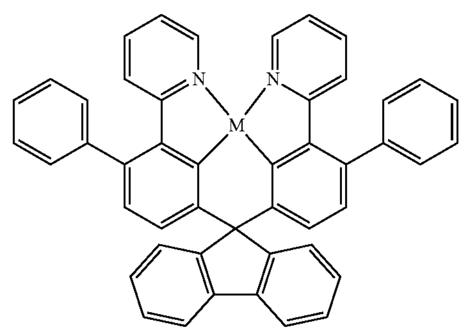
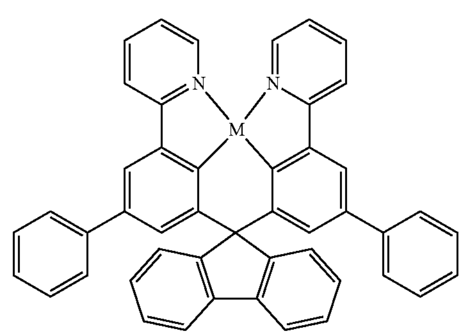

-continued
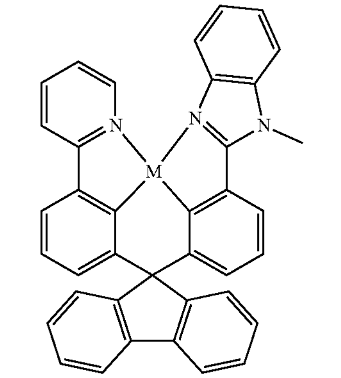
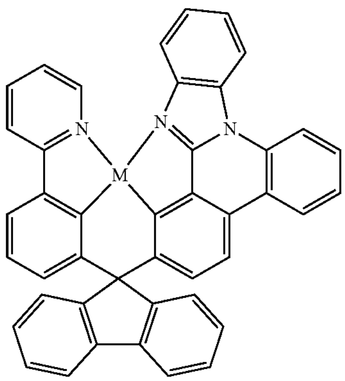
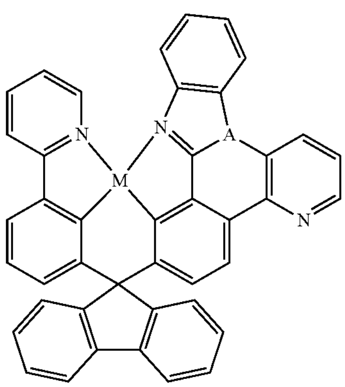
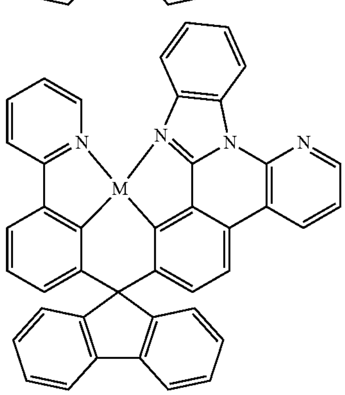
-continued
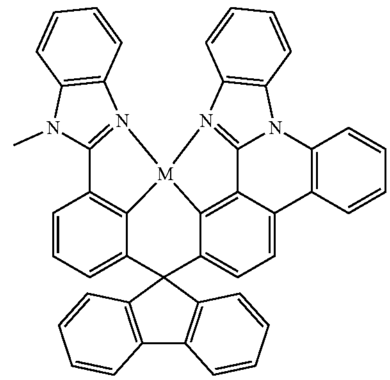
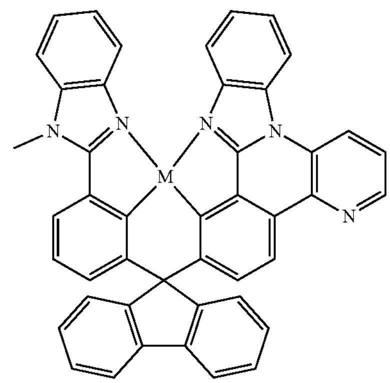
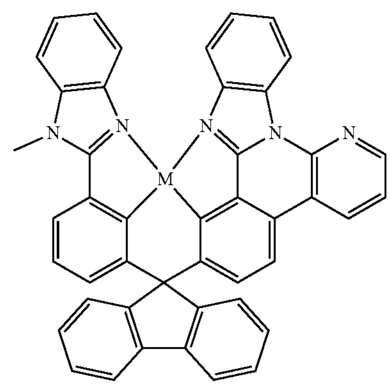
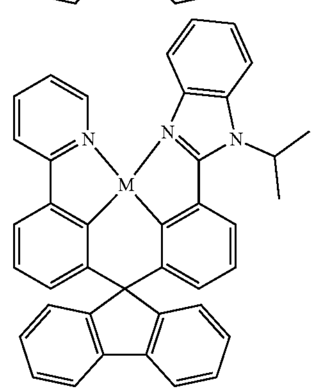

-continued
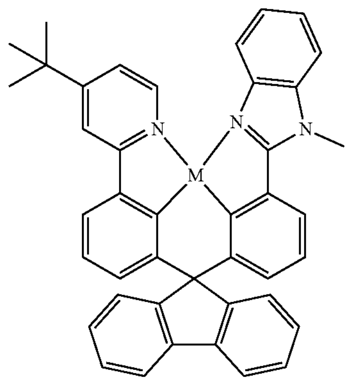
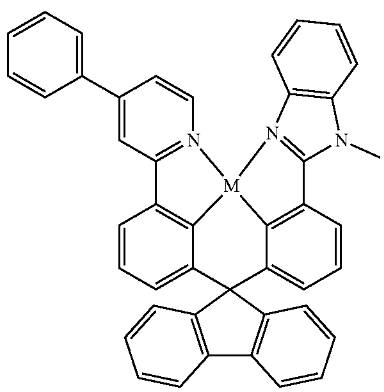
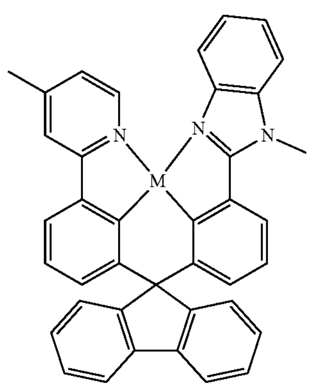
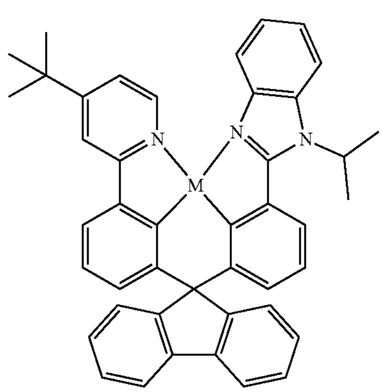
-continued
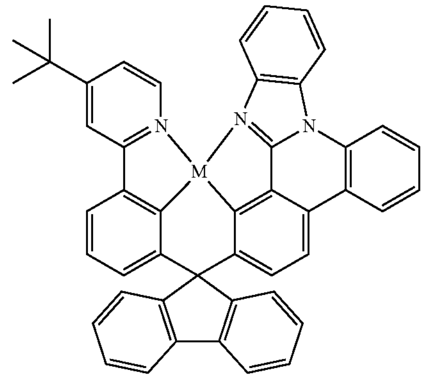
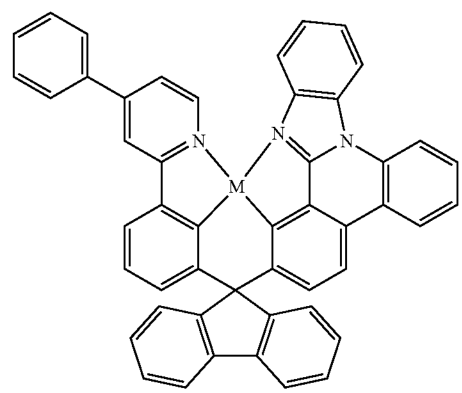
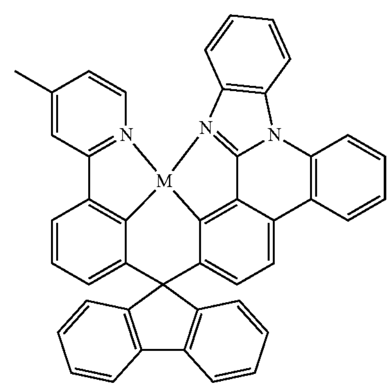
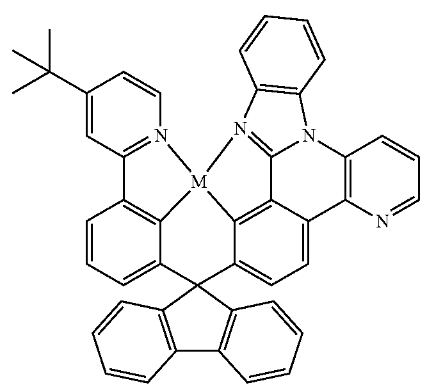

-continued
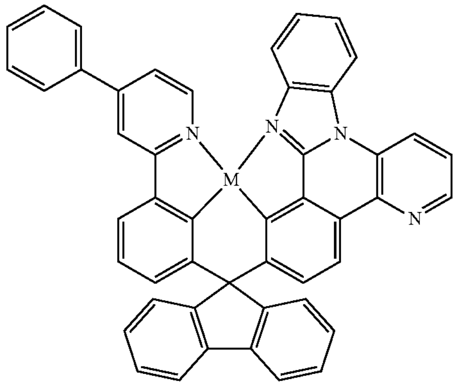
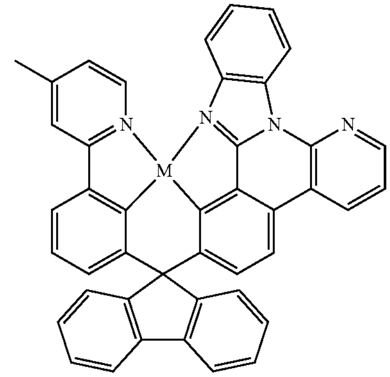
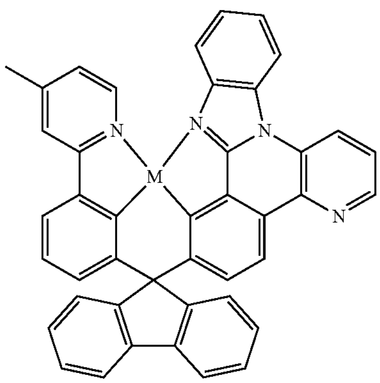
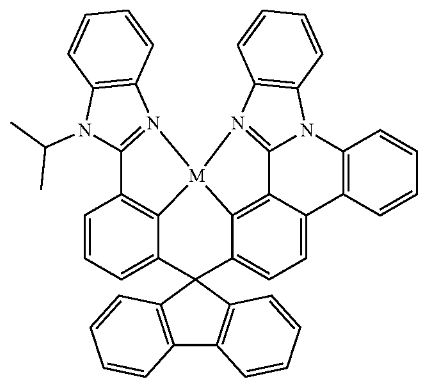
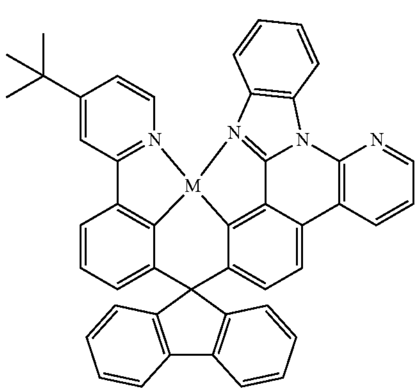
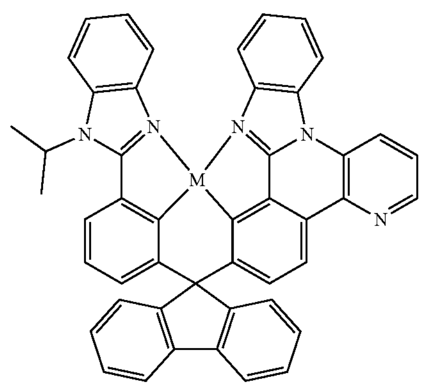
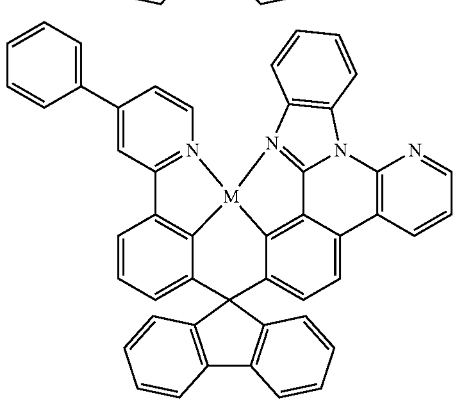
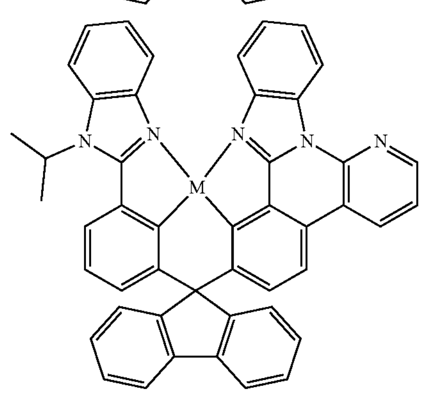

-continued
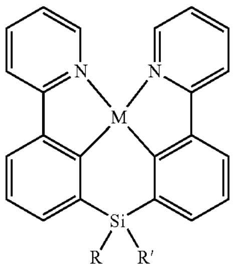
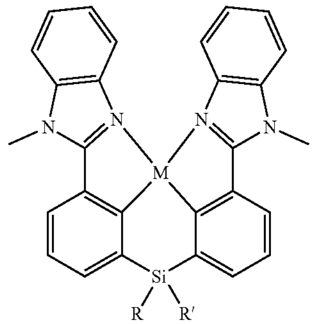
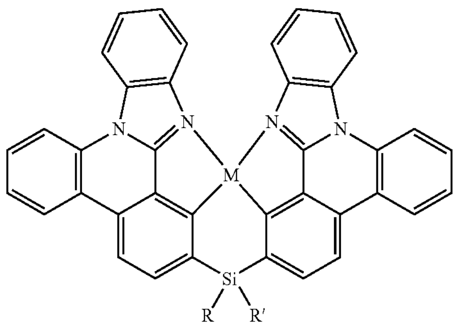
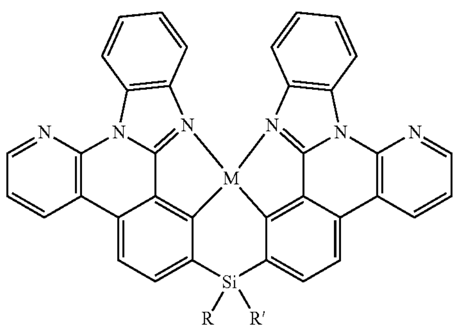
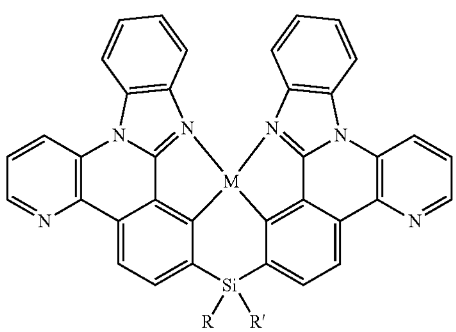
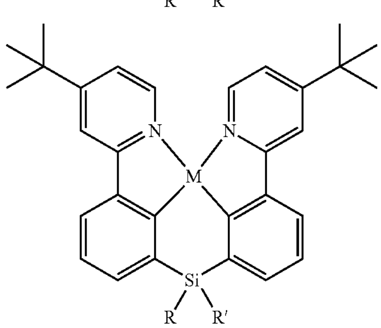
-continued
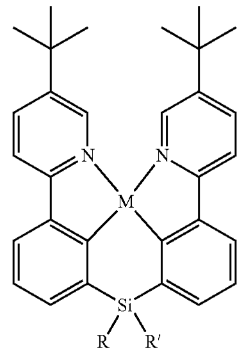
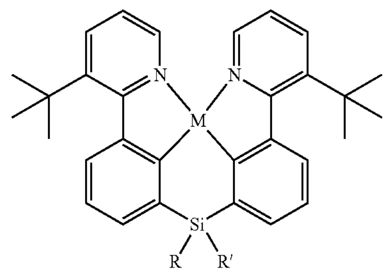
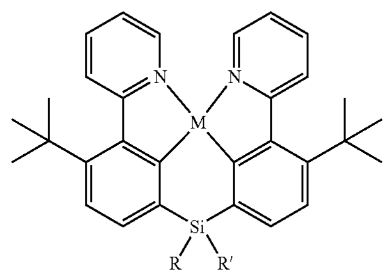
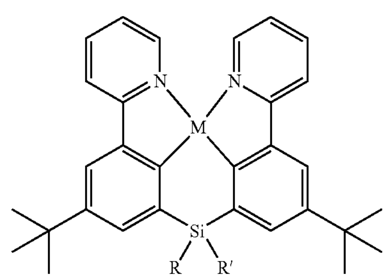
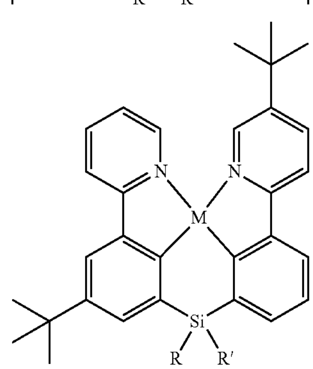

-continued
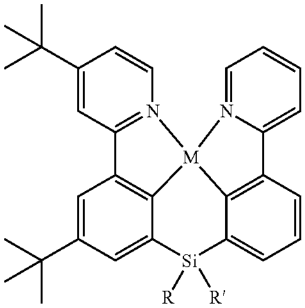
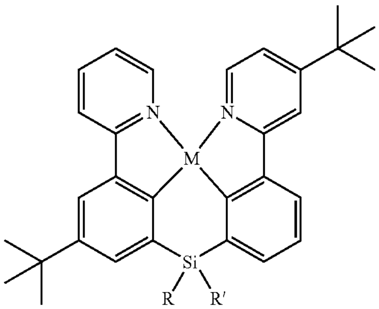
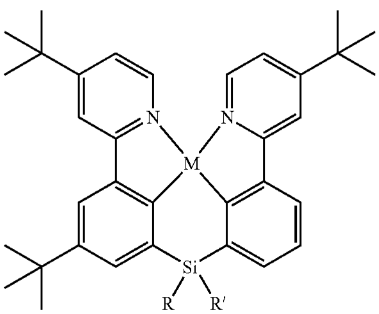
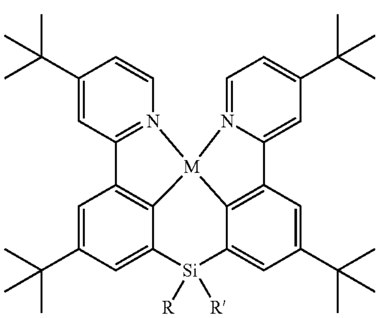
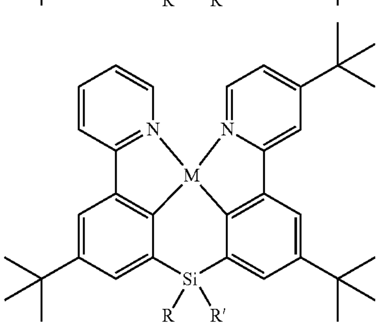
-continued
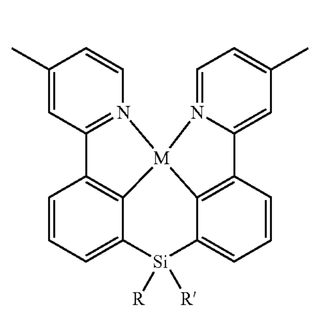
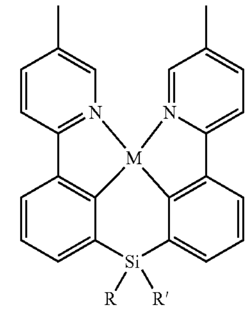
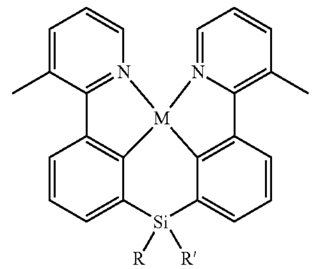
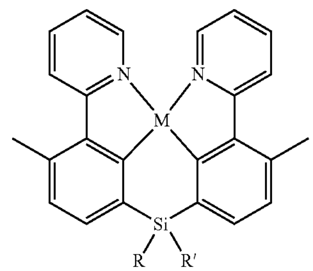
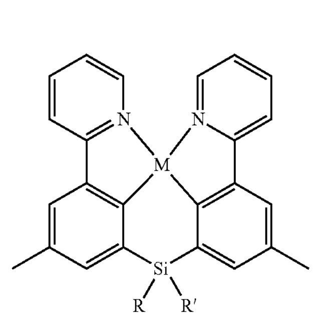
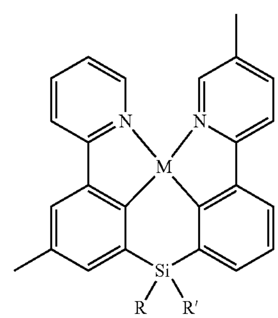
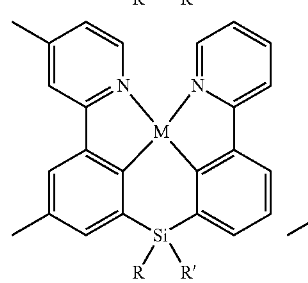
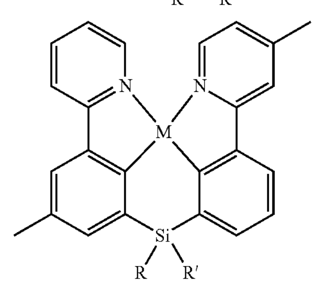
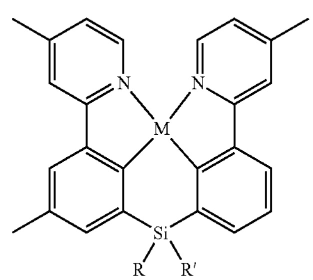

-continued
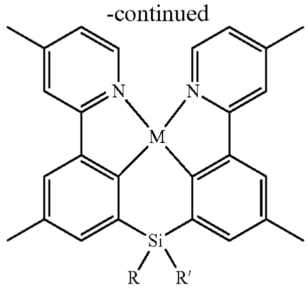
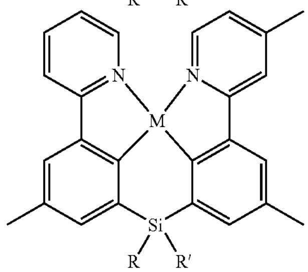
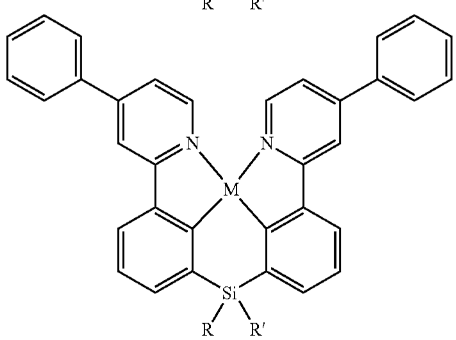
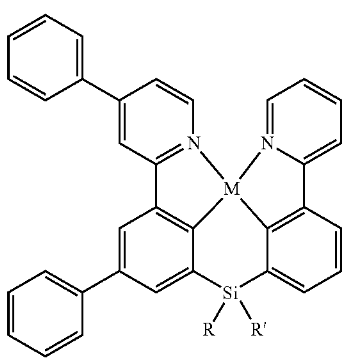
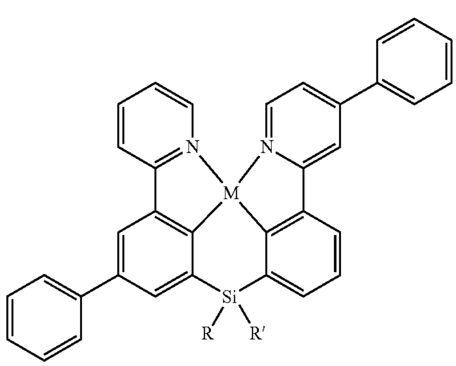
-continued
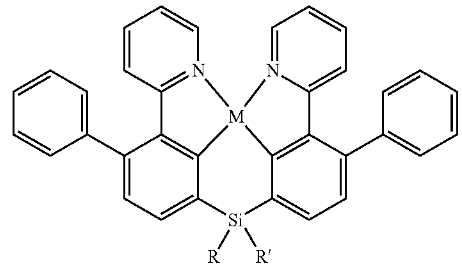
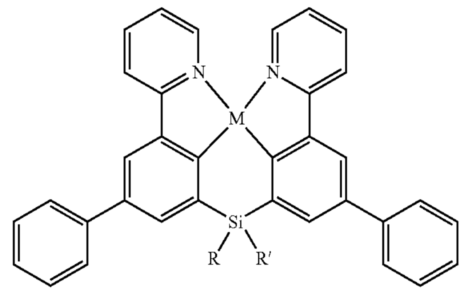
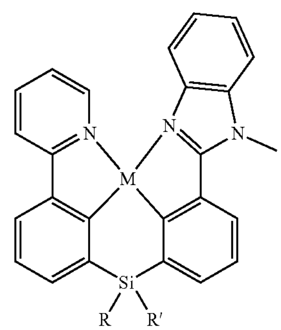
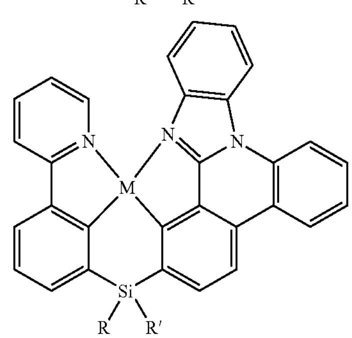
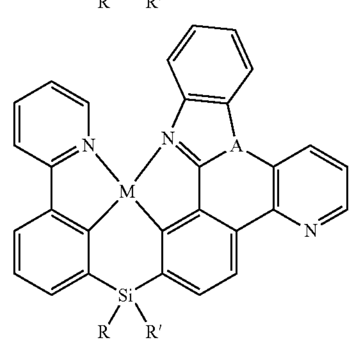

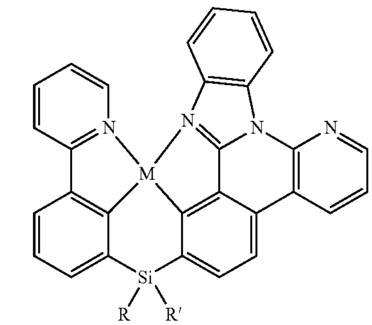
N
N
N
N
M
Si
R
R'
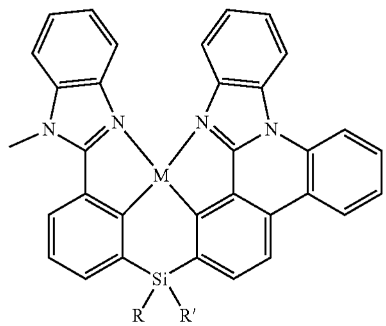
N
N
N
N
M
Si
R
R'
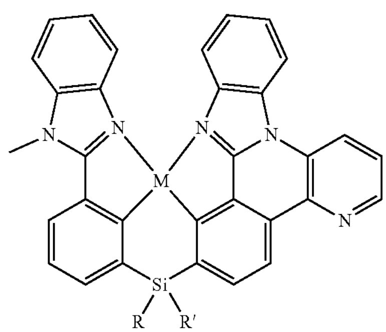
N
N
N
N
N
M
Si
R
R'
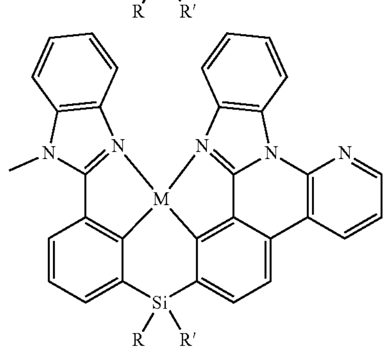
N
N
N
N
N
M
Si
R
R'
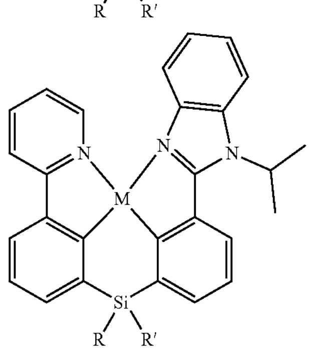
N
N
N
M
Si
R
R'
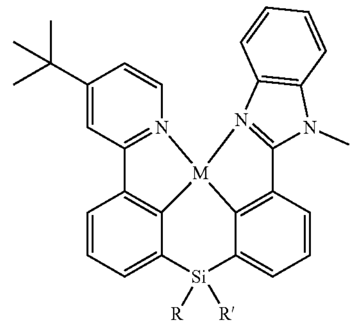
N
N
N
M
Si
R
R'
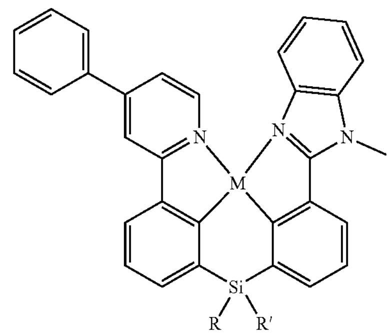
N
N
N
M
Si
R
R'
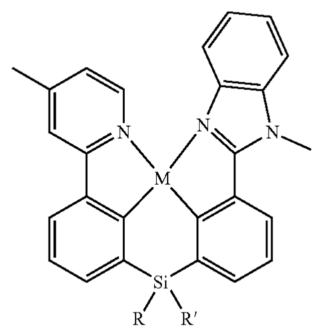
N
N
N
M
Si
R
R'
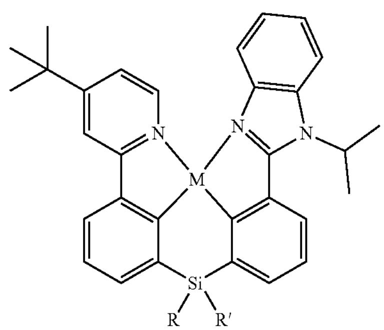
N
N
N
M
Si
R
R'
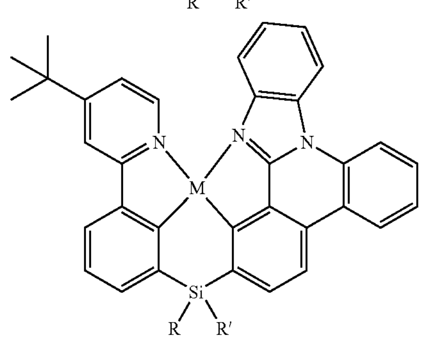
N
N
N
M
Si
R
R'

-continued
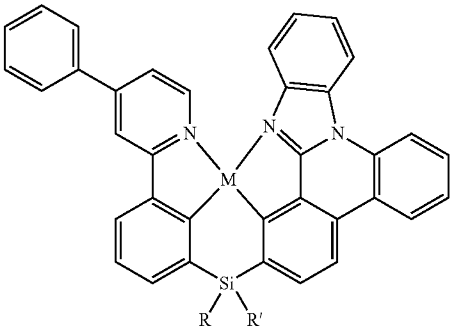
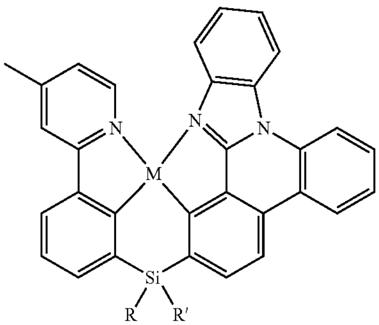
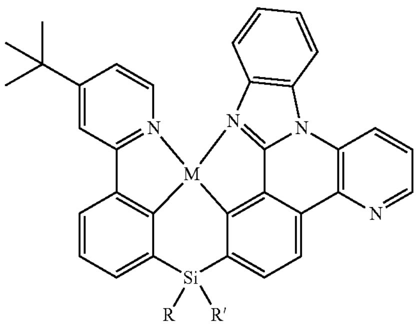
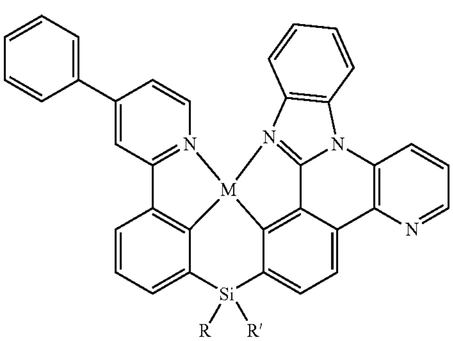
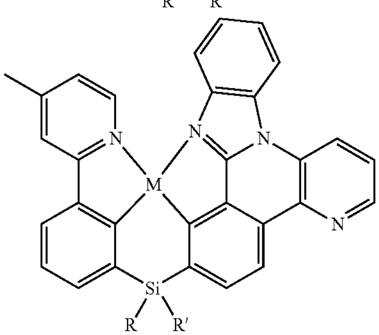
-continued
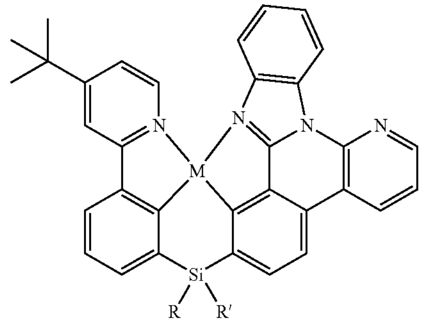
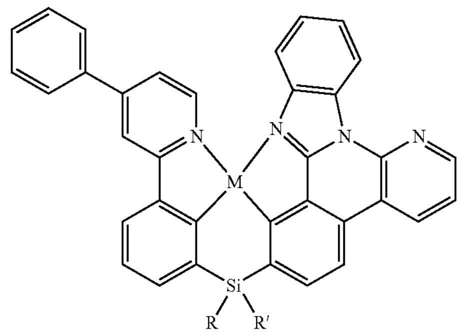
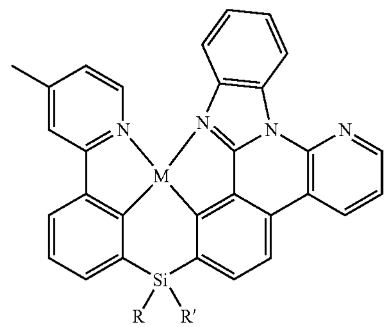
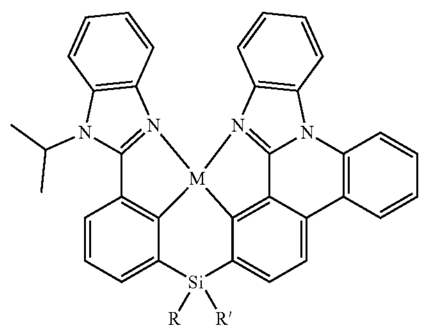
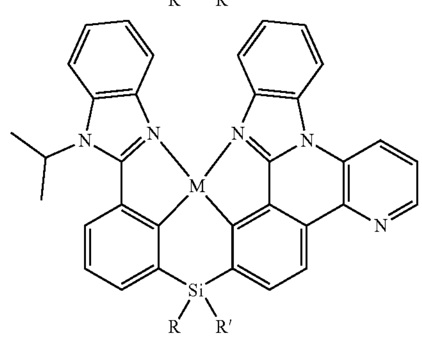

-continued
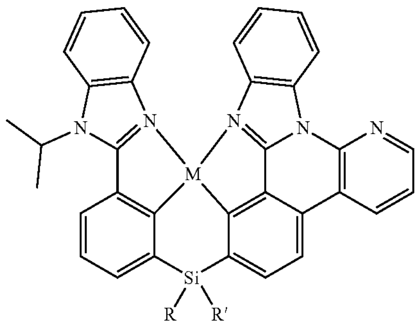
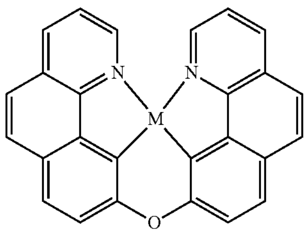
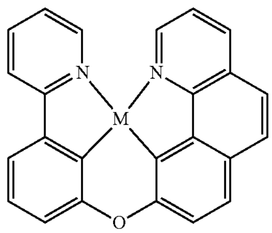
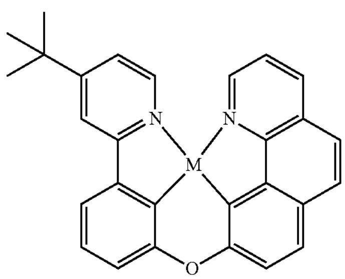
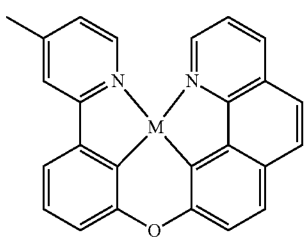
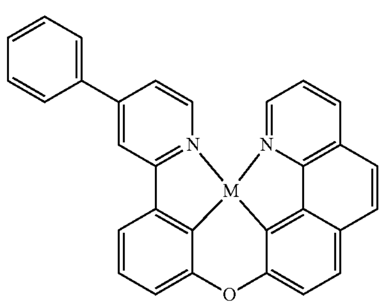
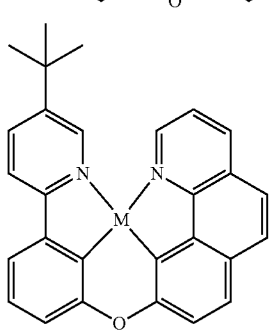
-continued
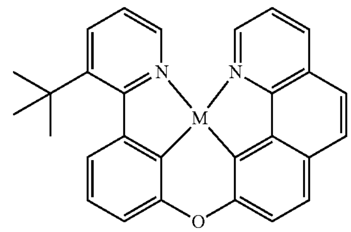
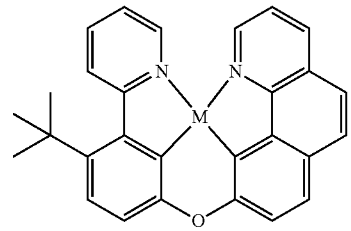
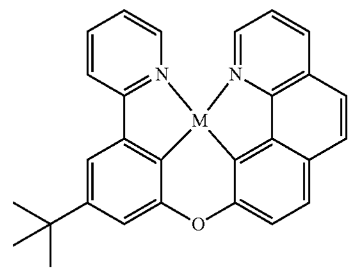
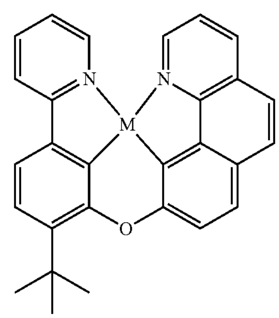
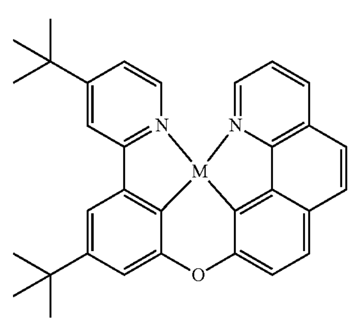
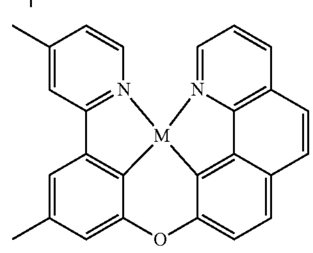

-continued
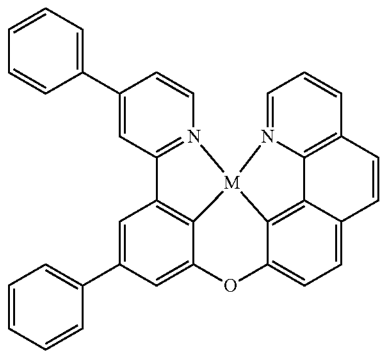
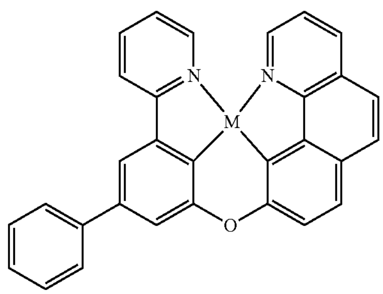
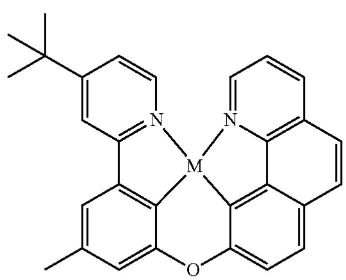
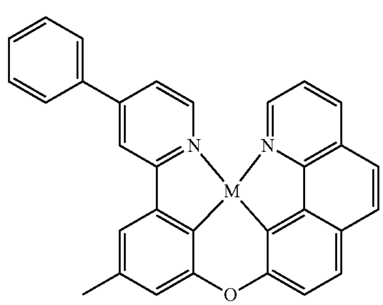
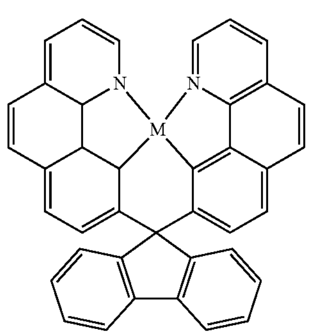
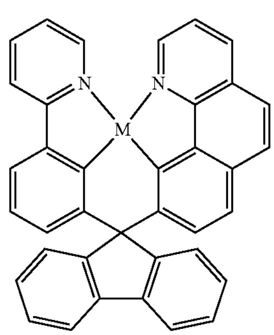
-continued
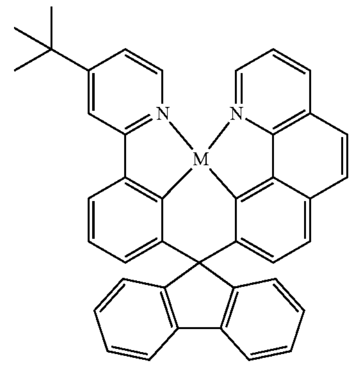
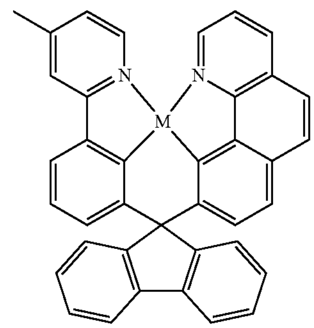
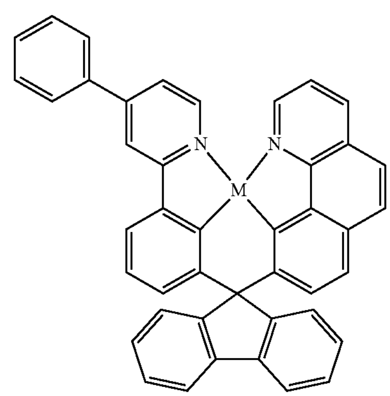
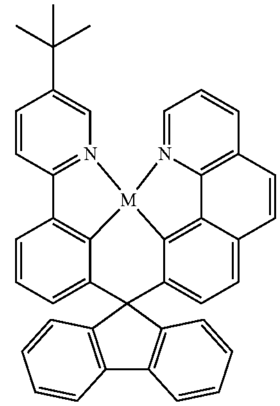

-continued
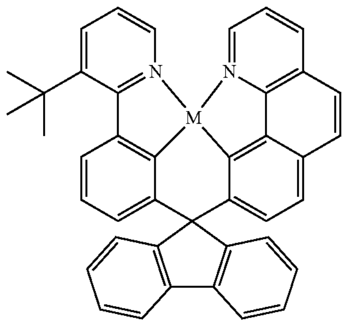
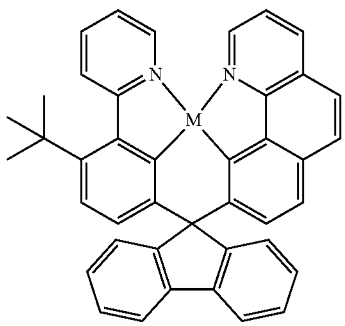
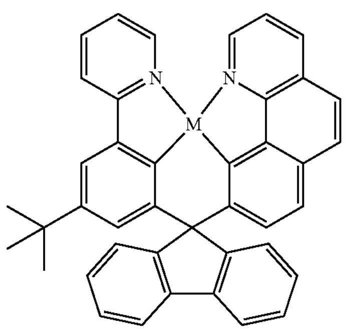
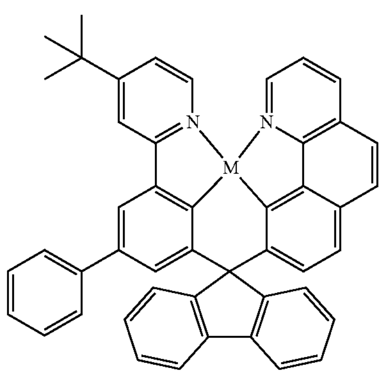
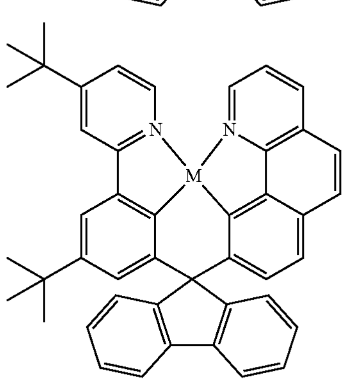
-continued
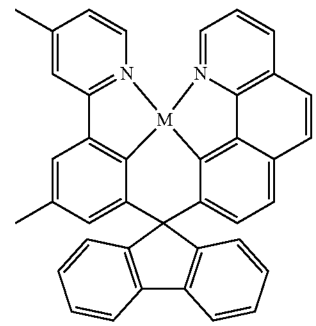
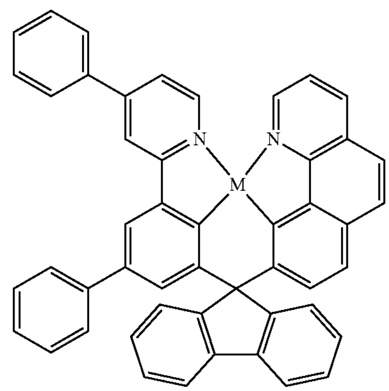
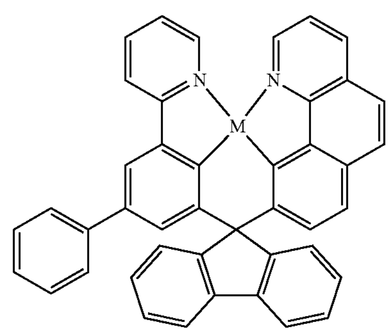
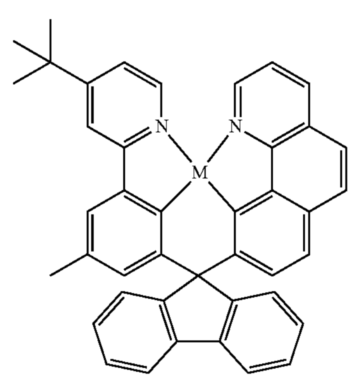

-continued
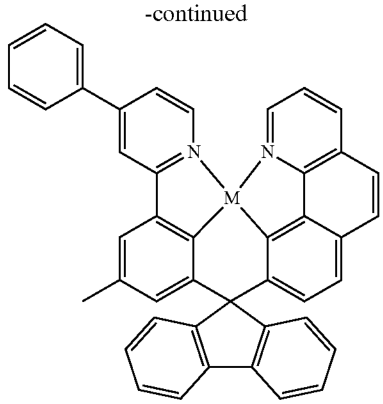
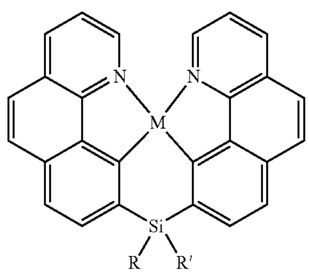
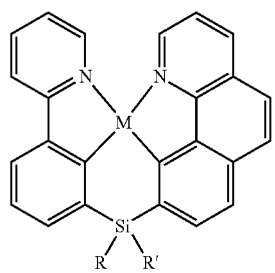
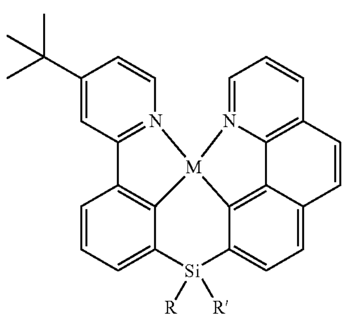
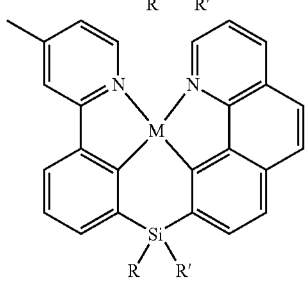
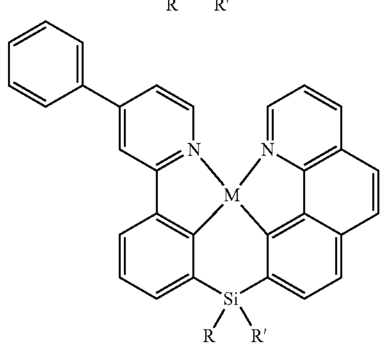
-continued
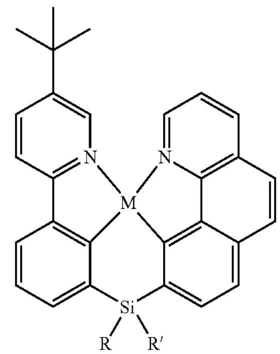
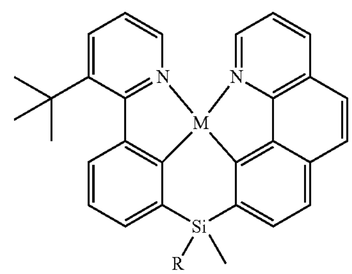
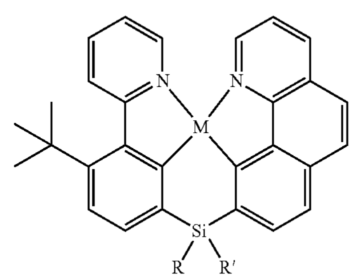
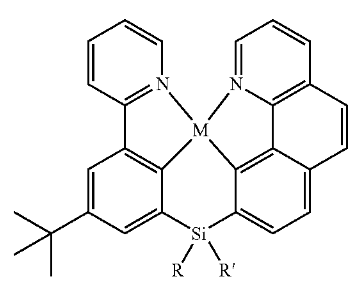
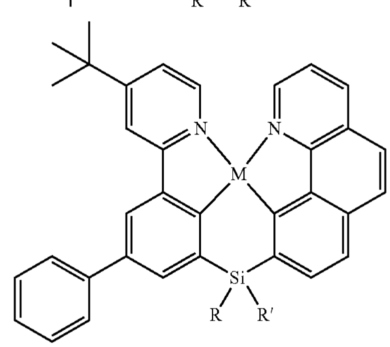

-continued

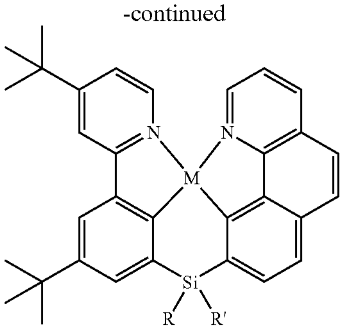

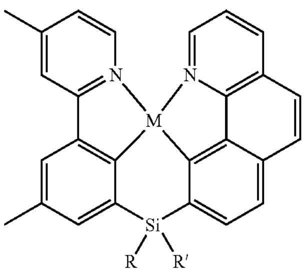

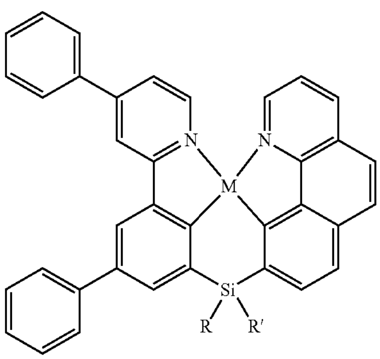

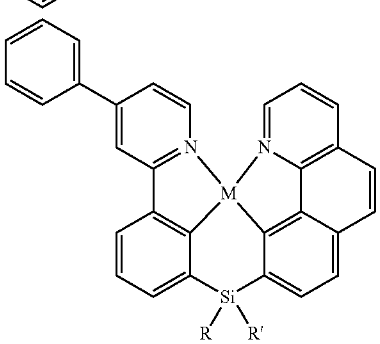

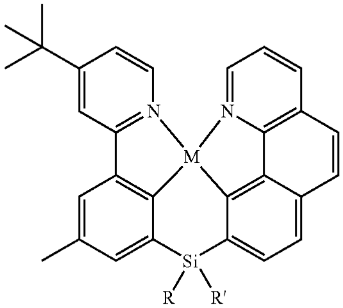

-continued

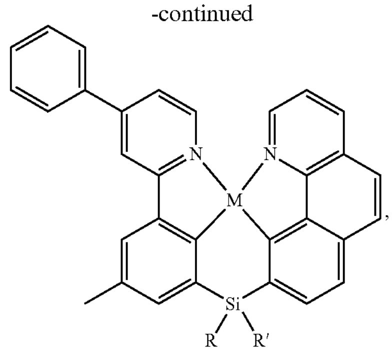

wherein R and R' each independently represents substituted or unsubstituted $C_1$-$C_4$ alkyl, alkoxy, aryl, or heteroaryl; and wherein M represents Pt(II).

3. The organic light emitting diode of claim 1, wherein a concentration of the complex in the emissive layer is in a range of 5 wt % to 100 wt %.

4. The organic light emitting diode of claim 3, wherein the emissive layer comprises a neat film of the complex.

5. The organic light emitting diode of claim 3, wherein the emissive layer comprises a doped film comprising a host material and the complex.

6. The organic light emitting diode of claim 5, wherein a concentration of the complex in the doped film is in a range of 5 wt % to 25 wt %.

7. The organic light emitting diode of claim 5, wherein the host material comprises a carbazole-based host having one to three carbazole skeletons.

8. The organic light emitting diode of claim 7, wherein the carbazole-based host is represented by one of Formulas 1-3:

Formula 1

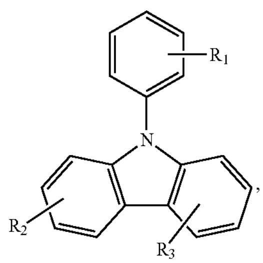

Formula 2

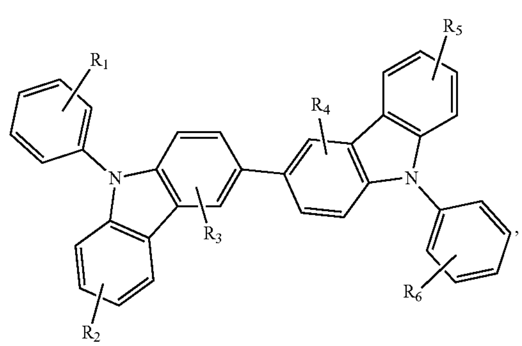

-continued

Formula 3

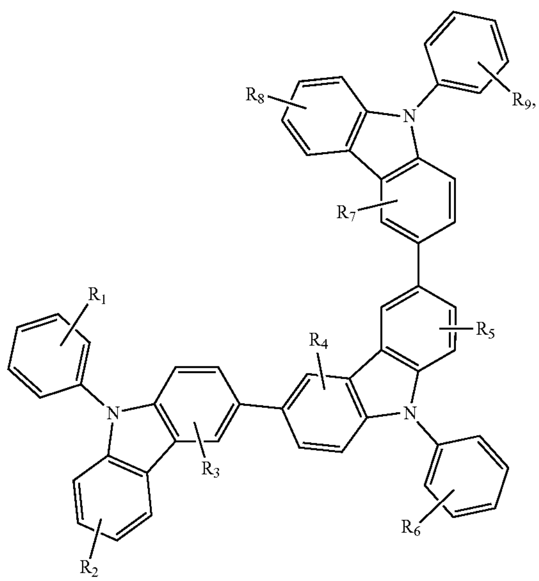

wherein each occurrence of $R^1$-$R^9$ independently represents halogen, hydroxyl, nitro, cyanide, thiol, or optionally substituted alkyl, alkenyl, alkynyl, aryl, heteroaryl, cycloalkane, cycloalkane, heterocyclyl, amino, alkoxy, haloalkyl, arylalkane, or arylalkene.

9. The organic light emitting diode of claim 8, wherein the carbazole-based host comprises one or more of tris-PCz (9,9',9"-triphenyl-9H,9'H,9"H-3,3':6'3"-tercarbazole), CBP (4,4-di(9H-carbazol-9-yl) biphenyl), mCBP (3,3-di(9H-carbazol-9-yl) biphenyl), and mCP (meta-di(carbazolyl) phenyl).

10. The organic light emitting diode of claim 1, wherein the emissive layer comprises one or more doped films comprising the complex, each doped film having a different concentration of the complex.

11. The organic light emitting diode of claim 10, wherein the emissive layer comprises a first doped film comprising the complex and a second doped film comprising the complex.

12. The organic light emitting diode of claim 11, wherein a concentration of the complex in the first doped film is in a range of 15 wt % to 25 wt % and a concentration of the complex in the second doped film is in a range of 5 wt % to 15 wt %.

13. The organic light emitting diode of claim 12, wherein the emissive layer further comprises a third doped film comprising the complex.

14. The organic light emitting diode of claim 13, wherein a concentration of the complex in the third doped film is in a range of 5 wt % to 10 wt %.

15. The organic light emitting diode of claim 1, wherein the first electrode is formed on the surface of the substrate.

16. The organic light emitting diode of claim 1, wherein, in Formula I, $Ar^1$ and $Ar^5$ do not represent imidazolium carbene, pyrazine, or triazole.

* * * * *